(12) United States Patent
Rakib et al.

(10) Patent No.: US 7,095,707 B2
(45) Date of Patent: Aug. 22, 2006

(54) APPARATUS AND METHOD FOR TRELLIS ENCODING DATA FOR TRANSMISSION IN DIGITAL DATA TRANSMISSION SYSTEMS

(75) Inventors: Selim Shlomo Rakib, Cupertino, CA (US); Yehuda Azenkot, Cupertino, CA (US)

(73) Assignee: Terayon Communication Systems, Inc., Santa Clara, CA (US)

( * ) Notice: Subject to any disclaimer, the term of this patent is extended or adjusted under 35 U.S.C. 154(b) by 1025 days.

(21) Appl. No.: 09/759,842

(22) Filed: Jan. 12, 2001

(65) Prior Publication Data

US 2002/0015423 A1 Feb. 7, 2002

Related U.S. Application Data

(60) Division of application No. 08/895,612, filed on Jul. 16, 1997, now Pat. No. 6,307,868, which is a continuation-in-part of application No. 08/684,243, filed on Jul. 19, 1996, now Pat. No. 6,356,555, which is a continuation-in-part of application No. 08/588,650, filed on Jan. 19, 1996, now Pat. No. 5,793,759, which is a continuation-in-part of application No. 08/519,630, filed on Aug. 25, 1995, now Pat. No. 5,768,269, which is a continuation-in-part of application No. 08/760,412, filed on Dec. 4, 1996, now Pat. No. 5,991,308.

(51) Int. Cl.
*H04J 9/00* (2006.01)
(52) U.S. Cl. .......................... 370/204; 375/265
(58) Field of Classification Search ............... 370/204, 370/206, 207, 208, 209, 335, 342; 375/215, 375/222, 261, 265, 296
See application file for complete search history.

(56) References Cited

U.S. PATENT DOCUMENTS 4,218,654 A 8/1980 Ogawa et al. ................ 370/97

(Continued)

FOREIGN PATENT DOCUMENTS

EP 0 767 544 A2 4/1997

(Continued)

OTHER PUBLICATIONS

Ungerboeck: "Trellis-Coded Modulation with Redundant Signal Sets. Part II: State of the Art" *IEEE Communications Magazine*, vol. 25, No. 2, Feb. 1987, pp. 12-21.

(Continued)

*Primary Examiner*—Phirin Sam
(74) *Attorney, Agent, or Firm*—Thelen Reid & Priest, LLP

(57) ABSTRACT

A system for bidirectional communication of digital data between a central unit and a remote unit wherein the need for tracking loops in the central unit has been eliminated. The central unit transmitter generates a master carrier and a master clock signal which are used to transmit downstream data to the remote units. The remote units recover the master carrier and master clock and synchronize local oscillators in each remote unit to these master carrier and master clock signals to generate reference carrier and clock signals for use by the remote unit receiver. These reference carrier and clock signals are also used by the remote unit transmitters to transmit upstream data to the central unit. The central unit receiver detects the phase difference between the reference carrier and clock signals from the remote units periodically and adjusts the phase of the master carrier and master clock signals for use by the central unit receiver to receive the upstream data.

13 Claims, 59 Drawing Sheets

PREFERRED TRELLIS ENCODER

U.S. PATENT DOCUMENTS

| | | | |
|---|---|---|---|
| 4,460,992 A | 7/1984 | Gutleber | 370/19 |
| 4,470,138 A | 9/1984 | Gutleber | 370/18 |
| 4,475,208 A | 10/1984 | Ricketts | 375/1 |
| 4,553,161 A | 11/1985 | Citta | 358/86 |
| 4,554,579 A | 11/1985 | Citta | 358/86 |
| 4,635,274 A | 1/1987 | Kubota | 375/1 |
| 4,677,624 A | 6/1987 | Betts et al. | 371/43 |
| 4,688,210 A | 8/1987 | Eizenhofer et al. | 370/335 |
| 4,723,164 A | 2/1988 | Nienaber | 358/148 |
| 4,748,681 A | 5/1988 | Schmidt | 455/33 |
| 4,757,460 A | 7/1988 | Bione et al. | 364/514 |
| 4,773,066 A | 9/1988 | Kirkman | 370/85 |
| 4,811,365 A | 3/1989 | Manno | 375/107 |
| 4,829,569 A | 5/1989 | Seth-Smith et al. | 380/10 |
| 4,894,789 A | 1/1990 | Yee | 364/521 |
| 4,912,721 A | 3/1990 | Pidgeon, Jr. et al. | 375/1 |
| 4,926,130 A | 5/1990 | Weaver | 328/14 |
| 4,933,930 A | 6/1990 | Lien et al. | 370/18 |
| 4,980,897 A * | 12/1990 | Decker et al. | 375/265 |
| 5,072,445 A | 12/1991 | Nawata | 370/104 |
| 5,090,024 A | 2/1992 | Vander Mey et al. | 375/1 |
| 5,093,718 A | 3/1992 | Hoarty et al. | 358/84 |
| 5,130,983 A | 7/1992 | Heffner, III | 370/85.8 |
| 5,133,079 A | 7/1992 | Ballantyne et al. | 455/4.1 |
| 5,157,686 A | 10/1992 | Omura et al. | 375/1 |
| 5,164,958 A | 11/1992 | Omura | 375/1 |
| 5,166,952 A | 11/1992 | Omura et al. | 375/1 |
| 5,193,094 A | 3/1993 | Viterbi | 371/43 |
| 5,195,092 A | 3/1993 | Wilson et al. | 370/94.2 |
| 5,200,993 A | 4/1993 | Wheeler et al. | 379/96 |
| 5,224,122 A | 6/1993 | Bruckert | 375/1 |
| 5,231,664 A | 7/1993 | Bestler et al. | 380/20 |
| 5,233,630 A | 8/1993 | Wolf | 375/67 |
| 5,235,615 A | 8/1993 | Omura | 375/1 |
| 5,235,619 A | 8/1993 | Beyers, II et al. | 375/38 |
| 5,239,557 A | 8/1993 | Dent | 371/1 |
| 5,247,347 A | 9/1993 | Litteral et al. | 358/85 |
| 5,253,268 A | 10/1993 | Omura et al. | 375/1 |
| 5,280,472 A | 1/1994 | Gilhousen et al. | 370/18 |
| 5,295,152 A | 3/1994 | Gudmundson et al. | 375/1 |
| 5,297,162 A | 3/1994 | Lee et al. | 375/1 |
| 5,305,308 A | 4/1994 | English et al. | 370/32.1 |
| 5,309,474 A | 5/1994 | Gilhousen et al. | 375/1 |
| 5,313,454 A | 5/1994 | Bustini et al. | 370/13 |
| 5,319,634 A | 6/1994 | Bartholomew et al. | 370/18 |
| 5,325,394 A | 6/1994 | Bruckert | 375/1 |
| 5,327,455 A | 7/1994 | De Gaudenzi et al. | 375/1 |
| 5,345,439 A | 9/1994 | Marston | 370/18 |
| 5,345,472 A | 9/1994 | Lee | 375/1 |
| 5,347,304 A | 9/1994 | Moura et al. | 348/12 |
| 5,353,300 A | 10/1994 | Lee et al. | 375/1 |
| 5,359,624 A | 10/1994 | Lee et al. | 375/1 |
| 5,363,403 A | 11/1994 | Schilling et al. | 375/1 |
| 5,363,404 A | 11/1994 | Kotzin et al. | 370/352 |
| 5,373,288 A | 12/1994 | Blahut | 340/825.08 |
| 5,373,502 A | 12/1994 | Turban | 370/18 |
| 5,390,166 A | 2/1995 | Rohani et al. | 370/335 |
| 5,394,391 A | 2/1995 | Chen et al. | 370/18 |
| 5,398,258 A | 3/1995 | Su et al. | 375/200 |
| 5,404,570 A | 4/1995 | Charas et al. | 455/22 |
| 5,408,465 A | 4/1995 | Gusella et al. | 370/17 |
| 5,414,699 A | 5/1995 | Lee | 370/18 |
| 5,416,797 A | 5/1995 | Gilhousen et al. | 375/705 |
| 5,418,813 A | 5/1995 | Schaffner et al. | 375/205 |
| 5,425,027 A | 6/1995 | Baran | 370/69.1 |
| 5,440,585 A | 8/1995 | Partridge, III | 375/261 |
| 5,442,625 A | 8/1995 | Gitlin et al. | 370/18 |
| 5,442,627 A | 8/1995 | Viterbi et al. | 370/22 |
| 5,442,662 A | 8/1995 | Fukasawa et al. | 375/205 |
| 5,442,700 A | 8/1995 | Snell et al. | 380/15 |
| 5,448,555 A | 9/1995 | Bremer et al. | 370/20 |
| 5,452,328 A | 9/1995 | Rice | 375/210 |
| 5,463,660 A | 10/1995 | Fukasawa et al. | 375/205 |
| 5,465,273 A * | 11/1995 | Cole | 375/296 |
| 5,467,342 A | 11/1995 | Logston et al. | 370/17 |
| 5,481,533 A | 1/1996 | Honig et al. | 375/206 |
| 5,488,412 A | 1/1996 | Majeti et al. | 348/10 |
| 5,499,236 A | 3/1996 | Giallorenzi et al. | 370/18 |
| 5,511,067 A | 4/1996 | Miller | 370/18 |
| 5,512,935 A | 4/1996 | Majeti et al. | 348/9 |
| 5,533,013 A | 7/1996 | Leppanen | 370/206 |
| 5,534,913 A | 7/1996 | Majeti et al. | 348/7 |
| 5,539,730 A | 7/1996 | Dent | 370/320 |
| 5,550,578 A | 8/1996 | Hoarty et al. | 348/7 |
| 5,557,316 A | 9/1996 | Hoarty et al. | 348/7 |
| 5,572,517 A | 11/1996 | Safadi | 370/50 |
| 5,572,528 A | 11/1996 | Shuen | 370/85.13 |
| 5,583,853 A | 12/1996 | Giallorenzi et al. | 370/441 |
| 5,586,121 A | 12/1996 | Moura et al. | 370/404 |
| 5,594,872 A | 1/1997 | Kawano et al. | 395/200.15 |
| 5,608,446 A | 3/1997 | Carr et al. | 348/6 |
| 5,608,728 A | 3/1997 | Ulm et al. | 370/488 |
| 5,610,911 A | 3/1997 | Ishikawa et al. | 370/503 |
| 5,617,410 A | 4/1997 | Matsumoto | 370/342 |
| 5,619,531 A | 4/1997 | Taylor et al. | 375/222 |
| 5,621,761 A * | 4/1997 | Heegard | 375/265 |
| 5,712,982 A | 1/1998 | Marcel | 395/200.17 |
| RE35,774 E | 4/1998 | Moura et al. | 348/12 |
| 5,737,329 A | 4/1998 | Horiguchi | 370/342 |
| 5,745,484 A | 4/1998 | Scott | 370/347 |
| 5,751,739 A | 5/1998 | Seshadri et al. | 371/43 |
| 5,757,856 A * | 5/1998 | Fang | 375/265 |
| 5,761,198 A | 6/1998 | Kojima | 370/337 |
| 5,774,500 A * | 6/1998 | Zogakis et al. | 375/261 |
| 5,822,359 A | 10/1998 | Bruckert et al. | 375/200 |
| 5,828,655 A | 10/1998 | Moura et al. | 370/236 |
| 5,930,235 A | 7/1999 | Arai | 370/252 |
| 5,953,376 A * | 9/1999 | Wei | 375/265 |

FOREIGN PATENT DOCUMENTS

| | | |
|---|---|---|
| WO | PCT/US95/04329 | 10/1995 |
| WO | PCT/US95/10899 | 3/1996 |

OTHER PUBLICATIONS

Pietrobon et. al. "Rotationally Invariant Nonlinear Trellis Codes for Two-Dimensional Modulation" *IEEE Transactions on Information Theory*, vol. 40, No. 6, Nov. 1994, pp. 1773-1791.

Biglieri et al. "Introduction to Trellis-Coded Modulation with Applications" 1991, MacMillan, New York.

"A Wireless Multimedia Network on a Time Division Duplex CDMA/TDMA", Seki K. et al., *IEICE Transactions on Communications*, vol. E78-B, No. 7, Jul. 1, 1995, pp. 1002-1015.

Westlaw Dialog Search.

R. De Gaudenzi et al., "Performance Evaluation of Quasi-Synchronous Code Division Multiple Access (QS-CDMA) for Satellite Mobile Systems," GLOBECOM '90: IEEE Global Telecommunications Conference, 1800-1804. (Apr. 1990).

R. Lupas et al., "Linear Multiuser Detectors for Synchronous Code Division Multiple Access Channels," IEEE Transactions on Information Theory, vol. 35, Issue 1, pp. 123-136. (Jan. 1989).

* cited by examiner

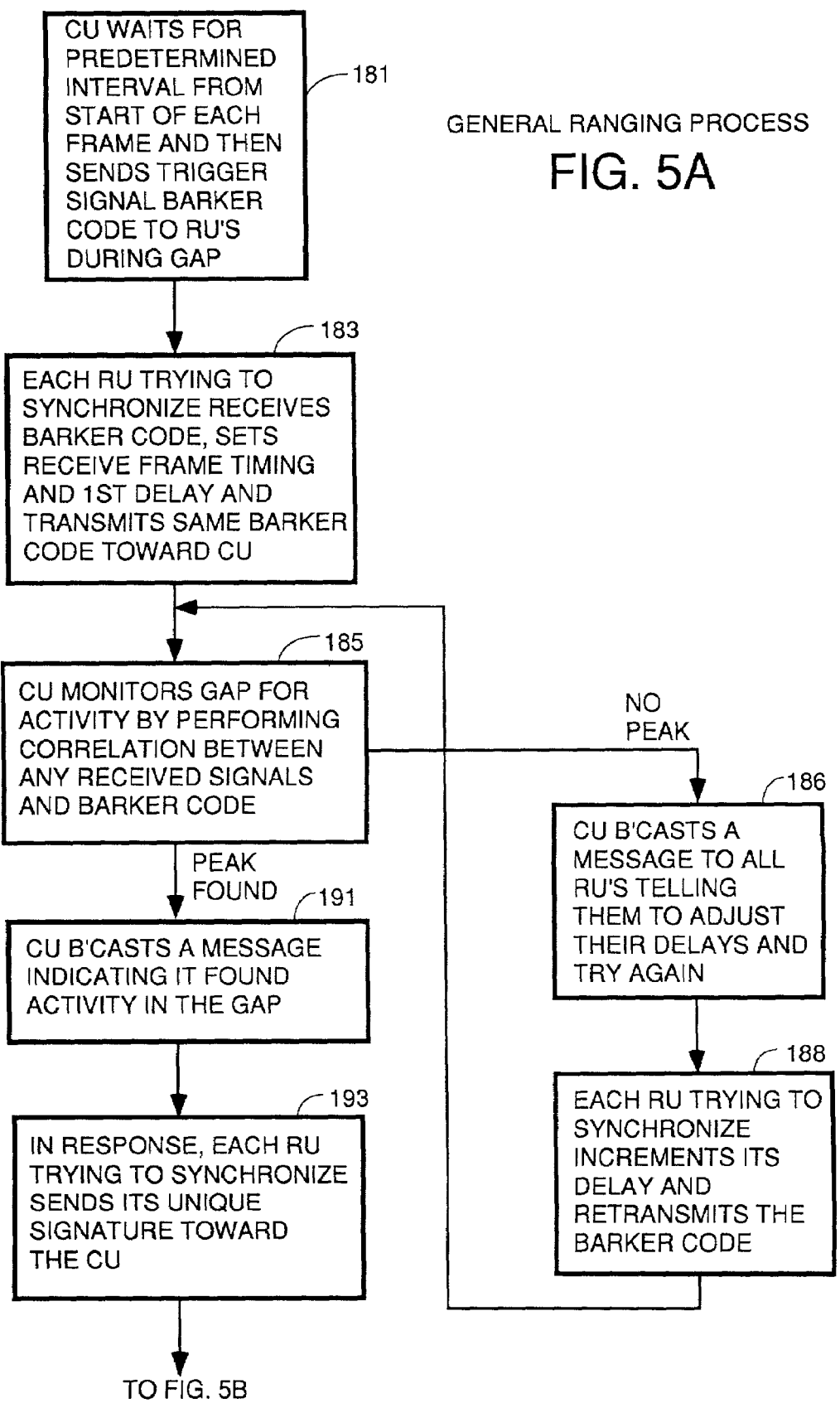

DEAD RECKONING RE-SYNC

PRECURSOR EMBODIMENT

RU MODEM

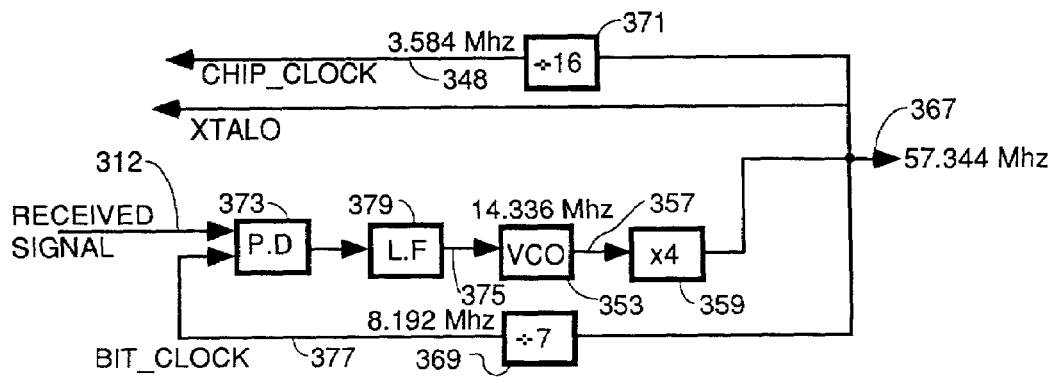
FIG. 11
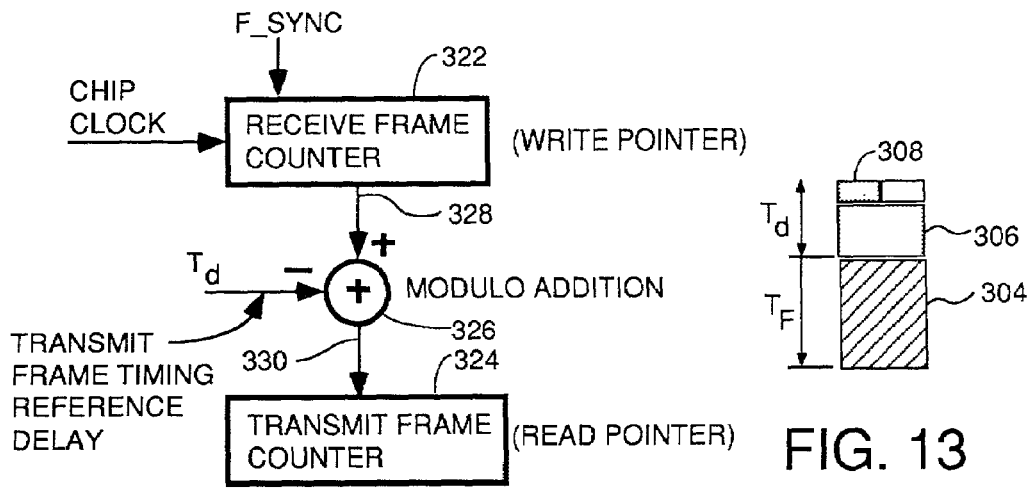
FIG. 12
FIG. 13
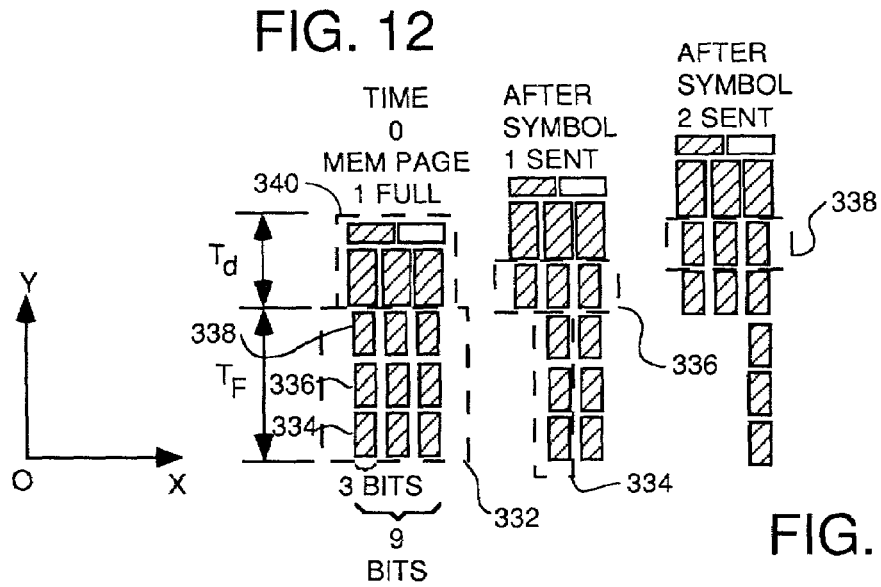
FIG. 14

PREFERRED TRELLIS ENCODER

| 0000 | 111 | 111 | |
|---|---|---|---|
| 0001 | 001 | 111 | = 1 - j |
| 0010 | 001 | 001 | = 1 + j |
| 0011 | 111 | 001 | = -1 + j |
| 0100 | 011 | 111 | = 3 - j |
| 0101 | 001 | 011 | = 1 + 3*j |
| 0110 | 101 | 001 | = -3 + j |
| 0111 | 111 | 101 | = -1 - 3*j |
| 1000 | 011 | 011 | = +3 + 3*j |
| 1001 | 101 | 011 | = -3 + 3*j |
| 1010 | 101 | 101 | = -3 - 3*j |
| 1011 | 011 | 101 | = 3 - 3*j |
| 1100 | 111 | 011 | = -1 + 3*j |
| 1101 | 101 | 111 | = -3 - j |
| 1110 | 001 | 101 | = 1 - 3*j |
| 1111 | 011 | 001 | = 3 + j |

INFORMATION
VECTOR [B]
FOR EACH
SYMBOL

ORTHOGONAL
CODE MATRIX $$483 \rightarrow \begin{bmatrix} 0\ 1\ 1\ 0 \\ 1\ 1\ 1\ 1 \\ 1\ 1\ 0\ 1 \\ 0\ 1\ 0\ 0 \\ \vdots \end{bmatrix} \times \begin{bmatrix} c_{1,1} & c_{1,2} & \cdots & c_{1,144} \\ c_{2,1} & c_{2,2} & \cdots & c_{2,144} \\ \vdots & \vdots & & \vdots \end{bmatrix}$$

REAL
PART OF
INFO
VECTOR
[b] FOR
FIRST
SYMBOL

REAL
PART OF
RESULT
VECTOR $$405 \rightarrow \begin{bmatrix} +3 \\ -1 \\ -1 \\ +3 \end{bmatrix} \cdot \begin{bmatrix} 1\ 1\ 1\ 1 \\ -1\ -1\ 1\ 1 \\ -1\ 1\ -1\ 1 \\ -1\ 1\ 1\ -1 \end{bmatrix} = \begin{bmatrix} 4 \\ 0 \\ 0 \\ -8 \end{bmatrix} \rightarrow 409$$

407

$[b_{REAL}] \times [\text{CODE MATRIX}] = [R_{REAL}] = $ "CHIPS OUT" ARRAY-REAL

FIG. 20B

| MSBs y3 y2 | PHASE difference (2nd-1st symbol) | 1+jQ WHEN LSB=00 | 1+jQ WHEN LSB=01 | 1+jQ WHEN LSB=10 | 1+jQ WHEN LSB=11 |
|---|---|---|---|---|---|
| 00 | 0 | 3-j | 1+j3 | -3+j | -1-j3 |
| 01 | 90 | 1+j3 | -3+j | -1-j3 | 3-j |
| 10 | 180 | -3+j | -1-j3 | 3-j | 1+j3 |
| 11 | -90 | -1-j3 | 3-j | 1+j3 | -3+j |

LSB & MSB FALLBACK MODE MAPPINGS

| LSBs y1 y0 | PHASE | 1+jQ |
|---|---|---|
| 00 | 0 | 3-j |
| 01 | 90 | 1+j3 |
| 10 | 180 | -3+j |
| 11 | -90 | -1-j3 |

MAPPING FOR FALL-BACK MODE - LSB'S

CU MODEM

FIG. 31 CU RECEIVER

FIG. 32 CU TRANSMITTER

FRAME DETECTOR/ RANGING DETECTOR

FINE TUNING TO
CENTER BARKER CODE

RU RANGING

CU RANGING AND CONTENTION RESOLUTION

STATE MACHINE

SIMPLE CU SPREAD SPECTRUM RECEIVER

SIMPLE RU SPREAD SPECTRUM TRANSMITTER

SYNCHRONOUS TDMA SYSTEM

| OFFSET | 1B ASIC | | 2A ASIC | |
|---|---|---|---|---|
| (CHIPS) | RGSRH | RGSRL | RGSRH | RGSRL |
| 0 | 0x0000 | 0x8000 | 0x0001 | 0x0000 |
| 1/2 | 0x0000 | 0xC000 | 0x0001 | 0x8000 |
| 1 | 0x0000 | 0x4000 | 0x0000 | 0x8000 |
| -1 | 0x0001 | 0x0000 | 0x0002 | 0x0000 |

TRAINING ALGORITHM

SE FUNCTION

2-STEP INITIAL EQUALIZATION TRAINING

ROTATIONAL AMPLIFIER CORRECTION

TOTAL TURN AROUND (TTA) IN FRAMES = OFFSET

CONTROL MESSAGE (DOWNSTREAM) AND FUNCTION (UPSTREAM)
PROPAGATION IN A 3 FRAMES TTA CHANNEL

OVERALL VIEW OF THE CU SENSING WINDOWS IN A "BOUNDLESS RANGING" ALGORITHM

| CHIP\FR | 1 | 2 | 3 | 4 | 5 | 6 | 7 | | 33 |
|---|---|---|---|---|---|---|---|---|---|
| 1 | 0 | 0 | 1 | 0 | 0 | 1 | 1 | ... | 0 |
| 2 | 1 | 0 | 0 | 1 | 1 | 1 | 1 | ... | |
| 3 | 0 | 0 | 0 | 1 | 1 | 1 | | | |
| 4 | 0 | 0 | 0 | 1 | 0 | 0 | 0 | ... | 0 |
| 5 | 0 | 1 | 0 | 0 | 1 | | | | |
| 6 | 0 | 0 | 1 | 1 | 1 | | | | |
| 7 | 0 | 0 | 0 | 1 | 1 | | | | |
| 8 | 0 | 0 | 0 | 0 | 1 | 0 | 0 | ... | |

FIG. 72

APPARATUS AND METHOD FOR TRELLIS ENCODING DATA FOR TRANSMISSION IN DIGITAL DATA TRANSMISSION SYSTEMS

This is a DIVISION of application Ser. No. 08/895,612, filed Jul. 16, 1997, now U.S. Pat. No. 6,307,868, which is a continuation-in-part application of U.S. patent application Ser. No. 08/684,243, filed Jul. 19, 1996 now U.S. Pat. No. 6,356,555, invented by Shlomo Rakib and Yehuda Azenkot which was a continuation-in-part application of U.S. patent application Ser. No. 08/588,650, filed Jan. 19, 1996 now U.S. Pat. No. 5,793,759, invented by Shlomo Rakib and Yehuda Azenkot, which was a continuation-in-part application of U.S. patent application Ser. No. 08/519,630, filed Aug. 25, 1995, invented by Shlomo Rakib and Yehuda Azenkot, now U.S. Pat. No. 5,768,269, issued Jun. 16, 1998, the contents of all of which are hereby incorporated by reference. This application is also a continuation-in-part application of a U.S. patent application entitled LOWER OVERHEAD METHOD FOR DATA TRANSMISSION USING ATM AND SCDMA OVER HYBRID FIBER COAX CABLE PLANT, Ser. No. 08/760,412, filed Dec. 4, 1996 now U.S. Pat. No. 5,991,308, invented by Amir Fuhrmann, Shlomo Rakib and Yehuda Azenkot, now co-pending, the entirety of which is hereby incorporated by reference.

BACKGROUND OF THE INVENTION

The invention pertains to the field of bidirectional passband digital communication systems, and, more particularly to the field of improvements in head end or central office modems to remove the phase locked loops therefrom.

Digital data communication systems are well known in the art. Many treatises are available that describe them. Among these treatises are: Dixon, "*Spread Spectrum Systems with Commercial Applications*", Third Edition, 1994 (Wiley & Sons, New York) ISBN 0 471 59342-7; Stallings "*Data and Computer Communications*", 4th Ed. 1994 (Macmillan Publishing Co., New York) ISBN0-02-415441-5; Lee and Messerschmit, "*Digital Communication*, 2d Ed." 1994 (Kluwer Academic Publishers, Boston), ISBN 0 7923 9391 0; Haykin, "*Communication Systems*" Third Edition 1994 (Wiley & Sons) ISBN 0 471 57176-8; Elliott, *Handbook of Digital Signal Processing: Engineering Applications*, (Academic Press, Inc. San Diego, 1987), ISBN 0-12-237075-9, all of which are hereby incorporated by reference. Generally, the problem which the invention is an attempt to solve is how to get rid of as many continuous tracking loops as possible in a bidirectional digital data communication system. The reasoning for this can be understood from the following discussion.

Digital data distributed communication systems can be baseband systems or passband systems. In baseband systems, the transmission media has the capability of transmitting digital pulses between widely separated transmitter and receiver locations. Passband systems require that the digital data be modulated onto a carrier frequency for transmission over the media.

Receivers for digital data passband systems can be either coherent or noncoherent. In coherent systems, the receiver has a local oscillator, usually taking the form of a phase locked loop (PLL) which is part of a continuous tracking loop and is maintained in constant phase lock with the phase and frequency of the carrier on which the received data is modulated. Coherent systems can make use of modulation schemes which alter either the phase, frequency or amplitude or any combination thereof of the carrier in accordance with the information content of the digital data to be transmitted. Incoherent systems do not have the local oscillator at the receiver phase locked to the carrier phase and frequency. In these systems, the designers have chosen to ignore the phase of the received signal at the expense of some degradation of the system performance and throughput.

Coherent systems can utilize binary or M-ary amplitude shift keying (ASK), phase shift keying (PSK) or frequency shift keying (FSK), as well as M-ary amplitude phase keying (APK) of which QAM (quadrature amplitude modulation) is a special case. Incoherent systems are limited to binary or M-ary ASK, FSK or differential phase shift keying (DPSK).

Coherent systems are higher performance systems because they have an additional degree of freedom for use in the modulation scheme which means more complex constellations of symbol sets can be used and more data bits can be encoded in each symbol in the constellation. This translates to greater throughput.

However, coherent systems are more complex since they require additional tracking loop circuitry at the receiver to recover the transmitted carrier and use the information so derived to steer the local oscillator so as to maintain its phase and frequency locked to the phase and frequency of the carrier. Usually the local oscillator being steered in the receiver is a PLL or has a voltage controlled oscillator negative feedback system in it (which is at the heart of almost every tracking loop). Carrier synchronization has been achieved by any one of a number of different ways in the prior art including use of PLLs where the carrier is not suppressed or Mth power tracking loops or Costas tracking Loops where the carrier is suppressed. Mth power and Costas tracking loops also contain voltage controlled oscillators as part of the tracking loop. The problem is that PLLs and negative feedback voltage controlled oscillators in tracking loops can and often do lose lock especially where there is rapid change in phase or frequency caused by conditions in the transmission media. When a PLL or other tracking loop loses lock, the system goes out of synchronization and fails to communicate data—its sole purpose in life.

All digital data communication also requires clock synchronization in the receiver to the clock in the transmitter because data is sent during discrete times. These discrete times are variously called chip times, bit times or symbol times in the prior art references. The importance of synchronization of the clock in the receiver to the clock in the transmitter is that in all forms of modulation, the amplitude, phase or frequency of the carrier (or some combination of these) must be sampled during each chip time so as to determine which symbol in the alphabet or code set in use was transmitted during that chip time based upon the phase, amplitude or frequency characteristics of the carrier during that chip time.

Receiver clock synchronization can be done on either a long term basis or a short term basis. Short term clock synchronization is called, amazingly enough, asynchronous transmission, but in fact the receiver clock is periodically synchronized to the transmitter clock at the beginning of transmission of each "character". A character is a collection of 5 to 8 symbols which are transmitted over a very short time (usually the symbols or binary bits that only have two states). The receiver clock resynchronizes during each character at the beginning thereof and need not resynchronize until the next character starts. Asynchronous transmission is cheap and less complex since timing synchronization problems caused by transmission of long uninterrupted streams of bits is avoided by sending the bits one character at a time and requiring synchronization between the receiver clock and transmitter clock only during that character.

The problem with asynchronous transmission is the high overhead. Each character of 5 to 8 bits must include a start bit, 1 or 2 stop bits and a parity bit. The start bit is used by the receiver to resynchronize its clock. The overhead of 2–3 bits per character of 5–8 bits makes asynchronous transmission inefficient to transmit large volumes of data. Asynchronous transmission can be extended to sending several characters grouped together with a preamble which is long enough for the receiver to synchronize to transmitted before every group of characters and a tracking loop to maintain the receiver clock in synchronization with the transmitter clock during the transmission of the group of characters. The concepts of the invention are applicable to asynchronous transmission where there is a tracking loop in the remote unit receiver but no tracking loop in the central unit receiver and only a periodic or occasional phase adjustment of the master clock and master carrier phase for use by the central unit receiver.

Synchronous transmission is a more efficient way of transmitting data since blocks of symbols or bits can be transmitted without start and stop codes. Sampling by the receiver during the middle of each bit or chip time is accomplished by keeping the receiver clock in synchronization with the transmitter clock. This maintenance of clock synchronization has been done in the prior art in many different ways. For example, a separate clock line can connect the transmitter and receiver, but this is impractical in many situations. A way of avoiding this is to embed the clock information in the data signal transmitted from the transmitter and recover the clock in the receiver.

Clock recovery has been done in a number of different ways in the prior art including transmitting the clock along with the data bearing signal in multiplexed form and using appropriate filtering of the modulated waveform to extract the clock. Another method is to use a noncoherent detector to first extract the clock and then processing the noncoherent detector output to recover the carrier. Where clock recovery follows carrier recovery, the clock is recovered from demodulated baseband signals. The early-late gate symbol synchronizer has also been used in the prior art to synchronize the receiver clock to the transmitter clock. This type clock recovery takes advantage of the fact that a matched filter output of a filter matched to a rectangular clock pulse is a triangular waveform which can be sampled early before the peak and late after the peak. By changing the timing of the sampling until the early and late samples have equal amplitude, the peak of the matched filter output signal can be found, and this will have a fixed phase relationship to the clock phase. This information is then used to steer a voltage controlled oscillator in a negative feedback system. Again, complicated circuitry centered around a voltage controlled oscillator is needed to recover the clock.

A technique called remote loopback or remote clock has been used in the prior art on, for example T1 type digital data communication phone lines. This technique is similar to the aspect of the invention involving having the remote unit local clock synchronized to the central unit master clock and using that local clock at the remote unit receiver for the remote unit transmitter. It is also similar to the aspect of the invention of using the central unit master clock, after adjustment in phase to synchronize it to the phase of the received clock from the remote unit transmitter, as the clock signal from the central unit receiver.

Since PLLs and tracking loops are not always reliable, and add complication and expense to receivers, it is desirable to be able to get rid of them wherever possible. Thus, a need has arisen for a bidirectional digital communication system where continuous tracking loops in the central unit receiver (or the receiver in the unit having the transmitter which transmits with the master clock and master carrier signals) have been eliminated.

SUMMARY OF THE INVENTION

A bidirectional digital data communication system according to the teachings of the invention will have: a central unit transmitter with any encoder to receive downstream data, encode it and drive any type of digital passband modulator with the encoder receiving a master clock signal from a master clock oscillator and the modulator receiving a master carrier oscillator; a remote unit receiver which has any compatible detector which receives a local carrier reference signal which is synchronized in frequency and phase to the master carrier signal and which is generated by any form of carrier recovery circuit, with the detector driving a decoder to decode the received data and output it, with the decoder receiving a local clock signal which has been synchronized with the transmitter master clock signal by any clock recovery circuit; a remote unit transmitter having any encoder type for receiving upstream data, encoding it and driving any digital passband modulator, the encoder receiving the local clock reference generated by the remote unit receiver clock recovery circuit and the modulator receiving the local carrier reference signal generated by the remote unit carrier recovery circuit; and a central unit receiver with any compatible coherent detector to detect the signal transmitted from the remote unit transmitter, with the central unit detector using the central unit master carrier from the master carrier oscillator in the transmitter but adjusted in phase to account for propagation delay from the remote unit, and with the decoder using the master clock signal from the central unit transmitter master clock oscillator but adjusted in phase for the propagation delay from the remote unit to the central unit. Thus, the central unit has no phase locked loops or other voltage controlled oscillator circuits for clock recovery or carrier recovery.

In the preferred embodiment, the master carrier and master clock are recovered in the RUs and used to transmit data upstream along with preamble data preceding payload data. The preamble data from each RU is used by the central unit transceiver to generate an amplitude and phase correction factor for that RU. The signals from that RU are then demodulated using the CU master carrier and demultiplexed and detected using the CU master clock. Phase and amplitude errors in the detection process caused by latency and channel impairments are eliminated or reduced by using the phase and amplitude correction factors developed for this RU from its preamble data. Thus, there is no need for continuous tracking loops in the CU receiver to recover the clock and carrier used by each RU to transmit its data. This single master carrier and master clock concept and the frame synchronization provided by ranging, and the improved throughput and lower error rates provided by the equalization and power alignment processes taught herein are useful in any form of bidirectional digital data distributed communication system regardless of the form of encoding, multiplexing or modulation used. Examples of the types of multiplexing that can be used in such systems are CDMA, TDMA, inverse Fourier, DMT or any other system where orthogonal signals are used to encode each separate channel of data from a source such as sine and cosine signals etc.

In the broadest embodiment of the invention involving no continuous tracking loops in the CU receiver to recover RU clock and carrier, the type of central unit transmitter and modulation scheme is not important nor is it important whether the central unit transmits a single channel of digital data downstream or multiplexes several channels. If the central unit transmitter is a multiplexing transmitter, the type of multiplexing is not important. Likewise, the type of detector used in the remote unit receiver is not important as long as it is compatible with the modulation scheme in use and it is not critical whether the central unit transmitter transmits the master carrier or suppresses it or transmits the master clock separate or embeds it in the data so long as the master clock and carrier phase information get transmitted somehow to the RUs such as embedded in the Barker code of the preferred embodiment. Likewise, the type of carrier recovery and clock recovery circuits used in the remote unit to synchronize the local clock and local carrier oscillators to the master clock and master carrier are not critical. Also, the type of decoder used in the remote unit receiver is not critical so long as it is compatible with the type of encoder used at the central unit transmitter. For the remote unit transmitter, any type of encoder and any type of modulator may be used for the upstream data, and the type of encoding and the type of multiplexing, if any, used for the upstream direction need not be the same as the downstream direction. The clock and carrier signals used by the remote unit transmitter are the same clock and carrier signals used by the remote unit receiver.

The central unit receiver can use any type of detector that is compatible with the modulation scheme used by the remote unit transmitter. Likewise, the type of decoder used in the central unit receiver is not critical so long as it is compatible with the remote unit transmitter encoder. The structure and operation of the central unit receiver phase detection and adjustment circuit is not critical to the invention. The only requirement on this circuit is that it be able to occasionally or periodically detect any phase differential between the central unit master carrier and the carrier used to transmit by the remote unit transmitter and detect any phase difference between the central unit master clock and the clock information used to transmit the received data. These phase differences are used by the central unit receiver to occasionally or periodically adjust the phase of the master clock and master carrier to match the phases of the carrier and clock signals used by the remote unit transmitter as received at the central unit receiver.

The invention is applicable to both asynchronous and synchronous methods of transmission, although synchronous transmission is much more efficient in terms of overhead consumed per unit of payload data delivered. Use of the invention in asynchronous transmission will be useful in asynchronous systems where tracking loops are used to maintain synchronization of the remote unit receiver local clock during transmission of one or more characters in a group.

In the preferred embodiment, the transmitters of the RU use synchronous code division multiplexing (SCDMA). SCDMA is defined as transmission of frames of spread spectrum signals with data from different channels spread using orthogonal pseudorandom spreading codes, said frames being synchronously transmitted from different RUs located at diverse locations such that all frames of corresponding frame number from all RUs arrive at the CU modem with their frame boundaries exactly aligned in time with the frame boundaries of the CU frame of the same frame number. The upstream data is then demultiplexed and decoding by the inverse code transformation that was used in the RU transmitter to spread the spectrum of the data using the orthogonal, pseudorandom spreading codes.

According to the most preferred embodiment, there is provided a code division multiplexing multiple access (CDMA) scheme using orthogonal codes to encode multiple channels of digital data for simultaneous transmission over a cable television media which is also carrying frequency division multiplexed cable television programming. Further, in this most preferred embodiment, alignment of multiple subscriber remote units at diverse locations on the cable television media to the same frame alignment reference is used to substantially reduce crosstalk between adjacent codes and allow multiple users to simultaneously share the same cable TV media for auxiliary services other than cable TV programming delivery. The ranging process described herein is useful for any digital communication system which delivers data from physically distributed transmitters to a central location in frames, but in the context of a CDMA system on a cable TV plant, it provides for synchronous CDMA which greatly increases system payload capacity. The use of synchronous CDMA coupled with frequency division multiplexing of upstream and downstream data on different frequencies than the cable TV programming provides a system whereby the entire bandwidth devoted to the digital auxiliary services may be simultaneously shared by multiple users who share a plurality of channels. Any of the known ways of achieving frame alignment may be used to achieve synchronous code division multiple access data transmission. In the preferred embodiment, frame alignment is achieved with the bulk of the processing done by the RUs with the CU only acting in a passive role as a sensor for deciding if a Barker code is in the gap, if there is more than one Barker code in the gap, asking for authentication and providing feedback for all of the above and for fine tuning processing to exactly center each RU's Barker code in the gap. This ranging process is done by alignment of ranging signals transmitted by remote units to guardbands or gaps between frames.

One inventive concept disclosed herein is to achieve high noise immunity by spreading the energy of the transmitted data out over time during transmission, and then compressing the energy again at the receiver to recover the data. Spreading the energy of the transmitted data out over time reduces susceptibility to burst errors and impulse noise. In addition to this spreading concept, the spectral efficiency of the system is enhanced by transmitting multiple separate channels of data over the same media without interference by using separate orthogonal codes to encode the data of each channel so that no interference results when all channels are simultaneously transmitted so long as proper frame alignment is maintained. In this way, the spectral efficiency, i.e., a measure of the amount of data that can be sent from one place to another over a given bandwidth, is enhanced without degradation of the data by crosstalk interference. The orthogonality of the codes used for each data stream, i.e., each channel or conversation, minimizes crosstalk between channels where the system is properly aligned, i.e., synchronized.

Using cyclic, orthogonal codes for SCDMA further enhances noise abatement by providing the ability to perform equalization using a subset of these codes. Equalization, as that term is used herein, refers to the process of determining the amount of crosstalk between adjacent codes resulting from minor errors of frame timing alignment and then generating phase and amplitude correction factors which can be used to negate the crosstalk. In the preferred embodiment, the orthogonal codes are cyclic codes.

In some species within the genus of the invention, code diversity is used to achieve further noise immunity. It has been found that some orthogonal codes are less immune to narrow band interference and other sources of noise than others. To avoid using such codes to spread the data from the same channel or timeslot all the time, code hopping is used in these preferred species of the inventive genus. Code diversity is achieved in several different ways, but, in the preferred embodiment, each transmitter uses a code shuffler circuit and each receiver uses a code deshuffler circuit. All shuffler and deshuffler circuits receive the same seed and generate the same sequence of pseudorandom numbers therefrom. These pseudorandom numbers are used to generate read pointers to a framer memory and write pointers to a buffer memory. The framer memory is where the information vectors or symbols are stored, and the read pointers generated by the shuffler circuits are used to read the timeslot data, i.e., symbol/information vector elements out in pseudorandom fashion and store them in a buffer in accordance with the write pointers generated by the code hopping shuffler circuit. The information vector elements thus stored in the buffer are used to do the matrix multiplication required by the code division multiplexing scheme. Alternatively, the symbol elements may be read out sequentially from the framer memory and stored pseudorandomly in the buffer.

The effect of this synchronous CDMA scheme is to "whiten" the noise sources such that no matter how complex the noise signals, the noise can be effectively managed using conventional error detection and correction bits in a forward error correction scheme. The digital data providing the interactive or bidirectional data communication is sent using a CDMA scheme, but for purposes of synchronization, the CDMA scheme is mixed with a TDMA scheme. More precisely, a guardband or gap which is free of data is added between frames of the CDMA signal. Digital data is transmitted in frames, each frame comprising 3 data symbols and a guardband. The guardband is used for non-data usage such as ranging, alignment and equalization.

The synchronous CDMA modulation scheme disclosed herein may be used with any shared transmission media and with any apparatus or method that can get all remote units synchronized to the frame timing of the central unit including the ranging/alignment scheme disclosed herein. Other possible methods of synchronizing to the same frame timing are for all remote units and the central unit to receive the same timing reference signals from some source such as internal atomic clocks or from an external source such as a Global Positioning System satellite from which all remote units and the central unit are effectively equidistant.

Likewise, the ranging/alignment scheme disclosed herein is useful for any other modulation scheme which transmits digital data in frames, requires frame synchronization and can insert a guardband between the frames.

Some species within the inventive genus use M-ary modulation code division multiplexing. Each remote unit receives a time division multiplexed stream of digital data. Each timeslot contains 9 bits of data. Each 9 bits is stored in a framer memory, and is divided into three tribits, each having 3 bits during readout of the memory. Each of the three symbols transmitted each frame is comprised of 144 of these tribits, one for each timeslot or channel. These tribits are encoded with a 4th bit prior to spreading by the code division multiplexing operation. The 4th bit is added by a Trellis forward error correction encoder to each tribit based upon the three bits of the tribit and based upon the previous state for this timeslot's data during the last frame. This 4th bit adds sufficient redundancy to enable a Viterbi Decoder in the central unit receiver to make a more error free determination of what data was actually sent in the presence of noise without requesting retransmission. The 4th bit also maps each tribit to a 16 point QAM (quadrature amplitude modulation) constellation by using the first two bits to represent the inphase or I axis amplitude and the last two bits to represent the quadrature or Q axis amplitude. Thus, M-ary modulation is used to achieve greater spectral efficiency.

With the system described herein, full 10 megabit/second traffic volume per each 6 MHz channel can be achieved in both the upstream and downstream direction over HFC. Unlike conventional CDMA, SCDMA transmission from transmitters like those disclosed herein stays within 6 MHz bands that do not interfere with or effect other adjacent channels. SCDMA has a number of other advantages over pure FDMA and TDMA systems in terms of capacity, scalability and bandwidth allocation. Standard IS-95 asynchronous Code Division Multiple Access spread spectrum systems are hindered by the capacity constraints of the 5–40 MHz upstream channel and the presence of a large amount of noise, and they often require 30 MHz wide channels which creates channel interference problems with neighboring services in the HFC spectrum. The biggest problem with asynchronous CDMA systems is self-generated noise because the RUs are not aligned with each other thereby losing orthogonality and creating a high degree of mutual interference. The higher self-generated noise raises the noise floor and reduces the capacity. SCDMA system insure that the RUs are in frame synchronization with each other and using orthogonal codes to minimize mutual interference as data is sent upstream. Preferably, SCDMA transmitters are also used to send data downstream. With the system described herein, multiple streams of digital data, each having a 64 kbps throughput can be simultaneously sent over a 6 MHz channel with a total 10 Mbps throughput. Each data stream is Trellis encoded, interleaved and spread over the entire 6 MHz using its own individual spreading code. Use of forward error correction and interleaving increases noise immunity to impulse noise, narrowband interference and Gaussian noise. The Trellis coding adds 4.8 dB coding gain, and interleaving enables withstanding long duration impulse noise of up to 100 microseconds without incurring errors. Use of spread spectrum technology adds another 22 dB processing gain. The combination of techniques yield a total 27 dB interference rejection allowing the system to operate in negative Carrier to Noise Plus Interference Ratio. The SCDMA transmitters are combined with TDMA payload data input streams which makes the system extremely scalable.

The high capacity of the SCDMA system disclosed herein is made possible by orthogonality which is made possible by the orthogonality of the spreading codes which is a result of the ranging process and the equalization process. The ranging process assures frame synchronization such that all codes arrive from distributed RUs arrive at the CU at the same time. The ranging process is carried out periodically to account for cable expansion/contraction with changing temperature, but the process is transparent to payload traffic in that it does not slow it down, stop it or cause errors. Re-ranging occurs upon certain error conditions and upon disconnect from the network and each powerup.

Equalization is achieved by measuring the channel response from each user to the CU and adjusting a precoder at the RU transmitter to "invert the channel", i.e., predistort the transmitted signal such that it arrives undistorted at the CU. Power alignment by each RU such that each RU transmission reaches the CU at approximately the same power level also helps to minimize mutual interference.

Dynamic bandwidth allocation allows as many 64 kbps streams or channels as necessary to be allocated to a particular service so that high demand applications such as video teleconferencing or high speed internet access can be supported simultaneously with low demand applications like telephony over the same HFC link. Bandwidth allocation is managed at the CU through an activity status table in each RU and the CU that indicates the status of each timeslot and code assignments. The CU updates the RU tables by downstream messages. Bandwidth can be guaranteed upon request while other services with more bursty traffic may contend for the remainder of the total 10 Mbps payload.

The advantages over TDMA systems include less need for fast acquisition and correspondingly lower sensitivity to narrowband interference. Further, below a certain SNR, TDMA systems may fail altogether. Contention for certain channels and contention affecting adjacent can cause amplifier overload in TDMA systems and can cause severe throughput and performance problems. FDMA systems where each user gets a narrow upstream frequency slice is very susceptible to narrowband noise which can wipe out an entire channel. FDMA systems often try to avoid this problem with frequency reallocation. This complicates and raises the cost of the system by requiring more intelligence. Throughput is also adversely affected as nothing is sent while frequencies are reallocated. Guardbands between channels waste bandwidth, and frequency misalignment degrades FDMA systems.

Any method or apparatus that uses these inventive concepts is within the teachings of the invention and is deemed to be equivalent to the apparatus and methods described herein.

BRIEF DESCRIPTION OF THE DRAWINGS

FIGS. 5A through 5C are a flow chart of a general ranging process according to one embodiment.

FIG. 11 is a block diagram of a timebase PLL circuit for use in generating the master clock in the CU or recovering the master clock from a clock steering signal from the frame detector in the RU.

FIG. 12 is a diagram of the timing offset relationship between the receiver frame counter and the transmit frame counter in the RUs for purposes of achieving frame synchronization.

FIG. 13 is a diagram of how the transmit frame timing delay translates to the state of fill of memory in the framer circuit.

FIG. 14 is a diagram illustrating the interleaving of data in the framer circuit and how the framer circuit is emptied for transmission.

FIG. 20A is a diagram illustrating the matrix multiplication of the information vector for each symbol by the orthogonal code matrix to achieve code division multiplexing.

FIG. 20B illustrates the matrix multiplication of the real part of the information vector by the code matrix to generate the real part of the result vector which is sent to the modulator.

FIG. 72 is a table showing 8 valid IDs arranged on the 8 chips of an 8 chip listening window of 33 consecutive frames, and showing no contentions.

DETAILED DESCRIPTION OF THE PREFERRED AND ALTERNATIVE EMBODIMENTS

Figure 1:
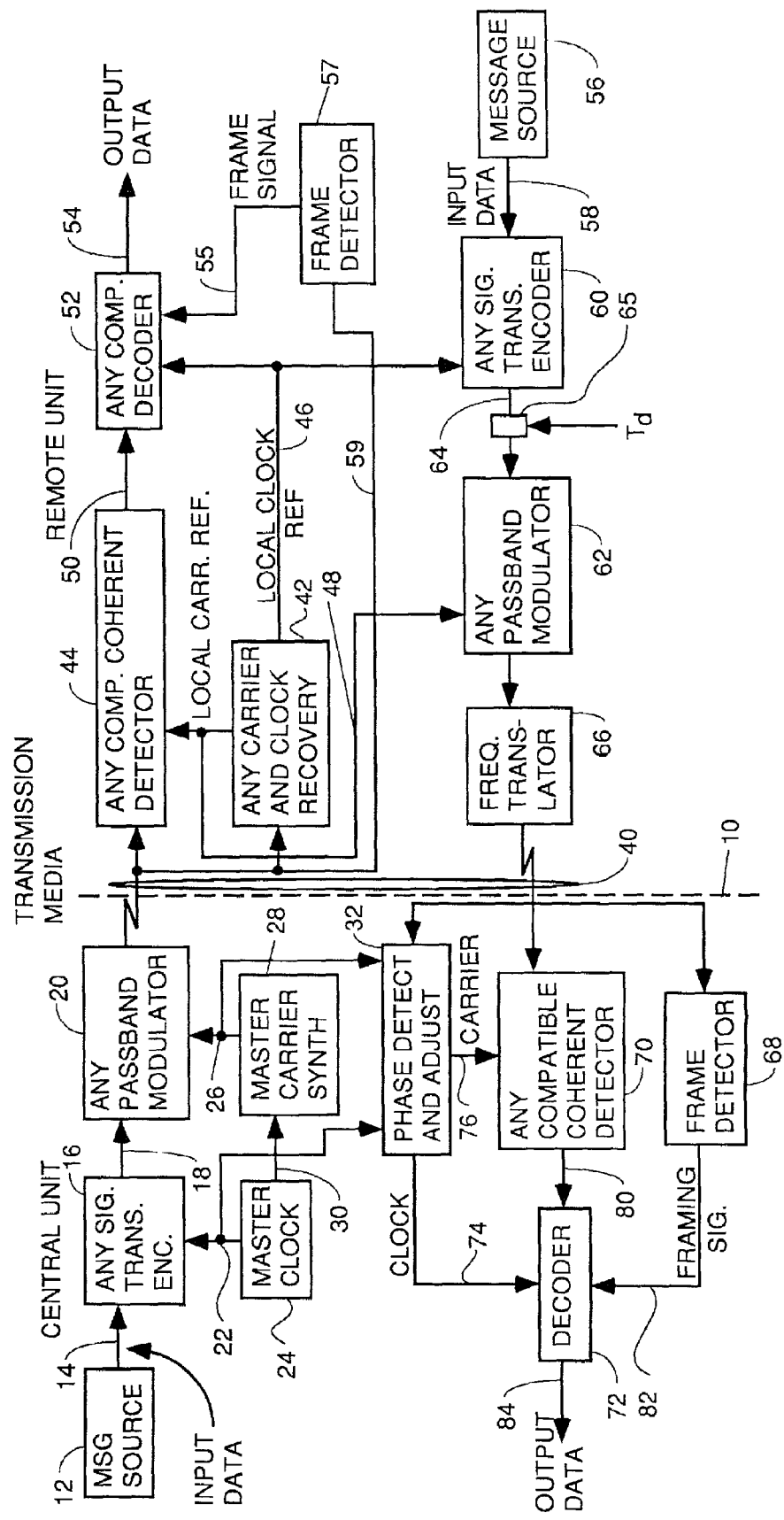
FIG. 1 is a block diagram of a bidirectional communication system according to the broadest teachings of the invention.

Referring to FIG. 1, there is shown a block diagram of a bidirectional, digital, passband communication system employing the teachings of the invention. The circuits to the left of dotted line 10 represent the central unit modem or transceiver, while circuits to the right of dotted line 10 represent the remote unit modem or transceiver. A message source 12 provides a downstream message signal on line 14 which may be either digital or analog. This signal is received and encoded by an encoder 16 which may be any type of encoder/multiplexer known in the prior art or later developed. The encoder 16 receives a master clock signal on bus 22 from master clock oscillator 24. The master clock signal on line 22 will be the clock signal to which the entire system synchronizes. The master clock signal defines the bit times or chip times during which a single bit or symbol comprised of multiple bits are used by modulator 20 to modulate the phase, amplitude or frequency of the master carrier signal which the modulator receives on line 26 from a master carrier synthesizer 28. The function of the encoder, among other things, is to assemble bits from the message source 12 into the groups which define each symbol which is to be transmitted during each chip time defined by the master clock (where a symbol could be a single binary bit), to assemble the chips into frames and to generate the framing signal which marks the frame boundaries. If a multiplexed system exists, the encoder 16 assembles the data to be transmitted on each virtual channel and prepares the data for multiplexing. In the case of code division multiple access or time division multiple access systems, the encoder 16 does the actual multiplexing of data from different sources onto different codes or into different timeslots on bus 18 and generates the frame boundary markers. If a frequency division multiplexed system is in use, the encoder 16 assembles the different data streams to be transmitted on the different frequencies and outputs them on separate buses represented by line 18 to the modulator 20 and generates frame boundary markers. The modulator 20 receives multiple carriers, all phase coherent with the master carrier from the master carrier synthesizer 28, and modulates each data stream onto its own dedicated carrier.

If the signal on line 14 from the message source 12 is analog, one of the functions of the encoder 16 is to sample and digitize it prior to assembly of the digital data into symbols or chips to be transmitted during each chip or bit time.

If message source 12, is digital, it emits one symbol every T seconds with the symbols belonging to an alphabet of M symbols comprised of symbols $m_1$, $m_2$ .... In binary systems, there are only two symbols, logic 1 and logic 0. In larger alphabets, each symbol may be represented by multiple bits so the output on line 14 is M-ary meaning there are M possible symbols in the alphabet, each of which can be made up of multiple bits. Generally, encoder 16 serves to produce a signal vector S made up of N elements with one such set for each of the M symbols in the source alphabet.

The signal vector S is passed on bus 18 to a passband modulator 20. The details of construction and operation of the modulator 20, like the details of the construction and operation of the encoder 16 are not critical to the invention, and they can be anything known in the prior art or later developed. The function of the passband modulator 20 is to construct a distinct signal $s_i(t)$ of duration T for each symbol $m_i$ by modulating the master carrier signal during each time T using the bits of the symbol to guide the process of altering the phase, frequency or amplitude or some combination thereof in accordance with the selected modulation scheme.

Typically, the master clock oscillator 24 is a temperature compensated, crystal controlled oscillator and the clock signal thereof is fed to a master carrier frequency synthesizer 28, as symbolized by line 30, for use in synthesis of the master carrier signal. In alternative embodiments, the master carrier synthesizer can be a stand alone crystal controlled oscillator. In other alternative embodiments, the master clock signal need not be generated in the central unit transmitter, and, instead, the master clock signal is received from an external source such as the message source 12. Likewise, the master carrier can be received from an external source. In still other alternative embodiments, the master clock and master carrier synthesizer need not be crystal controlled and may even vary in frequency so long as they vary slowly enough that the tracking loops in the remote unit receiver can stay in lock. If variable sources for clock and carrier are used, the periodicity of resynchronization process carried out by a phase detect and adjust circuit 32 in the central unit receiver should be made to have a smaller period so resynchronization is done more frequently. More detail on the function of circuit 32 will be given later.

After modulation, the signal is transmitted on transmission media 40 to the remote unit or units. Transmission media can be a hybrid fiber coax cable plant, a cellular phone system, a landline telephone network or a local area or wide area network medium connecting computers and peripherals together. Transmission from the central unit to the remote units will be referred to as the downstream direction, while transmission from the remote units to the central unit will be referred to as the upstream direction. The carriers used for upstream and downstream transmission are usually in the RF range of frequencies and are separated in frequency although alternatives discussed below to separate upstream and downstream data may also be used.

The downstream RF signal is received by both a coherent detector 44 and a carrier and clock recovery circuit 42. Carrier and clock recovery circuit 42 is typically a phase locked loop or other type tracking loop. The functions of circuit 42 are: to generate a local clock signal and a local carrier signal internally, usually employing voltage controlled oscillators; detect the phase difference between the received master clock signal and the local clock signal and lock the local clock signal in phase and frequency with the received master clock signal and output the phase and frequency locked local clock signal on line 46; and detect the phase difference between the received master carrier signal and the local carrier signal and lock the phase and frequency of the local carrier signal to the phase and frequency of the received master carrier signal and output the phase and frequency locked local carrier signal on line 48. The manner in which the master carrier and clock signals are transmitted downstream are not critical to the invention, and any of the ways known in the prior art or later developed will suffice the practice the invention. For example, in multiplexed systems, one code, timeslot or frequency may be devoted solely to sending the master carrier or master clock or both. In the particular example of the invention in a synchronous code division multiplexed environment, the master carrier is sent as a pilot tone on a dedicated code, and the clock information is embedded in a unique Barker code which is transmitted during every guardband between frames of payload data. The details of the construction and operation of PLLs and tracking loops are well known in the art, and any of the prior art configurations that are compatible with the particular manner in which the master carrier and master clock signals are transmitted downstream will suffice to practice the invention. Examples of types of tracking loops other than PLLs that are also known in the prior art for use in carrier synchronization and tracking the phase and frequency of a master carrier are Mth power loops and Costas loops described at page 564–565 of the Haykin treatise incorporated by reference herein. The clock synchronization circuitry in circuit 42 can be as simple as an appropriate filter when the master clock is transmitted with the data bearing signal in multiplexed form. Another approach used in the prior art is to use a noncoherent detector to extract the clock signal embedded in the data. Clock recovery can be performed after carrier recovery to recover the clock from baseband signals output from the coherent detector. The preferred method of clock recovery is to use the early-late gating method to sample the output of a matched filter which has a transfer function matched to a particular signal bearing the clock information such as a unique Barker code or a rectangular clock pulse. Some of the prior art clock synchronization techniques are described at pages 566–7 of the Haykin treatise incorporated by reference herein.

The coherent demodulator/detector 44 functions to demodulate and detect the incoming symbols and can be any prior art design which is compatible with the modulation scheme used in the central unit transmitter. Although, the detector 44 is stated here to be a coherent detector, in embodiments such as the SCDMA (synchronous code division multiple access) example described below where a rotational amplifier is used to correct phase errors, the demodulator/detector 44 does not have to be coherent. In such embodiments, the demodulator portion does not have to receive a reference carrier which is phase locked with the master carrier so long as the rotational amplifier is used in the detector to correct the resulting phase errors. The same is true for the coherent detector 70 in the CU receiver.

The function of the demodulator/detector is to use the local carrier reference signal on line 48 to demodulate the payload data from the downstream RF signal, detect the transmitted constellation points and output a baseband signal on line 50.

The baseband signal is received and processed by any compatible decoder represented by block 52. The function of decoder 52 is to reverse the encoding and/or multiplexing process carried out by encoder 16 at the central unit transmitter and determine which symbol was sent during every chip time or bit time. The decoder 52 receives the local clock signal on line 46 and uses it to determine when the bit time or chip time boundaries are for purposes of sampling. The decoder 52 also functions to detect the frame boundaries of the downstream frames and reorganize the received data back into the frames organized by the encoder 16 for output on bus 54. To assist the decoder is doing the frame boundary recognition, a framing signal is generated on line 55 by a frame detector circuit 57. Any prior art decoder design that can perform this function for the particular encoding/multiplexing scheme selected for use by the central unit transmitter will suffice to practice the invention. The frame detector circuit 57 receives the downstream RF signal on line 59 (or is coupled to the baseband signal output from the detector 44) and looks for unique frame boundary signals in the stream of data transmitted from the central unit transmitter. Frame detectors are well known in the art, and there is such a circuit in every digital communication system that transmits data in frames. One method of frame detection used in the SCDMA examples presented below is separation of frames by a guardband, and transmission of a unique Barker code by the central unit transmitter during every guardband. This stream of incoming data at the remote receiver is passed through a filter having a transfer function matched to said Barker code and the correlation peak which results when the Barker code passes through the matched filter is used to mark the frame boundaries.

The upstream payload data is received from any message source 56 on line 58. An encoder 60 receives this message signal (and digitizes it if necessary) and functions like encoder 16 to assemble the bits into symbols for transmission during each bit time or chip time defined by the local clock reference signal on line 46. As was the case for encoder 16, encoder 60 may also do the multiplexing of different channels of data onto different codes or into different timeslots in CDMA or TDMA systems, respectively. In the case of an FDMA system, encoder 60 assembles the message bits from one or more sources into separate bits streams which are supplied to a modulator 62 for use in modulating separate carriers received by the modulator from a synthesizer (not shown) which receives the local carrier reference signal on line 48 and generates a plurality of different carriers therefrom.

The encoder 60 may use a different form of encoding and/or multiplexing for the upstream direction than were used for the downstream direction. Any encoder design known in the prior art or later developed will suffice for purposes of practicing the invention. In fact, the encoder 60 can even use a clock signal at a different frequency from the master clock signal so long as the different clock signal is phase coherent with the master clock signal. Phase coherent means that there is periodic coincidence in time of clock edges between the two different clock frequencies. In such an embodiment, the local clock reference signal on line 46 (locked in phase and frequency to the master clock) would be supplied to a frequency synthesizer which would then generate the new clock frequency so as to be phase coherent with the master clock signal.

The upstream data output from the encoder 60 on line 64 is received by an adjustable delay circuit 65 which receives an adjustable delay value Td. This circuit is used when the system of FIG. 1 requires frame synchronization and the remote units are at differing distances from the central unit. Typically such systems include synchronous TDMA and synchronous CDMA systems. The value of Td is adjusted for each remote unit based upon its physical distance from the central unit so as to achieve frame synchronization. Frame boundaries are delineated by an easily found signal. In frame synchronous systems such as SCDMA, the frame detector 68 can be eliminated.

The output of the delay circuit 65 is sent to a modulator 62. Modulator 62 functions to guide modulation of the phase, frequency or amplitude of some combination thereof of one or more carriers. In a single carrier system, the carrier being modulated is the local carrier reference signal on line 48 which is locked in frequency and phase with the master carrier. In an alternative embodiment, the local carrier reference signal is supplied to a frequency synthesizer which generates a different frequency carrier which is phase coherent with master carrier signal. Phase coherent in this context is that there is periodic coincidence in time of zero crossings of the master carrier and the new carrier frequency generated by the synthesizer.

The particular structure and operation for the passband modulator 62 is not critical to the invention. Also, the particular modulation scheme used is not critical to the invention and need not be the same modulation scheme used in the downstream direction. Any prior art design for a modulator or a design subsequently developed will suffice to practice the invention so long as it is compatible with the type of encoding done by encoder 60.

Typically, the transmission in the upstream direction is done at a different frequency from the downstream transmission so as to share the transmission media 40 by frequency division multiplexing. However, other forms of multiplexing such as time division or code division multiplexing may also be used to separate the upstream and downstream data. Frequency translator 66 represents the circuitry needed to separate the downstream and upstream data and it assumes that the form of separation is FDM. If TDMA or CDMA is used to separate the upstream from the downstream data, the circuit 66 represents whatever circuitry is used to do the multiplexing. Such circuitry is well known in the art.

The upstream RF signal is transmitted across media 40 to a central unit receiver. The upstream RF is coupled in the central unit receiver to a phase detect and adjust circuit 32, a frame detector 68 and a coherent detector 70. The function of the phase detect and adjust circuit is: to occasionally or periodically extract the received clock signal and the received carrier signal from the upstream RF signal; determine the phase difference between the extracted clock and carrier signals and the master clock and master carrier signals, respectively; adjust the phase of the master clock and master carrier signals and apply the phase adjusted clock and carrier signals to the decoder 72 and coherent detector 70, respectively.

The design of the phase detect and adjust circuit 32 is not critical to the invention, and any circuit that can perform the function stated above will suffice to practice the invention. One example of a phase detect and adjust circuit would be a pair of delay lines through which the master clock and master carrier signals are transmitted, with the amount of delay set to equal the total turnaround time for transmission of the carrier and clock signals from the central unit to the remote unit and back to the central unit. If the total turnaround time is stable, this circuit will adjust the phase of the master clock and master carrier signals for phase coherence with the received clock and carrier signals and once the phase is adjusted, it does not have to be adjusted again. If the total turnaround time changes because of, for example, network expansion, the phase detect portion of the circuit can periodically or occasionally determines the phase differences in any one of a number of different ways known in the prior art. For example, phase differences can be determined by comparing the phase between preamble data and Barker code data encoding the carrier and clock data, respectively, said preamble data and Barker code data being transmitted by each RU occasionally or periodically such as at the beginning of each frame or on a dedicated code or in a dedicated timeslot. The phase information recovered from the Barker code and preamble data transmitted by the RU is compared to the phase of the master clock and carrier.

In other words, one way of transmitting the clock and carrier information for each RU to the CU is for the remote unit transmitter to generate a Barker code which is a copy of the CU Barker code but which encodes the local clock reference and which has good correlation properties such that it can be detected in the presence of noise or even if transmitted in the midst of payload data. This Barker code can be modulated onto the local carrier reference at the remote unit and transmitted to the CU. This Barker code can be transmitted in guardbands between upstream data frames where it is detected by the phase detect and adjust circuit and used to extract the phase of the local clock and local carrier signals used for upstream transmission. The extracted clock and carrier phase information is compared in phase to the master clock and master carrier phase in the CU for each RU, and the phase error for each RU's local clock and local carrier reference signals is applied to master clock and master carrier rotational amplifiers, respectively, when data from that RU is being received. These rotational amplifiers are coupled to receive the master clock and master carrier signals, respectively, and to receive the phase error signals and adjust the phase of each signal in accordance with their respective phase errors. The phase adjusted master clock and master carrier signals at the output of the rotational amplifiers are then applied to the decoder 72 and coherent detector 70 via lines 74 and 76, respectively. If no guardbands are used, the Barker codes for the upstream channel can be transmitted occasionally or periodically during the payload data, and the same process described above is carried out following extraction of the clock and carrier from the Barker code.

In alternative embodiments, only the clock is transmitted with the Barker code, and the remote unit carrier is transmitted as a separate sidetone pilot channel on a dedicated code, a dedicated timeslot or on its own frequency which is different than either of the upstream or downstream frequencies.

Each remote unit generates its own framing signals. These unique signals are detected by frame detector 68. The RU framing signals can be Barker codes transmitted by each RU indicating the start of its frame. The details of the design of the frame detector are not critical to the invention, and any frame detector from the prior art or later developed will suffice to practice the invention. A detailed design for a frame detector to detect a Barker code is presented later herein.

After the master carrier signal has had its phase adjusted to match the phase at the central unit of the carrier transmitted by remote unit, the phase adjusted carrier on line 76 is used by coherent detector 70 to detect the upstream RF and convert it to baseband observed data on line 80. Detector 70 can be any coherent prior art detector which is compatible with the form of modulation employed on the upstream channel. The details of the detector design are not critical to the invention.

The baseband data output from the detector on line 80 is supplied to decoder 72. The function of the decoder 72, like the decoder 52, is to make a decision from the observed signal as to which symbol was transmitted during each bit time or chip time, and reverse the encoding process performed by encoder 60 by descrambling, de-interleaving and/or demultiplexing the data and reassembling it into the frames of data originally put together by the encoder 60. This process is done with the aid of the phase adjusted master clock signal on line 74 which defines the boundaries of the bit times or chip times and with the aid of the framing signal on line 82 which defines the frame boundaries. The reassembled data stream is output on line 84.

SPECIFIC EXAMPLES

There follows some examples of specific systems that utilize the teachings of the invention. First an embodiment that uses synchronous code division multiple access is discussed. Synchronous code division multiple access in a distributed system requires that all frames from the remote units at different distributed locations arrive at the central unit receiver with their frame boundaries aligned in time. Accordingly, we start with a discussion of the ranging process which is carried out between each remote unit (hereafter RU) and the central unit (hereafter CU) so as to set a transmit frame timing delay for the remote unit which will result in proper frame alignment of that remote unit's frames.

Those skilled in the art will appreciate that the ranging processes described herein has applicability to any distributed data communication system which transmits data in frames regardless of the form of multiplexing or the form of modulation used. Likewise, the equalization processes and power alignment processes described herein all have applicability to any distributed digital data communication system having a near-far problem and having channel impairments that can cause phase and/or amplitude errors in the received points causing them to deviate on the constellation plane at the receiver end from their positions on the same constellation plane at the transmitter end.

In the SCDMA system to be described below, the upstream and downstream data is received at the transmitter in a time division multiple access (TDMA) stream with 8 payload bits in each timeslot. The digital data in the TDMA streams is re-arranged into symbols, as described briefly above, and is transmitted in frames, with three symbols plus one guard band or gap per frame. The guardband or gap is reserved for transmission of alignment Barker codes, and no other data is supposed to be transmitted during the gaps.

The concept in alignment is to adjust variable delays imposed at the site of each transmitter prior to transmission of a Barker code so as to compensate for different propagation delays from each transmitter site such that the Barker code from each subscriber transmitter trying to align arrives at the head end receiver during the same gap. When the variable delays at each subscriber transmitter are adjusted properly, each subscriber will be said to be in alignment so that the signals encoding the symbols that are simultaneously transmitted on the transmission media will all be transmitted with the same frame timing.

Alignment is important to obtain pure orthogonality so as to obtain low cross talk. If the transmitters are not perfectly aligned, the signals transmitted can still be recovered, but there is some cross talk between channels which will limit the capacity of the SCDMA system to carry information.

This process of aligning all the delay circuits in the transmitters is sometimes alternatively called ranging herein and is broadly applicable to other types of multiple access digital data transmission systems also which suffer from different propagation times from different transmitter sites such as time division multiple access systems that form part of the prior art discussed above.

Figure 2A:
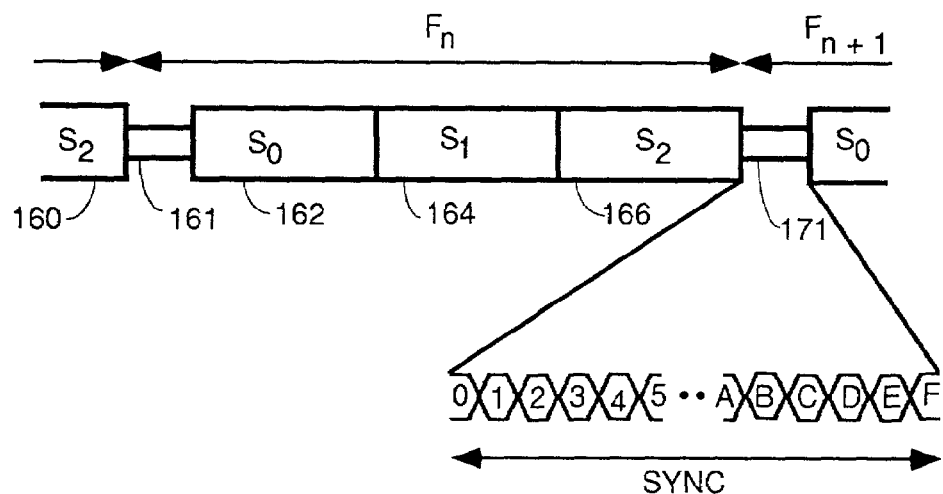
FIG. 2A is a diagram of typical upstream or downstream frame structure showing how each frame is separated from its neighbors by a gap.

Referring to FIG. 2A, there is shown a diagram of the typical frame structure. In the preferred embodiment, each frame is composed of three symbols of 144 chips each and a gap or guardband comprised of 16 chips for a total of 448 chips each having 278 nanoseconds duration. The chip is the basic unit of time in the "code domain", where code domain refers to the signals propagating across the shared media. In the preferred embodiment, each chip is a QAM modulated element of a result vector where the result vector is comprised of a number of elements equal to the number of timeslots and is the result of code division spreading of the elements of an information vector constructed from the bits of each channel or timeslot. In the preferred embodiment, each receiver receives a TDMA serial bit stream comprised of 144 individual timeslots or channels each of which contains 8 bits. To these 8 bits there is added a 9th bit in the preferred embodiment which can be used for side channel conversations with the CU unrelated to the data received from the external device. These 9 bits are divided into three tribits of 3 bits apiece. A collection of 144 of these tribits is stored in a framer memory and, in some species within the inventive genus, these 144 tribits will be the information vector which is multiplied by the code matrix to generate a result vector having 144 elements. These 144 result vector elements will be QAM modulated to generate the 144 chips that are transmitted as a symbol. This process is repeated for each of the three tribits of each timeslot thereby resulting in the transmission of three symbols in each frame. In the preferred embodiment however, each tribit is encoded with one or more redundant bits based upon the three bits and the state of these same three bits of the same timeslot during the last frame for purposes of forward error correction. The redundant bit(s) is calculated to aid a Viterbi Decoder in a receiver in the central unit to ascertain with a higher degree of accuracy from the received signals which have been corrupted by media impairments what bits were originally present as each tribit. Some species within the inventive genus may omit the addition of the redundant bits and the Viterbi Decoder and still many advantages within the genus of the invention will still be present although a higher bit error rate will result.

One skilled in the art will appreciate that the construction of the information vector which will be used to generate each symbol by taking only some of the bits from each timeslot spreads the data from each timeslot out over time. This renders the data less susceptible to burst noise. The code division multiplexing allows multiple channels of digital data to be simultaneously transmitted in a 6 mHz channel without interference between channels. In addition, frequency division multiplexing may be utilized to transmit even more channels of digital data above and beyond the 144 channels transmitted in the first 6 mHz channel. In other words, another 144 different TDMA digital channels may be code division multiplexed and transmitted simultaneously with the first 144 digital channels but on a second 6 mHz channel. This second 6 mHz channel has a different center frequency than the first 6 mHz channel which is separated from the center frequency of the first 6 mHz channel sufficiently to not interfere therewith. Both the first and second 6 mHz channels have center frequencies which are separated sufficiently from the center frequencies of the cable television programming sharing the same media so as to not interfere therewith. In alternative embodiments, this scheme can be replicated with any number of symbols greater than 1, or with only one symbol if immunity to burst noise is not important.

In FIG. 2A, the three symbols of frame $F_n$ are symbolized by blocks 162, 164, and 166. The gap or guardband is symbolized by blocks 161 and 171 on both ends of the frame. There is one guardband associated with each frame. The guardband 171 (sometimes also referred to herein as the gap) is used for synchronization and equalization purposes for the frame comprised of symbols 162, 164, 166 and guardband 171. The symbols carry the information for the various channels of digital data provided to the subscribers. The frame period is 125 microseconds. The frame data payload is 128 channels times 72 kilobits per second per channel plus 16 control and management channels each of which has a data rate of 72 kilobits per second for management and control information.

The process of synchronization is the process wherein each RU has a variable delay in its transmitter set using feedback from the CU on one of the management and control channels such that the transmitted frame from each RU arrives at the CU with its frame boundaries exactly aligned with the frame boundaries of the frames from the other RUs. Alignment of all frames from all RUs results in the beginning of the gap 161 for each frame from each RU occurring at the same time at the location of the CU regardless of differences in propagation delays from the various RUs to the CU. In FIG. 2A, time increases to the right.

Figure 2B:
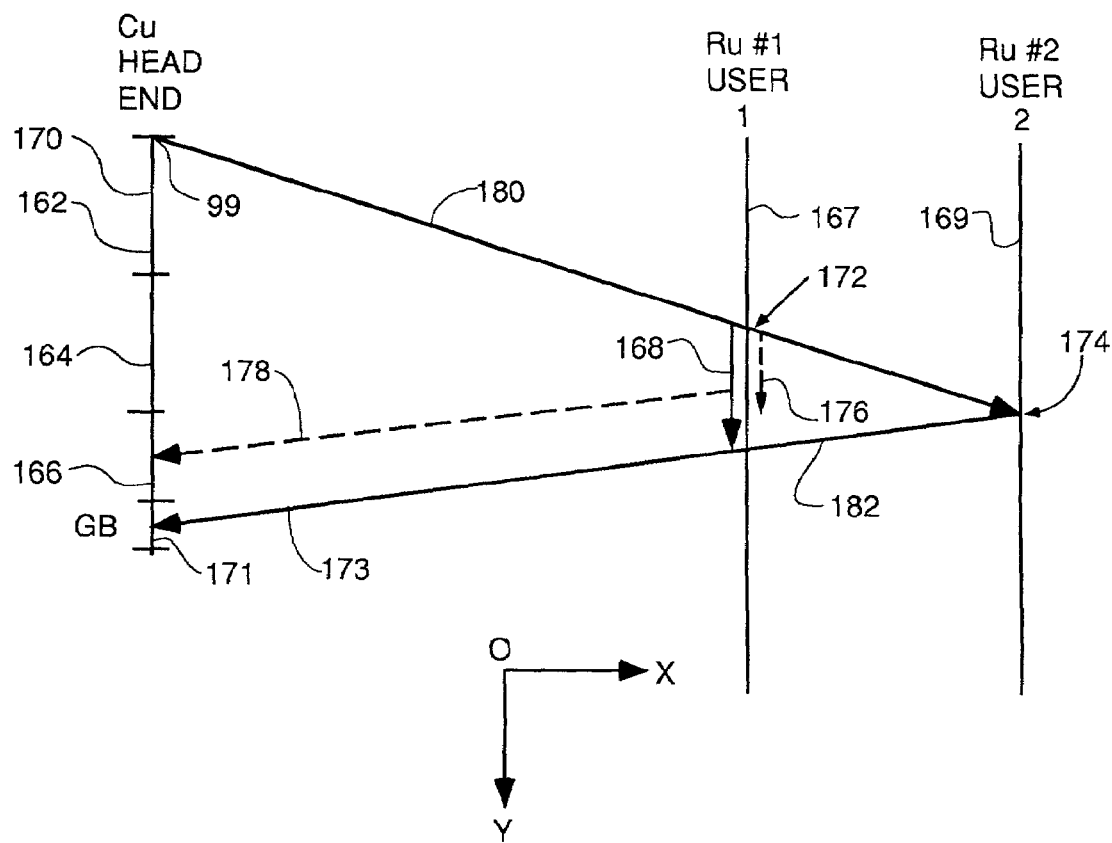
FIG. 2B is a time diagram illustrating how the general ranging process works.

Alignment of Any Digital Data System that Sends Data Bits Collected as Frames Referring to FIG. 2B, there is shown a symbolic diagram illustrating the concepts involved in alignment. In FIG. 2B points having increasing positive coordinates along the y-axis starting from the origin at 99 represent increasing time. Points along the x-axis to the right of origin represent increasing distance from the central unit which is designated at position 170. Time 99 represents the beginning of symbol 162 in FIG. 2A at the CU. The gap 171 at the end of the three symbols will be used for alignment, and the end of gap 171 will be deemed the end of the frame.

The alignment process is started asynchronously by any RU that needs to align. The central unit transmits a Barker code during each frame at the same time in the frame. In the preferred embodiment, this Barker code is transmitted during the gap. This Barker code is received by each remote unit at a different time because of different propagation delays, but as to any particular RU, the Barker code is always received at the same time during every frame until the CU changes its delay (a concept to be discussed more fully below). The Barker code represents a trigger to any RU attempting to align and marks the receive frame timing reference for that RU. The time of receipt of the Barker code represents the start of the variable delay interval being adjusted by the RU during the alignment process.

The CU's "every frame" Barker code transmission during the frame shown in FIG. 2A is represented by line 180. The Barker code is received by RU #1 at position 167 at time 172. The Barker code is received by RU #2 at position 169 at time 174. The alignment process is a trial and error process of adjusting a delay from the time of receipt of the Barker code to the time of transmission of the same Barker code by each RU back toward the central unit at position 170 until the delay is properly adjusted such that the re-transmitted Barker code arrives at the CU during the gap. Vector 168 represents correct delay timing for RU #1 at position 167 such that its Barker code transmission 173 (preferably, the RU Barker code is identical to the CU Barker code) arrives in the middle of the gap 171. Dashed vector 176 represents an incorrect delay resulting in a Barker code transmission, represented by dashed line 178, from RU #1 which arrives sometime during the middle of symbol 166 thereby missing the gap 171. This condition represents an incorrect alignment and may result in crosstalk.

Likewise, the RU #2 at position 169 uses zero delay and emits a Barker code transmission 182 immediately upon receipt of the Barker code trigger transmission 180 from the CU 170. This Barker code transmission 182 from RU # 2 also arrives during the middle of gap 171 thereby indicating that RU # 1 and RU # 2 are correctly aligned.

The alignment Barker code transmissions are typically short bursts having energy levels which are sufficient to make detection during gap 171 easy even though gap 171 also includes random noise energy and with good correlation properties and amplitudes not so high as to substantially interfere with data if the Barker code arrives at the CU in the middle of a symbol.

The alignment Barker code transmissions are detected during the gap by performing a correlation mathematical operation in the CU receiver between the Barker code that was transmitted and the received signal. If the received signal was the same Barker code that was transmitted by the CU, the correlation operation will output a signal that peaks at the time of maximum overlap between the Barker code transmitted by the CU and the received signal. The timing of this peak indicates the alignment state of the RU that transmitted the Barker code which resulted in the peak. Each symbol encoded in the code domain includes error detection and correction bits (ECC bits) such that any errors that occur can usually be detected and corrected when the symbols are re-constituted by the framer circuitry in the receiver.

Figure 3:
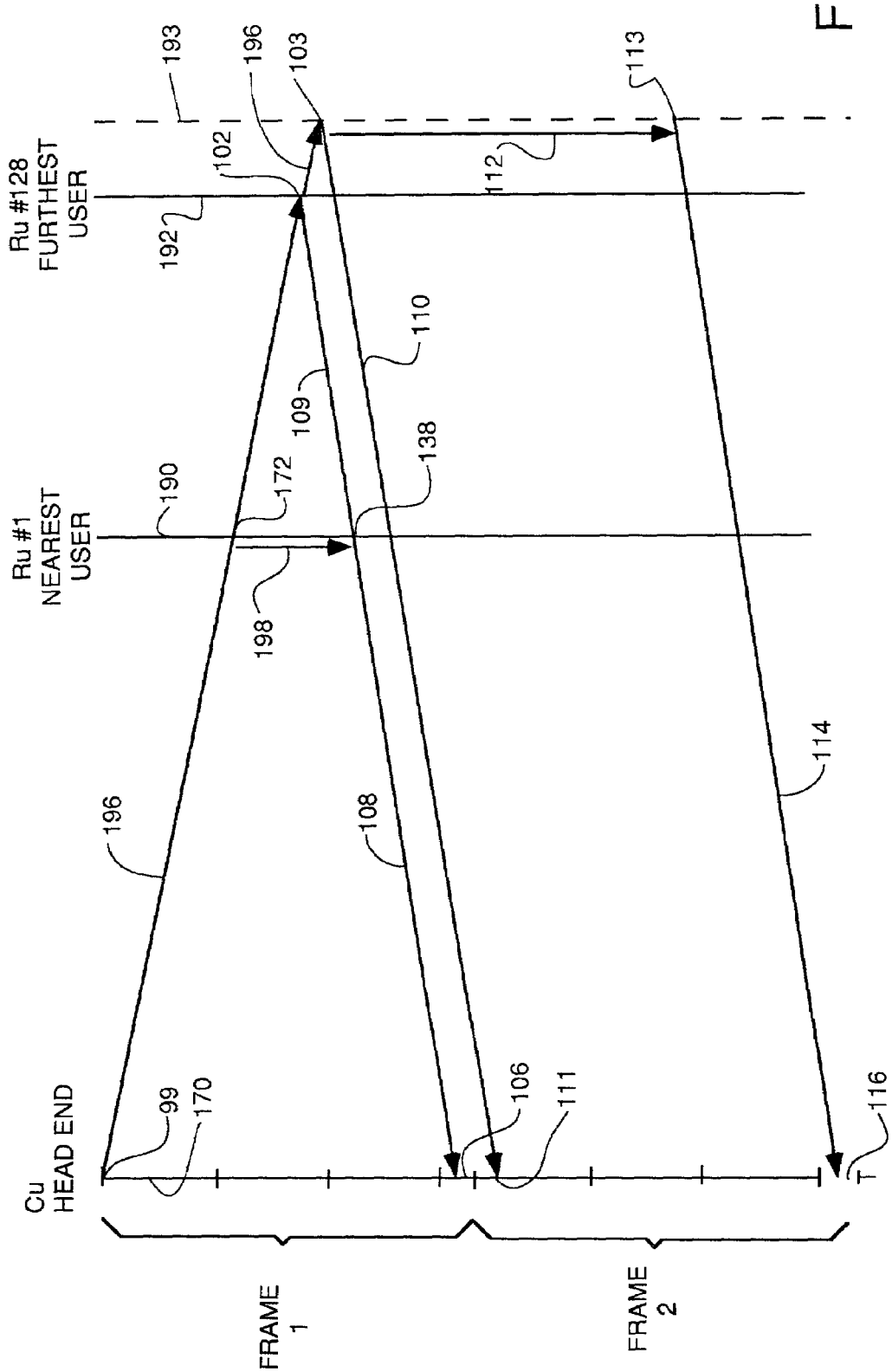
FIG. 3 is a time diagram which illustrates a problem which can occur when the network expands.

Referring to FIG. 3, there is shown a diagram like that of FIG. 2B which illustrates a problem which occurs when the network physically expands. This can occur under certain circumstances such as during the heat of a summer afternoon when the physical media thermally expands thereby altering the propagation times of Barker code signals from the CU to the RUs and from the RUs back to the CU. In the example shown, the CU at position 170 transmits Barker code 196 at time 99. This Barker code reaches the nearest RU, RU #1, at position 190 at time 172. The same Barker code reaches the furthest RU, RU #128, located at position 192 at time 102. RU #1 uses a delay symbolized by vector 198 and re-transmits the Barker code 108 at time 138. This alignment transmission hits gap 106 in frame #1 indicating that RU #1 is properly aligned.

The RU #128, when located at position 192 uses no delay and immediately retransmits Barker code transmission 109 at time 102. Transmission 109 also arrives during gap 106 indicating that, at least at position 92, RU #128 is properly aligned.

Now suppose that the network physically expands such that RU #128 finds itself physically at position 193. In this position, RU #128 receives Barker code transmission 196 from the CU at time 103, and, because RU #128 is already using the minimum possible delay for retransmission of an alignment code, alignment transmission 110 is also transmitted at time 103. However, because of the physical expansion of the network, alignment transmission 110 reaches the CU at time 111 which is after the end of the gap 106 and sometime in the middle of the first symbol of frame #2.

When an RU properly hits the gap, it is authenticated, i.e., identified, and the CU tells it that alignment has been achieved thereby causing the RU to stop adjusting its delay by trial and error. Because RU #128 does not receive any acknowledgement from the CU that it is properly aligned, its starts incrementing its delay vector in a trial and error process. After several incrementations, the delay vector finally reaches the delay represented by vector 112. With this delay vector, an alignment transmission 114 is transmitted from RU #128 at time 113 which reaches gap 116 located at the end of frame 2. However, this means that RU #128 is synchronized with the wrong frame. It is required for proper operation of the system to have all RUs synchronized to the gap at the end of the same frame in which the Barker code transmission from the CU which triggered the RUs alignment transmissions occurred. If one or more RU aligns to the gap at the end of another frame, the results can be disastrous in terms of errors generated in the CU receiver in interpreting data transmitted by the RUs.

Figure 4:
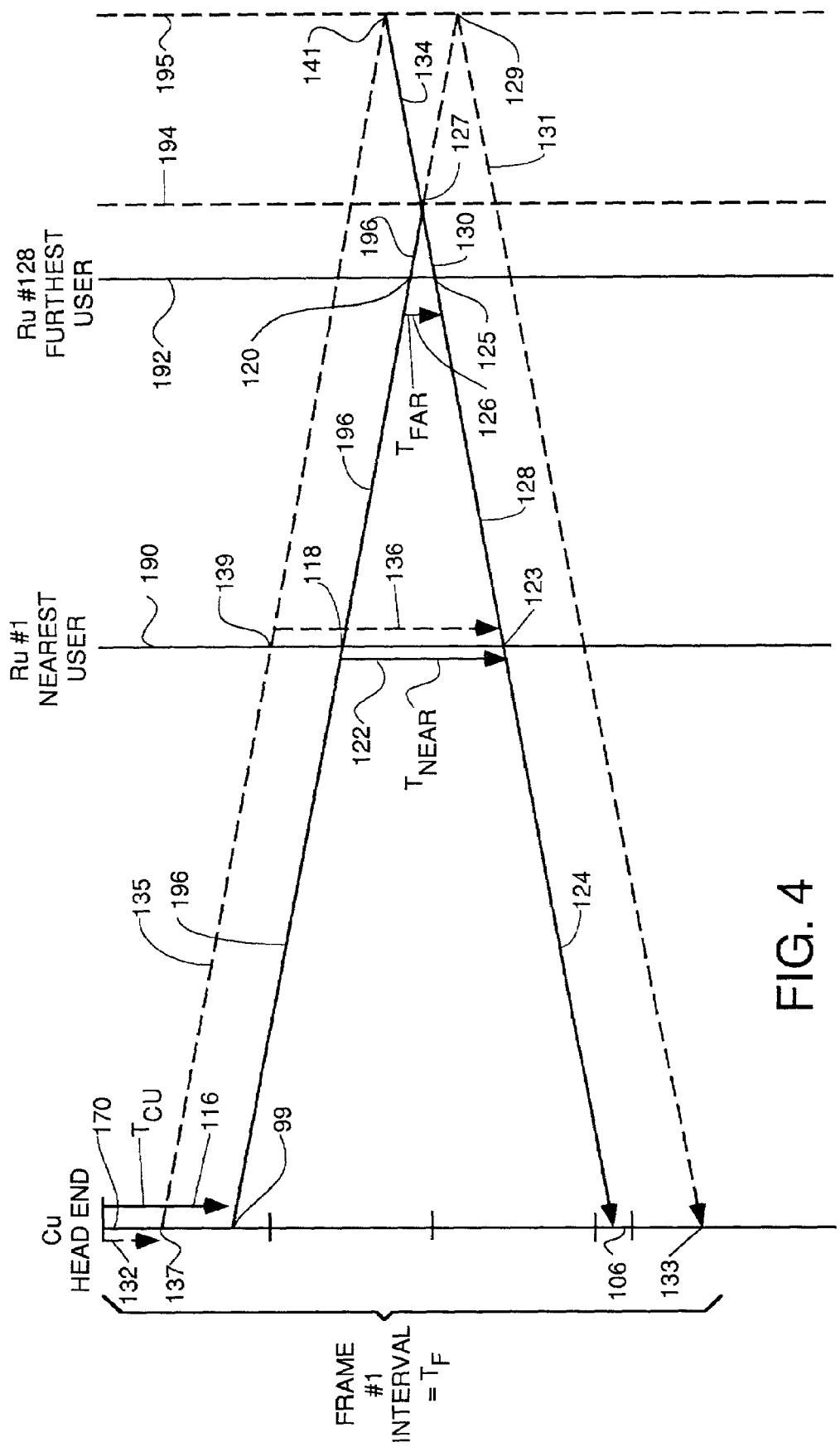
FIG. 4 is a time diagram which illustrates how the problem illustrated in FIG. 3 can be solved in one embodiment.

Referring to FIG. 4, there is shown a diagram like that of FIG. 3 which illustrates the solution to this misalignment problem outlined in the discussion of FIG. 3. In the diagram of FIG. 4, CU 170 imposes a delay, represented by vector 116, prior to transmitting the alignment triggering Barker code transmission 196 at time 99. The Barker code transmission 196 arrives at the nearest RU, RU #1, at position 190 at time 118. Time 118 establishes the receive frame timing for RU #1. RU #1 then imposes a delay represented by vector 122 and transmits the same Barker code alignment transmission 124 at time 123. Time 123 establishes the transmit frame timing reference for RU #1. The time delay between times 118 and time 123 is predictable since the CU will transmit its Barker code transmission 196 at the same time during every frame (in the gap) until such time as it is necessary to alter the timing of transmission 196 to keep all RUs in alignment. In other words, the time of reception of the Barker code transmission 196 for all RUs is predictable and will be a periodic signal which happens once during each fame. The alignment transmission 124 from RU #1 reaches gap 106 at the end of frame #1.

The alignment transmission 196 from the CU reaches RU #128, the furthest RU, at time 120. Time 120 establishes the receive frame timing reference for RU #128 while at position 192. Thereafter, at time 125, the RU #128 transmits alignment transmission 128. This transmission arrives during the gap 106 at the end of the first frame thereby indicating that RU #128 is properly aligned at this position.

As in the case of RU #1, the delay between times 120 and 125 for RU #128 is predictable.

Now suppose that the network expands, and RU #128 finds itself at position 194. In this position, the CU alignment triggering transmission 196 arrives at time 127. In order to stay aligned, RU #128 will reduce its delay vector 126 to zero and immediately retransmit an alignment transmission 130 comprising the same Barker code which it received. The transmission 130 arrives during gap 106 thereby indicating that RU #128 is still aligned at its new position by cutting its delay vector to zero.

Now assume that the network further expands such that RU # 128 finds itself at position 196. In this new position, alignment transmission 196 from the CU would arrive at time 129. With a zero delay by RU #128, the resulting alignment transmission 131 would arrive at time 133 just after the end of the gap 106 thereby indicating the RU #128 had been taken out of alignment by the expansion of the network. RU #128 would then continue to adjust its delay vector until it aligned to the next gap following the end of frame #2 thereby causing errors.

To prevent this from happening, when the CU finds that an RU which was previously in alignment has gone out of alignment because of network expansion, the CU will reduce its initial delay from the delay represented by vector 116 to the delay represented by vector 132. With this new delay vector, a Barker code alignment triggering transmission 135 will be transmitted at time 137. This alignment triggering transmission 135 will arrive at the position of RU #1 at time 139 and will establish a new receive frame timing reference. If RU #1 has not adjusted its delay vector 122 in advance by one of the mechanisms to be described below, it will go out of alignment. It may then enter a realignment phase and will ultimately, by trial and error, adjust its delay vector to that represented by dashed vector 136. After so adjusting its delay, RU #1 will transmit an alignment transmission 124 at time 123 so as to again hit gap 106 thereby re-entering alignment.

The alignment triggering transmission 135 from the CU arrives at the position 196 of RU #128 at time 141. Using a zero delay vector, RU #128 transmits its alignment transmission 134. This alignment transmission 134 arrives during gap 106 thereby placing RU #128 again in alignment.

FIG. 4 shows an alignment process where the alignment is to the gap at the end of the first frame in which the alignment trigger signal 196 is transmitted. In real life systems, this may not be practical, so the alignment process is carried out to the gap following some integer number of frames in the future. The mathematical expression which defines this relationship is given in equation (1) below:

$$TTA = T_{cu} + T_{ru} + 2 \times T_p = \text{constant} = n \times T_F \qquad (1)$$

where

TTA=the total turnaround time from the CU to the farthest RU;

$T_{cu}$=the delay imposed by the CU illustrated by vector 116 in FIG. 4;

$T_{ru}$=the delay imposed by the farthest RU illustrated by vector 126 in FIG. 4 (also called $T_{far}$);

$2 \times T_p$=two times the propagation delay $T_p$ from the CU to the farthest RU; and $n \times T_F$=an integer multiple of the frame interval $T_F$.

Of course, when the network expands, there is a certain additional delay in the propagation delays which will be called $T_u$ for the uncertainty of this additional propagation delay. Therefore, three additional requirements are imposed with respect to how much delay the CU and the RUs must be able to impose. Those additional requirements are given below in equations (2), (3) and (4):

$$T_{cu} = [T_d + T_u] \text{ modulo } T_F \qquad (2)$$

where $T_d$=the span of the network, i.e., equal to the quantity $[TTA_2 - TTA_1]$ where $TTA_2$ equals the total turnaround propagation time for a signal to propagate from the CU to the farthest RU and back, and $TTA_1$ equals the total turnaround propagation time for a signal to propagate from the CU to the nearest RU and back; and modulo $T_F$=the remainder of $[T_d + T_u]$ divided by $T_F$.

$$T_{far} > T_u \qquad (3)$$

where $T_{far}$=the smallest possible $T_{ru}$ of the farthest RU and is equal to the smallest RU delay which can be imposed by the farthest RU;

$$T_{near} < T_F - T_u \qquad (4)$$

where $T_{near}$=the maximum possible $T_{ru}$ of the nearest RU.

What all this means in a practical sense is that to set up the delays in the network so that all RUs are aligned, the following steps are taken and the limitations on possible delays imposed by the CU and RUs given in equations (1) through (3) are imposed so that all RUs align to the same gap. The practical network to be aligned by the following procedure has a CU coupled by a fiber optic trunk line to an optical node. The optical node is located out in the area to be served and can be coupled to as many as 2000 homes by 2000 individual coaxial links. To align such a network, step 1 would be to bring an RU to the position of the optical node and fix its delay at $T_{near} = T_F - T_u$. With this delay, the nearest RU would not hit any gap except by shear luck. Assuming the nearest RU does not hit the gap with this delay, the second step would be to adjust the delay of the CU until the nearest RU hits a gap. When this occurs, the condition $T_{cu} = [T_d + T_u]$ modulo $T_F$ would be true meaning that the CU would have adequately compensated for the uncertainty of the propagation delay increment to $T_d$ caused by network expansion.

Figure 5B:
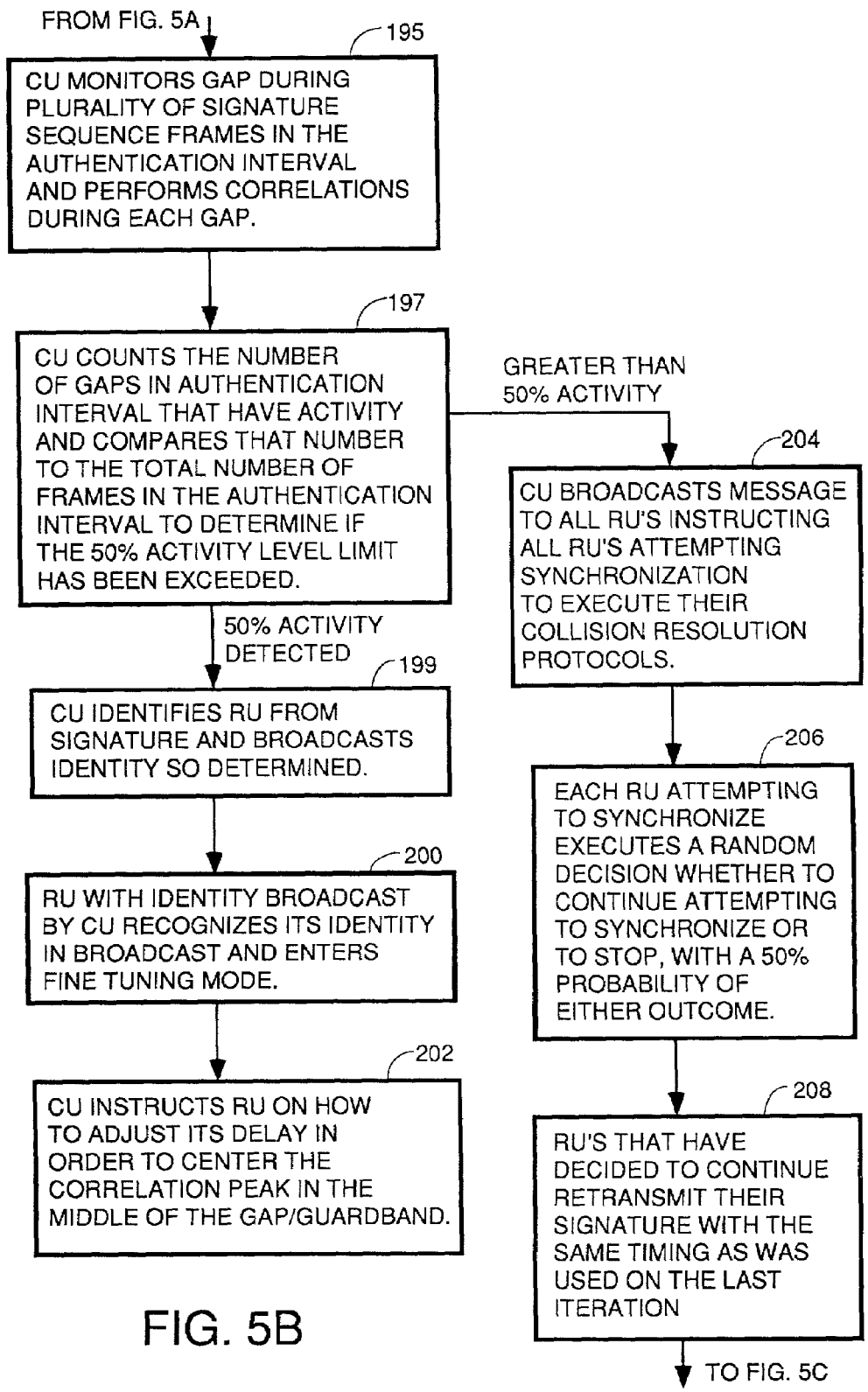
Figure 5C:
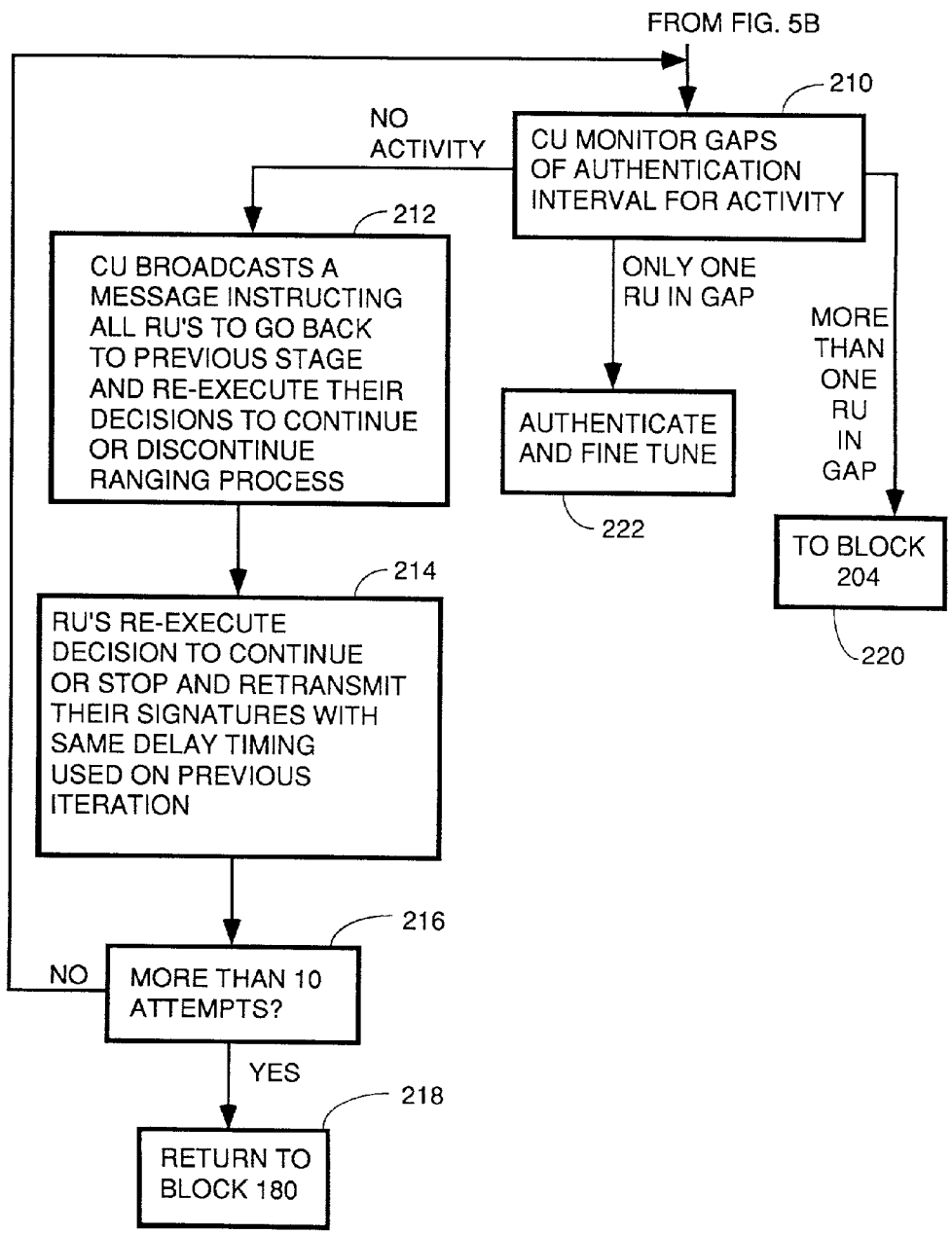

Referring to FIGS. 5A, 5B, and 5C, there is shown a flow chart for the general alignment/ranging process which is used in training all RUs to set their transmit frame timing delays $T_d$ properly such that each frame transmitted by an RU will arrive at the CU at the same time as all other frames transmitted from other RUs despite differing propagation times. One of the unique characteristics of the ranging processes described herein is that the RU does the ranging process and the CU is more or less passive which is in contrast with the prior art.

How the RUs Synchronize their Local Oscillators to the Master Carrier and Master Chip Clock Signals from the CU in an SCDMA Embodiment Generally at the time of powerup of an RU, the RU first adjusts its AGC level to make full use of its analog to digital converter dynamic range. Next, the RU does frame detection to determine where the gaps in the CU broadcasts are in time by performing correlations in the RU receiver frame detector looking for the known Barker code which the CU transmits during every gap. Once the gap is located, the frame detector sets the time base generator to synchronize on that receive frame timing reference. Next, the RU performs chip clock synchronization and carrier recovery in the manner described below. Carrier recovery is done by examining slicer error on a known BPSK pilot carrier or pilot channel signal transmitted during a predetermined timeslot using a predetermined code (CU local oscillator signal samples in timeslot 0 spread with all 1s CDMA code and transmitted using BPSK in the preferred embodiment).

In this particular SCDMA embodiment, the pilot channel is the manner in which the master carrier signal from the CU is transmitted to the RUs so that they can synchronize their local oscillator PLLs to the master carrier for purposes of generating their local carrier reference signals. These local carrier reference signals are used by the RU receiver to detect the incoming downstream data and by the RU transmitter to transmit the upstream data. The pilot channel also carries the frame number data. In other words, the RU receiver slicer error on the pilot channel signal is used to synchronize the RU local oscillator to the phase of the CU master carrier local oscillator or other master carrier source.

Chip clock synchronization in the RUs to the chip clock, i.e., the master clock signal of the CU, is performed by the fine tuning circuitry of the frame detector in each RU. The frame detector in each RU synchronizes the RU chip clock to the master chip clock signal embedded in the Barker code sent by the CU during every gap. This is all the RU needs to do to set itself up for reception of CU data and messages.

The RU then starts listening to CU messages to determine if it tuned to the right CU and to determine when the CU solicits ranging activity by a message on one of the command and control channel. In some embodiments, the "clear to range" message can be eliminated, and the CU can watch for ranging Barker codes all the time, but it is preferred to allow the CU to throttle ranging activity. The RU then performs a ranging process described below and registers itself with the CU by sending an authentication sequence of Barker codes after frame synchronization has been achieved (discussed below). This is done by a CPU in the RU when it receives a message from the CU saying "I found one Barker code in the gap, please send your authentication code". The RU CPU then sends data to the RU transmitter telling it what authentication sequence of Barker codes to send back to the CU to identify this particular RU. The CU will then transmit a message indicating what authentication code it found and how many chips off center of the gap the Barker code it found landed. The CPU in the RU that is ranging then properly adjusts the transmit frame timing delay reference $T_d$ to center the Barker code in the gap. Other items of data the RU CPU sends to the ranging circuit in the RU transmitter is data indicating the power level to use for the ranging Barker codes and an RU/CU signal indicating to the ranging circuit whether it should follow the rules of ranging for an RU or CU.

The CU next instructs the RU to entering an equalization training interval to determine the coefficients to set into the RU transmitter's precode filter to predistort the RU signals to eliminate channel distortion and test the quality of the ranging result. The training algorithm is discussed below, but other ways of performing equalization which are known in the prior art can also be used. In addition, other ways of achieving frame synchronization known in the prior art can also be used and other ways of achieving synchronization of the RU local carrier oscillator and local clock oscillator to the master carrier and master chip clock signals, respectively, known in the prior art can also be used to practice the invention of eliminating tracking loops in the CU in the SCDMA environment.

FIGS. 5A through 5C gives the details of interaction between the CU and RUs to achieve frame synchronization using the particular ranging process symbolized by FIG. 4. The ranging process starts as symbolized at block 181 with the CU waiting for a predetermined interval from the start of each frame and then sending a trigger signal Barker code transmission to the RUs during the gap. Usually this trigger signal is sent during the gaps between frames even when the CU adds additional delay for reasons discussed below. The RUs monitor these gaps for these Barker codes using their frame detector circuits.

Block 183 symbolizes the process wherein each RU trying to synchronize (the terms "synchronize", "ranging" and "alignment" all are used synonymously to mean the process of training an RU to set its delay vector properly to get its frame boundaries aligned with the CU frame boundaries) receives the Barker code trigger signal transmission from the CU using its frame detector and sets its receive frame timing and then sets a first trial and error delay value for its delay vector. Thereafter, the RU transmits the same Barker code it received from the CU towards the CU as an alignment transmission using the first trial and error delay value.

In block 185, the CU monitors the gap for receipt of a Barker code by performing a correlation between any received signal during the gap and the Barker code that was transmitted as the trigger signal. If a Barker code identical to the trigger signal is received during the gap, the correlation will result in a correlation peak being found in the gap. If a correlation peak is found, processing proceeds to the process symbolized by block 191. There, the CU broadcasts a message to all RUs indicating that it found activity in the gap. Then the process of block 192 is performed where each RU trying to synchronize sends its "signature", i.e., its RU identification code in the form of a Barker code transmission sequence. That is, in response to the broadcast from the CU indicating activity in the gap, each RU trying to synchronize sends its unique signature towards the CU in order to determine if that RU's Barker code is the Barker code the CU found in the gap and whether it is the only RU in the gap. This process is called authentication.

The process of block 193 symbolizes the start of the authentication process. Each RU has a unique signature which comprises the transmission and nontransmission of Barker codes during the gaps of a multiple frame authentication period. Specifically, the unique signature of each RU will involve transmitting the Barker code during some gaps of the authentication period but not during others in a sort of "Morse code". Each Barker code transmission results in a correlation peak during one of the chips in the gap. Each RU has a unique 16 bit RU ID, each bit being either the presence or absence of a Barker code correlation peak somewhere in the gap. Therefore, it takes 16 frames or 4 superframes to transmit the RU ID.

The number of gaps during which the Barker code is transmitted compared to the number of gaps during which the Barker code is not transmitted during the authentication period is such that if only one RU is aligned to the gap and is transmitting its authentication signature, activity will be found in the gaps of the authentication interval only 50% of the time. This scheme for authentication is chosen so that the CU can detect contentions, i.e., more than one RU in the same gap, in the manner described below.

After performing the process of block 193, the process of block 195 on FIG. 5B is performed. This process involves the CU monitoring each of the gaps during the plurality of signature sequence frames in the authentication interval and performing correlations between the signals received in each of the gaps and the Barker code that the CU transmitted. Correlation peaks are found comparing the correlator output to a threshold value. The threshold value is set by detecting a noise threshold when the gap is empty and setting the threshold at a fixed delta above the empty gap base noise value.

Next, the process of block 197 is performed. In this process, the CU counts the number of gaps in the authentication interval that have had activity detected therein, and then compares that number to the total number frames in the authentication interval to determine if the 50% activity level limit has been exceeded indicating that more than one RU is hitting the gap. The advantage of this method is that activity detection, contention detection and authentication are all combined into a single process thereby speeding up the process by more efficiency.

Returning to the consideration of the process of block 185, if the CU, while monitoring the alignment gap for activity, finds no peak resulted from the correlation calculation, then the process of block 186 is performed. In this process, the CU broadcasts a message to all RUs telling them to adjust their delays and to try again to hit the gap with their Barker code transmissions. Then, the process of block 188 is performed wherein each RU trying to synchronize increments its delay vector and retransmits the same Barker code as was received from the CU. Thereafter, the process of block 185 is performed again wherein the CU monitors the gap for activity. The loop comprising blocks 185, 186 and 188, taken together, comprise the trial and error process which causes all RUs trying to align themselves to continually increment their delay vectors until at least one of them hits the gap.

Returning to the consideration of block 197, if 50% activity level is detected during the authentication interval, it means that only one RU is in the gap. In such a case, the process of block 199 is performed. In this process, the CU identifies the RU whose Barker code transmissions are found in the gap from the unique signature sequence transmitted during the authentication interval. In other words, the CU examines exactly which gaps had correlation peaks therein and the sequence of these gaps and looks up this sequence in a lookup table listing the unique signature sequence for each RU in order to identify the particular RU that has successfully aligned itself. Block 199 is reached only if activity is detected in exactly 50% of the gaps.

After the CU identifies the RU, it broadcasts the identity so determined to all RUs as the last step of block 199.

Next, the process of block 200 is performed. In this process, the RU with the identity broadcast by the CU recognizes its identity in the broadcast message and enters a fine tuning mode. The purpose of the fine tuning mode is to cause the value of $T_d$ to be precisely adjusted so that the frame boundaries of frames transmitted by this RU arrive at the CU exactly aligned in time with the frame boundaries of the CU receive frames which are offset in time from the CU transmit frame boundaries in some embodiments).

The fine tuning mode is represented by the process of block 202. In this process, the CU instructs the RU which has aligned itself in the gap on how to adjust its delay vector in order to center the correlation peak calculated by the CU to the exact middle of the gap. In the preferred embodiment, the gap is comprised of 16 chips which comprise 8 chips in the middle of the gap and then 4 chips on either side of this middle group of 8. It is desirable during the fine tuning mode to get the correlation peak centered in the middle of the middle 8 chips. As mentioned above, a chip is a small interval of time equal to the frame period of 125 microseconds divided by the 448 chips which comprise each frame. In other words, each chip is 279 nanoseconds in duration. The fine tuning process of block 202 involves sending messages back and forth between the CU and the RU which has been identified as having aligned itself in the gap. These messages are sent over the management and control channels. Since clock recovery and carrier recovery has already been accomplished in the RUs before ranging is started, receiving of these management and control messages is no problem and constellations involving phase information can be used. In some embodiments, the exchange involves only one instruction from the CU to the RU saying, for example, "Increase your delay vector by 2 chips" or, "Decrease your delay vector by 3 chips". In other embodiments, multiple trial and error adjustments are made. The RU then makes the instructed adjustment and retransmits the Barker code. The CU again calculates a correlation peak and examines where the peak occurs in the gap. If the peak occurs in a suitable position, the CU sends a message to the RU telling it to stop adjusting its delay vector as satisfactory alignment has been achieved. The RU then adjusts the coefficients of its precode equalization filters 563 in FIG. 33 to compensate for the phase change caused by the time alignment shift of the fine tuning process. This is done by multiplying all four feed forward coefficients by the negative of the phase shift caused by the timing offset.

Returning to the consideration of the process of block 197, if the CU determines that greater than 50% of the gaps during the authentication interval had correlation peaks therein, i.e., greater than 50% activity is detected, then the process of block 204 is reached. This process is only reached if more than one RU has aligned itself to the same gap. If this case, because each RU is transmitting its unique signature, and because each signature is a unique sequence with only 50% activity level, the result of two RU's being in the same gap will be that during more than 50% of the gaps of the authentication interval, correlation peaks will occur. It is impossible to find tune the RUs if more than one RU is trying to fine tune during the same gap. Therefore, the CU has to reduce the number of RUs that are in the gap to one, and it starts this process by performing the process of block 204. In this process, the CU broadcasts a message to all RUs instructing only the RUs attempting to synchronize to execute their collision resolution protocols.

Next, the process of block 206 is performed, to start the collision resolution protocol, wherein each RU attempting to synchronize executes a random decision whether to continue attempting to synchronize or to stop attempting to synchronize. Each RU will make this decision with a 50% probability of either outcome.

After all RUs make their random decisions whether to continue, the process of block 208 is performed. In this process, the RUs that have decided to continue to align retransmit their signature sequences without changing their timing, i.e., with the same timing as was used on the last iteration of the trial and error process. In other words, each RU that has decided to continue transmits its unique signature sequence (sometimes hereafter called a "dotted sequence") over another authentication interval using the same delay vectors that are currently set.

Next, the process of block 210 on FIG. 5C is performed wherein the CU again monitors the gaps of the authentication interval for activity.

If the random decisions whether to continue or not result in no RUs transmitting their signatures, then no activity will be found in the gaps of the authentication interval. In this event, the process of block 212 will be performed wherein the CU broadcasts a message instructing all RUs to go back to the previous stage and to reexecute their decisions to continue or discontinue the ranging process.

The RUs then re-execute their decisions whether to continue or stop attempting to align themselves and retransmit their signatures during the authentication interval with the same delay timing used on the previous iteration, as symbolized by block 214.

Following the process of block 214, the process of block 216 is performed to determine if more than 10 attempts to get one RU in the gap have occurred. If so, the process of block 218 is performed to return to block 181 and restart the ranging process from the top. If fewer than 10 attempts have been made, processing returns to the process of block 210 wherein the CU again monitors the gaps of the authentication interval for activity.

If the process of block 210 finds only one RU in the gap, i.e., 50% activity level is detected during the authentication interval, then the process of block 222 is performed. The process of block 222 authenticates the RU by broadcasting the identity of the RU found in the gap and then the RU is fine tuned in the manner previously described with reference to block 202.

If the CU finds in the process of block 210 more than one RU is still in the gap, processing returns to block 204 where the CU broadcasts a message to all RUs instructing them to execute their collision resolutions protocols. This process is symbolized by block 220.

Alternatives to Preferred Ranging Process

There are several alternative embodiments to the ranging process described in FIGS. 5A–5C. They generally fall into two classes. The first class of embodiments is the preferred embodiment represented by FIGS. 5A–5C all of which involve the RU measuring propagation time of its signals to the CU by the trial and error process of adjusting its transmit frame timing delay $T_d$ until a verification management and control message is received from the CU saying "you hit the gap". There are alternative species within this class wherein the CU sends some kind of an easily detectable marker which triggers the RUs to send some kind of an easily detectable echo signals with good strong correlation peak qualities back to the CU and carrying out the trial and error process to adjust the timing of the echo signals until only one RU is in the gap and a verification message is received from the CU to that effect. In other words, instead of the RU echoing back the same Barker code that the CU sent, the RU could send a chirp or a long, low power sequence that extends over multiple gaps, over an entire frame or over multiple frames. The RU could also send back a very narrow, e.g., one chip wide, high power pulse which is easily detectable over the upstream noise. The CU receiver, during ranging, would perform a correlation on the known chirp, long, low-power sequence, or short, high power pulse to develop correlation peaks. Multiple correlation peaks detected by the CU indicate a contention, and the CU would instruct all RUs that were ranging to "flip the coin" and try again. Once only one RU was ranging and had hit the gap, the identification process would proceed by sending a sequence of whatever signal was sent for initial ranging (or some other easily detectable signal with strong correlation peak characteristics) in a predetermined unique sequence of sequential gaps as in FIGS. 5A–5C. Another alternative species is to perform the trial and error ranging process but eliminating the need for the identification sequence by sending ranging signals which are both easily detectable and unique to each RU. This complicates the CU receiver gap monitor circuit however since it must perform as many different correlations as there are different RUs. This can be done in parallel with a single correlator for each RU or in serial with a single fast correlator that performs multiple correlations on a buffer of samples of the signals received during each (or over whatever is the length of the sequence sent by the RU). Contention would be detected as multiple correlation peaks. Contention resolution would be by a message from the CU to the RUs to flip the coin. Once a single RU was ranging, it would adjust its transmit frame timing delay until it received a message from the CU that its correlation peak had a relative timing relationship to the start of the CU frames such that if the RU transmitter were to transmit with that transmit frame timing delay, its frames would arrive at the CU coincident with the CU frames and all frames of corresponding number from other RUs that were already in frame synchronization.

Another alternative embodiment within the class where the RU determines the proper transmit frame timing delay by trial and error generally comprises the following steps. The RU precomputes an 8 of 16 temporary RU ID which is randomly selected. The CU solicits for ranging transmissions. Each RU which wishes to range, transmits its temporary RU ID as 8 Barker code transmissions in 8 gaps of the next 16 RU frames (selected to match the temporary RU ID sequence) with a first iteration of transmit frame timing delay value. The CU generates a ranging status data comprised of 16 bytes, each bit of each byte representing whether a correlation peak occurred during a corresponding chip of the middle 8 chips of a corresponding gap. The CU reorders the 16 bytes into eight 16 bit fields, and transmits this data to all RUs over 4 consecutive frames as a ranging status message which includes data regarding which superframe the ranging status data applies to and the superframe during which the next ranging transmissions are to be made. Each RU receives the status message and stores it in memory and informs the RU computer of the presence of the message. The RU computer parses and scans the ranging status message and interprets the data therein according to the ranging protocol as follows. If all entries are zero, then all ranging RU conclude they have missed the gap and set a new value for their transmit frame timing delays and retransmit their temporary IDs in the next iteration of 16 frames at an activation time specified in the downstream ranging status message. The new transmissions arrive at the CU, and one byte of raw ranging status data is stored in a FIFO memory in the CU. The CU controller initiates a DMA transfer of the FIFO data, and processes the raw ranging data into a new ranging status message and submits valid RU IDs to a training input queue. If the ranging status message analyzed by the RU controller indicates more than one pulse in some gaps, a collision has occurred. If an RU does not find its temporary ID in the status message, it assumes it was involved in the collision, and performs its contention resolution algorithm as described elsewhere herein. If an RU finds its temporary ID in the ranging status data, it is authenticated and in the gap. By looking at the positions of the pulses of its temporary ID in the gap, the RU determines how far off center it is from the middle of the middle 8 chips, and calculates its own offset and applies it to its transmit frame timing delay. The RU is now ready for equalization training. A variation of the above protocol is demand ranging where, after a power failure that would result in all RUs attempting to recover simultaneously thereby swamping the contention resolution mechanism, each RU is addressed individually by its RU ID and asked to begin ranging.

The other class of ranging embodiments involves the CU calculating the total turnaround time to each RU and instructing each RU as to how much transmit frame timing delay to use. In this class, the CU sends a marker signal which can be easily detectable by the RU receivers. Each RU trying to range, then immediately transmits back the same easily identifiable signal which can be detected by the CU receiver even if it arrives during the middle of a frame of payload data. Such a signal can be a chirp, a high-power, narrow pulse or a long sequence of chips that spreads out over one or more frames. The CU detects the correlation peak of the signal and compares it to the time of transmission of the original marker signal. The difference is the total turnaround time or TTA. The CU then sends a message to the RU to identify itself which can be done by the "Morse code" authentication sequence, or in one of the other ways identified above for the first class of ranging embodiments. Once the CU knows the RU's identity and its TTA, the CU can send a message to the RU instructing it as to how much transmit frame timing delay to use to achieve frame synchronization, and the RU sets this amount of delay for transmission of every frame.

Note that in these alternative embodiments of both classes where the ranging signal transmitted by the RU can be detected over the noise of payload data where it arrives at the CU during a frame such as in the embodiments using a large-amplitude, easily detectable pulse or a long sequence which stretches out over one or more frames and which can be detected by a correlator, there is no need for a gap in every frame. The only requirement in high, throughput SCDMA systems is that the RU frames arrive synchronously with correspondingly numbered frames from other RUs (lower throughput CDMA systems do not require frame synchronization). If that timing relationship can be achieved without a gap, then there is no need for a gap. For example, in the case of a narrow, large amplitude pulse, when the RU transmit frame timing delay is set so that this pulse arrives at the beginning of the correspondingly numbered frames from other RUs, then the RU has achieved frame synchronization. In the case of a long sequence that spreads out over, for example, two frames, where the correlation peak is found at the end of the second CU frame, this would mean that if the RU starts a frame transmission at the time it started transmission of the long sequence, that frame will arrive coincident with the CU frame boundaries and therefore, will also be coincident with the frame boundaries of other correspondingly numbered RU frames. Any methodology to achieve this frame synchronization is within the teachings of the invention.

Resynchronization when the CU Changes its Delay Vector

The process of adjusting the delay vector used by the CU in transmitting its trigger signal Barker code can result in loss of synchronization by all RUs in the system unless something is done to prevent this before the CU changes its delay. That is, when the CU shortens its delay vector, the RUs closer to the CU than the furthest RU will all go out of alignment unless certain measures are taken to forewarn them of the coming change. There are 3 different embodiments of processes for realigning all of the RUs when the CU changes its delay vector. The preferred one of these embodiments is symbolized by the flow chart of FIG. 7 and involves activity prior to the CU changing its delay vector to prevent loss of synchronization by all RUs when the CU changes its delay.

Figure 6:
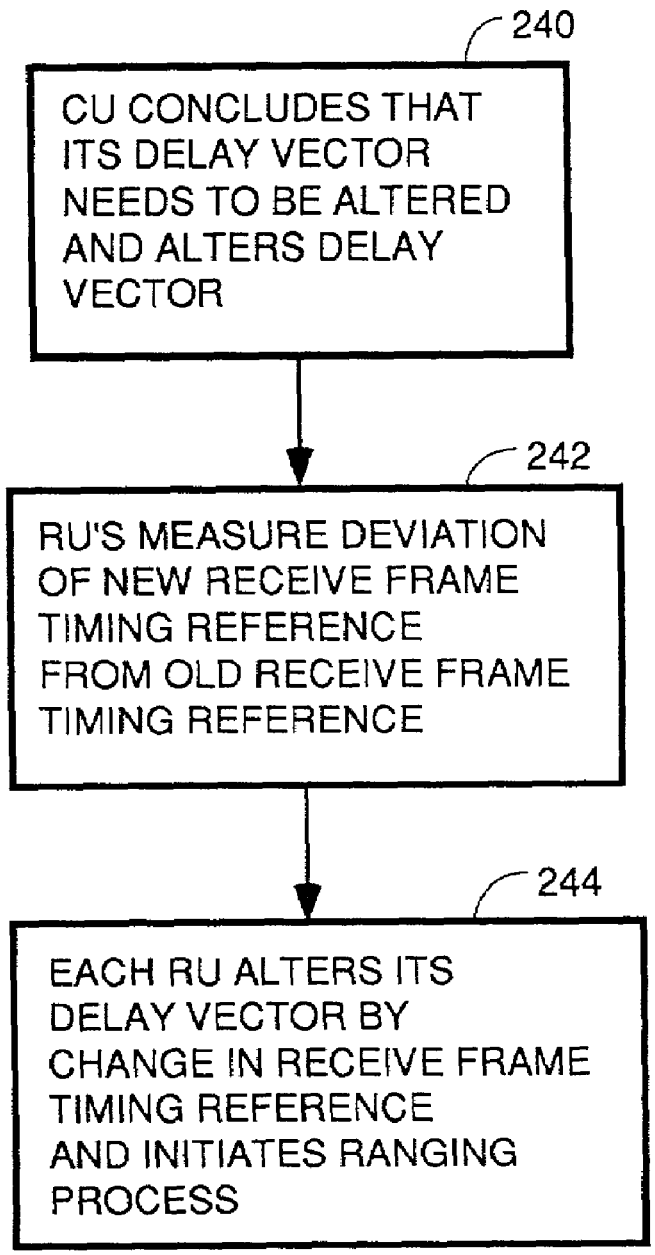
FIG. 6 is a flow chart illustrating one embodiment of how re-synchronization to frame boundaries can be achieved by dead reckoning after the CU changes its delay vector.

The first of these processes is shown in the flow chart of FIG. 6. This process will be called the dead reckoning resynchronization process for lack of a better term. In this process, the CU concludes, in block 240, that its delay vector needs to be altered in order to keep the farthest RUs in alignment. This conclusion can be drawn in any one of a number of different ways such as by monitoring the farthest RU for continued alignment after the farthest RU tells the CU that it is aligned with the shortest possible delay vector in use. Or, alternatively, the CU can send out a message to the farthest RU periodically inquiring as to whether it is still aligned. This message can take the form of a request for that RU to transmit its authentication signature and then monitoring the next few frames of an authentication interval to determine if that farthest RUs authentication signature shows up in the authentication interval gaps. If the CU concludes in block 240 that it needs to alter its delay vector it then alters the delay vector.

As noted previously, because the CU uses the same delay vector during every frame in transmitting its Barker code trigger signal, the RUs have a predictable periodic signal from the CU upon which they can rely to measure the timing change made by the CU. In other words, the time of arrival of the Barker code from the CU during each frame is predictable to each RU, and when it changes, the RUs can measure by how much it changed. When the Barker code from the CU does not arrive at the predicted time, the RUs know that the CU has just altered its delay vector. The RUs then measure the deviation of the new receive frame timing reference, i.e., the time of arrival of the Barker code trigger signal from the CU, by measuring the difference between the old receive frame timing reference and the new receive frame timing reference. This process is symbolized by block 242.

Finally, each RU realigns itself in the process of block 244. In this process, each RU alters its delay vector by an amount equal to the change in the receive frame timing reference. Then each RU initiates a ranging process. The CU monitors the gap at the end of every frame so any RU can initiate ranging at any time.

Figure 7:
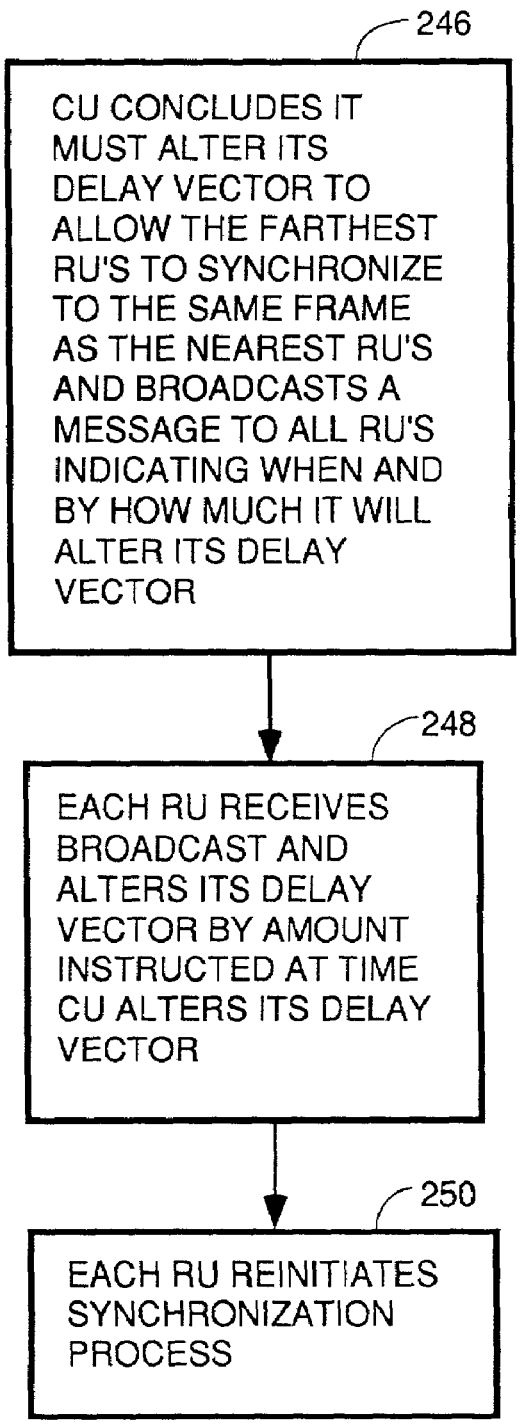
FIG. 7 is a flow chart illustrating another embodiment of how re-synchronization to frame boundaries can be achieved by a downstream instruction from the CU after the CU changes its delay vector.

FIG. 7 represents the preferred process for resynchronizing all RUs after the CU has changed its delay vector. This process will be called the precursor embodiment herein. This process starts with block 246 wherein the CU concludes that it must alter its delay vector to allow the farthest RUs to synchronize to the same frame as the nearest RUs. The CU, after reaching the conclusion that a change in its delay vector must be made, broadcasts a message to all RUs indicating when and by how much it will alter its delay vector.

Next the process of block 248 is performed wherein each RU receives the broadcast and alters its delay vector by an amount equal to the amount that the CU will be changing its delay vector at the specified time. That is, each RU alters its delay vector by the amount instructed by the CU at the time indicated in the message from the CU that the CU will alter its delay vector.

Finally, the process of block 250 is performed wherein each RU reinitiates a synchronization process.

Both of the embodiments of FIGS. 6 and 7 will result in little or no loss of data because each RU resynchronizes very rapidly. This result follows because each RU's delay vector is immediately set at the delay needed for synchronization at the time the CU alters its delay vector thereby eliminating the delay of the trial and error incrementation of the delay vectors.

The final embodiment for resynchronizing after the CU changes its delay vector is for the CU simply to broadcast the message to all RUs saying, "You must all now realign as I have just changed my delay vector." Each RU then re-enters the alignment process symbolized by FIGS. 5A, 5B, and 5C. This process is repeated by each RU until all RUs are aligned.

Note that in the ranging process described above, it is the RUs that determine how far they are from the CU rather than the CU determining how far each RU is from it. The advantage of having the RUs doing the ranging is that the CU does not have to stop payload traffic on the various channels to perform ranging functions each time a new RU enters the system or an existing RU loses synchronization. In a system where the traffic may frequently include high demand applications such as real time video, stopping traffic flow for ranging is not a viable possibility because it would interrupt the flow of video information and disrupt the subscriber's video conference, movie etc. In the ranging system described herein in its various embodiments, there is no need to stop traffic since the ranging process is done out of band, i.e., in the gaps. Further, because the transmitted power of the Barker codes is low and correlation processes are used, the process can start blind with any trial and error timing value without interfering with channel traffic. That is, even if the Barker code transmitted back toward the CU by the RU has improper timing and lands somewhere outside the gap, its power level is low enough to not cause substantial interference, and even if some small amount of interference is caused, the chips of the symbols transmitted during the frame have enough redundancy with the Trellis encoded modulation to recover from the interference without an error. Because correlation to a known Barker code pattern (the same Barker code pattern the CU transmitted to the RUs during the previous gap) is used by the CU to determine whether it has or has not detected a Barker code from an RU in the gap, the RUs can transmit their Barker codes at very low power levels so as to avoid interfering with traffic and causing errors in the data of the various payload channels during the trial and error process of setting their transmit frame timing delay values $T_d$ so as to hit the gap.

Of course for embodiments where the ranging signals can be detected even when they arrive in the middle of the frame and do not interfere with payload data reception, traffic does not have to be stopped during ranging. As is apparent from the foregoing discussion, there is no need to preset an approximation of the correct transmit frame timing delay into the RUs before they start and then fine tune the delay since even a gross misalignment will not cause any appreciable errors in the payload data. Since Trellis coded modulation and a redundant bit are used in each tribit of payload data, any errors caused by misalignment can be detected and corrected by forward error correction without the need for retransmission. In other embodiments however, conventional ranging techniques could be used where the CU measures the range to the RUs to establish synchronous CDMA, and the particular ranging species initiated by the RUs described herein are not required to practice the invention of a system with a CU with no tracking loops.

In the high power pulse embodiments described above, the RUs act like transponders by sending a narrow, high amplitude pulse upon receipt of a trigger signal from the CU. The trigger signal from the CU could be a special pulse, a Barker code, etc. If the RU was misaligned, and the large amplitude pulse landed in the middle of the upstream payload data, the CU would ignore the particular chip which was "stepped on" by the high amplitude pulse. The payload data could still be recovered because the bandwidth of the payload data has been spread so widely using direct sequence CDMA spreading. Trellis code modulation is not needed for this scheme to work. After detecting the RU's pulse and comparing its timing with the position of the frame timing reference, the CU would ask the RU for its identity and the RU would send it by any conventional manner such as pulse position modulation, amplitude shift keying etc. The CU would then send a message to the RU instructing it to change its transmit frame timing delay in a direction to put the pulse closer to the fixed timing reference, and this process would continue until the RU hit the timing reference. Note in this method, that a gap or guardband is not needed in each frame.

Boundless Ranging

Note that in the ranging embodiments described above, it is assumed that the "span" of the system, i.e., the difference between the TTA of the farthest RU and the TTA of the nearest RU, is smaller than one frame time. When this is true, all RUs can align to the same gap. When all the RUs are aligned to the same gap, and the CU knows the total turnaround time, dynamic code assignment can be used where the CU informs the RUs by downstream management and control messages what codes each is supposed to use. The CU will then know what codes to use and when to use them in decoding signals from each RU because both the RUs and the CU count frame numbers for the CU frames and all code assignments to the RUs are in terms of CU frame numbers.

In very large systems, the span may exceed the frame time, and to force the span to be less than the frame interval would unreasonably constrain the system size. When the span of the system is greater than the frame time, an accounting problem arises because not all the RUs can align to the same gap. This means that the CU will not know which codes each RU used to spread the spectrum of its payload data, unless it knows the total turnaround time to each RU. In other words, each frame transmitted by the CU downstream to the RUs is numbered by virtue of a kiloframe marker signal encoded in the pilot channel carrier tone. The RU receivers detect this kiloframe marker and count individual received frames and thus know what frame number each received frame from the CU is. If the span of the system is less than one frame interval and each RU is aligned to the same gap, each RU will know that when, for example, CU frame 99 is received, the next set of frames transmitted by the RUs all will arrive at the CU at the same time, i.e., the beginning of the next frame at the CU and all those RU frames will have frame number 100 assigned to them by the CU and will be despread and decoded together. In this situation, downstream instructions to RU #1927 to use codes #55 and 57 during frame 100 and to RU #3 to use code #3 during frame 100 make sense, and the CU can properly decode the data from each of these RUs because it knows which codes each used during frame 100. Suppose however that RU #1927 is aligned to the next sequential gap following the gap to which RU #3 is aligned. This means that when frame #99 is received from the CU, the frame transmitted by RU #3 in response to frame #99 (the downstream data of frame 99 if offloaded, new upstream data is loaded, and the frame is "retransmitted" back toward the CU) will be numbered 100 when it arrives at the CU. However, the frame transmitted by RU #1927 in response to receipt of frame #99 will arrive at the beginning of CU frame #101 and will be treated by the CU as RU frame #101. If the CU does not know that RU #1927 is not aligned to the same gap as RU #3, it will assume that RU #1927 and RU #3 are both using the codes assigned to them for frame 100, when RU #1927 is actually using the codes assigned to it for frame #101.

One remedy for this accounting problem is for the CU to know the TTA or total turnaround propagation time for each RU and transmit that TTA for each particular RU to that RU.

Each RU then uses its TTA time plus the kiloframe marker encoded in the pilot channel (or transmitted downstream in any other way) to keep track of what frame number each received CU frame is and what frame number will be assigned by the CU to the next RU frame transmitted in response to receipt of the CU frame. This allows the RU to use the proper assigned orthogonal, pseudorandom spreading codes assigned by the CU for each frame since the RU will know what frame number will be assigned by the CU to each of the RU's frames and knows that the code assignment messages from the CU are based upon the frame numbers assigned to RU frames by the CU.

The actual algorithm carried out in the CU to calculate TTA for each RU to support boundless ranging in this particular embodiment is quite simple. This algorithm happens after the RU whose TTA is being calculated has successfully completed the ranging process and is aligned with some gap. The CU sends a frame to the RU. The frame itself has no frame tag number, but the kiloframe markers in the pilot channel data allow the RU's to count received CU frames using a local counter. Meanwhile, as the CU sends frames, its frame count continues to rise. In response to the received frame, the RU sends a frame back to the CU along with a TTA_service_request which includes the RU frame tag number for the transmitted frame which is equal to the local counter value. In other words, the RU frame tag number sent back with the TTA_service_request matches the CU frame number of the frame just received as determined by the local counter value. When the RU's frame reaches the CU, the CU subtracts the RU frame tag number from the CU's current frame tag count. This difference times the frame interval is equal to the TTA for that RU. The multiplication times the frame interval is not actually necessary since the RU only needs to know how many complete frames behind the current CU frame count each one of the RU's transmitted frames will be in order to use the proper codes for each frame.

High Level Transceiver Block Diagram

Figure 8:
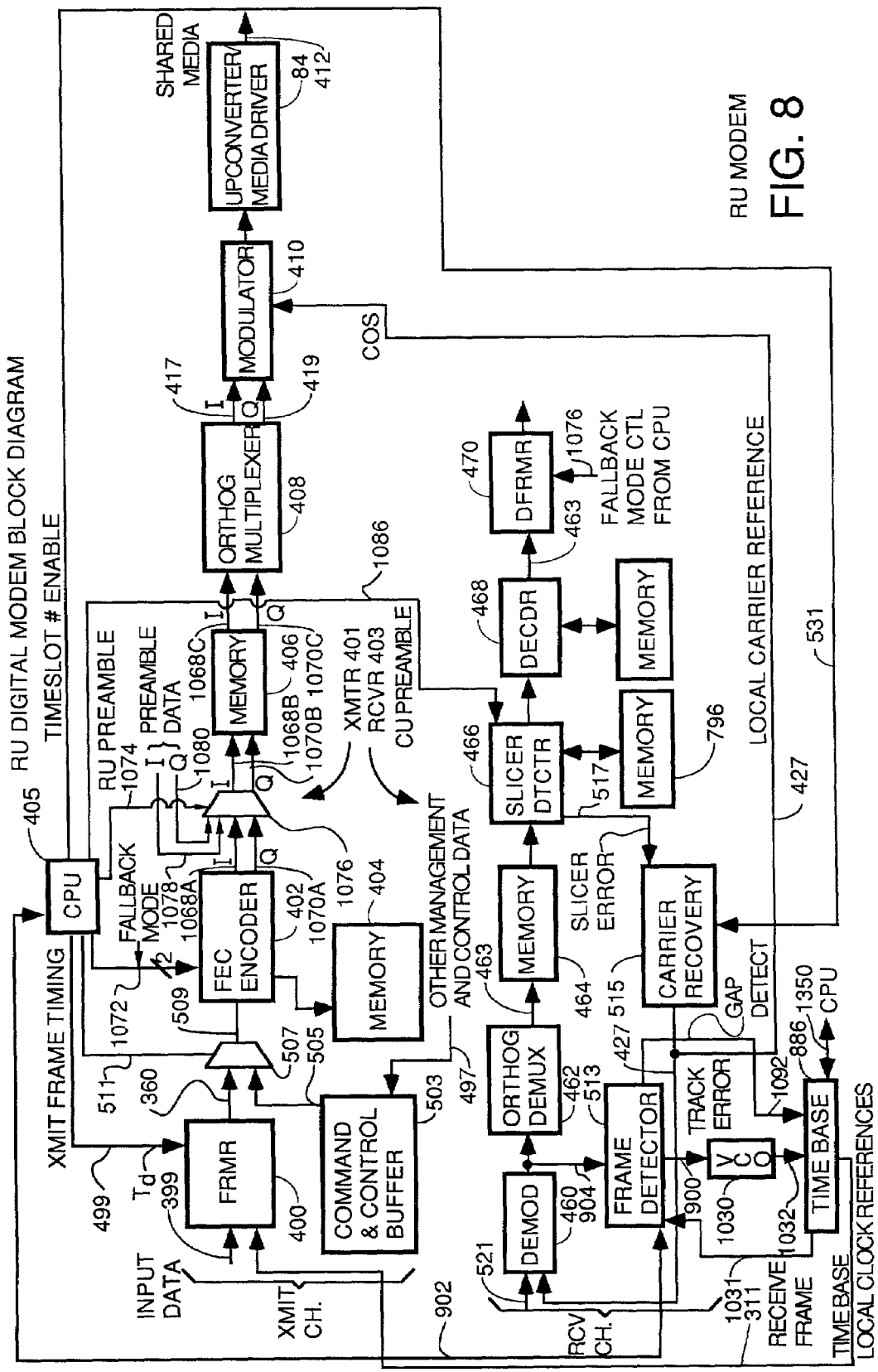
FIG. 8 is a block diagram of an RU modem according to one embodiment of the invention.

Referring to FIG. 8, there is shown a high level block diagram of the preferred species of a transceiver for use in the modem of each RU. The CU modem is similar except that it does not have tracking loop circuitry that tracks the carrier and clock signals transmitted by each RU. Instead, the CU circuitry includes circuitry such as that illustrated at 32 in FIG. 1 to periodically correct the phase difference between the master carrier and master clock signals and the carrier signals and clock signals transmitted by each RU based upon preamble data. A block diagram of the CU transceiver is given in FIG. 28.

The circuitry of FIG. 8 that is common to both CU and RU versions will be described below, and the differences between CU and RU versions will be individually discussed where appropriate. If no specific mention is made regarding whether a circuit is in the RU or CU versions, the reader should assume it is identical for both versions.

The transmitter 401 of the transceiver uses a framer circuit 400. The function of the framer is to receive one or more streams of digital data via data path 399 from one or more sources and to organize this data into a plurality of frames, each frame comprised of one or more symbols. In the preferred embodiment, the framer circuit 400 composes the frames of data from a TDMA data stream on bus 399 where each timeslot corresponds to one channel, a channel being a logical construct indicating data on this channel will be kept separated from data on the other channels even though a shared transmission media is used and will appear to the user to have arrived on its own media dedicated solely to it. There are 128 payload data channels to share among all users and there are 16 management and control channels some of which are also shared for a total of 144 channels or timeslots. Each RU may be assigned one or more channels or timeslots depending upon the amount of bandwidth it has been awarded by the CU in response to requests for bandwidth from the RU. In addition, bandwidth may be reserved to the various RUs on a permanent basis in some embodiments, and in these embodiments, the channels or timeslots may be permanently assigned or the reserved number of channels may be assigned on a guaranteed basis each time the RU requests bandwidth.

It is not critical to the invention that the incoming data streams arrive in a TDMA stream on bus 399. The streams of data from peripheral devices or networks could, in alternative embodiments, arrive via FDMA on bus 399 or each source of data could be connected to the framer circuit 400 by a separate input bus.

The framer circuit 400 and its associated circuitry implement the variable delay that sets the variable transmit frame timing reference for each RU to achieve frame synchronization by the ranging process described above. This transmit frame timing reference establishes the timing of transmission of the orthogonally CDMA encoded chips of each frame such that all frames arrive from each of the physically distributed RUs at the CU at the same time and aligned with the CU frame boundaries. Although, the invention still works even if frame synchronization is not maintained because of the orthogonality of the CDMA codes which are used, it does not work as well since the maximum number of users which can be simultaneously sharing the available payload channels is limited. This is because there are higher levels of crosstalk between CDMA codes when frame timing synchronization between all RUs and the CU is not maintained. Therefore, each RU undergoes the ranging process described above after first powerup and from time to time thereafter to properly set its transmit frame timing delay to achieve frame synchronization. The transmit frame timing delay $T_d$ is learned by cooperation between the transmitter 401, the receiver 403 and the CPU 405 in the RU which is ranging and the counterpart devices in the CU by virtue of communication between the RU and CU on the management and control channels. The CPU changes the value of $T_d$ on line 499 until frame synchronization is achieved and thereafter maintains that value of $T_d$ until ranging is performed again.

The particular manner in which frame synchronization is achieved is not critical to the invention, and other processes can be used such as by trial and error correlation of a selected data string spread by a selected CDMA code transmitted at differing values of $T_d$ with the signal from another RU which is known to be in frame synchronization which comprises the same data string spread by the same selected CDMA code.

The framer circuit 400, in the preferred TDMA input bus embodiment, bridges the two time domains between the TDMA input data and the chip clock code domain (reading of the framer circuit is done at the chip clock rate and writing is done at the byte clock rate at which timeslots of data are written one 9-bit byte at a time). The output data stream from the framer circuit 400 comprises three arrays of tribits per frame, each array of tribits representing an information vector which, after encoding by the orthogonal multiplexer 408, is transformed into one symbol of chips. In the preferred embodiment, the orthogonal multiplexer 408 is a code division multiplexer which uses a plurality of orthogonal cyclic codes, each code being used to encode the data from a different channel. This is a so-called direct sequence type spread spectrum operation wherein the bandwidth of the baseband signals on buses 1068C and 1070C are spread across a broad spectrum by the CDMA codes using orthogonal code multiplexer 408 in FIG. 8. This is because of the much higher clock rate of the chip clock used to drive the multiplication of the individual information vector elements times the code elements.

In an important class of alternative embodiments, the orthogonal encoding multiplexer 408 could be any encoder which encodes each channel with a different orthogonal waveform for purpose of multiplexing to keep data from different sources separate. For example, these orthogonal multiplexer could store digital samples that define a plurality of orthogonal sine and cosine waveforms, each at a different frequency. Any other set of orthogonal waveforms of different frequencies other than sines and cosines would also work to encode the various channel data samples. Each channel's data would then be multiplied by a different waveform's samples to generate new digital samples which define orthogonally encoded data on buses 417 and 419 for modulation onto the RF carrier frequencies. In such embodiments, the bandwidth of each channel's data is not spread as wide as in a CDMA system. In fact, each channel's data would be dumped into a narrow bandwidth frequency bin. In such systems, the orthogonal demultiplexer, i.e., decoder 462 in FIG. 8 would perform the inverse transformation on the received samples to bring them back to baseband signals on bus 463. For example, the orthogonal code multiplexer 408 could be an inverse Fourier transform processor. The inputs to the inverse Fourier transform processor 408 in this alternative embodiment would be the information vector elements on buses 1068C and 1070C. Each of these information vector elements would define the magnitude of one frequency component in the Fourier spectrum of the output signal to be generated. The inverse Fourier transform processor would then calculate the time domain waveform that would have that Fourier spectrum and output digital samples that define that time domain waveform on buses 417 and 419. These samples would be used to modulate one or more RF carriers in accordance with whatever modulation scheme was being used. The receiver's demultiplexer/decoder 462 on the receiving end of the transmitted signal then performs a Fourier transform on the incoming signal samples to output the individual frequency components the magnitudes of which define the original information vector components.

Note that each information vector element in this embodiment always defines the magnitude of the same frequency component. In an alternative multitone system, the information vector elements can be pseudorandomly scrambled in the transmitters so that they define different frequency component magnitudes in each frame and then pseudorandomly descrambled in the same order in the receivers.

In SCDMA direct sequence spread spectrum transmitters of the preferred embodiment, the three information vectors output during each frame are converted by CDMA spreading to the three symbols that are transmitted during that frame. The data in each information vector spans the entire 144 timeslots in the sense that three bits from each timeslot or channel are present as the elements of the information vector as a tribit. This interleaving of data from each timeslot into each information vector is preferred but not critical to the invention. Likewise, the transmission of three symbols per frame is not critical to the invention and fewer or greater numbers of symbols could be transmitted.

In the preferred embodiment, the circuitry of the transceiver is virtually all digital, so the arrays of tribits are true arrays, the elements of which are used sequentially in the matrix multiplication to perform the CDMA spreading.

In analog embodiments, the arrays of tribits will be streams of tribits, with three separate streams per frame.

Before finishing the description of the rest of the transceiver circuitry in FIG. 8, the framer circuit 400 will be described in more detail. The RU's and CU all utilize framer circuitry to implement the delays needed to achieve frame synchronization. The framer is comprised of a FIFO memory and supporting circuitry that stores incoming digital data from the time division multiplexed data stream received by each RU and CU. The difference between the RU and CU framer circuitry is that the CU does not change its transmit frame timing delay except in the situation described above of network expansion which raises the need for the CU to change its delay so that the farthest RUs can synchronize to the same gap as the nearer RUs. The symbols of each frame are composed by outputting the data from the FIFO memory in a different way than it was loaded during each frame. The basic idea is to pass the 9 bit groups of bits from each time slot through the analog of a FIFO delay line implemented by a memory so as to simultaneously implement the delay imposed by each RU and CU needed for frame synchronization while providing a convenient way to compose the symbols of each frame from the data in the TDMA data stream.

Figure 9:
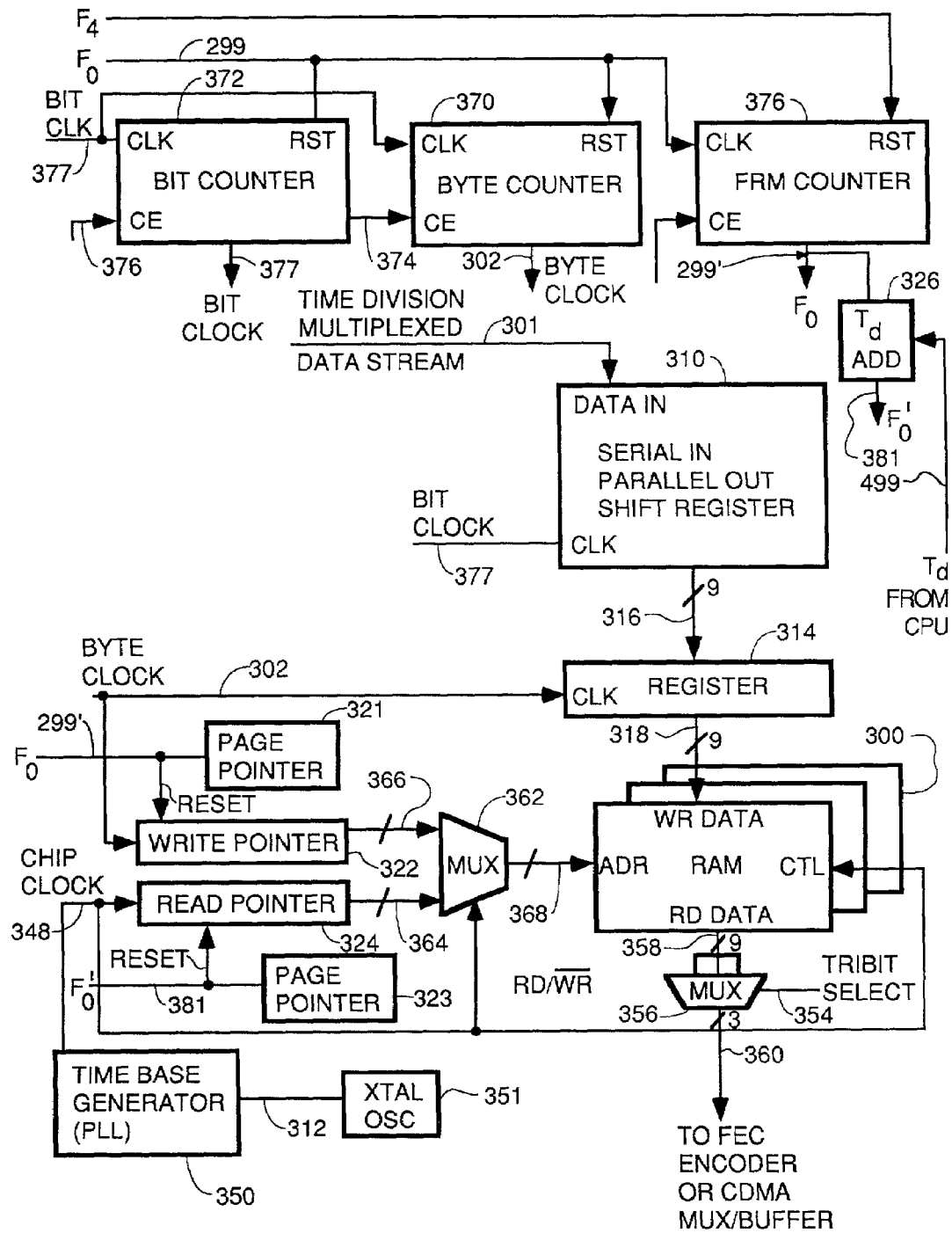
FIG. 9 is a block diagram of a framer circuit for use in the CU and RU transmitter sections.
Figure 10:
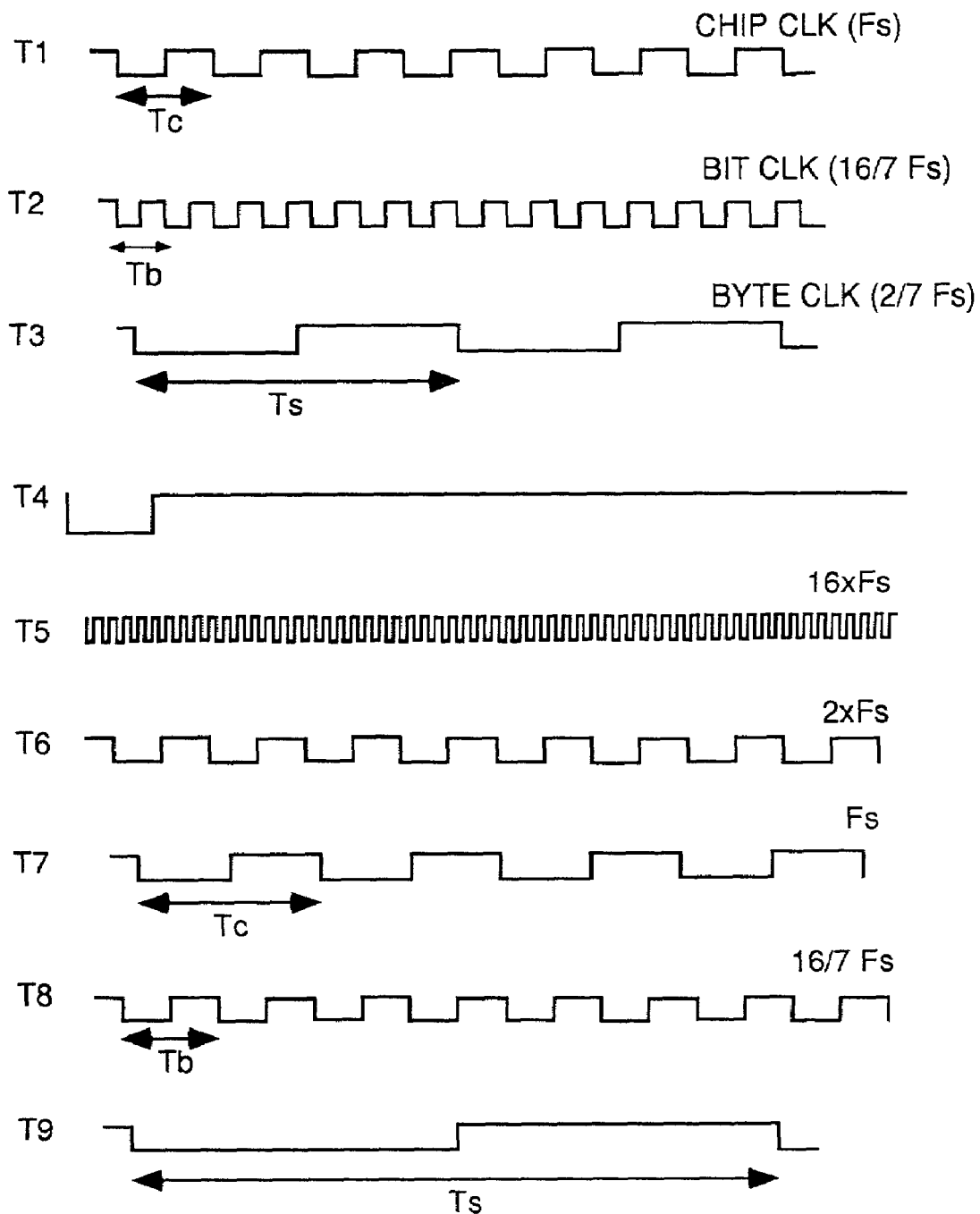
FIG. 10 is a timing diagram illustrating the relationships of various clock signals in one embodiment of the system.

FIG. 9 shows the circuitry that implements the framer in the preferred embodiment, and FIG. 10 shows the timing relationships between the chip clock signal which sets timing in the code domain and the bit and byte clocks which set timing in the time domain. FIG. 10 also shows a number of other signals generated by time base generator 886. The basic period from which all other signals are generated is the chip clock signal shown on time line T1 of FIG. 10. The relationships between the periods of the various signals in FIG. 10 is shown in parentheses at the right edge of each signal. For example, for the bit clock signal shown on time line T2 of FIG. 10, for every 7 periods of the chip clock signal, there are 16 periods of the bit clock signal. For every 7 periods in the chip clock signal, there are two periods in the byte clock signal shown on time line T3 in FIG. 10. Handling of the TDMA input data stream is synchronized to the bit clock and byte clock signals.

The chip clock signal on line 348 of FIG. 9 is generated by a time base generator PLL 886 and is synchronized with the TDMA data stream by the action of the PLL in keeping both the chip clock and bit clock signals synchronized with the master clock reference signal. To this end, the received signal including the Barker code sent by the CU which has the master clock signal embedded therein is fed into the tracking loop of FIG. 11 on line 312. In the CU receiver, line 312 comes from a from a crystal-controlled oscillator 351 (which is preferably temperature compensated). The crystal oscillator 351 is only present in the CU versions of the modem since the local clock signals generated by the RU modem time bases are phase locked to the recovered master clock signal transmitted by the CU (preferably embedded in the Barker code). Thus, the RU framer circuits receive their time base signals from time base circuits like the circuit 886 in FIG. 8 which is kept synchronized to the master clock signal by the frame detector 513, PLL 1030 and time base 886 in FIG. 8. The local chip clock signal of the local clock reference signals on bus 311 are synchronized in phase to the recovered master chip clock signal from the CU.

A block diagram of the tracking loop 350 in the RU receivers is shown in FIG. 11. In FIG. 8, the tracking loop in the RU receiver is shown generally as comprising frame detector 513, the tracking error signal on line 900, a voltage controlled oscillator 1030 and time base circuit 886. In FIG. 9, time base generator PLL is supposed to represent all this tracking loop circuitry.

The details of the tracking loop are set forth in FIG. 11. A voltage controlled oscillator 353 operating at a frequency of 14.336 MHz sets the basic operating frequency. The output frequency of the VCO on line 357 is multiplied by a factor or four by multiplier 359 to generate a high speed clock signal at 57.344 MHz on line 367. This oscillator 353 corresponds to VCO 1030 in embodiments like that shown in FIG. 8. A bit clock signal on line 377 is synthesized by dividing the frequency of the high speed clock signal on line 367 by a factor of 7 in a divide-by-seven counter 369 to generate a bit clock signal having a frequency of 8.192 Mhz. A chip clock signal on line 348 is generated by dividing the high speed clock signal on line 367 by a factor of 16 in a divide-by-16 counter 371 to generate a chip clock signal having a frequency of 3.548 Mhz. The multiplier 359, divider 369 and divider 371 together corresponds to the time base circuit 886 in embodiments like that shown in FIG. 8.

The bit clock and chip clock signals are kept synchronized in RUs to the master clock signal by a phase detector 373 which compares the phase of the received signal on line 312 to the phase of the bit clock signal and outputs a signal which is coupled to the frequency control input 375 of the VCO through a low pass filter 397. The bit clock and chip clock signals in the CU modem are kept synchronized to the master clock signal on line 312 from a crystal control oscillator. In the RUs, the phase detector 373 takes the form of the clock recovery circuits in the frame detector described elsewhere herein coupled with a phase detection circuit that compares the phase of the recovered clock to the phase of the bit clock signal. The phase detector circuit 373 and low pass filter correspond to the frame detector circuit 513 in the block diagram of the RU transceiver shown in FIG. 8.

The relationships between timing in the time domain and timing in the code domain are as follows:

There are 144 total time slots or channels in the TDMA stream, of which 128 are payload time slots and 16 are management and control time slots;

Each time slot or channel in the TDMA streams carries 9 bits of digital data synchronized with the bit clock;

One time slot worth of data or 9 bits is stored in the framer for each cycle of the byte clock;

1 frame=144 times slots, each with 9 bits plus 16 chips for the alignment gap;

1 frame also equals 3 symbols plus the 16 chip periods of the alignment gap 448 chip periods;

1 symbol=144 chip periods;

1 gap=16 chip periods;

For every 16 bit clock periods, there are 7 chip clock periods, and for every byte clock period, there are 9 bit clock periods.

To implement the delay necessary in each RU and CU transmit channel circuitry to maintain frame synchronization, consider the following with reference to FIG. 9. The data stream coming into the framer circuitry during each time slot is stored in a different address in memory 300 in FIG. 9 at the data rate of the byte clock signal on line 302. The byte clock signal on line 302 is generated by a byte counter 370 shown at the top of FIG. 9 which generates a byte clock signal transition on line 302 every 9 cycles of the bit clock signal on line 377 from the time base generator 350. Memory 300 is a three page memory and the addressing circuitry of FIG. 9 controls the address and data ports such that data is written into and read from the two pages by alternating the use of these buses. Data from the time slots/channels in the time division multiplexed stream of serial data on line 301 is shifted serially into a serial-in, parallel-out shift register 310 at the bit clock rate of the signal on line 377. The byte clock signal on line 302 causes a register 314 to store the current 9-bit, parallel format output of the shift register on bus 316 after each 9 new bits are shifted into shift register 310.

The 9 bit parallel format output of the register 314 is presented on 9-bit bus 318 to the write data input port of memory 300. Thus, a new 9-bit group of data from the TDMA stream is presented for storage on each cycle of the byte clock signal. Each 9-bit group of data from the TDMA stream is stored in a different memory location of memory 300 as will become clear from the discussion of the address generation circuitry described below.

Data is read out of memory 300 at the same rate at which it was stored, but starting at some programmable time after the data is stored, thereby implementing the variable delay needed to maintain frame synchronization with the CU frame timing. This programmable delay $T_d$ is set by the difference in addresses between the address stored in a receive frame counter (read pointer) and the address stored in a transmit frame counter 324 in FIG. 12 (write pointer).

To illustrate this concept, FIG. 13 represents portions of memory 300 with the stippled portions 306 and 308 representing the number of addresses difference between the position of the read pointer and the position of the write pointer to implement the delay $T_d$. The cross hatched portion 304 represents one frame of 9-bit bytes while the stippled portions 306 and 308 represent the amount of the delay $T_d$, where portion 306 represents a portion of the delay $T_d$ expressed in full 9-bit bytes, and portion 308 represents the remainder of the delay $T_d$ expressed as part of a single byte. In other words, the delay $T_d$ may be some fraction of the number of bit clocks making up an entire 9-bit byte. This is because the delay needed to maintain frame synchronization may not work out to be an integer number of byte clocks.

FIG. 9 shows how the time delay $T_d$ is implemented using a receive frame counter 322 that generates the write pointer address controlling where incoming data is stored in the memory 300 and a transmit frame counter 324 that generates a read address pointer that controls the read address from which data is read for transmission. The F_sync signal on line 326 resets the write pointer in counter 322 to zero at the beginning of each new frame. A modulo adder 326 adds the number of chip clocks based upon the desired time delay $T_d$ to the output write pointer on bus 328 and inputs the result into the transmit frame counter 324 as the read pointer. The value of $T_d$ is varied on a trial and error basis during the synchronization process until the gap is hit and the CU sends a message to whatever RU is synchronizing telling it to freeze $T_d$ at the value that caused the gap to be hit by the Barker code.

FIG. 14 is a memory filling diagram that illustrates how entire 9-bit bytes are received continuously, while 3-bit tribits for each of 144 channels are sent out simultaneously to compose the symbols of each frame. FIG. 14 graphically illustrates how the frame memory 300 fills and is emptied during this process. Frame memory 300 has 144 memory locations corresponding to the 144 channels of the system on each of three pages. While one page is being filled, another page is being simultaneously emptied at the same rate. Each memory address on each page can store the 9 bits of data from one of the 144 time slots in the TDMA stream. 16 memory locations on each page are reserved for the storage of management and control data to be sent across the 16 management and control channels. In FIG. 14, address numbers increase with an increasing Y coordinate.

At time (0) in FIG. 14 (the leftmost column), page one of the memory is shown as completely full with one frame of data comprised of three vertical columns of three crosshatched blocks apiece. Each column of three blocks, such as blocks 334, 336 and 338 represent one symbol, each symbol having 48 tribits therein. The middle column of FIG. 14 represents the state of fill of the memory after transmission of the first symbol comprised of blocks 334, 336 and 338. The rightmost column of FIG. 14 represents the state of fill of the memory after transmission of symbol 2 comprised of blocks encircled by dashed line 334.

The width along the X axis of each individual crosshatched block in FIG. 14 is equal to the 3 bits of a tribit, and the entire width of a column of blocks is equal to the 9 bits of a time slot. The positive x direction represents increasing time in the time domain. In other words, the first 9-bit byte that is stored is stored in the lowest row of the lowest three blocks in the left column with increasing time in the TDMA stream extending from left to right.

The blocks surrounded by dashed line 332 in the leftmost column represent 144 memory locations, each storing the 9 bits from one of the 144 time slots in one frame of data. The three crosshatched blocks 334, 336 and 338 represent the first symbol of the first frame, each symbol storing 48 tribits. Note in the middle column, after transmission of the first symbol in the frame, these three blocks are gone. Note also that the data of symbol 1 is read out of the memory "across time", i.e., along the y axis, thereby interleaving the data from the first tribits of individual channels in the time domain into different temporal relationships in the code domain and spreading out the energy of the time slot data over the entire frame interval. This is part of the teaching of code division, multiple access or CDMA modulation schemes, but is not critical to the invention. Interleaving of data improves the immunity of the data to burst noise.

The three blocks within dashed box 334 in the middle column of FIG. 14 represent the second symbol of data that is to be transmitted in the first frame. Note that these three blocks are gone in the rightmost column representing the state of page one of the memory fill after transmission of the second symbol.

While the first and second symbols are being transmitted, another page of the memory 300 continues to fill up as the data from new timeslots is received. For example, while symbol 1 from page 1 of the memory is being transmitted during the first frame, the data in the three blocks encircled by dashed line 336 in the middle column is received in page 2 of the memory and stored. Thus, while one third of the data from page 1 is read and transmitted, one third of page 2 of the memory is filled with new data. Likewise, while the second symbol of page 1 is being transmitted, the data represented by the three blocks encircled by dashed line 338 in the right column is received and stored in page 2 of the memory.

Figure 15:
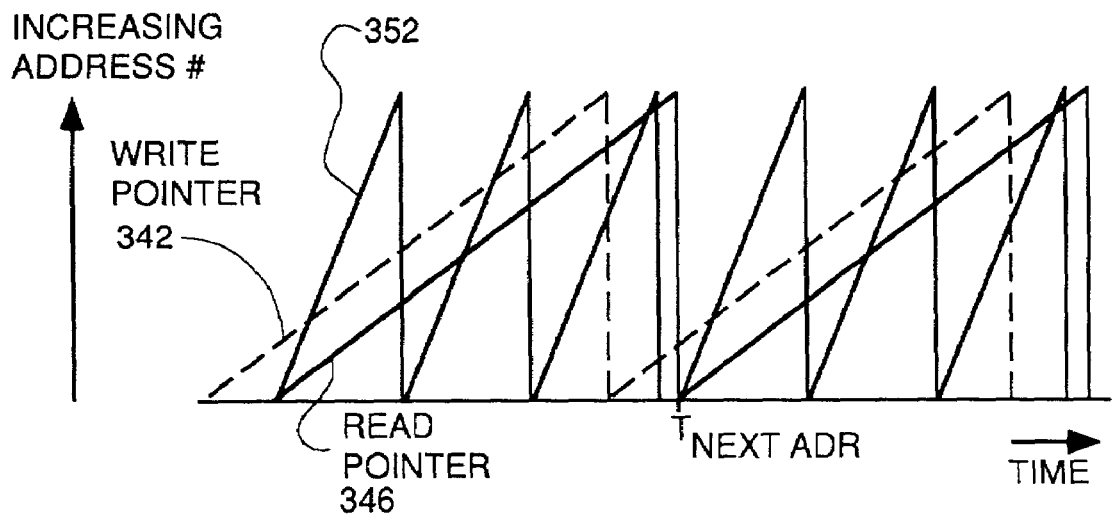
FIG. 15 is a diagram illustrating the timing relationships between the read and write pointers in the framer circuit.

The blocks encircled by dashed box 340 represents the delay $T_d$ implemented by modulo adder 326 in FIG. 15 and the 16 chip alignment gap.

FIG. 15 is a diagram of the relative rates of address incrementation of the read and write pointers used to manage the framer buffer memory 300 including the relative timing of address incrementation for reading the tribits. Dashed line 342 represents the rate of address incrementation of the write pointer generated by counter 322 in FIGS. 12 and 15. This counter counts transitions in the byte clock signal on line 302 in FIG. 9, with the byte clock signal shown on time line T3 in FIG. 10. Every cycle of the byte clock signal causes register 314 in FIG. 9 to latch a new 9-bit byte therein and present it on bus 318 to the write data port of two-port memory 300. Every cycle of the byte counter also causes write pointer counter 322 to present a new write pointer address on bus 366 for use in controlling where the data on bus 318 is stored. A multiplexer 362 having its output coupled to the address port of memory 300 and having as its inputs the write pointer on bus 366 and the read pointer on bus 364 is suitably switched so that the write pointer and read pointer addresses are presented at the appropriate times at the address port to implement the memory filling and memory reading operations described herein.

The bit clock signal on line 377 in FIG. 9 is used to clock the serial-in, parallel out shift register 310. The bit clock signal is generated by the time base generator shown in FIG. 11 and is counted by a modulo 9 bit counter 372 shown at the top of FIG. 9 for purposes of helping generate the byte clock signal on line 302 in FIG. 9. This counter 372 counts the bit clock signal on line 377 from time base generator 866 modulo 9 and outputs a transition to logic 0 on line 374 after every 9th bit period. The transition on line 374 acts as a count enable signal to byte counter 370 to enable incrementation of the byte counter 370 by the next bit clock cycle. This generates the byte counter signal on line 302. The bit counter 372 is always enabled by the hard wired count enable signal on line 376. Both the bit counter and the byte counter are reset to 0 by asserting the $F_0$ signal on line 299 for fast resetting and resynchronization of the system. The $F_0$ signal occurs at the end of each frame. The $F_0$ signal is generated by a portion of the time base generator not shown in FIG. 11, and is counted as a clock signal by frame counter 376 which outputs a synchronized $F_0$ signal on line 299'. The frame counter 376 is reset every 4th frame by a super frame signal $F_4$.

The time delay $T_d$ necessary for hitting the CU gap with a Barker code transmission is added to the $F_0$ signal on line 299' by the modulo adder 326 to generate the $F_0'$ signal on line 381. The value of $T_d$ is received from the CPU via bus 499 and changes by trial and error during ranging but is frozen at whatever delay centers the transmitter Barker code in the gap at the CU. The $F_0$ signal on line 299' also increments the page pointer 321 for the write pointer and simultaneously resets the write pointer 322 to zero at the end of each frame so as to cause a page swap and begin writing again at address 0 of the next page.

The delayed $F_0'$ signal on line 381 increments the page pointer 323 of the read address circuitry to cause a page swap and simultaneously resets the read pointer counter 324 to zero so as to begin reading at address 0 of the next page at the end of the frame.

Returning to the consideration of FIG. 15, solid line 346 represents the rate of emptying the frame memory 300 in FIG. 9. This rate of emptying is based upon incrementation of the read pointer counter which counts the chip clock signal on line 348 from time base generator 866. Since each symbol stores 144 tribits from 144 different channels and since there are three symbols and a 16 chip gap in each frame, the total number of chips in a frame is 448. Since all the 432 tribits of all three symbols of the frame must be read out while the byte counter is counting to 144 to store a frame's worth of 9-bit bytes of data from 144 channels or time slots, the read pointer is incremented on the chip clock signal. This causes all 432 tribits from all three symbols of a frame to be read out while the next frame of data is being stored thereby preventing overflow of memory 300. This is why the read pointer line 346 in FIG. 15 is shown as emptying the memory at the same rate as the write pointer fills it.

Line 352 in FIG. 15 represents the rate of incrementation of the read pointer counter 324 in FIG. 9. The read pointer counter increments on each cycle of the chip clock signal such that it increments from 0 to 143 during the time to read all the tribits from the first symbol. This has the effect of causing the 9 bits of data from each of the 144 timeslots or channels to appear sequentially at the read data output bus 358. However, it is desired to only unload all 144 tribits from a single symbol during one symbol time, so some switching on the output bus is needed, as described below.

A tribit select counter (which is not shown in FIG. 9) is coupled with a multiplexer 356 which does this switching. This tribit select counter generates a tribit select signal on line 354 in FIG. 9 which controls switching by a multiplexer 356. This multiplexer has an input coupled to the 9-bit read data output port 358 of the memory 300. The tribit select counter counts at a rate to generate the select signal on line 354 in such a way as to cause only tribits from the first symbol to be output from the multiplexer 356 on bus 360 during the time that first symbol is being transmitted.

Figure 16:
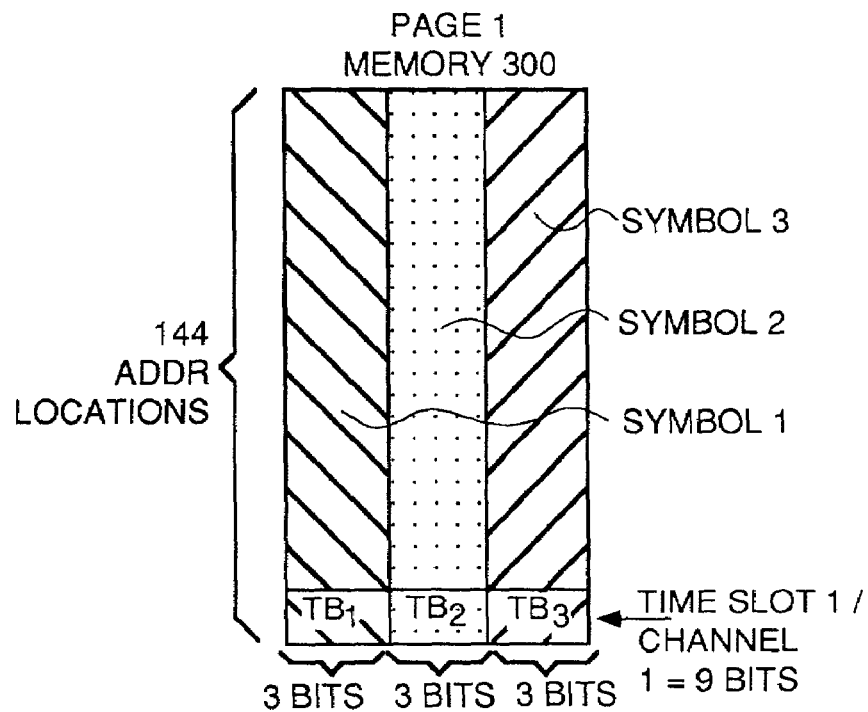
FIG. 16 is a diagram illustrating how tribits of interleaved data are stored as symbols in the framer memory.

FIG. 16 is a diagram which helps illustrate the manner in which framer memory 300 is emptied for transmission. FIG. 16 shows a completely filled page 1 of memory 300 in FIG. 9 comprising 144 memory addresses, each filled with one 9-bit byte, and divided into three columns of 3-bit tribits. Each column, marked by the legends symbol 1, symbol 2 and symbol 3, is comprised of 144 tribits and represents one symbol of a frame. To send this frame of data, the read pointer will increment 144 times during the time the first symbol is being encoded. The state of the tribit select counter during this first 144 cycles is such that only the 144 tribits of symbol 1 will be output on bus 360 to the forward error correction (FEC) encoder 402 in FIG. 8.

After the 144th incrementation, the read pointer counter 324 rolls over to zero and begins to count up to 143 again. At the 144th incrementation, the tribit select counter increments which causes the multiplexer 356 to select the middle column of tribits from symbol 2 in FIG. 16 for output on bus 360 in FIG. 9 to the forward error correction encoder 402 in FIG. 8. A similar process unloads the 144 tribits of symbol 3.

Bus 360 in FIG. 9 is, in the embodiment shown in FIG. 8, coupled to a forward error correction encoder 402. In FIG. 9, a multiplexer 362 having its output coupled to the address input of the framer memory 300 has two inputs: one is coupled to the output of the read pointer counter 324 and the other is coupled to the output of the write pointer counter 322. This multiplexer alternately couples the read pointer on bus 364 and the write pointer 366 to the address port 368 of the memory 300 on every cycle of the chip clock signal on line 348. The chip clock signal is also coupled to the control input of the memory 300 to serve as the RD/WR* control signal controlling whether the memory uses the address at port 368 in a read or a write transaction.

Returning to the consideration of the transceiver block diagram of FIG. 8, the output data streams from the framer on bus 360 in FIG. 9 may optionally be passed through a forward error correction encoder 402. The forward error correction encoder 402 can be eliminated in some embodiments or an ARQ encoder may be substituted. The embodiment of FIG. 8 symbolizes a class of species which use systematic codes where the bits of the tribits are not scrambled and the FEC encoder is a convolutional encoder. In alternative embodiments, the tribits on bus 360 can be pseudorandomly scrambled prior to being received by the FEC encoder 402. In other alternative embodiments, the FEC encoder can use block codes. In the preferred embodiment, FEC encoder 402 is used for Trellis encoding.

The purpose of the forward error correction encoder 402 is to add one or more redundant bits to each tribit so as to improve the error rate for the energy per bit-to-noise power density ratio resulting from the chosen modulation scheme. In the preferred embodiment, the FEC encoder 402 is a Trellis encoder for a 16-QAM, Rate 3/4 Trellis code having 16 states, a pi/4 rotational invariant, no parallel paths and an effective code length of 2. In yet another alternative embodiment, the forward error correction encoder 402 could be a Reed-Solomon Encoder which generates a first set of code words which are then further encoded in a Trellis encoder. An advantage of using Trellis encoded modulation either with or without Reed-Solomon coding is that it allows redundancy to be added to the payload data so as to enable forward error correction without increasing the symbol rate and the consumed bandwidth. This prevents the need for retransmission of garbled data since the errors can usually be eliminated by the Viterbi decoder using the redundant bits. Trellis encoded modulation uses redundant bits to map the payload data into a larger constellation of possible points (called signal space coding). The bandwidth required for transmission is not increased, nor is total noise admitted by the receive filter. Basically, Trellis encoding uses a channel coder to receive each k payload bits and convert them into n bits where n is greater than k and includes some redundant bits which contain information about the k payload bits. The n bit group is then processed by a modified line coder to produce symbols for transmission from a constellation having size $2^n$. Significant coding gains can be achieved in this way. For example, assuming a particular additive white Gaussian noise channel produces an acceptable probability of error without coding at some signal to noise ratio using a constellation of size M, using Trellis encoded modulation, the error probability can be reduced at the same signal to noise ratio or the signal to noise ratio can be reduced at the same error probability, and, per Ungerboeck, most of this theoretical reduction can be achieved using a constellation of 2M plus a channel coding scheme. As an example of the type of coding gain that can be achieved using Trellis coded modulation, consider the following. If only tribits were used without coding with redundant bits, and an 8-AM constellation were used, according to Ungerboeck transmission with $10^{-5}$ error probability with an SNR of 26 transmitting and 3 bits per symbol could be done. However, by the use of Trellis encoded modulation using a 16-AM constellation, it is possible to send 3 bits error free down to 18 db SNR. Therefore, using Trellis encoding, it possible to achieve a coding plus shaping gain of 26−18=8 db. In the invention, a coding gain of approximately 4 db is obtained. The main advantage of using Trellis coded modulation is the ability to reduce the error rate or increase the number of payload bits without increasing the symbol rate and bandwidth consumed. This can be done using a constellation no greater than 2M. More details about Trellis encoded modulation are contained in Lee and Messerschmit, *Digital Communication, 2d Ed.*, 1994 (Kluwer Academic Publishers, Boston), ISBN 0 7923 9391 0, which is hereby incorporated by reference. Trellis encoded modulation is not required however to practice the invention of a CU with no tracking loops to constantly track the RU clock and carrier frequencies, and, therefore, the encoder 402 in FIG. 8 could be eliminated or replaced with simple encoders using any known error detection or correction encoding scheme and a mapper to map the resulting encoded symbols into points in a constellation.

Figure 17:
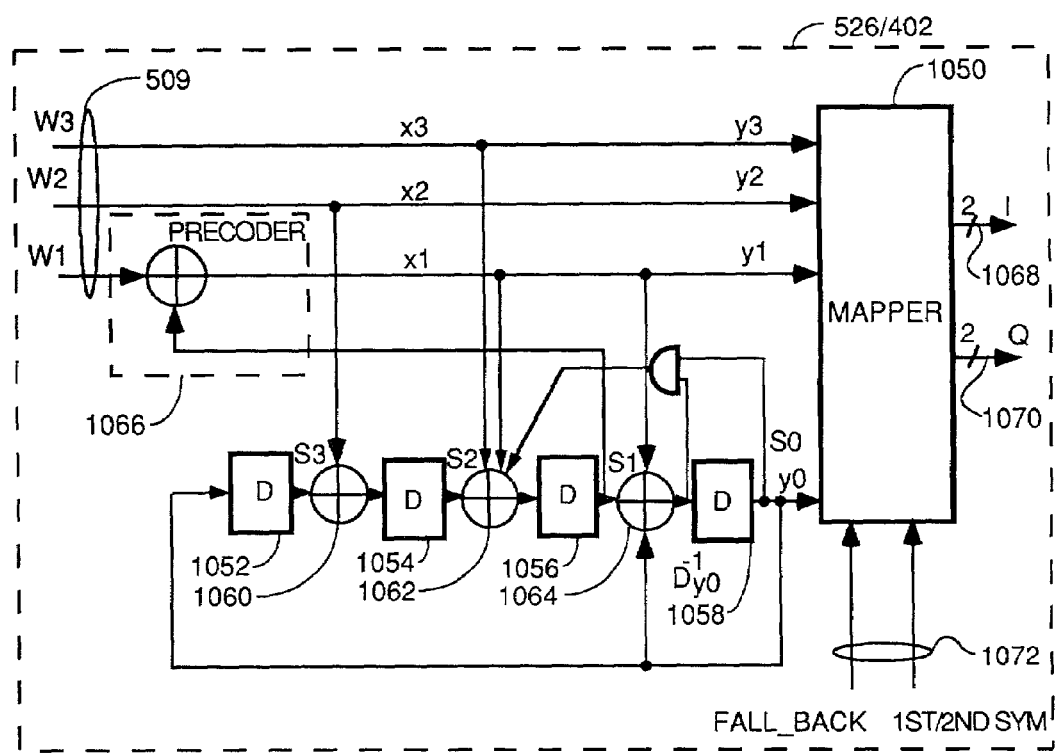
FIG. 17 is a diagram of the preferred trellis encoder.

In the preferred embodiment, the forward error correction encoder 402 take the form of the Trellis encoder shown in FIG. 17. The input to the encoder is comprised of three payload bits of a tribit on lines W1, W2 and W3 of bus 509. Bits W3 and W2 pass through the convolutional encoder section unchanged and arrive at mapper 1050 unchanged as bits y3 and y2, respectively. Bit y0 at the input of the mapper is generated by an encoder section comprised of D flip flops 1052, 1054, 1056 and 1058 coupled by exclusive-OR gates 1060, 1062 and 1064. These exclusive-OR gates combine the outputs of the flip flops with various combinations of the W3, W2 and W1 bits and two feedback bits. The output of flip flop 1058 is the y0 bit and is a factor in the generation of the two feedback bits. The y1 bit is the W1 bit after an exclusive-OR operation in a precoder 1066 with the output of flip flop 1056.

Mapper 1050 has a normal mode and several other modes including a fallback mode. In normal mode, the mapper takes the 16 combinations of the y0 through y3 bits and maps them to the 16-QAM constellation of FIG. 18. The mapper outputs 2 bits on an I bus 1068 and 2 bits on a Q bus 1070. For input combination of 4 bits, the two bits on the I bus define the coordinate along the I axis in FIG. 18 of the resulting constellation point, and the two bits on the Q bus define the coordinate along the Q axis. The mapping is nonlinear, and is defined by the table of FIG. 19. For example, an input code of 0101 for bits y0–y3, maps to a 1+3*j constellation point having an I coordinate of 1 and a Q axis coordinate of +3. This Trellis encoder has a code gain of approximately 4 db SNR.

The I and Q bits on buses 1068 and 1070 are then stored as separate real and imaginary arrays for the information vector [b] in memory 406 in FIG. 8. These real and imaginary arrays then have their bandwidths spread individually by CDMA orthogonal code multiplexer 408 in the manner illustrated by FIG. 20B to generate real and imaginary array components of a result vector. The elements of each result vector define the individual chips of one symbol in a frame.

Figures 21, 22:
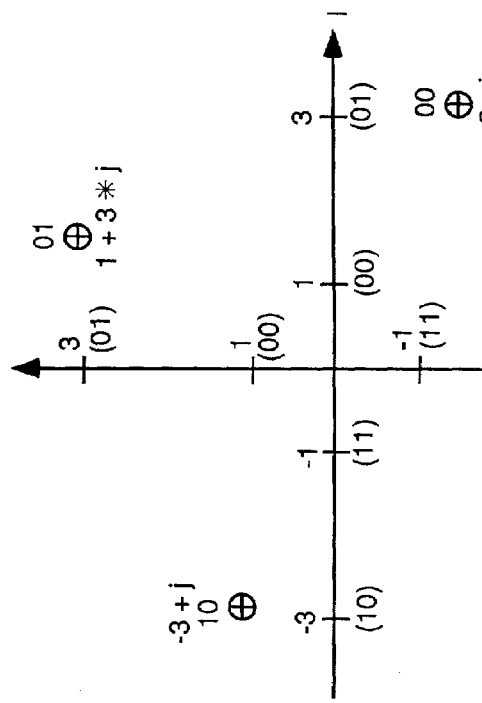
FIG. 21 is the mapping of the constellation for the fallback mode LSBs.
FIG. 22 is a table of the LSB and MSB fallback mode mappings.

Fallback mode and the other available modes are implemented in the Trellis encoder of FIG. 17 through control signals on bus 1072 from CPU 405 in FIG. 8. The mapper has normal mode, fallback mode, access channel mode, training channel mode and no code mode in some embodiments. In fallback mode, the encoder output in divided into two symbols and transmitted separately. The 2 LSBs (y0, y1) are transmitted as the first symbol and the 2 MSBs (y3,y2) are transmitted in the second symbol. The 2 LSBs are transmitted QPSK with a 4 point constellation. The two MSBs are transmitted DQPSK. To avoid changing the output power during fallback mode, the 4 point constellation of FIG. 21 was chosen for fallback mode. FIG. 22 shows the mapping for the LSB and MSB chips in fallback mode. The receiver needs to be synchronized between the first and second symbols to know which symbol carries the information of the LSBs and MSBs. In other words, when the transmitter goes into fallback mode, the 144 tribits that were encoded and then mapped into the 144 chips of the first symbol in the first frame in normal mode are now split into LSB and MSB components where are mapped into the first and second symbols of the first frame in fallback mode. Likewise, the 144 tribits that were encoded and mapped into the second symbol of the first frame in normal mode are split and mapped into the third symbol of the first frame and the first symbol of the second frame. Since the receiver is synchronized and knows which symbol of which frame it is receiving at all times, the CPU 405 controls the deframer circuit 470 so as to properly reassemble the original data stream via signals on bus 1076 in FIG. 8. Constant link quality monitoring for noise, crosstalk and signal quality is performed in background cycling constantly through all codes and timeslots. When a fallback mode threshold is exceeded, fallback mode is initiated and maintained until conditions return below threshold. Monitored values are stored by a diversity management function in the CU computer that controls code diversity and fallback operations.

In embodiments where forward error correction is not used, encoder 402 is an ARQ encoder which simply adds enough ECC bits to allow the receiver to detect an error and request a retransmission. The retransmission request is made on one of the command and control channels. In some block code embodiments, the forward error correction encoder 402 uses cyclic codes where the sum of any two code words is a code word and any cyclic shift of a code word is also a code word. Note that the Viterbi decoder 468 discussed below in the description of the receiver is used only when the forward error correction encoder 402 is a convolutional or Trellis encoder.

Although the discussion of the forward error correction encoder 402 has not heretofore included any discussion of the modulation process carried out by modulator 410, Trellis-Coded Modulation (hereafter referred to as TCM) is preferred because of its lower error rate in the face of channel impairments. TCM modulation combines the forward error correction and modulation process by redefining the coding as the process of imposing certain patterns on the transmitted signal. This provide more effective utilization of band-limited channels as is the case for multiple access on HFC cable TV plants. Trellis-Coded Modulation is characterized by three basic features:

(1) the number of signal points in the constellation used is larger than what is required for the modulation format of interest with the same data rate wherein the additional points allow redundancy for forward error control coding without sacrificing bandwidth;

(2) convolutional encoding of the message data is used to introduce a certain dependency between successive signal points such that only certain patterns or sequences of signal points are permitted; and (3) soft-decision decoding is performed in the receiver, in which the permissible sequence of signals is modelled as a Trellis code.

The preferred form of the encoder 402 is the 16 state Trellis encoder shown in FIG. 17. This encoder is characterized by parity check polynomials given in octal form as follows: h3=04, h2=10, h1=06, h0=23, d^2_free=5.0, Nfree=1.68. The nonlinear term is given by D^2[y0(S) .AND.D^(−1)y0(D)]. More details are given in Pietrobon, Ungerboeck et al., "Rotationally Invariant Nonlinear Trellis Codes for Two Dimensional Modulation," IEEE Transactions on Information Theory, Vol. 40, No. 6, November 1994, pp. 1773–1791, which is hereby incorporated by reference.

In the preferred embodiment, the forward error correction encoder 402 has multiple modes which add different numbers of redundant bits while always maintaining the code word length at 4 bits. In a normal mode, one redundant bit is added per tribit. In a fallback mode when channel impairments are high, fewer payload bits are sent and more redundant bits are sent in each 4 bit code word.

The encoder 402 in the transmitter is a state machine which, in conjunction with state memory 404, receives the stream of tribits for each symbol and calculates a 4th redundancy bit for each tribit. This 4th bit provides redundancy for error detection and correction and for use by a Viterbi Decoder 468 in the receiver in ascertaining with greater accuracy the data that was actually sent despite the presence of noise. The 4th bit in each tribit is part of the Trellis modulation scheme and is generated by the convolutional encoder 402. A three bit constellation would normally have only 8 points. However, Trellis modulation adds redundant bits interspersed in the information stream of tribits and increases the size of the constellation to enable more spacing between constellation points thereby enabling better discrimination between points by the receiver and lowering the bit error rate without increasing the bandwidth. In noisy environments like CATV media, Trellis modulation is preferred, but some species of the invention will work without the redundant 4th bits and using a smaller constellation. In the preferred embodiment, the encoder is used to provide greater accuracy and better noise immunity. The encoder, in the preferred embodiment, is a state machine but it could also be a lookup table implemented in RAM or ROM etc. The implementation of the state machine is not critical as long as the implementation is fast enough to keep up with the chip clock data rate. For purposes of this discussion, it will be assumed that the convolutional encoder 402 is present.

M-ary Modulation in Code Division Multiple Access System

Figures 18, 19:
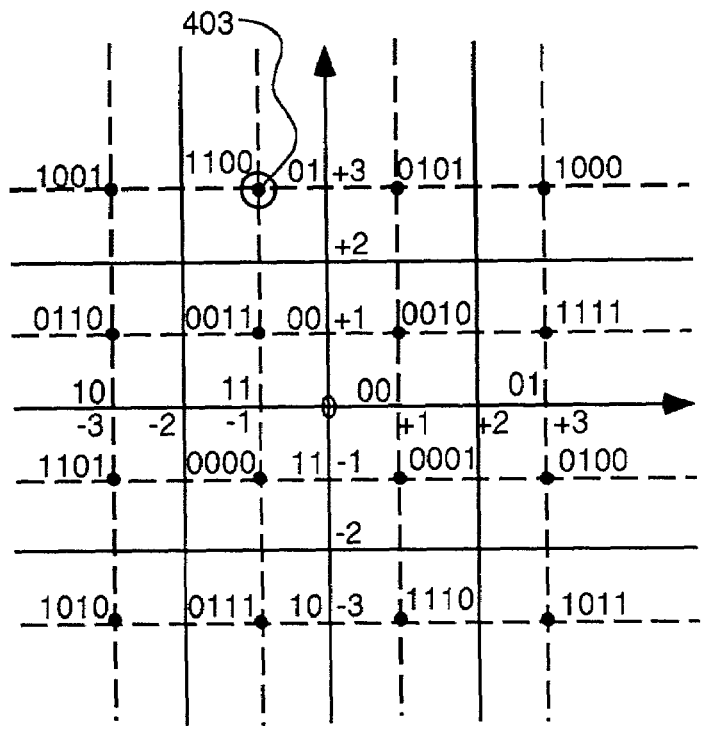
FIG. 18 is a diagram of the preferred QAM16 constellation.
FIG. 19 is a table of the binary and polar representations of each of the QAM16 constellation points.

The output of the convolutional encoder 402 is an array of 4-bit digital numbers for each of symbols 1, 2 and 3 shown in FIG. 2A. Each of these 4-bit numbers has two bits representing a real part and two bits representing an imaginary part. Thus, the information vector [b] shown at 481 in FIG. 20A for use in the matrix multiplication for CDMA spreading of each symbol is comprised of 144 4-bit elements, each element comprising one tribit plus the additional 4th bit calculated by the convolutional encoder 402. Each 4-bit symbol element in FIG. 20A, such as element 483 represents one third of the information bits from the corresponding timeslot in the TDMA stream input received by the transceiver plus the redundant bit calculated by the convolutional encoder 402. FIG. 20A illustrates how the information vector [b] for each symbol has its energy spread over time by the process of code division multiplexing implemented using matrix multiplication of the information vector [b] of each symbol times a matrix of orthogonal codes. The first two bits of each 4-bit symbol element are used to define the amplitude of either the I or Q coordinate, and the last two bits are used to define the amplitude of the other orthogonal vector element. The constellation of input point mappings of all possible points defined by a 4 bit symbol element or "chip" is shown in FIG. 18. FIG. 18 maps each of 16 possible input points, i.e., permutations of the 4 bits of each chip in each symbol array to a point in space defined by the in-phase or I axis for the real part and the quadrature or Q axis for the imaginary part of each point. The I coordinate of each point represents the amplitude for that point imposed upon the sine wave carrier fed to the modulator 410 in FIG. 8 on line 427 (only the COS signal is shown and the sine wave is generated internally to the modulator 410 by performing a 90 degree phase shift) to modulate that point. The Q coordinate of each point in the constellation represents the amplitude imposed by modulator 410 on the cosine wave carrier fed to it in order to modulate the point in QAM Trellis modulation. FIG. 19 is a table listing all the possible 16 combinations of 4 bits in the Code column and the corresponding 2's complement digital representation of the real and imaginary coordinates for each combination in the Inphase and Quadrature columns, respectively. For example, the input point 1100 maps to a point having a +3 imaginary coordinate and a −1 real coordinate on the constellation of FIG. 18. The mapping of FIG. 18 was selected to give maximum separation between points in the constellation for best noise immunity, but any other mapping would also work. Likewise, 2's complement representation is not required for the coordinates as they can be represented in other number systems as well. In the preferred embodiment, the encoder 402 is a Trellis encoder coupled to a state memory 404. The function of the Trellis encoder 402 is to select the bit to append to each tribit to put it at a place in the 16 point constellation of FIG. 18 which gives maximum noise immunity. This selection is made according to known Trellis modulation principles based upon the previous states. In other words, Trellis encoder 402 and state memory 404 comprise a state machine which transitions to one of the 16 states or points in the constellation based during each chip time based upon the incoming tribit data and the previous states. The memory 404, in the preferred embodiment, is large enough to record the last state for each of the time slots, so as each tribit arrives, the last state for the time slot from which the tribit was generated is looked up in memory 404, and the tribit is encoded based upon that channel's prior state.

The stream of 4-bit symbol elements that are output from the encoder 402 are stored in memory 406 as three different linear arrays corresponding to symbols 1, 2 and 3 in FIG. 16. Each 4-bit symbol element is a complex number comprised of 2 bits which define the magnitude of the I or inphase coordinate of a constellation point and 2 bits which define the magnitude of the Q or quadrature coordinate of the same constellation point. These two I and Q values are output on buses 1068 and 1070.

After passing the tribit stream from the framer 400 through the encoder, the resulting 4-bit data streams are stored as separate I and Q information vector arrays for each symbol in memory 406. Each symbol is comprised of two linear arrays of 2 bit numbers: one array contains multiple 2-bit elements defining the real or inphase "I" coordinates for all the elements of the symbol and the other array stores the 2-bit elements which define the imaginary or quadrature "Q" coordinate of each symbol element. The 144 array elements of each symbol define an information vector b for each symbol. The code division multiplexer 408 then spreads each information vector separately with a separate orthogonal code for each channel and combines the spread data into a single orthogonally coded data stream.

FIGS. 20A and 20B show the matrix multiplication process which is performed within code division multiplexer 408 in FIG. 8 to multiply each of the two linear arrays that define each symbol times the orthogonal code matrix [c] identified as matrix 407 in FIG. 20B. In the preferred embodiment, the matrix multiplication is performed by a microprocessor, but any machine that can do the matrix multiplication will suffice to practice the invention.

The encoding in CDMA MUX 408 spreads the energy of the symbols over time using orthogonal codes or orthogonal, cyclic codes. This is done in two steps. First, a linear array information vector of just real parts, i.e., inphase coordinates of the symbol to be transmitted, symbolized by array 405 in FIG. 20B, is multiplied by the code matrix 407. This operation generates another linear array of real or inphase coordinates along the R axis of a result space in a results constellation similar to the constellation of all possible input points shown in FIG. 18. This first linear array 409 defines the real axis coordinates in the result constellation for a plurality of chips from the first symbol to be transmitted.

Second, the same process is repeated for the imaginary coordinate linear array (not shown) for the same symbol the real coordinates of which were just processed. This results in another linear array comprising the imaginary or quadrature coordinates of the chips in the results array. This imaginary component array of the results array also is not shown in FIG. 20B.

The real component array, represented by linear array 409, is part of an overall result or "chips out" array which contains both the real and imaginary coordinates of a plurality of chips to be transmitted. These chips map to points in the result space, and the points in the result space map to whatever points in the input point space that are defined by the real and imaginary components in the information vector array b, of which array 405 is the real part. The mapping between the input point space and the results space is defined by the contents of the code matrix and the orthogonal codes.

Before performing the matrix multiplication, the 2's complement values of the real and imaginary components of the information vector b input array are converted to their decimal equivalents as shown in FIG. 20B in some embodiments. FIG. 20B is a simplified version of the system in which there are only 4 channels resulting in 4 elements of each symbol. The 4 real components of the information vector b shown in array 405 after conversion to their decimal equivalents, are, respectively from top to bottom, +3 (first three bits of channel 1), −1 (first three bits of channel 2), −1 (first three bits of channel 3) and +3 (first three bits of channel 4). This column of numbers is multiplied by the first row in the code matrix to yield the result 4 as the first real component in results array 409. This result is derived from summing the partial products as follows [(3×1)+(−1×1)+(−1×1)+(3×1)]=4. The next component down in the real part array 409, i.e., 0, is derived by multiplying the next real component down in the array 405 (−1) times the second row of the code matrix in a similar manner yielding [(−1×−1)+(−1×−1)+(−1×1)+(−1×1)]=0. In the preferred embodiment, arrays 405 and 409 would be 144 elements long, and the code matrix 407 would have 144 elements in each row and would have 144 rows. The orthogonal codes are actually the columns of the array. Note that the channel 1 element always gets multiplied by an element of the first column and so on for all the elements of array 405 as array 405 is multiplied by each of the 4 rows in array 407. Thus, the first column in array 407 is the orthogonal code used to spread out the bandwidth of the data from the channel 1 timeslot. For ease of generation, the set of orthogonal pseudorandom codes in matrix 407 is also cyclic.

Because each orthogonal code used in array 407 is also pseudorandom, and the rate of generation of the chips in the result vector (the chip rate) is much higher than the bandwidth of the input data represented by the information vector 405, the bandwidth of the resulting signals defined by the result vectors generated by this process is spread into an extremely broad spectrum. In fact, the bandwidth of the result vectors generated by this process extends to plus and minus infinity. The spread signal consists of replicas of the same power spectrum repeated end to end, so the signal can be recovered by the receiver even though only the portion within the passband of the amplifiers on the hybrid fiber coax channel and the transmitter and receiver filters is processed by the demodulation and despreading circuitry in the receiver.

The CDMA MUX 408 in FIG. 8 that does the matrix multiplication can be a programmed microprocessor or a dedicated custom logic circuit, etc. Any design which can perform the multiplication of the information vector times the code elements for all the active channels will suffice. Since the code matrix is comprised of purely 1's and −1's, the multiplication is made simpler. If the codes in the code matrix are Hadamard codes, the matrix multiplication can be made using the Fast Hadamard Transform algorithm in a digital signal processor or microprocessor. If the code matrix is comprised of sin and cosine terms, the Fast Fourier Transform can be used. Although any orthogonal or any cyclic code can be used to practice the invention, cyclic codes are preferred because they are easier to generate.

Figure 23:
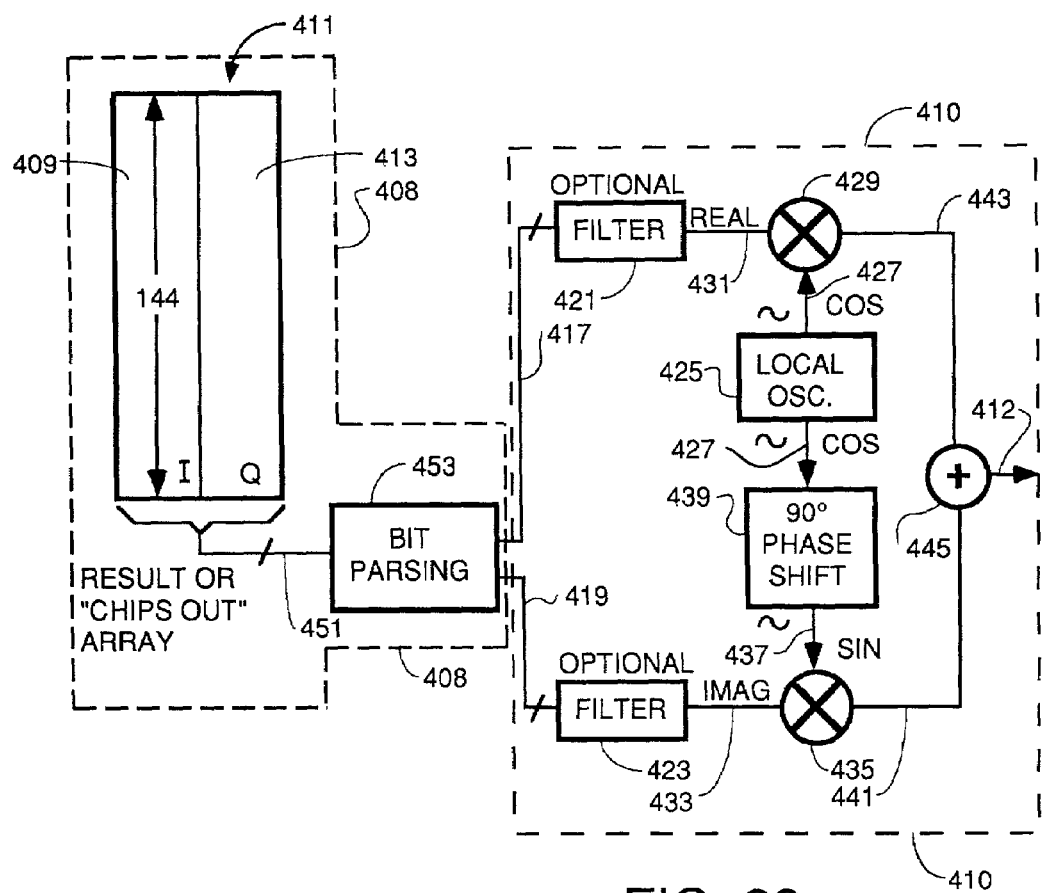
FIG. 23 is a diagram of one form of modulator that can be used to modulate the spread spectrum data onto two RF carriers.

The resulting real and imaginary component linear arrays of the results or chips out array are stored in a memory within the CDMA Mux 408 which is not separately shown. The components of these two arrays are then output on separate I and Q buses to a modulator 410 where they are used to amplitude modulate the amplitudes of two RF carriers that are 90 degrees out of phase using a Trellis modulation scheme in one embodiment or are used to control modulation in a carrierless modulation scheme described elsewhere herein. The resulting two AM carriers are summed and output on the transmission media 412. This is done as illustrated in FIG. 23 in one embodiment. An up conversion or down conversion frequency translator (not shown in FIG. 23, 84 in FIG. 8) is used to move the resulting signal in frequency to the band designated for use. The frequency band designated for use depends upon whether the transmission media 12 is a cable TV system, satellite system etc. and further depends upon whether the signals are travelling in the upstream or downstream direction.

Referring to FIG. 23, more details of the coordination of the multiplexer 408 and the modulator 410 and the internal details of one embodiment of the modulator 410 in FIG. 8 are illustrated for the transmitter modulators in either the RU or CU. The result or chips out array is stored in memory 411 which is part of the CDMA MUX, and comprises the real or inphase array 409 and the imaginary or quadrature array 413 of the 144 result points or chips in the result space. On every chip clock, one result point or chip comprising a real component and an imaginary component is output on bus 451 to a bit parsing unit or bit splitter 453. The bit parsing unit 453 splits off the real component and outputs those bits on bus 417. The imaginary component will be parsed out, and those bits will be output on bus 419.

Figure 24:
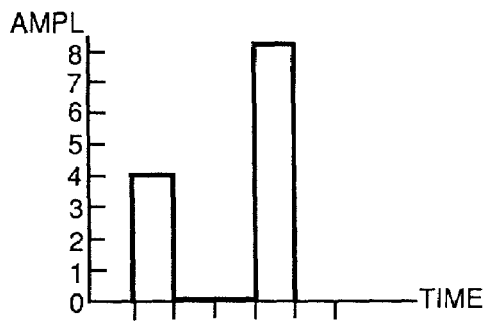
FIG. 24 is a diagram illustrating the problem with rapidly changing chip amplitudes which can cause excessive high frequency content.

Because the RF signals that carry the information from the 144 channels must share the transmission media with other RF signals having adjacent frequencies, two optional digital passband Nyquist shaping filters 421 and 423 are used to limit the bandwidth of the signals on buses 417 and 419 to 6 Mhz to avoid interference with signals on neighboring frequencies. The digital signals on buses 417 and 419, when converted to their decimal equivalents usually have rapid transitions between levels in adjacent intervals. This is illustrated in FIG. 24 which is a plot of the changes in amplitude over time of the real components of the results vector for the array 409. These filters 421 and 423 are Nyquist passband filters having center frequencies at the carrier frequency and having 6 dB bandwidth points which are each separated in frequency from the center frequency by a frequency gap $1/(2T_c)$ where $T_c$ is the chip rate period, i.e., the time between transitions from one chip level to the other. The Nyquist filters 421 and 423 remove high frequency Fourier components caused by sharp edges in such signals. This filtering effectively rounds off corners of the waveform defined by the transitions between successive chip levels in the "chips out" array and limits most of the power density in the Fourier spectrum of such signals to a 6 Mhz band centered around the frequency of the RF carrier generated by local oscillator 425. This local oscillator 425 generates a sine wave, RF carrier at a frequency selected to be compatible with the switching rate of CDMA multiplexer 408 and to not interfere with existing cable TV service signals on adjacent frequencies. Since, in one embodiment, the local oscillators in the RUs and CU that are used for the modulators and demodulators all run synchronously locked in phase to each other and to the phase of the master clock and master carrier signals used by the CU to transmit downstream data, and are kept in phase in the RUs by the carrier and clock recovery circuits described elsewhere herein, all the local oscillators that generate carriers will be designated 425 even though they are separate circuits one of which is in the CU and some of which are in the RUs.

The modulator uses a local oscillator COS wave carrier signal from the master carrier synthesizer in the case of the CU transmitter. In the case of the RU transmitter, the carrier signal comes from the tracking loop carrier recovery circuit (515 in FIG. 8) in the RU. In the preferred embodiment, the RU generates a local carrier signal which is phase coherent with the master carrier by using the frame detector and tracking loop circuitry previously discussed to synchronize the RU local clock with the master clock signal embedded in the CU Barker code. This RU local clock signal is then multiplied in a PLL to generate an RU local carrier reference signal which is phase coherent with the master carrier. The CU generates its master carrier in the same way using the master clock signal. However, the local carrier signal is generated, it is applied to the carrier input 427 of an amplitude modulator 429 which also receives the filtered real component of each chip on bus 431. The modulator 429 modifies the amplitude of the carrier signal on line 427 in accordance with the amplitude of the decimal equivalent the real component on bus 431 and outputs the result on bus 443.

The imaginary or quadrature component of each chip, after filtering, is input on bus 433 to another amplitude modulator 435. This modulator receives at a carrier input 437 a sine wave of the same frequency as the cosine wave on line 427, but shifted in phase by 90 degrees by phase shifter 439. In an alternative embodiment, these local oscillator SIN and COS signals on lines 427 and 437 are actually generated in the carrier recovery circuit 515 in FIG. 8 and are locked in frequency and phase to the pilot channel tone sent downstream from the CU during timeslot 0. Modulator 435 modifies the amplitude of the sine wave in accordance with the amplitude of the imaginary component on bus 433, and outputs the result on line 441. Lines 441 and 443 are coupled to a summer 445 which sums the two waveforms and outputs them on the shared transmission media via line 412.

In some embodiments, the line 412 may be coupled to suitable interface circuitry to drive the signal on line 412 into a wireless or cellular system, a terrestrial microwave link, a coaxial cable of a cable TV, telephone or other system, a fiber optic link of a cable TV, telephone or other system, a local area or wide area network or any other media developed in the future for real time communication of data. Such interface circuitry is known and will not be described further herein.

Figure 28:
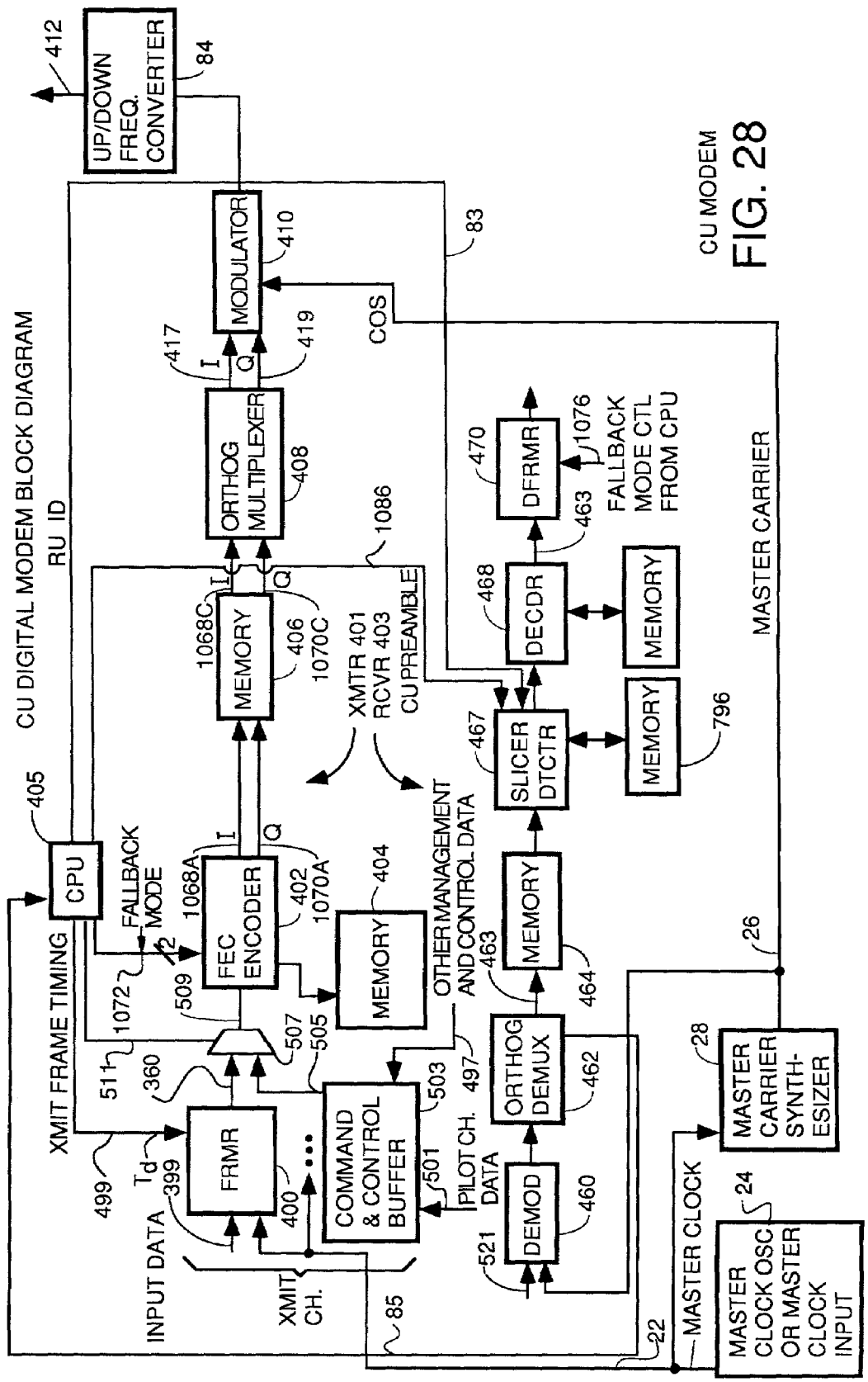
FIG. 28 is a block diagram of one embodiment of a CU modem.

As mentioned briefly above, in an alternative embodiment for purposes of carrier recovery by the RUs for downstream data, the master carrier signal is sent downstream as pilot channel data on a specific dedicated timeslot using a dedicated code. Referring to FIG. 28 there is shown a block diagram of the CU transceiver. The master carrier signal is applied to the CU transmitter modulator 410 via line 26. The master carrier signal is generated by the master carrier synthesizer 28 from the master clock signal on line 22. The pilot channel data in the CU transmitter is supplied to the forward error correction encoder on line 501 via a command and control buffer 503. This pilot channel data is only transmitted downstream by the CU in the preferred embodiment, and the RUs do not transmit pilot channel data upstream since the CU knows the RU carrier is the same as the master carrier but somewhat offset in phase. In general, the command and control buffer stores data to be transmitted on the command and control channels for system management, contention resolution, ranging etc. by either the RU or CU transceiver. This other command and control data is received from the CPU 405 via bus 497. Bus 505 couples this command and control data to an input of a switch 507 which has a second input coupled to receive the payload data on bus 360 from the framer. The switch selects one of these buses as the source of data which is output on bus 509 to the forward error correction encoder 402 for Trellis encoding. Switching of switch 507 is controlled by CPU 405 by a control signal on line 511 in some embodiments and is switched automatically by logic circuitry that knows when the command and control timeslots occur and when the payload timeslots occur.

In the transceiver of FIG. 8 for the RU, no pilot channel data is input to the command and control buffer. Instead the local carrier oscillator is either synchronized to the frequency and phase of the pilot channel or is synthesized from the recovered master clock. In embodiments where carrier recovery is performed, a local carrier oscillator inside carrier recovery circuit 515 is synchronized to the frequency and phase of the pilot channel signal broadcast in timeslot 0 from the CU. Such is the function of carrier recovery circuit 515 in FIG. 8. The local reference carrier signal on line 427 is generated by using a tracking loop to lock the phase of a local carrier oscillator 425 in carrier recovery circuit 515 to the phase of the master carrier signal recovered from the pilot channel data (local carrier oscillator 425 can be located in the carrier recovery circuit or in the modulator 410, but is preferably in the carrier recovery circuit). The local carrier reference is supplied to demodulator 460 in the RU receiver section as the COS signal on line 427 in embodiments having coherent detectors. In embodiments having rotational amplifiers, the demodulator/detector can be incoherent. In the CU receiver where a rotational amplifier is used, the demodulator 460 in FIG. 28 receives the synthesized master carrier signal on line 26 for incoherent demodulation.

Likewise, in the RU transmitter 401 of FIG. 8, the carrier recovery circuit 515 transmits to the modulator 410 a local oscillator signal on line 427 which is synchronized in frequency and phase to the pilot channel signal received by the RU receiver. This signal is input to the RU transmitter modulator so that its signals can be recovered by the CU receiver using the master carrier signal generated at the CU without the need for a carrier recovery tracking loop in the CU receiver to constantly track the RU transmitter's carrier. However, preamble data must be inserted into every RU timeslot's data for use by the CU receiver to periodically correct for the phase and amplitude errors of the carrier signals for that timeslot and that RU because every RU is at a different distance from the CU. Thus, even though the RU transmitter modulators uses a local carrier reference which is locked in frequency and phase to the master carrier at the CU, the differing propagation times and channel impairments cause phase and amplitude changes which are different for each RU. These phase and amplitude changes must be resolved by the CU separately for each RU so that the CU can adjust the phase of its master clock and master carrier signals for use in the CU receiver section when timeslot data from each particular RU is being received. This is the purpose of the preamble data which each RU transmits. The exact manner in which this is done will be described further below after completing the description of the carrier recovery circuit 515.

The RU carrier recovery circuit 515 can be any conventional phase-locked loop clock recovery circuit, Mth power loop, Costas loop, suppressed carrier-tracking loop, etc. In the preferred embodiment, the carrier recovery circuit in the RU receivers takes the form shown in FIG. 25. This circuit is basically a phase lock loop that compares a slicer error signal during timeslot 0 to the local oscillator frequency and phase generated by the voltage controlled oscillator 425. The circuit then generates an error signal based upon the comparison to adjust the frequency and phase of a voltage controlled oscillator 425 to the frequency and phase of the pilot channel signal transmitted during timeslot 0. The voltage controlled oscillator 425 serves as the local carrier reference signal for the demodulator 460 in the RU receiver section and the modulator 410 in the RU transmitter section. Specifically, the slicer detector 466 generates a slicer error signal on bus 519 which indicates at least the phase error between the received signal and a legitimate point in the constellation.

Figure 25:
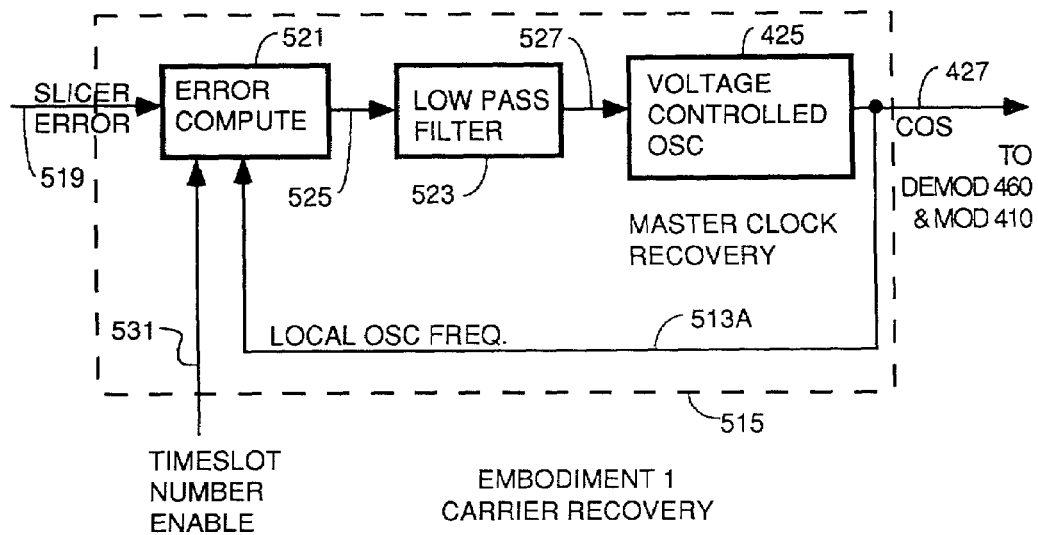
FIG. 25 is a block diagram of one embodiment for carrier recovery circuitry in the RU receivers to recover the master carrier from pilot channel data and slicer error signals.

The error computing circuit 521 also receives a timeslot number enable signal on line 531 in FIGS. 25 and 8 from the CPU 405. This signal indicates when timeslot 0 data is being received at slicer 466, and causes the error computing circuit 521 to activate only when timeslot 0 pilot channel data is being received. Thus, carrier recovery and phase correction at the RU in this particular embodiment is an occasional rather than continuous function. During timeslot 0 the signal on 519 (which has been demodulated using the local oscillator signal on line 427) will indicate the phase error between the local oscillator signal on line 427 and the master carrier information in the pilot channel data. This phase error may be caused by a phase error between the local oscillator signal on line 427 and the master carrier pilot channel signal, or because of impairments on the channel such as noise, or it may be a combination of the two. Because the effect of noise is random but a phase error between the pilot channel and the local oscillator is constant until corrected, the phase error component caused by noise is removed by averaging in a low pass filter 523. The slicer error signal on line 519 is coupled to an error computing circuit 521 which also receives the local oscillator signal on line 513A which is coupled to line 427. The phase error is calculated and output on line 525 to low pass filter 523 which averages the phase error over time thereby removing the noise component. The resulting average error signal is coupled on bus 527 to the error signal input of a voltage controlled oscillator 425 to generate the local carrier reference signal on line 427.

Figure 26:
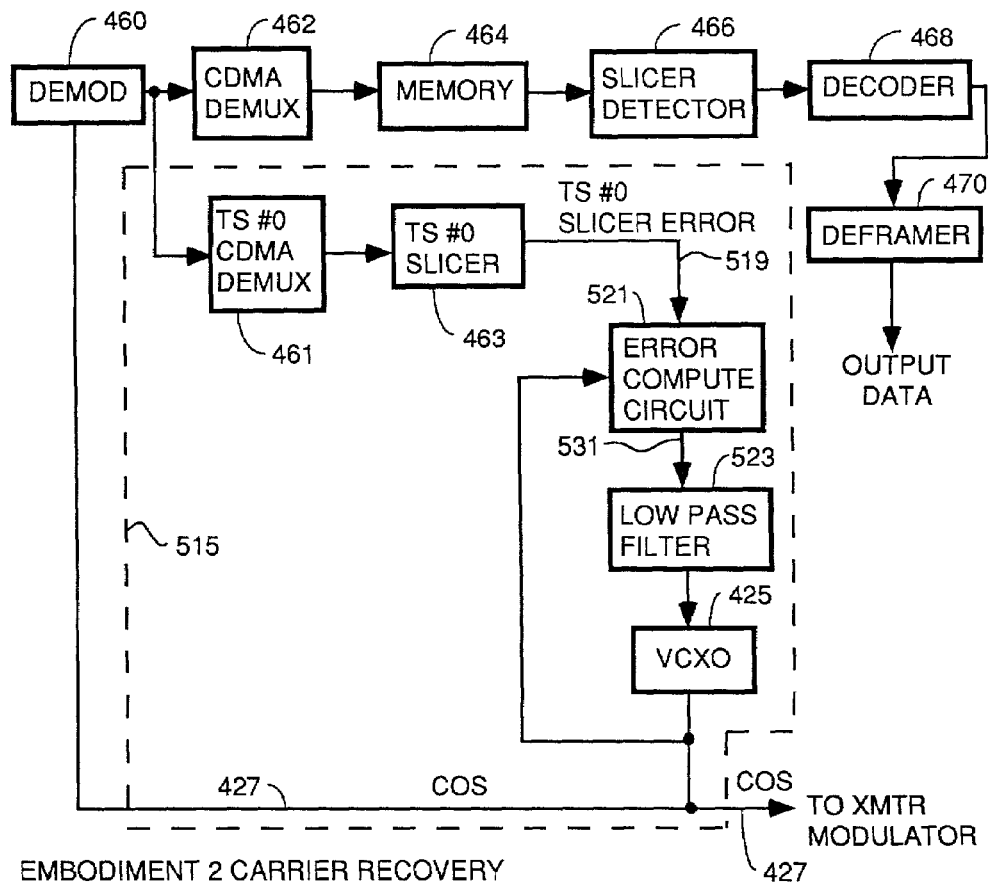
FIG. 26 is a block diagram of another form of carrier recovery circuitry in the RU receivers to recover the master carrier from pilot channel data and slicer error signals.

An alternative carrier recovery arrangement is shown in FIG. 26 where elements that have like reference numbers to elements in FIG. 8 serve the same purpose in the combination and will not be discussed here. The embodiment of FIG. 26 uses an additional CDMA demultiplexer 461 which recovers only the pilot channel data on timeslot 0 by reversing the CDMA spreading process via a transpose matrix for the dedicated CDMA code used to spread timeslot 0. The received timeslot 0 data is output on bus 465 to another slicer 463 in addition to the slicer 466 which compares the pilot channel data to a known point in the BPSK constellation used to transmit the pilot channel signal and develops a timeslot 0 slicer error signal which is output on line 519. The slicer error signal is compared to the local oscillator signal on line 427 by an error compute circuit 521 and a phase error signal is output on line 531. This phase error signal is averaged by low pass filter 523, and the resulting error signal is coupled to the error signal input of the voltage controlled oscillator 425. The output signal from the VCXO 425 is coupled via line 427 as the COS signal to the demodulator 460 and the modulator 410. A 90 degree phase shift is applied to the COS signal in each one of these units to generate the SIN signal on line 437. The SIN and COS signals can be in either digital or analog form in various species within the genus of the invention.

Referring to FIG. 28 showing the CU transceiver block diagram, the apparatus and method by which upstream carrier recovery, gain control and clock synchronization is achieved will be described. Even though all RU local oscillators are synchronized in frequency and phase with the master carrier information in the pilot channel data from the CU, the differing distances from each RU to the CU cause two different problems. The first is a different phase shift for the clock and carrier signals of each RU at the CU. The QAM signal demodulation used in the preferred embodiment depends for its accuracy on the ability to accurately distinguish between the amplitudes and phases of each received constellation point. The differing propagation times and differing channel impairments experienced by each RU's signal, cause both amplitude and phase errors in the received data that must be determined and corrected for to obtain accurate QAM demodulation at the CU receiver.

To correct for each RU's phase and amplitude errors, the CU must determine the phase error and amplitude error for each RU and correct for them individually as the timeslot data for each RU is being received. The way this is done is for each RU to send known preamble data to the CU in the timeslots currently assigned to that RU before the block of payload data is sent. This is done each time the RU transitions between an idle state when no data is being sent and an active state when upstream data is being sent. The CPU in the CU assigns the timeslots to the various RUs and so informs them in management and control messages on the management and control channels. This is done in response to bandwidth requests from the RU. The process by which the CU adjusts the phase of the master clock and master carrier signals for each RU is shown in FIG. 27.

Upstream Carrier Recovery Error Correction Factor Per Timeslot

Figure 27:
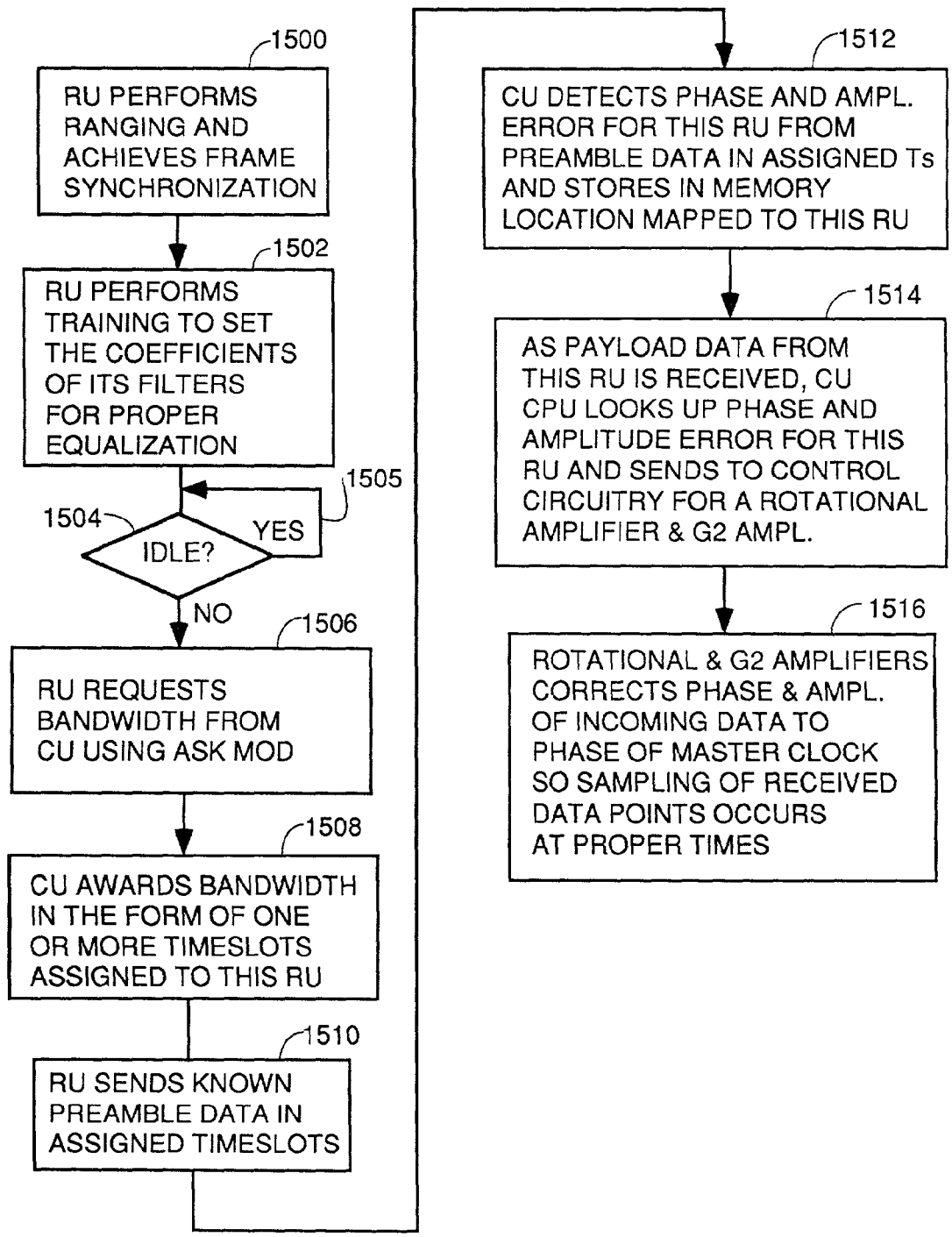
FIG. 27 is a flow chart of the process carried out by the CU receiver to adjust the phase of the master clock and master carrier signals used in the CU to recover each RU's data using amplitude and phase error adjustments developed and stored in memory for each RU from preamble data sent by that RU.

Referring to FIG. 27, there is shown a flow chart symbolizing the startup processing by the RU and the CU to determine the phase error in the clock and carrier signals for the RU each time the RU transitions from the idle to the active state. The first step in the sequence of an RU coming online is symbolized by block 1500 where the RU performs the ranging process described above to achieve frame synchronization. Next, the RU, in step 1502 performs the training process described later herein to set the coefficients of its filters to achieve proper equalization. Next, the RU determines whether it has any payload data to send in step 1504, and, if not, the RU stays in the idle state by transitioning along path 1505. If the RU has payload data to send, step 1506 is performed where the RU requests bandwidth from the CU in a management and control message modulated by amplitude shift keying. Because the CU does not yet know the phase error of the RU, upstream management and control messages from the RUs to the CUs are sent on the access channel portion of the management and control channels using a modulation scheme which does not require phase information such as amplitude shift keying or any other modulation scheme which does not require phase synchronization by the CU to the RU carrier and clock. Modulator 410 in FIG. 8 is used in the RU transmitter to do the ASK modulation as well as QAM modulation of the payload data simply by picking the two points of the 16 point QAM constellation that correspond to the two points of the ASK constellation during transmission of upstream management and control messages. Downstream management and control messages are sent using the same modulation scheme as is used for the downstream payload data.

In response to the bandwidth request, in step 1508, the CU sends a downstream management and control message to the RU awarding bandwidth in the form of assignment of one or more timeslots. The RU responds to the bandwidth assignment by sending known preamble data to the CU during the assigned timeslots. FIG. 28 shows a block diagram of the CU modem. All the items in FIG. 28 that have the same reference numbers as items in FIG. 8 server the same purpose in the combination. The specific differences in functions of various blocks in the CU modem will be described briefly below.

The CU knows what the preamble data is supposed to be and knows when the preamble data is being received by virtue of knowing when the timeslots assigned to the RU sending the preamble data are being received. When preamble data is being received, the CPU 405 in FIG. 28 activates the CU PREAMBLE signal on line 1086. This causes the slicer 467 to begin an iterative process to reduce the slicer error to as low a value as possible. The slicer 467 in the CU functions differently in some respects than the slicer 466 in the RU. The slicer 467 in the CU includes a rotational amplifier and a G2 amplifier and a control circuit whereas the slicer/detector 466 in the RU uses a rotational amplifier and G2 amplifier if it has incoherent demodulation. When preamble data is being received, the slicer circuit sets initial values for an amplitude error and a phase error for use in detecting the preamble data. The initial amplitude error signal is used by the G2 amplifier in slicer 467 to correct for amplitude errors, and the initial phase error is used by the rotational amplifier to correct for phase error. The known preamble data point 3-j is then compared to the received data point, and the error is sent to the control circuit. The control circuit examines the error and readjusts the amplitude and phase error values used by the G2 and rotational amplifiers inside slicer 467. This process is continued until the error is zero. The final amplitude and phase error correction factors are then stored in memory 796 in a memory location devoted to the particular RU which sent the preamble data. The process described above is symbolized by steps 1510 and 1512 of FIG. 27.

Step 1514 in FIG. 27 represents the process of determining the timeslot that is currently being received, looking up the modem ID currently assigned to that timeslot, retrieving the appropriate phase and amplitude error correction factor for that modem and applying those correction factors to a rotational amplifier and G2 amplifier inside the slicer/detector circuit 467 in FIG. 28. Step 1516 represents the process carried out by the G2 and rotational amplifiers in the slicer/detector circuit 467 in correcting the phase and amplitude of the received payload data signals as they are received using the correction factors for the particular modem that sent the payload data.

The CU modem of FIG. 28 includes a master clock oscillator or input for a master clock signal 24 from which the master clock signal on line 24 is distributed to all circuits that need it. A master carrier synthesizer 28 receives the master clock signal and generates a master carrier signal 28 therefrom. The master carrier signal is distributed on line 26 to the modulator 410 of the CU transmitter, the demodulator 460, and to any other circuit that needs it. The slicer/detector circuit 467 knows which RU's signals are currently being received from memory 464 by virtue of RU ID data received on bus 83 from the CPU 405. This data is generated by the CPU from the timeslot allocation table. The CPU is informed which timeslots are currently being received by signals on bus 85 from the orthogonal demultiplexer or other circuitry not shown which functions to reassemble ATM packets using the 9th bit cell delimiter codes in the manner described in the TER-004.1P parent patent application which is incorporated by reference herein. The CPU informs the control circuitry within slicer/detector 467 which RU's phase and amplitude correction factors to use by sending RU ID data on bus 83 to the slicer.

In the embodiment shown in FIG. 8, the CPUs in the RUs keeps track of and help control the process of breaking the payload data from their peripherals/user devices into 8 bit bytes, adding a 9th bit to support the higher level protocol and sending the 9-bit bytes during the assigned timeslots. Before the payload data is sent however, the CPU or timing logic (not shown in FIG. 8) in the HU activates a Preamble signal on line 1094 which controls switching by a multiplexer 1076. This multiplexer receives the encoded I and Q information vector payload data on buses 1068A and 1070A at one input and predetermined, fixed preamble data I and Q values on buses 1078 and 1080 at another input. When the switching control signal on line 1074 is activated, multiplexer selects the data on buses 1078 and 1080 for coupling to buses 1068B and 1070B for storage in memory 406. The preamble data on buses 1078 and 1080 define a known point 3-j in the QAM constellation.

Line 1074, buses 1078 and 1080 and multiplexer 1076 are only present in the RU transmitters since the technique described here is used only in the upstream data to achieve proper synchronization, so these circuits are absent from the CU transceiver block diagram of FIG. 28.

In the CU receiver shown in FIG. 28, the slicer detector 467 is responsible for comparing the received data to the known preamble constellation point during preamble data reception to determine the amplitude and phase errors. The received signal takes the form:

$$a * e^{j\varnothing} * s(t)$$

where s(t) is the desired signal;
a=the amplitude error caused by channel impairments and the near-far problem; and
$e^{j\varnothing}$=the phase error caused by channel impairments and the near-far problem.

The slicer detector 467 in FIG. 28 encompasses several circuits shown in the more detailed block diagram of the CU receiver discussed later herein. The slicer detector 467 operates to perform an iterative process to converge on a multiplication factor having amplitude and phase components to multiply times the received signal so as to cancel the amplitude and phase error such that s(t) is detected as the constellation point 3-j without any slicer error. The amplitude and phase error coefficients in the multiplication factor which reduce the slicer error to 0 are then stored in memory 796 for use by the slicer in receiving the payload data for the timeslot(s) assigned to the RU for which the multiplication factor was stored.

Specifically, the job of the CU receiver slicer detector 467 is to determine the correct 1/a and $e^{-j\theta}$ coefficients in a multiplication factor of the form:

$$(1/a)*e^{-j\theta} \qquad (5)$$

where 1/a is the gain correction coefficient to solve the near-far problem and correct for channel impairments; and $e^{-j\theta}$ is the phase error correction coefficient to solve the near-far problem and correct for channel impairments and get the CU synchronized with each individual RU despite differing path lengths and differing channel impairments between the CU and each RU.

The Near-Far Problem

The near-far problem involves interference with reception of weak signals transmitted from a remote RU by strong signals transmitted by a near RU. In the prior art, this is often solved by time division multiplexing so that the two transmitters are never transmitting at the same time. In the SCDMA environment, this solution will not work since all RUs have to be able to transmit whenever they need to transmit if bandwidth is available. Therefore, in the SCDMA example described here, the amplitude levels of the signals transmitted by the RUs are controlled so that all signals arriving from the RUs at the CU should arrive at approximately the same amplitudes, and channel impairment effects are corrected by gain level adjustments in the CU receiver at a point before the baseband signal enters the slicer so as to minimize interpretation errors caused by amplitude errors (the G2 gain adjustment amplifier and rotational amplifier in slicer/detector 467 are located so as to receive the received signals before they get to the slicer). For a discussion of the iterative process carried out by this circuitry during the preamble for each timeslot to establish the values for the amplitude and phase error correction coefficients for use in receiving the payload data for that timeslot, see the discussion of the cooperation of G2 amplifier 788, rotational amplifier 765, slicer 800, control loop 781 and memory 796 in the detailed block diagram of the CU receiver discussed below.

Thus coherent modulation and detection is used for both upstream and downstream transmissions, but the coherent detection may be accomplished using rotational amplifiers.

The pilot channel data on timeslot 0 is spread with a dedicated CDMA code in CDMA multiplexer 408 for transmission on the timeslot 0 management and control channel as the pilot channel data which encodes the CU master carrier. Use of a pilot channel signal on one of the command and control channels is only one of the possibilities for distributing carrier frequency and phase information. Other possibilities are transmission of any modulated waveform which can be detected by the RU receivers in which the CU carrier frequency and phase information is encoded in the modulation. Note also that the RU can use another carrier frequency than the master carrier so long as phase coherence can be achieved in the CU receiver between the RU carrier and the master carrier.

The form of carrier recovery described above is only one way of achieving a coherent system with only one master clock and master carrier synthesizer. In FIG. 8 a coherent demodulator is shown having the structure of FIG. 29. In the preferred embodiment shown in the block diagram of the RU and CU receivers of FIGS. 30 and 31, respectively, incoherent detection could also be used using any of the well known incoherent detection apparatus in conjunction with rotational amplifiers. In the CU receiver of FIG. 31, incoherent demodulation and a rotational amplifier is used. Alternative embodiments for incoherent receiver technology is described in Haykin, *Communication Systems*, at page 503–505 and is hereby specifically incorporated by reference herein.

Another form of synchronization that is required is symbol or chip clock synchronization. The receiver must know the instants in time when the modulation can change its states from the amplitude and phase of one chip to that of the next. That is, the RU and CU receivers must know the start time and finish time of each chip in order to decipher what that chip was. This allows the receiver to determine when to sample and when to quench its product integrator or other chip state detection circuitry for purposes of starting the chip decoding process.

Chip Clock Synchronization

Symbol synchronization in the context of the SCDMA example herein is recovery of the CU chip clock in each RU. In the preferred embodiment, recovery of the CU master chip clock and master carrier is done by synchronization circuitry including frame detector 882, control loop 781, VCXO 784 and time base 886, VCXO 808 and frequency synthesizer 760. The master chip clock is recovered from the Barker code transmitted by the CU. The master carrier is synthesized by synthesizer 760 from the CU master chip clock in the preferred embodiment. There are at least two different ways of generating the master carrier in the RUs discussed herein and there are other ways known in the prior art. Any one of these ways will suffice to achiever carrier synchronization. One way to generate a synchronous local master carrier in the RUs is to control the phase of VCXO 808 in FIG. 30 using slicer error on bus 798 generated by pilot channel data. The preferred way is to synthesize the master carrier from the recovered master chip clock. Both embodiments outside the methods of recovering a master carrier known in the prior art are represented by FIG. 30.

Figure 30:
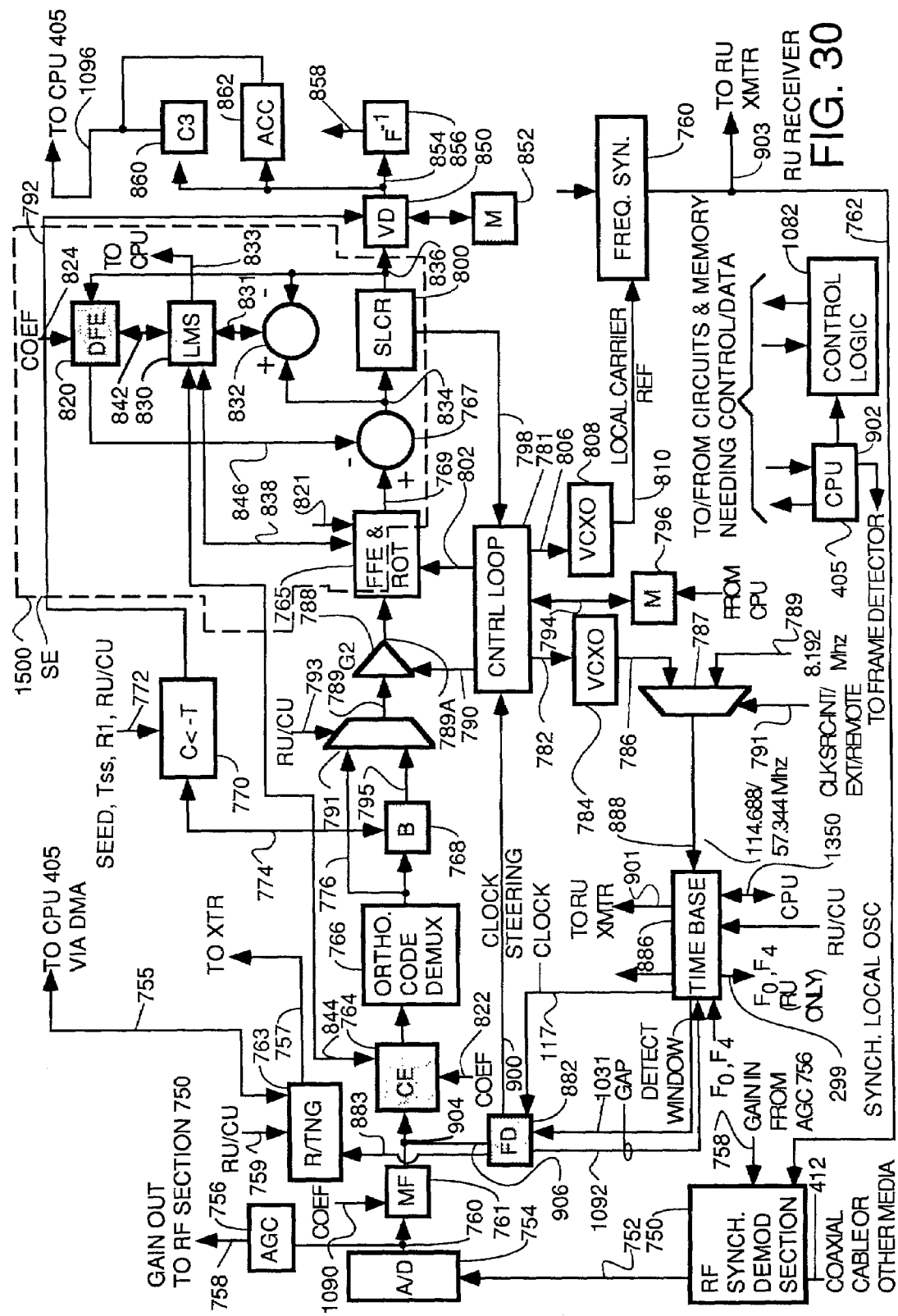
FIG. 30 is a more detailed block diagram of one embodiment for an RU receiver.

In one embodiment represented by FIG. 30, the CU master chip clock is recovered by correlating in the frame detector in each RU a known Barker code transmitted during every gap by the CU, with the Barker code encoding the chip clock therein. Each RU uses a correlator with an early-late gate to detect the Barker code and get the RU's chip clock synchronized with the CU chip clock encoded in the Barker code. This process of chip clock synchronization is carried out by the frame detector 513 in FIG. 8 and frame detector 882 FIG. 30. The frame detector 513 and the frame detector 882 each includes both coarse and fine tuning circuitry. The coarse tuning circuitry performs downstream frame synchronization by locating the gap in each CU frame transmission by finding a known Barker code transmitted by the CU in the gap. Time base circuit 886 in FIG. 8 and FIG. 30 helps the frame detector find the Cu frame gap by generation of a window signal on line 1031 in FIG. 8 and FIG. 30. This window signal activates the RU frame detector and tells it the limits within which the CU gap is expected. In the preferred embodiment, the CPU 405 generates the window signal as a GAP_a signal on line 902 (not shown in FIGS. 30 or 8) and sends it to the frame detector via bus 902 in FIGS. 8 and 30. In the preferred embodiment, the CPU is informed by the frame detector 513 as to when the CU gap and Barker code have been found by a signal on line 902 in FIG. 8 and by a connection not shown in FIG. 30. That information is given by the CPU to the time base circuit 886 in FIGS. 8 and 30 by a signal on bus 1350.

The frame detector 513 in the RU receivers is only active during this window signal, so clock recovery in the RUs is actually periodic and not continuous in the SCDMA example given by FIGS. 8 and 30 although a tracking loop is still used in the RU. The RU clock tracking loop forming part of the RU synchronization circuitry in FIG. 8 is frame detector 513, VCO 1030, time base 886 and line 1031. A low pass filter is present to filter out noise, but is not shown in FIG. 8. In FIG. 30, the clock tracking loop is frame detector 882, low pass filter 115, control loop 781, VCXO 784, time base 886 and window signal 1031 and clock line 117.

Figure 31:
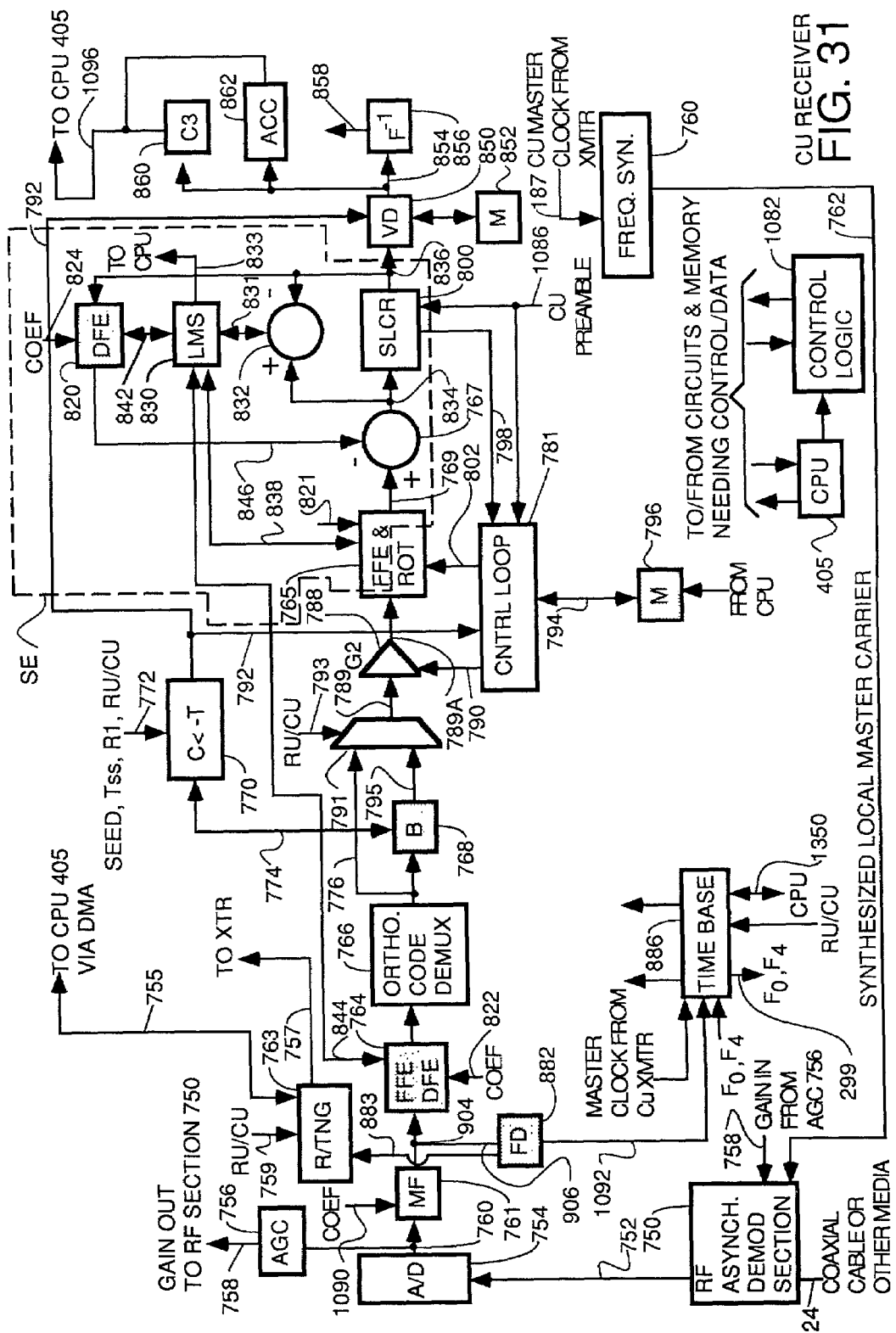
FIG. 31 is a more detailed block diagram of one embodiment for a CU receiver.

The time base circuit 886 in FIG. 8 is comprised of a series of cascaded counter stages that receive a high speed input clock that is phased locked by the clock steering signal from the frame detector (line 900 in FIG. 8 and FIG. 30). The cascaded counters generate the chip clock, frame clock, superframe clock and kiloframe clock signals. In FIGS. 30 and 31, the time base circuit 886 includes the circuits 369, 359 and 371 in FIG. 11 as well as other circuits to generate the window signal as described further below and circuits to generate the other signals on FIG. 10 as well as the F0 and F4 frame and superframe signals. The time base 886 in both the receiver and transmitter of each modem also include a chip counter and a frame counter as well as sampling registers which are used to correctly align the timebase with external signals. Once the time base is aligned to these external signals, all internal timing needs of the modems are served by the time bases so that they do not depend upon external signals for operation, but the external signals are monitored for loss or shift. In the case of the CU, the external signals to which the time base is aligned are the frame timing, timeslot timing and bit timing signals from the TDMA input stream to the CU transmitter. These signals are monitored by connections not shown in FIGS. 31 and 28. In the case of the RU, the external signals include the recovered master clock and the Frame and Kiloframe signals derived from the downstream data.

The time base circuit 886 provides these signals which include receive frame timing reference information to any circuit in the receiver or transmitter that needs this information such as the receiver's orthogonal demultiplexer 462 in FIG. 8 and the orthogonal code demultiplexer 766 in the receiver of FIGS. 30 and 31. The time base circuit also continually checks the position of the gap by sampling a gap detect signal from the frame detector on line 1092 in FIG. 30 and FIG. 8 over multiple frames so as maintain frame synchronization and know when frame synchronization has been lost. When the gap position is lost, the modem immediately attempts to resynchronize to the gap.

The orthogonal code multiplexers in the RU and CU transmitters also get receive frame timing reference signals, but these frame timing reference signals establish the boundaries of the CU's frame timing reference since each RU transmitter times its transmissions and other processing so that frames transmitted therefrom arrive at the CU coincident with the CU frame boundaries. And of course the CU transmitter needs to transmit its frames in synchronism with the CU frame boundaries. To that end, the receive frame timing reference signal generated by the frame detector 882 in FIG. 30 and 513 in FIG. 8 is sent to the modem's local CPU or other control circuit 405 via bidirectional bus 902 in FIG. 8 and via bus 883 and DMA memory 763 in FIG. 30.

Figure 33:
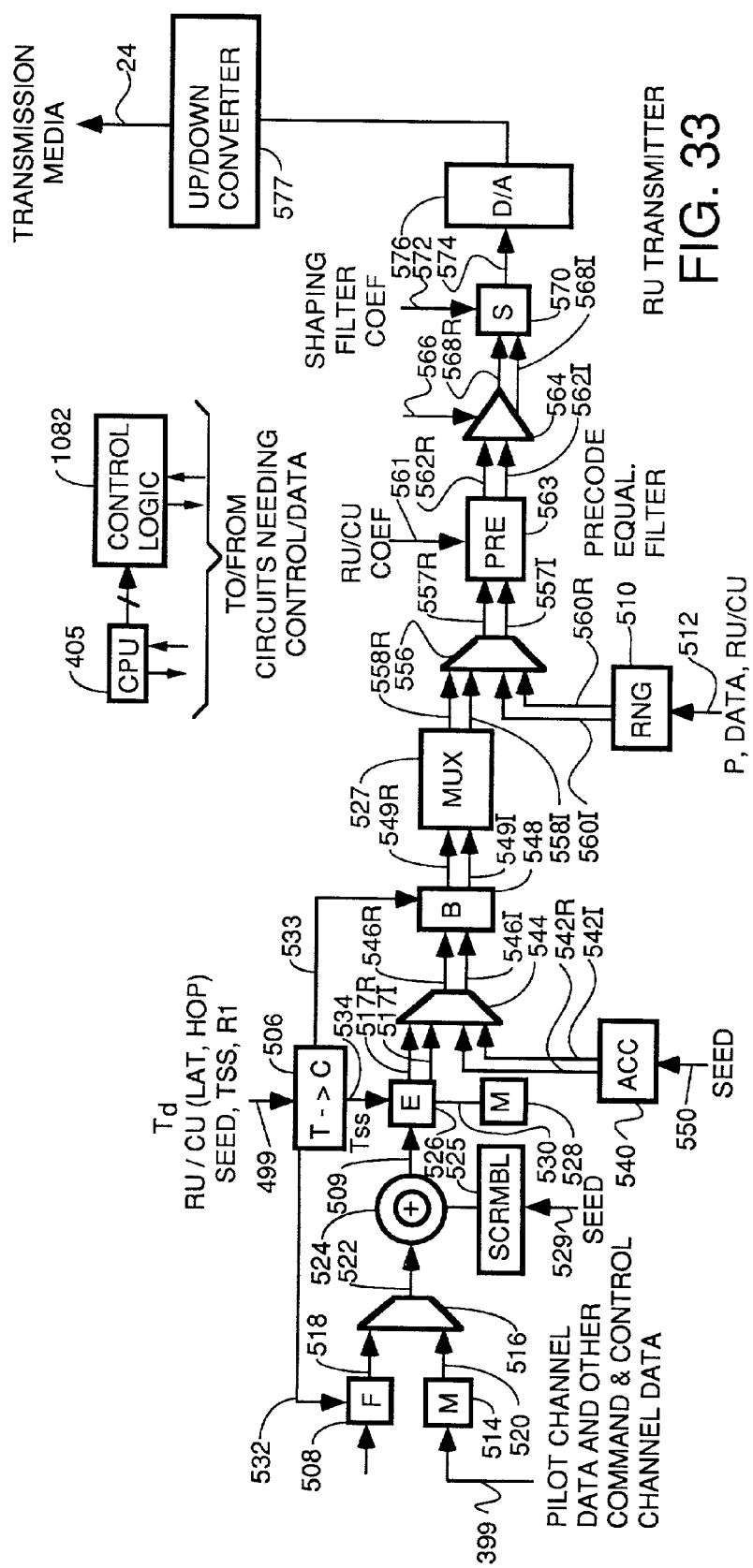
FIG. 33 is a block diagram for an SCDMA embodiment of an RU transmitter.

The CPU or other control circuit 405 then uses this frame timing reference to set the timing of the transmit frame timing delay $T_d$ on line 499 to the transmitter frame circuits 400 in FIG. 8 and via lines 499 and 532 in FIG. 33 to the framer circuit 508 in FIG. 33 (FIG. 33 is a block diagram of the preferred embodiment of the RU transmitter).

The fine tuning circuitry in the frame detectors 513 and 882, in FIGS. 8 and 30, respectively, performs clock recovery for chip clock synchronization by using early-late gating techniques in conjunction with correlation to generate a clock steering tracking error signal on bus 900. This signal corrects the phase of the output clock signal from a voltage controlled oscillator 784 in FIG. 30 and VCO 1030 in FIG. 8. This output clock signals is used by time base generator 886 in the RU to generate a local chip clock signal which is synchronous with the master chip clock in the CU. This recovered master chip clock signal and other timing signals generated from it are distributed to various circuits in the RU modem transmitter and receiver that need it to keep processing synchronized with processing in the CU.

The coarse tuning circuitry in the frame detectors 513 and 882 cooperates with a software process running in CPU 405 and the window signal generated by the time base under control of the CPU to help the frame detector locate the CU frame gaps. This is done using control and timing signals on bus 902 on the CPU and the real and imaginary data components on bus 904 output by the demodulator 460 in FIG. 8 and the matched filter 761 in FIG. 30. This gap location process is accomplished by continually moving the boundary of a sliding correlation window established by the signals on bus 1031 in FIGS. 8 and 30 until a correlation peak appears at the same time at least twice consecutively. How this works will be explained in more detail next.

Frame Detector

Referring to FIG. 30, there is shown a block diagram of the preferred form of a ranging detector which forms the heart of frame detector in each RU and is used in the CU for ranging detection of Barker codes. The frame detector circuit of FIG. 30 may be hereafter referred to as the ranging detector even though it has frame detection and chip clock synchronization functions as well.

The ranging detector has an acquisition mode and a tracking mode. In acquisition mode, it is simply trying to rapidly find a known Barker code arriving in the collection of signals on bus 904 in FIGS. 8 and 30. In the preferred embodiment, where the transmit data is passed through a raised squared cosine filter, bus 904 is coupled to the output of a matched filter having a transfer function which is the inverse of a raised squared cosine function. But in other embodiments, these two filters may be eliminated. Bus 904 carries data defining the real part of the received signal on line 906 and the imaginary or quadrature part of the received signal on line 908.

In acquisition mode, the interest is in quickly finding the gap by correlating the incoming signals with the known Barker code, but this can be done by simply looking at the sequence of signs of signals received since the Barker code is a known, unique sequence of chips of differing signs but constant amplitude. The Barker code can be located effectively in tracking mode by looking at only the sequence of differing signs in the received data. Therefore, in tracking mode, the CPU sends selection control signal ACQ on bus 902 to control the state of switches 906 and 908 so as to select the signals on buses 910 and 912. The signals on buses 910 and 912 are the outputs of circuits 914 and 916 which serve to compare the incoming signals on bus 904 to zero and output a first number if the sign of the incoming chip is + and output a second number if the sign of the incoming chip is −. When acq is not asserted, the raw data on buses 918 and 920 is selected for passing through switches 906 and 908. The acq signal also passes through OR gate 922 to gate the output signals from switches 906 and 908 through to finite impulse response filters 924 and 926 in acquisition mode for correlation. The OR gate 922 also receives a GAP_a signal which is asserted by the CPU via bus 902 when the CPU thinks it is in the gap by virtue of signals from the frame detector. Therefore, the signals on buses 928 and 930 from switches 906 and 908 will be correlated by FIR filters all the time when the ranging detector is in acquisition mode and, while in tracking mode, only during the gap.

The FIR filters 924 and 926 have impulse response functions which are programmable and are set by the CPU 405 to match the Barker sequence which the receiver is looking for. The Barker sequence being sought is defined by data written by CPU 405 into register 932. When this exact sequence of + and − chips resides in either one of the FIR filters, the filter output will peak. Absolute value circuits 934 and 936 are coupled to the outputs of the FIR filters, and output the absolute values of the FIR output signals on buses 938 and 940. Circuit 942 has two different modes which are selected by the acq signal on line 943. In acquisition mode when the receiver is trying to initially locate the gap, circuit 942 selects the greater of the signals on buses 946 or 948 for output on bus 944. In tracking mode, the sum of the signals on buses 946 and 948 is output on bus 944.

Comparator 950 acts to set a minimum threshold above which the FIR output peaks must rise before they are counted as possible reception of the CU Barker code. Comparator 950 compares the signals on bus 944 to a threshold level on bus 945, and, if the threshold is exceeded, outputs a logic 1 on bus 951 during the interval when the threshold is exceeded. The threshold level is set by data written into register 952 by CPU 405 via bus 902 (bus 902 contains more signals lines than just the two lines shown in FIG. 30). The number of peaks is counted by a false alarm counter 952 the output of which is stored in register 960 which is periodically read by the CPU in a process of monitoring and controlling the ranging detector. A process in CPU 405 which monitors the number of false alarms, sets the number of frames over which false alarms will be counted by writing a number of frames into register 956. This number is loaded into interval counter 954 which counts down from that number by counting the GAP_b signals on line 957 which occur one per frame. When the count reaches zero, line 958 is activated which clears the false alarm counter 952, strobes the count before clearing into register 960 and reloads counter 954 from register 956. When the CPU determines that the number of false peaks is too large according to the number in register 960, it raises the threshold by writing new data to register 952 to raise the threshold.

Course tuning to find the gap is accomplished by the ranging detector as follows. The CPU starts with an estimate of when it thinks the gap will start. At that time, signal GAP_a on bus 902 is asserted during each frame interval. The CPU only wants to look at peaks during the gap in each frame interval, so it uses a sliding window to restrict the time during which it is looking for peaks. The sliding window is symbolized by bracket 962 in FIG. 35. The boundaries of this window are established by data written by CPU 405 to register 964 in a manner to be described below.

Circuit 970 passes only the first peak on the output of the AND gate 968 which occurs after the GAP_a signal indicates the gap is thought to have started. A time base counter 972 counts chip clock signals on line 974 and is cleared by the GAP_a signal every frame. When circuit 970 passes a peak (actually a logic 1 level) through on bus 976, the current count of the time base counter 972 output on bus 980 is sampled and stored in register 978. The count value on bus 980 is also coupled to a comparison input of a greater than or equal to comparator 965, the other input of which is coupled to receive the output of the register 964. The output of the comparator 965 is the gating signal on line 966. Since the count of time base counter 972 will be reset to 0 at the moment the CPU thinks the gap is starting, the count stored in register 978 represents an offset error indicating how much later the gap may have actually started compared to the time the CPU thought the gap was starting.

Figure 35:
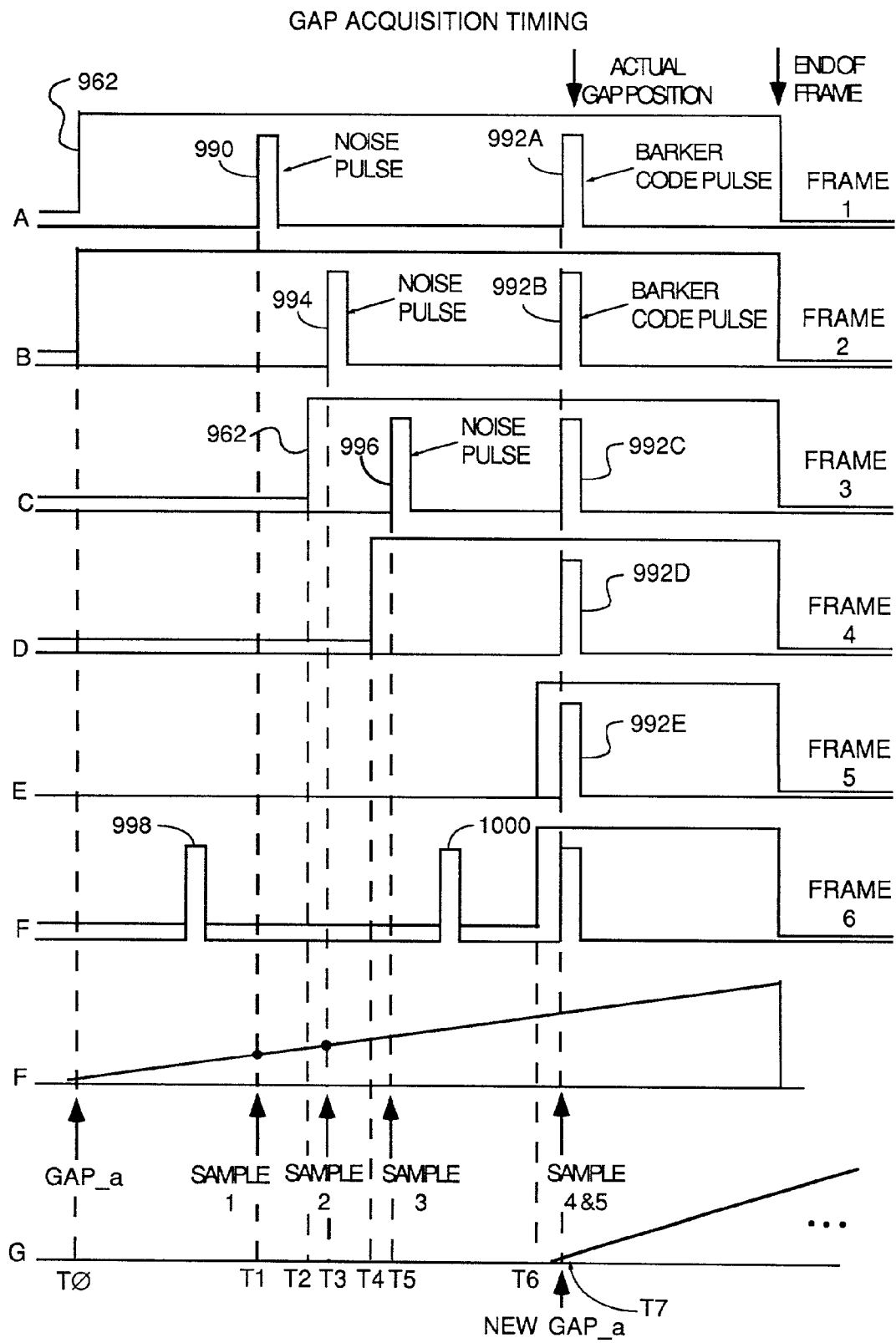
FIG. 35 is a timing diagram of the gap acquisition process in the RUs.

FIG. 35 is a timing diagram that helps explain the course tuning process to find the time the CU frame gap occurs which is carried out by the RU receivers. Timeline A of FIG. 35 represents the initial sliding window position 962 set by the CPU during a first frame before it is sure where the gap is and shows the times of two peaks observed during frame 1. Timeline B represents the position of the sliding window and the peaks observed during frame 2. Initially, the CPU does not know where the gap is, so the software process decides to watch for peaks on line 976 for the whole frame. Accordingly, the CPU writes a 0 into register 964 at time T0 and simultaneously activates the GAP_a signal. Activation of the GAP_a signal resets the timebase counter 972 and drives a logic 0 onto bus 980. The 0 in register 964 is compared to the 0 on bus 980 by greater than or equal to comparator 965 which finds an equality and sets line 966 to logic 1 thereby gating pulses on bus 951 from the threshold comparator through to the first pulse selection circuit 970. Comparator 965 drives line 966 to logic 1 anytime the number on bus 980 is greater than or equal to the output of register 964. This action opens sliding pulse observation window 962 in FIG. 35 at time T0. The window will remain open until the end of the frame.

During frame 1, shown on timeline A of FIG. 35, a noise pulse 990 is gated through circuit 970 at time T1, and the actual Barker code pulse 992A which occurs at time T7 is blocked by circuit 970. The occurrence of noise pulse 99Q causes sampling of the count on bus 980 by the register 978, which is indicated in FIG. 35 as sample 1 at time T1. This value is read by the gap acquisition process executing on CPU 405 and stored for later comparison.

Because the noise pulse 990 was random, it does not occur again at time T1 in the second frame shown on timeline B of FIG. 35. Instead, another noise pulse 994 occurs at time T3, later than T1, and another Barker code pulse 992B occurs at time T7. First pulse selection circuit again gates pulse 994 through and blocks pulse 992B. This causes the taking of sample 2 of the count on bus 980 during frame 2. The coarse tuning gap acquisition process reads the value stored in register 978 and compares this value to the value previously read from this register during frame 1. The CPU concludes pulse 990 occurred at a different time than pulse 994, and, therefore, pulse 990 was noise and cannot be attributed to the Barker code because if it were the Barker code, it would not be random and would have occurred at the same time. Accordingly, the gap acquisition process moves the position of the window 962 for frame 3 to open at a time just before the occurrence of pulse 994 so as to eliminate any pulses before that time from consideration but so as to analyze pulse 994 to see if it is attributable to the Barker code. The CPU gap acquisition process moves the position of window 962 by taking the sample 2 number from register 978, subtracting a fixed amount from it, and writing the result to register 964.

The situation for frame 3 is shown on timeline C of FIG. 35. The window 962 opens at time T2, but because pulse 994 in frame 2 was noise, it does not occur again in frame 3 at time T3. Instead, noise pulse 996 occurs at time T5, and is gated through by circuit 970 while the actual Barker code pulse 992C is blocked. Pulse 996 causes sample 3 to be taken. The gap acquisition process compares sample 3 to sample 2 and concludes that pulse 994 was noise because pulse 996 did not occur at the same relative time (relative to the occurrence of GAP_a). Accordingly, the gap acquisition process concludes that the window 962 can be moved again. This time, the window is moved to open at a time T4 just before the time of occurrence of pulse 996 at time T5.

During frame 4, window 962 opens at time T4, but no pulse occurs again at relative time T5, but the Barker code pulse 992D occurs again at time T7. This Barker code pulse is gated through by circuit 970 and causes sample 4 to be taken. The gap acquisition process reads sample 4 and compares it to sample 3, and decides that pulse 996 was noise because pulse 992D did not occur at the same relative time. Accordingly, the gap acquisition process moves the position of window 962 again so as to open at a time T6 just before the occurrence of pulse 992D.

The situation during frame 5 is shown on timeline E of FIG. 35. The window opens at time T6 thereby precluding consideration of any pulses occurring before T6. Another Barker code pulse 992E occurs again at relative time T7 which is gated through as the first pulse in this frame after the window opened by circuit 970. This causes the taking of sample 5 which the gap acquisition process compares to sample 4 and concludes that the relative times of occurrence of pulses 992D and 992E were the same. The gap acquisition process then concludes that pulses 992D and 992E were Barker code pulses and that it has found the gap. Accordingly, the gap acquisition process leaves the window 962 set to open at time T6 in frame 6 shown on timeline F of FIG. 35 thereby ignoring noise pulses 998 and 1000 which occur before T6. The gap acquisition process then moves the time of activation of GAP_a to time T7, as shown on timeline G in FIG. 35, and switches the ranging detector to go into tracking mode for the chip clock recovery process by de-asserting the acq signal on bus 902.

Figure 36:
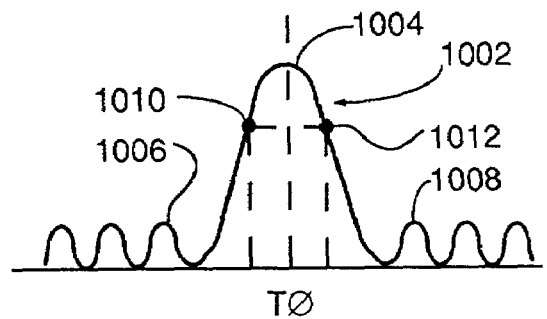
FIG. 36 is a diagram of the early-late gating process to recover the master clock phase information in the RU receivers.

The chip clock recovery process is carried out by early-late gate sampling circuitry in FIG. 30 and, in the preferred embodiment, begins after the gap acquisition process. The basic concept is illustrated in FIG. 36 which is a diagram of the sampling by the early-late gating circuitry of the output of the FIR filters (correlator output) when phase lock with the chip clock has been achieved. Curve 1002 represents the output signal on bus 944 from the correlation process that occurs in the FIR filters 924 and 926 between the known Barker code (defined by coefficients in register 932) and the incoming signal. The major peak 1004 centered on time T0 (a different T0 than in FIG. 35) represents the correlator output when the Barker code sent in the gap by the CU arrives and is perfectly aligned in the FIR filters 924 and 926 with the data in the register 932. This register contains data defining the + and − polarity sequence of the individual elements of the Barker code sent by the CU. Every CT-2 chip clock (8 chip clocks), a new digital sample of the received signal enters the FIR filters. The FIR filters do a summation of the results of each stage every CT-2 chip clock. When all the samples of the Barker code have entered the FIR and are aligned with the + and − polarity sequence that defines the Barker code the receiver is looking for, the summation on the CT-2 chip clock that results in the alignment causes the peak 1004 at the output on line 944. Peaks 1006 and 1008 are examples of the summation results in the FIR filter before and after perfect alignment occurs. Points 1010 and 1012 represent sample points each of which is spaced apart from time T0 by one CT-2 chip clock. When the local clock oscillator 784 in the embodiment of FIG. 30 or VCO 1030 in FIG. 8 is exactly aligned in phase with the phase of the master clock signal generated by the CU, the amplitudes of sample points at 1010 and 1012 will be the same. When there is some phase error, the two sample point 1010 and 1012 will have unequal amplitudes because pulse 1004 will not be symmetrically centered on T0. This generates the error signal CLOCK STEERING on line 900 in FIGS. 8 and 30 which causes the phase of a chip clock voltage controlled oscillator in the phase locked loop to shift in such a manner as to alter the timing in which the data samples are fed into the FIR filters 924 and 926 so as to get the correlator main pulse 1004 to center on time T0.

The manner in which this clock recovery process is carried out by the circuitry of FIG. 30 is as follows. Circuits 1014 and 1016 are the digital equivalents of sample and hold circuits. Circuits 1018 and 1020 are each delay circuits that each impose a CT-2 chip clock delay on a sample signal on line 1022. This sample signal is generated by the CPU 405 once per frame at a predetermined time in the gap after the GAP_a signal is activated. The sample signal cause circuit 1014 to sample the magnitude of the pulse 1004 on line 944 so as to take sample 1010 in FIG. 36. This sample value is coupled to one input of a subtractor 1024, the other input of which is the magnitude of the signal on bus 944 (all processing is digital in the preferred embodiment). The subtractor 1024 constantly subtracts the first sample value 1010 stored in register 1014 from the changing values on bus 944 and presents the difference on bus 1026. Two CT-2 chip clocks later, the sample signal on line 1022 reaches register 1016 and causes it to store the difference value at that time on bus 1026. The value stored in register 1016 is the difference in amplitude between samples 1010 and 1012 in FIG. 36. This value is the track error signal on bus 900. The CLOCK STEERING signal on line 900 is digitally integrated in a low pass filter (not shown in FIG. 8—block 115 in FIG. 30) to eliminate the effect of random noise, and the result is used as an error signal to correct the phase of a voltage controlled oscillator 784 in FIG. 30 and VCO 1030 in FIG. 8. These voltage controlled oscillators serve to generate the local chip clock reference signals in the embodiments of FIGS. 30 and 8. This chip clock reference signal is coupled on bus 1032 in FIG. 8 and buses 786, 793 and 888 in FIG. 30 to time base 886 which generates the other timing signals needed to synchronize operations of the receiver and transmitter in FIG. 8.

In alternative embodiments, the chip clock could be recovered by transmitting the chip clock with the data bearing signal in multiplexed form and then using appropriate filtering or demultiplexing at the RU to extract the chip clock. Another possibility is to use a noncoherent detector to extract the chip clock taking advantage of the fact that the chip clock timing is more stable than the carrier phase. The carrier is then recovered by processing the detector output during every clocked interval. Another possibility where clock recovery follows carrier recovery, as is done in the preferred embodiment, is to extract the chip clock from demodulated baseband output from the CDMA demultiplexer.

In addition, all the RUs may possibly synchronize to a single common external time source such as GPS satellite time information although synchronization to within 1 microsecond may not be adequate accuracy in all applications. Any conventional methodology for achieving synchronization of the RU chip clocks and local oscillator signals to the corresponding signals in the CU will suffice for purposes of practicing the invention.

Figure 37:
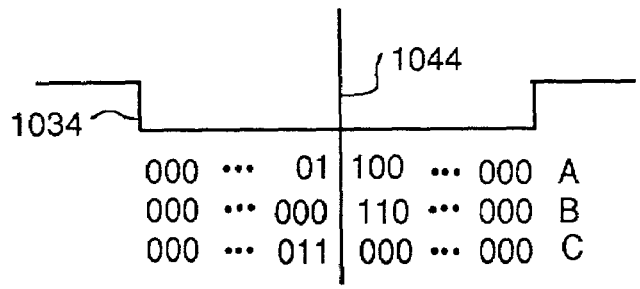
FIG. 37 is a diagram illustrating the data patterns which are acceptable for a centered Barker code to be declared in the fine tuning process.

The ranging detector of FIG. 30 also includes circuitry to determine when a Barker code is exactly centered in the gap. This capability is used in the CU version of the ranging detector during the fine tuning process at the end of the ranging process where the CU sends instructions to the RU on how to adjust its transmit frame timing delay to exactly center its Barker code in the gap. How this is done will be explained with reference to FIG. 37 which illustrates the 3 permissible patterns of data at the output of comparator 950 for a centered Barker code condition to be declared. Basically, the gap is 32 chip clocks wide, and is represented by window 1034. Comparator 950 will output 32 logic 0s or 1s during the gap interval, and these are shifted into shift register 1036. Two latches 1038 and 1040, each 16 bits wide, have their inputs coupled to the 32 bit parallel output bus 1042 of the shift register. These two registers 1038 and 1040 are constantly enabled, and are loaded with the contents on bus 1042 at the end of the gap with one taking the lower 16 bits and the other taking the upper 16 bits. For the Barker code to be centered only the three bit patterns shown in FIG. 37 are permissible. The first bit pattern on line A indicates two logic 1s on either side of the gap centerline 1044 and represents the data pattern that will be present in latches 1038 and 1040 when the RU's transmitted Barker code has been exactly centered. The bit patterns on lines B and C represent acceptable conditions where the Barker code is not exactly centered. The data patterns in registers 1038 and 1040 are read by the ranging process in execution on CPU 405 during the fine tuning process to deduce what instructions to give the RU to change its transmit frame timing delay $T_d$ so as to move its Barker code toward the center of the gap.

Returning to the consideration of FIG. 8, the remaining receiver side circuitry of the transceiver will be described in more detail. As is the case with the transmit channel, the processing performed in the receiver may be performed using analog or digital or some combination of analog and digital circuitry. The receiver will be described as if all processing was digital as it is in the preferred embodiment. The signal received from the shared transmission media 412 is passed through an analog-to-digital converter (not shown) and the resulting digital data stream is passed to a demodulator 460.

Figure 29:
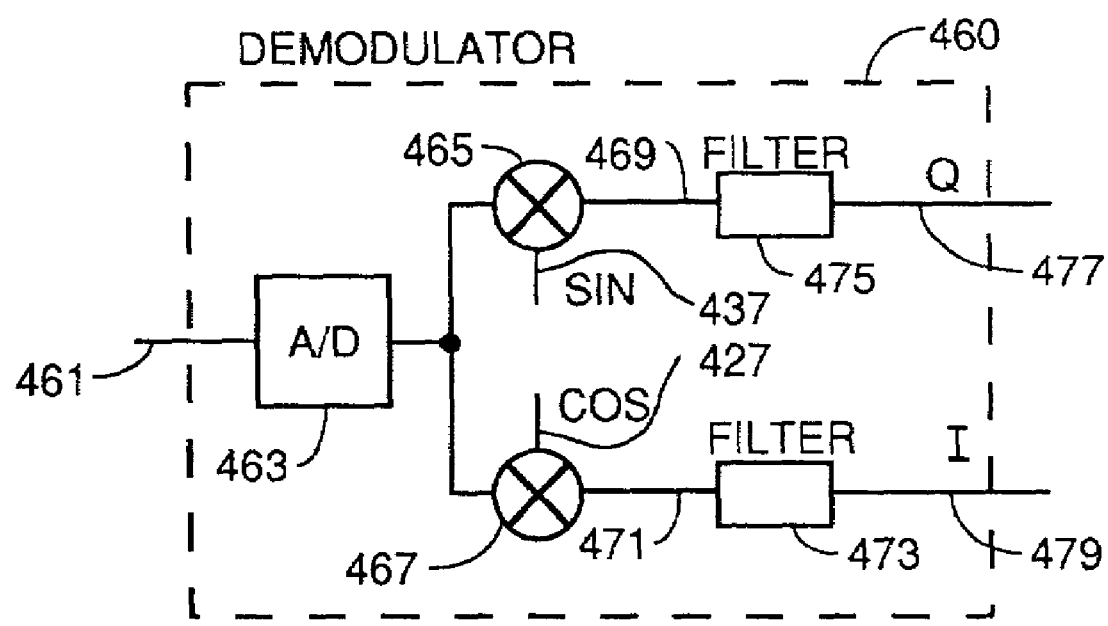
FIG. 29 is a block diagram of one embodiment for a demodulator for used in the CU or RU receivers.

FIG. 29 is a more detailed diagram of the structure of the demodulator 460 in the receiver. The received analog signal from the shared transmission media is coupled on line 461 to the analog input of an A/D converter 463. The stream of digital data resulting from the analog-to-digital conversion is simultaneously fed to two multipliers 465 and 467. Multiplier 465 receives as its other input on line 481, a stream of digital values that define the master carrier in the CU or the local carrier reference in the RU having the same frequency and synchronous in phase with the RF carrier sine wave on line 427 in FIG. 8. Multiplier 467 receives as its other input on line 427, a cosine signal which is synchronous with the CU's master carrier pilot channel broadcast in timeslot 0 but 90 degrees out of phase therewith. The inputs labelled SIN and COS in FIG. 26 are generated by the carrier recovery circuit 515 in the embodiment of FIG. 8 where carrier recovery is performed. The code dedicated to the pilot channel is used to spread the pilot channel signal using conventional spread spectrum techniques. Each receiver decodes the pilot channel using this same code to recover the pilot channel carrier signal and applies the recovered signal to a phase detector in a phase lock loop which is used as a local oscillator source for the demodulator in each RU receiver section and the modulator in the RU transmitter section.

The results output from the demodulator on lines 469 and 471 are digital baseband data streams which basically defines the mix products comprised of a fundamental carrier frequency and upper and lower sidebands. Digital filters 473 and 475 filter out the desired sidebands that contain the real and imaginary parts of each chip or result point that was transmitted. The stream of quadrature or imaginary components of the received chips are output on bus 477. The stream of inphase or real components of the received chips are output on bus 479. Per the teachings of the invention, the recovered clock and carrier signals in the RU are then used for transmissions by the RU to the CU so that the CU can coherently communicate with the RU's without having to synchronize to different clock and carrier signals used by the RU's.

In alternative embodiments, the RUs can use their own clock and carrier signals which are unrelated to the CU's versions and the CU can contain its own phase lock loop circuitry to recover these signals and synchronize to them in order to demodulate and interpret the data transmitted by the RUs.

In some embodiments, the streams of real and imaginary components of the 144 chips of each symbol on buses 477 and 479 are stored in two linear arrays in CDMA Demultiplexer 462 in FIG. 8. The CDMA Demultiplexer 462 multiplies each of the real and imaginary component arrays times the transpose of the code matrix used by the CDMA MUX 408 of whatever RU or CU that transmitted the data to reverse the orthogonal code encoding process. This matrix multiplication process results in two linear arrays of decoded chip real and imaginary parts for each symbol. These arrays are stored by the CDMA Demultiplexer 462 in memory 464. In alternative embodiments, the CDMA Demultiplexer processes the two streams of real and imaginary components "on the fly" such that they do not have to be first stored as input arrays in a memory in the CDMA Demultiplexer 462.

The mapping by orthogonal code transformation from the constellation of possible input points shown in FIG. 21 leads to a constellation of possible points in a received chip space. A detector 466 of the RU shown in FIG. 8 or detector 467 of the CU shown in FIG. 28 examines the points in each of the arrays and compares the received chip points they define against the legitimate possible points in the received chip space. The detector, otherwise known as a slicer, is a known type of circuit and no further details are necessary herein. The function of the detector is to restore the gain and phase of the received signal using G2 and rotational amplifiers, recover the pilot channel data therefrom and generate slicer error signals on bus 517 for the pilot channel data for use by carrier recovery circuit 515 in FIG. 8 so as to allow generation of a local carrier reference which is in synchronization with the master carrier, determine the boundaries of each payload data chip and determine the values for the I and Q coordinates of each received chip and compare the I and Q coordinates of each received chip point against the closest points in the constellation of legitimate possible points in the received chip space that could have been transmitted. The detector then makes a preliminary decision as to which of the possible legitimate points in the received chip constellation each received chip is likely to be.

The detector 466 outputs its preliminary determinations to a Viterbi Decoder 468 which performs the prior art Viterbi algorithm to determine the actual constellation point sent with each chip. The Viterbi Decoder uses the 4th bit in each chip of each symbol to detect and correct errors using the Viterbi algorithm to derive the most probable tribit path defined by the points actually sent from the path in the received chip space defined by the 4-bit components of the symbols actually received. The addition of the 4th bit to each tribit converts the input constellation from an 8 point to a 16 point constellation by addition of redundancy. The addition of this redundant 4th bit increases the distance between the path through a space defined by successive input constellations, one for each symbol time. The fact that the chip path is farther from the 3 bit path makes it easier for the receiver to divine from the noise corrupted received data what the actual tribits transmitted were. Viterbi Decoders are well known in the art of digital communications, and no further details will be given here. This Viterbi algorithm could be carried out by a programmed digital computer if slow speed is enough or by a dedicated hardware circuit if speed is important. Viterbi Decoder based systems are used by Qualcomm, Inc. in San Diego in cellular phone systems to combat noise in digital cellular phone transmissions, and the details of their patents and products are hereby incorporated by reference.

The output data points from the Viterbi Decoder are a stream of tribits. These tribits are stored in a memory in a deframer circuit 470 which functions to reassemble a replica of the TDMA data stream in the time domain from the incoming stream of chips or tribits comprising each symbol. This process is done by reversing the reading and writing processes described above in filling and emptying the framer memory 300 of FIG. 14.

Fallback Mode

Fallback mode is entered when noise power gets too high. The noise power is detected by the CU, and when it reaches a predetermined threshold, the CU commands all RU modems to reduce the amount of payload in each symbol and add more redundancy. Fallback mode is implemented by a mode control signal on line 530 in FIG. 32 to the encoder circuit 526 (the connection to the CPU 405 is not shown). This mode control signal can command three modes: idle mode where the encoder pass the tribits adding only zeroes as the 4th bit; normal mode where 4th bits are added based upon the previous state for that timeslot during the last symbol time; and fallback mode where more redundant bits are added to each 4-bit group and correspondingly less payload data in included in each 4 bit group.

Code Diversity in CDMA to Improve Performance

Figure 38:
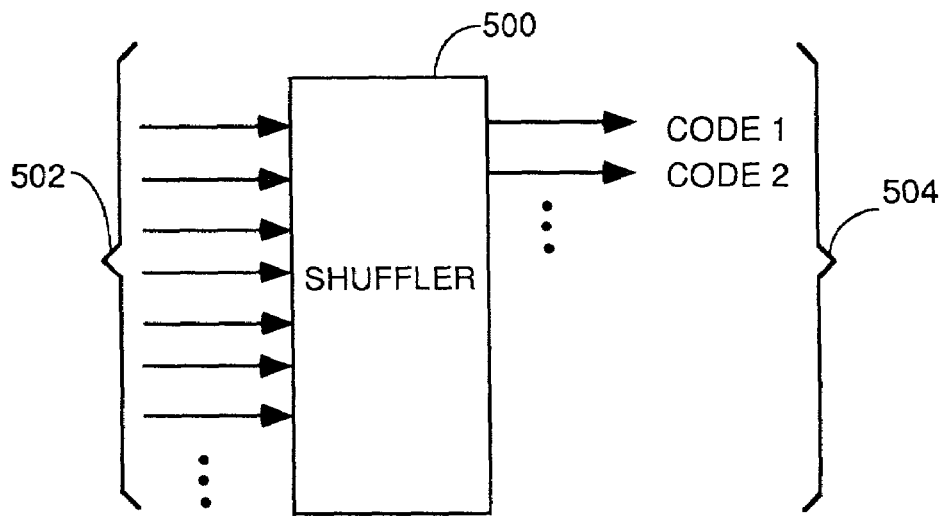
FIG. 38 is a block diagram of one form of implementation of code diversity shuffling.

Referring to FIG. 38, there is shown a diagram of a machine to achieve code diversity in CDMA systems so as to improve the performance thereof. The code diversity apparatus and processing described herein is useful in any digital data communication system wherein code diversity is used to keep separate conversations separate. It has been found by the applicants that in CDMA systems, some codes are more sensitive than others to misalignment and narrow band interference and will have higher bit error rates. In most systems, the higher bit error rate caused by one code would be unacceptable and the codes which are more sensitive to noise could not be used. In some systems with large numbers of channels of digital data to send, there are only one or a few code sets which have enough codes which are orthogonal to accommodate all the channels. For example, with 144 different timeslots/channels, there is only one code set with 144 orthogonal codes. Rather than omit the codes which are too sensitive and possibly not have enough codes to accommodate all channels, the codes are shuffled between channels randomly thereby spreading usage of the weaker codes around among the different channels. Code diversity requires coordination between code diversity tables in the RU transmitter and the CU receiver so that both are using the same codes during the same frames to encode and decode specific timeslot data. There are also restricted code lists that list codes that are not to be used. RUs that implement code diversity must maintain their code diversity and restricted code tables up to date with CU downstream messages to remain operational. The RU computer must download a checksum verified copy of the current tables and activate the tables before the modem can initiate or receive connection requests. Downstream messages updating the code diversity and restricted code list tables are sent from the CU with a superframe tag number which defines when the update is effective. Every downstream message includes a table checksum against which the RU modem can check its own checksum to insure validity of its tables. The CU broadcasts its checksum each superframe, and each RU maintains an independent checksum.

This code diversity concept can be used in any CDMA system. In CDMA systems where all the timeslot data is collected in one physical location, code diversity can be implemented using a shuffler 500 shown in FIG. 38. In this application, the shuffler is a crossbar switch which receives a plurality of inputs 502 and has a plurality of outputs 504. The inputs 502 each carry the digital data from one timeslot. The outputs 504 each carry the digital data from a randomly assigned one of the inputs, which changes periodically, and are coupled to matrix multiplication circuitry such that each timeslot's data gets multiplied by a different code during different periods. The inputs 502 are coupled to the inputs of a crossbar switch within shuffler 502 which periodically or randomly shuffles each of the inputs to a different output line for coupling to a multiplier for multiplication by a CDMA spreading code assigned to that output line. The crossbar switch can take the form of the high speed crossbar switch disclosed in U.S. Pat. No. 5,355,035 which is hereby incorporated by reference.

In systems like the CDMA CATV system disclosed herein where at each RU not all the timeslot data for all 144 timeslots is present at each location, the shuffler takes a different form and is located in the CU. In this embodiment, the inputs 502 represent requests for bandwidth relayed to the CU by all the RU's, and the outputs 504 represent code assignment transmissions to the RU's over the command and control channels where the code assignments could change every frame or even after transmission of each symbol. At the CU however, all the timeslot data of channels to be transmitted to the RU's is located in one place, so the shuffler can take the physical crossbar switch form previously discussed in the paragraph next above. The shuffler 500 can also take the form of a suitably programmed computer to shuffle the timeslots to different codes as well as perform the matrix multiplication.

The use of this shuffling technique spreads the weak codes around but the weak codes still cause errors. If the level of errors generated by this technique cannot be tolerated, forward error correction is used in conjunction with the code diversity to eliminate the errors. Forward error correction means sufficient redundant bits are inserted into the data stream by the encoder 526 in the CU and RU transmitters to allow any errors to be corrected without the need for retransmission of frames with errors. In the specific embodiments disclosed herein, Trellis modulation is used with a convolutional encoder in each RU and CU transmitter to calculate and add to each tribit a redundant 4th bit. These 4th bits are used by the receivers and Viterbi Decoders therein to correct errors by making judgments from the received data which points from the constellation of possible points were actually sent.

In the preferred embodiment for a transmitter described below with reference to FIG. 32, a diversity shuffler 506 implements code diversity by coordinating the shuffling of timeslot data to different, randomly selected CDMA spreading codes by the signals on buses 532 to the framer 508 and the signals on bus 533 to the buffer 533. This will be described in more detail below.

Preferred RU Transmitter Block Diagram

Figure 32:
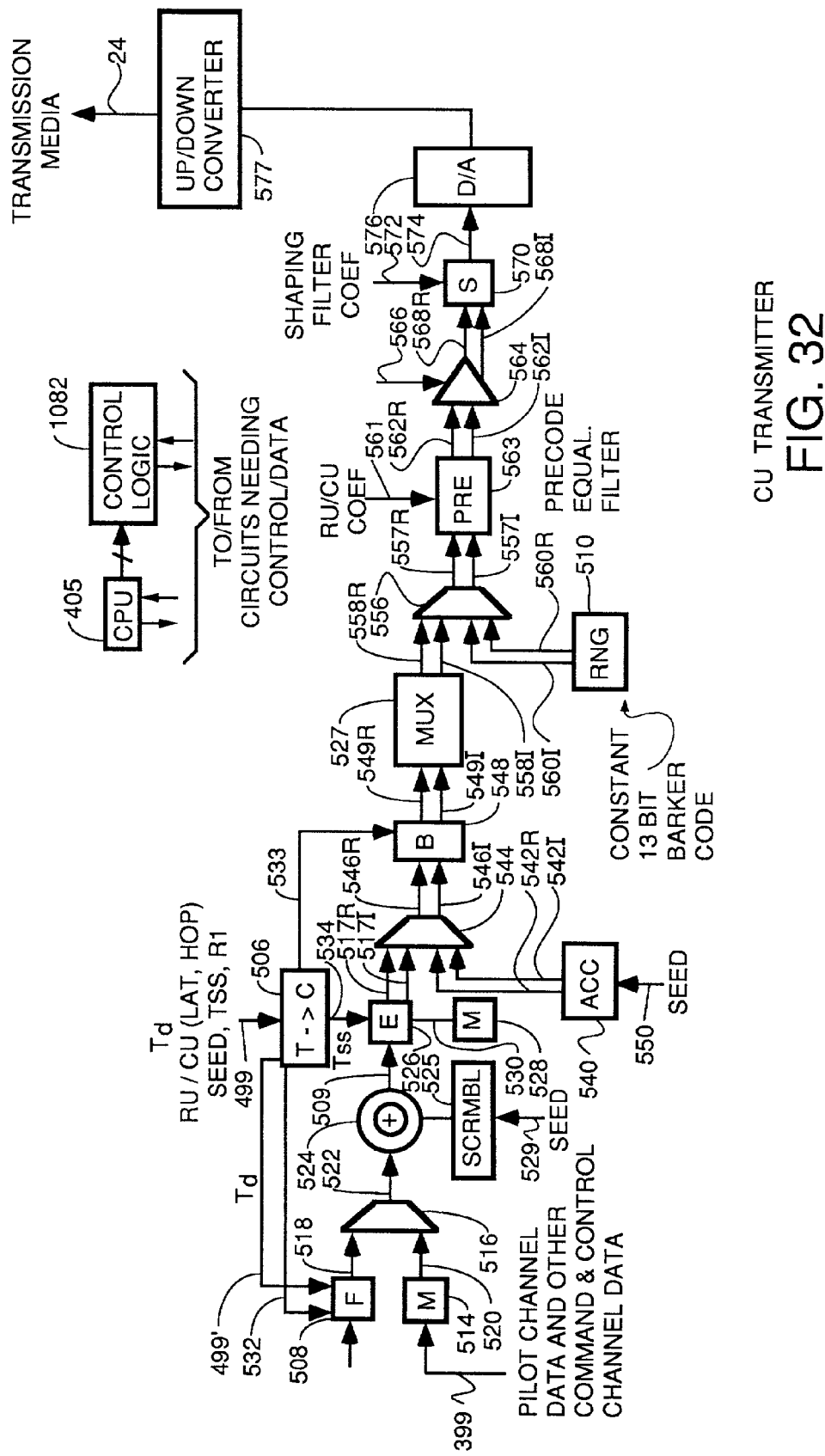
FIG. 32 is a block diagram for an SCDMA embodiment of a CU transmitter.

Referring to FIG. 32, there is shown a block diagram of the preferred species of transmitter circuitry for an SCDMA species of CU transmitter within the genus of the invention. FIG. 33 is the preferred RU transmitter embodiment for a species within the genus of the invention. The transmitters of FIGS. 32 and 33 will be discussed jointly and only differences between them will be separately discussed. References to the transmitter should be understood as referring to either the RU or CU type. The transmitter is used in the transceivers of the RU and CU modems to transmit via synchronous CDMA data in both the upstream and downstream direction although transmission in the downstream direction can be by TDMA or any other scheme without adversely affecting performance. SCDMA is preferred for the upstream direction because of its increased throughput capacity. In the CU access control circuitry 540, the data points for management and control information is chosen to be ASK or DQPSK points from the QAM constellation so that ranging communications and other communications that need to occur before the RU receiver achieves phase synchronization can still occur.

In FIG. 32, block 506 is the diversity code shuffler that implements the time to code transformation. The code shuffler receives a pseudorandom seed number on bus 499 which controls the pseudorandom order of shuffling of codes such that the various timeslots or channels are not always encoded with the same CDMA codes. Bus 499 also carries Tss data which defines which timeslots are assigned to this RU transmitter and an RU/CU signal which tells the code shuffler whether it is operating in an RU or CU. The R1 data on bus 499 defines reserved codes which cannot be used, and the $T_d$ data is received from the CPU and receiver frame detector circuitry to set the transmit frame timing delay value for this RU so as to hit the gap with its Barker code thereby achieving frame synchronization.

Block 508 is the framer circuitry that implements the variable transmit frame timing delays needed to implement the ranging process to achieve the necessary frame synchronization and time alignment of the CDMA spread channel data for synchronous CDMA. The framer circuitry 508 is described in more detail in FIG. 12. Block 548 is a buffer that stores the shuffled 4 bit groups of symbol elements which serve as the information vector [b] for the matrix multiplication performed by the CDMA Multiplexer 527. Code diversity can be implemented by block 506 by controlling the order of tribits read for each symbol from framer memory 508 via read pointers sent to the framer on bus 532, and the framer structure must be such that read pointers can be externally supplied. The time delay value Td is supplied to the framer via bus 599'. The tribits exit the framer on bus 518 in the order dictated by the read pointers supplied either externally via bus 532 or internally generated. They are pseudorandomly scrambled by scrambler 524 in the manner described below (in the preferred embodiment) and redundant bits are added by encoder 526 if operating in normal or fallback mode. The randomizer machine scrambles the incoming data for privacy and to make the data look more like white noise. This reduces the dynamic range at the output of the transmitter. The randomizer receives its scrambling instructions from a scramble register 525 which receives and stores a seed code on bus 529. In some embodiments, the randomizer 524 can be omitted.

Encoder 526 adds at least one bit to every tribit in the preferred embodiment to implement Trellis modulation. Some embodiments have no encoder, and some embodiments have an encoder which has no idle and/or no fallback mode.

The encoded bits are divided into real (or inphase) and imaginary groups by dividing each encoded tribit in half and outputting the first 2 bits as the real bits on bus 517r and the last two bits on bus 517i. Buses 517r and 517i are coupled to a switching circuit 544 which also receives as inputs real and imaginary components of access channel information on buses 542r and 542i. During normal payload transmission operations, switching circuit 544 selects the data on buses 517r and 517i for coupling on buses 546r and 546i to buffer memory 548. During access channel operations, switching circuit 544, under control of microprocessor 405 or other timing logic, selects the data on buses 542r and 542i for coupling on buses 546r and 546i, respectively. The real and imaginary components in each tribit on buses 546r and 546i are written into buffer 548 in the order dictated by write addresses on bus 533. Elsewhere herein, the manner in which the multiplexer 544 is operated to overlay media access control data on buses 542r and 542i with payload data on buses 517r and 517i in buffer 548 is described. Buffer 548, when fully written, during each symbol time has 144 4-bit elements comprising an information vector the order of which is randomly scrambled anew each symbol time in the preferred embodiment. In other embodiments, the codes may be assigned sequentially during each symbol for all active timeslots, or a rolling sequential assignment of codes to all active timeslots may be used.

Figure 39:
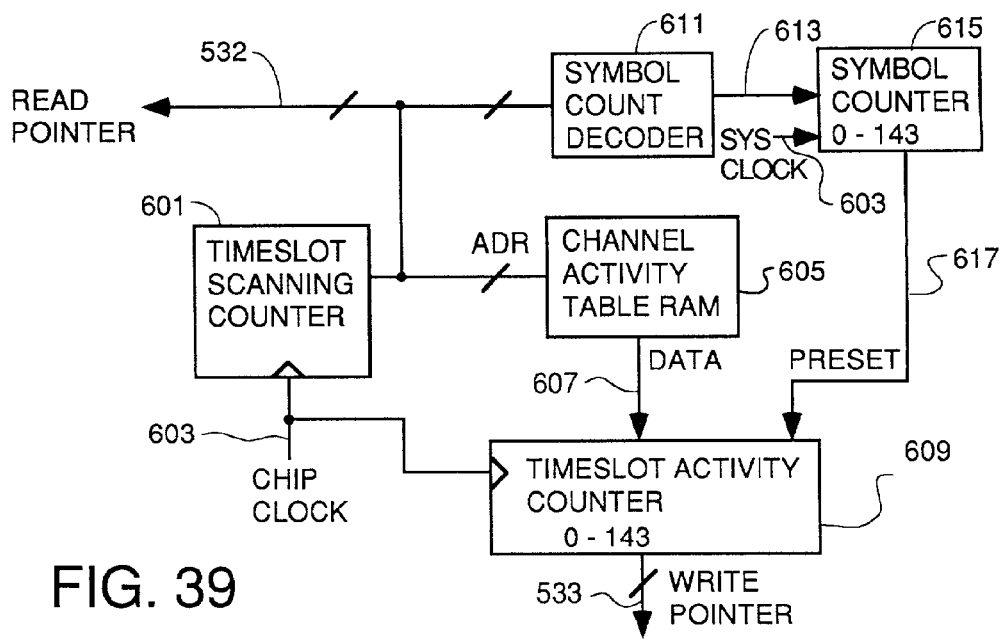
FIG. 39 is an alternative embodiment for a code diversity shuffling circuit.

Referring to FIG. 39, there is shown a block diagram of a simple embodiment for the code diversity shuffler 506. This embodiment does not do random shuffling but does a rolling shuffle in the following manner. Each RU and the CU has a code diversity shuffler of the same type and all shufflers operate synchronously to shuffle the same timeslots to the same codes simultaneously. A timeslot scanning counter 601 increments from 0 to 143 in synchronism with a system clock on line 603. This count is output on bus 532 as an address to a random access memory 605 which stores a copy of the channel activity table. The channel activity table is a table which stores data indicating which of the 144 timeslots are currently being used. The CU broadcasts data to all RUs indicating which channels are currently assigned, and each RU updates its activity table using circuitry not shown in FIG. 39. Bus 532 carrying the timeslot scanning counter output is also coupled to the framer 508, and the count on bus 532 acts as a read pointer controlling which tribit from the current symbol being read is output from the framer on bus 518. The count on bus 532 is also coupled to an address input of RAM 605 and causes data to be output on bus 607 indicating whether the channel corresponding to the current count is currently assigned. This data is, for example, a logic 1 if the timeslot is assigned and logic 0 if not. The bus 607 is coupled to the increment input of a timeslot activity counter 609 which has its clock input coupled to the system clock on line 603. When a logic 1 is output on bus 607, the timeslot activity counter 609 increments on the next upward clock transition. Counter 609 counts sequentially from 0 to 143 and then rolls back over to zero. The output of the counter 609 on bus 533 is coupled as a write pointer to the address input of buffer memory 548 in FIG. 32 and controls where the tribit output by the framer 508 is written, after encoding by encoder 526, in the information vector [b] stored in buffer memory 548. The read pointer on bus 532 is also coupled to a symbol count decoder 611 which generates an incrementation signal on line 613 each time the count on bus 532 reaches 143 thereby indicating the first tribit of a new symbol will be read on the next upward system clock transition. A symbol counter 615 then increments on the next upward clock transition to generate a new symbol count on bus 617. This symbol count is coupled to a preset input of the timeslot activity counter 609 and causes the timeslot activity counter to be preset to whatever symbol count exists on bus 617 and to continue to increment from there as active timeslots are found. When symbol counter reaches 143, it rolls over to 0. Thus, for each new symbol, the timeslot activity counter starts incrementing from a new number. This causes a rolling shuffle of the positions in which the 4-bit groups are placed in buffer memory 548 thereby causing each active timeslot to be spread using a different code during each new symbol to achieve code diversity.

Figure 40:
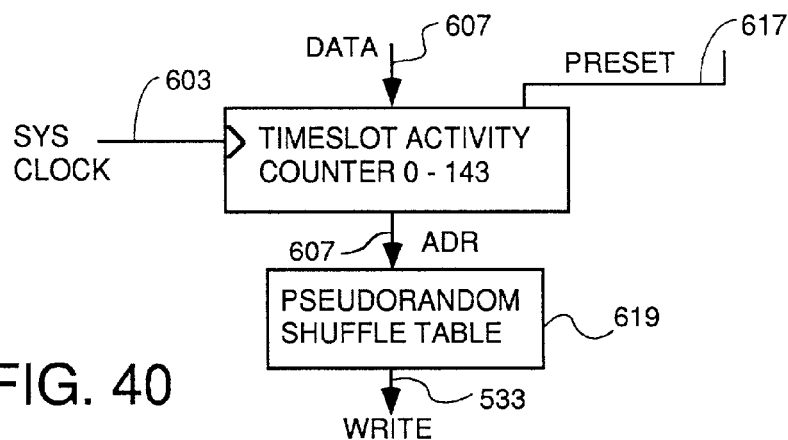
FIG. 40 is another alternative embodiment for a code diversity shuffling circuit.

FIG. 40 is a block diagram of another embodiment for a code diversity shuffler that can be substituted for diversity shuffler 506 in FIG. 32. This embodiment does a pseudorandom shuffle of codes using a shuffling table filled with pseudorandomly distributed write pointers. In FIG. 40, all elements are the same as in FIG. 39, except that the output on bus 533 from the timeslot activity counter 609 is coupled as an address input to a memory 619 which can be either a RAM, ROM, PROM, EEPROM or EPROM. Memory 619 stores a collection of 144 write pointers which are pseudorandomly distributed relative to the sequential address inputs. Each count on bus 607 from the timeslot activity counter causes whatever pseudorandom write pointer is stored in that address in memory 619 to be output as the write pointer on bus 533 to buffer memory 548 in FIG. 32. All RUs and CUs have an identical copy of the pseudorandom shuffle table stored in memory 619, and all RU's and the CU synchronously scan the activity table and synchronously, pseudorandomly assign the same CDMA spreading codes to the active timeslots.

Figure 41:
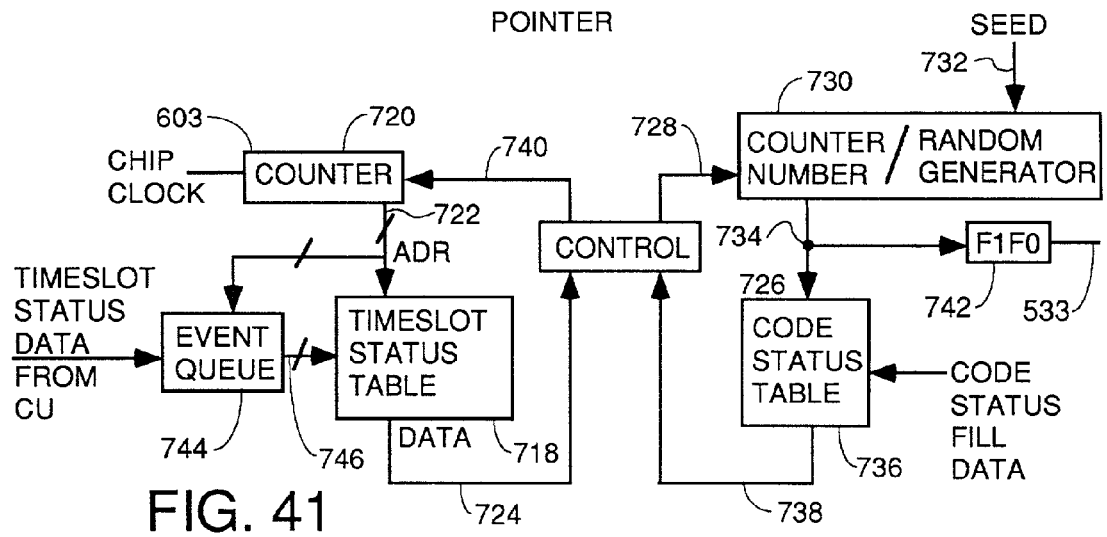
FIG. 41 is another embodiment for a code diversity shuffling circuit.

FIG. 41 shows a block diagram of a preferred code diversity shuffler that may also be used for shuffler 506 in FIG. 32. A timeslot status table in memory 718 stores a current map shared by all RUs and the CU of which timeslots/channels are currently active. In the preferred embodiment, the data stored in this table for each timeslot includes its present mode, its next mode and local/remote information. Permissible modes include: idle where no code is assigned, normal where a code is assigned, fallback #1 where more than one code is assigned to a timeslot and fallback #2 where even more codes are assigned to an active timeslot than in fallback #1 mode. The addresses in table 718 are sequentially scanned using addresses generated on a bus 722 by a counter 720 driven by the chip clock on bus 603. The data regarding the status of each sequentially scanned timeslot is output on bus 724 to control logic 726. The status data on bus 724 tells the control logic whether or not a CDMA code needs to be assigned. If control logic 726 sees data indicating a timeslot is active on bus 724, it generates a signal on bus 728 causing counter/random number generator 730 to generate a pseudorandom number on bus 734 to act as a write pointer for purposes of guiding the encoded 4-bit group from encoder 526 in FIG. 32 into the storage location in buffer memory 548 which will be multiplied by the code pointed to by the number on bus 734. The code number on bus 734 is generated from a seed number on bus 732. All RU and CU code diversity shufflers receive this same seed and all RUs having active timeslots and the CU operate synchronously to assign the same CDMA code to the active timeslots so that the CU can recover the CDMA spread data transmitted by the RU using the same CDMA code(s) that were used to spread it. The pseudorandom number generated in this manner is output on bus 734 as an address into a code status table stored in random access memory 736, and is also stored in FIFO memory 742 for later output as a writer pointer on bus 533. The code status table stores information shared by all RUs and CUs regarding which codes are eligible for use. Some codes may be block from usage because they either do not have sufficient noise immunity or for some other reason are not to be used. The data regarding whether use of the code pointed to by the address on bus 734 is permissible is output to the control logic via bus 738. If the data on bus 738 indicates the code pointed to by the address on bus 734 is permissible for use, the control logic generates a signal on bus 740 telling counter 720 that it should now generate an address to read the contents of the next address in sequence in the timeslot status table. All active timeslots are assigned a code once per symbol.

It is important in the embodiment of FIG. 41 that the contents of the timeslot status table and the code status table be constantly updated by all the RUs and CU so that they all share the same information. Updates of code status and timeslot status are broadcast by the CU on a broadcast channel using message protocol with CRC and ECC bits appended. The messages about timeslot status are stored in event queue 744 which also receives the address pointer on bus 722. As the address of each timeslot appears on bus 722, the event queue searches for update messages regarding that timeslot and updates the contents of the timeslot status table via bus 746.

Returning to the consideration of FIG. 32, the buffer memory 548 outputs two information vectors on buses 549r and 549i. The elements in these information vectors are, respectively, the first two bits in every Trellis encoded tribit as the real information vector and the last two bits of every Trellis encoded tribit as the imaginary information vector.

In FIG. 32, block 510 generates the ranging Barker codes needed for the ranging process to achieve frame synchronization. In the CU transmitter of FIG. 32, the ranging circuit 510 generates a constant Barker code of 13 bits at level power transmitted during every CU frame gap. In the RU transmitters, the Barker code is transmitted with varying delays and varying power levels per the data on bus 512 until the gap is hit. Preferably, this ranging Barker code generator 510 is a state machine. Rules for creating this state machine in the embodiment represented by FIG. 32 are: any activity in the gap indicated by the ranging status message that does not indicate the RU's temporary ID indicates a collision; a simple binary stack contention resolution algorithm is used where once an RU starts ranging, any subsequent collision push it deeper on the stack and any empty gap pops it closer to the top of the stack as in a LIFO mechanism. The ranging state machine 510 also receives as its input on bus 512 from CPU 405 a P parameter which sets the power of the ranging pulse and data which defines the Barker code of the ranging pulse. The ranging circuit 510 in the RU transmitter of FIG. 33 will scan all possible Td delays at a first power level which is low in the range of permissible powers and wait for confirmation from the CU that it has hit the gap. If no such message is received, the RU CPU 405 raises the power level to the next level up and scans through all the possible delays again. This process of scanning all possible delays and raising the power to the next level and scanning the delays again is continued until the RU hits the gap. Circuit 510 also receives on bus 512 RU/CU information which tells the circuit 510 whether it is in an RU or CU. The data on line 512 also controls whether a single Barker code is transmitted or a specific sequence of Barker codes during successive gaps to make up the authentication or signature sequence. The data on bus 512 also controls the position of a Barker code pulse relative to the center of the gap. Since this data comes from the CPU 405, the CPU knows when the transmitter is ranging and can properly interpret ranging status messages broadcast by the CU and received by the CPU via bus 1096 and command, communication and control circuit 860 in FIG. 30. Circuit 510 carries out the ranging process including contention resolution, pulse position modulation, steering and signature transmission described elsewhere herein in some embodiments, and in other embodiments, these processes are carried out by the CPU 405 and circuit 510 in cooperation with each other.

In some embodiments, circuit 510 in FIG. 32 also plays a role in the upstream equalization process. Upstream equalization is the process of reducing or diminishing undesired noise in the desired upstream data caused by, for example, reflections from impedance discontinuities in the coax or other media, misalignment of frames etc. Equalization is implemented in part by circuit 510 in placing a particular, predetermined pattern of signals in one or more gaps between frames so that the CU and RU receivers can determine the noise characteristics then present in the channel and take steps to "equalize" or reduce the noise. In some embodiments, this is done by the RU adjusting coefficients of an adaptive filter so that it has a transfer function which is the inverse of the transfer function of the channel, i.e., the transfer function of the equivalent circuit representing the media connecting each RU to the CU. Performing equalization increases the overall system throughput capacity, but it is not absolutely essential if lower capacity can be tolerated.

Block 514 on the left side of FIG. 32 is a register or memory storing command and control data such as the pilot channel signal to be transmitted on the 16 access and command and control channels. This data arrives on bus 399 the CPU 405. Block 516 is a multiplexer which selects between the payload data for the 128 payload channels from the framer 508 on bus 518 or command and control data on bus 520. Switching between these data streams is under control of timing logic which is not shown. The selected data stream is then output on bus 522. Typical command and control data includes data messages exchanged between the RU and CU and CU regarding ranging such as "I want to start ranging", "I found more than one Barker code in the gap, please perform your contention resolution procedure" etc. some of which are described in more detail in the discussion of ranging and contention resolution.

Because the 4th bit to be added to each tribit depends upon the state of the tribit from this channel during the last symbol, a memory 528 is used to keep a record of the state of each channel's 4 bit chip state during the last symbol transmission. This information is supplied to the convolutional encoder via bus 530 as each channel's tribit is encoded during each symbol. The mode in which the diversity shuffler 506 operates is controlled by the diversity shuffler by a signal on bus 534.

Media Access Control

Block 540 represents circuitry to acquire an access channel and carry out media access control communications to implement ISO MAC layer protocols. Since there are only 4 access channels across which all message traffic requesting channel bandwidth and awarding same pass, contentions will occur when more than one RU simultaneously requests bandwidth on the same access channel. Therefore, access channels are acquired according to the following protocol. Each RU transmitter receives a seed number on bus 550 and pseudorandomly selects which access channel to attempt to use and pseudorandomly selects which 6 symbols of a superframe comprised of 12 symbols to send. The RU then sends an authentication code identifying itself in the form of the unique sequence of 6 of the 12 symbols of a superframe of 4 frames, said unique sequence pseudorandomly selected using the seed. All RUs use the same seed, so the likelihood of more than one picking the same authentication code is small. The 6 symbols sent can contain the RU's message telling the CU how many channels it needs, or a separate message can be sent after access is achieved. The CU listens on all access channels, and during each superframe determines if more than 6 symbols were sent. If so, the CU broadcasts a message on the control channel indicating there is a contention on a particular access channel. The RUs trying to gain access then do the contention resolution protocol described elsewhere herein used for ranging. If only 6 symbols are detected during the superframe, the CU broadcasts a message on the control channel indicating which 6 symbols were found. The CU can include in the broadcast message code assignments for the requested channels in reservation embodiments or, in another embodiment, can simply transmit updates to the timeslot activity table indicating which timeslots or channels have been awarded to the RU which gained access. The RU that sent these six symbols then knows that it has been awarded access, and updates its timeslot activity table which is maintained in the diversity shuffler 506. All RUs hear the timeslot activity update broadcast message and similarly update their timeslot activity tables.

Once an access channel is acquired, circuit 540 may, in some embodiments, present data on buses 542r and 542i to multiplexer 544 which comprise access control messages. Multiplexer 544 either selects these media access messages on buses 542r and 542i or the encoded chips from the convolutional Trellis encoder 526 to the code division multiplexer 527 via buses 546r and 546i and buffer 548. The multiplexer 544 is controlled by switching control signals from the CPU 405 to edit the contents of the buffer 548 to overlay the 4-bit groups of the access control symbols with the payload data on bus 507 so that the media access control 4-bit groups go into the right addresses of the buffer 548 so as to get spread by the CDMA codes assigned to the access channels.

The media access control messages constitute requests from RUs for bandwidth and awards of specific channels to the RUs by the CU in some embodiments. The awards of specific channels to specific RUs implement a reservations scheme and the awards can take many forms such as broadcasts on the control channel of timeslot activity table update messages or specific messages on the access channels in other embodiments. Also, other media access protocols other than the reservation scheme which are described elsewhere herein are also possible through various protocols some of which may require message traffic on the access channels. In an important alternative embodiment, all the different schemes for allocating channels to specific timeslots may be used or combinations of schemes for various groups of channels may be used. In this embodiment, the type of scheme used is programmable by the user, and in a variation of this embodiment, may be changed by the CU computer based upon traffic conditions and the number of contentions and efficiency considerations.

Because a reservation scheme is implemented in the preferred embodiment, no contentions occur on the 140 non media access control payload channels so no contention resolution protocols are carried out for these channels. However, contentions are expected to occur on the 4 access control channels shared between all the RUs so contention resolution will have to be carried out in the manner described elsewhere herein.

Spreading of the spectrum of the chips from the convolutional encoder 526 is done by orthogonal code multiplexer 527. This circuit or software routine performs code division multiplexing or orthogonal encoding of the data on each channel by matrix multiplication. It sets the amplitude of the output chips on buses 558$r$ and 558$i$ based upon matrix multiplication of the orthogonal codes times the elements of the input information vectors on buses 549$r$ and 549$i$ from buffer 548. Each of the information vectors on buses 549$r$ and 549$i$ is individually spread by the orthogonal code multiplexer to generate individual real or inphase and quadrature or imaginary result vectors 409 and 413 in FIG. 42 on buses 558$r$ and 558$i$.

There is only one orthogonal, cyclic code that has 144 different codes. That code is used and is, in hexadecimal representation: 0218 A503 BA4E 889F 1D92 C1F3 AB29 8DF6 ADEF. Other codes can be used, but the above code is best. Although cyclic codes are the preferred embodiment for ease of implementation, any other orthogonal, noncyclic code set can also be used in alternative embodiments, or other orthogonal, cyclic codes can be used where fewer channels/timeslots are required. The cyclic code given above uses the convention that all logic 0's represent −1s and all logic 1s represent +1 in the orthogonal code spreading matrix. The first code of the 144 different codes in the code set will be all 1s regardless of the contents of the code given above. The second code in the code set is the code given above: 0218 A503 BA4E 889F 1D92 C1F3 AB29 8DF6 ADEF. The third code is obtained by shifting the code one binary place and taking the overflow bit that "falls off" the most significant bit position edge of the code in the second least significant bit position. The fourth code is obtained by repeating process done to obtain the 3rd code on the 3rd code.

The results of the matrix multiplication performed in the orthogonal code multiplexer 527 are coupled via buses 558$r$ and 558$i$ to one input of a switching circuit 556 switching of which is controlled by the CPU 405. The other input of the switching circuit 556 is coupled to buses 558$i$ and 558$r$ to receive the ranging data from ranging circuit 510. The switch 556 selects the data on buses 558$r$ and 558$i$ for coupling via buses 557$r$ and 557$i$, respectively, to a precode FFE/DFE filter 563 during the three symbol transmission times of each frame when payload data is being sent. The switch 556 selects the ranging pulse data on bus 560 during the gap following transmission of the last symbol in each frame.

Equalization, as that term is used herein, is the process of compensating for distortions and noise that occur caused by noise in the channel between each RU and the CU. The precode filter 563 performs a measured predistortion at each RU transmitter so that the data arrives at the CU undistorted despite the channel impairments between that particular RU and the CU. The amount of the predistortion is calculated by each RU to substantially or exactly compensate for the current distortion conditions existing in the channel between it and the CU. The predistortion characteristic is implemented by setting the transfer function of the precode equalization filter 563 by changing the tap coefficients of the filter. This transfer function is controlled by the RU/CU Coefficient data input to the filter on bus 561. Each RU uses its own unique, measured RU/CU Coefficient data to establish a predistortion which is appropriate to its own signals for its position on the network so as to cause its signal to reach the CU with little or no distortion. More details on both upstream and downstream equalization are given in connection with the discussion of the training process symbolized by the flowcharts of FIGS. 45A, 45B and 45C.

The CU transmitter of FIG. 32 differs from the RU transmitter in the sense that the precode filter 563 has its tap coefficients set to implement an average predistortion suitable for transmission to all RUs. This predistortion transfer function can be set by averaging the individual predistortions calculated individually for each RU.

The output of the precode filter on buses 562$r$ and 562$i$ is applied to a scaler amplifier 564 which scales the amplitude level of the digital numbers on buses 562$r$ and 562$i$ in accordance with a signal on bus 566 which indicates the activity level of the modem, i.e., how many timeslots are currently in use by this modem. The purpose of this scaling is to enhance performance by taking advantage of the full precision of a digital to analog converter 576 at the output of the transmitter. A digital to analog (D/A) converter has a dynamic range for its analog output. When few timeslots are active, the summation of the CDMA spreading matrix multiplication partial products does not lead to chip amplitudes which extend to the full limits of the D/A converter's dynamic range. As a result, the full precision of the D/A converter is not used, and the inherent noise of the D/A conversion process affects the transmitted signal more. To make use of the full precision of the D/A converter, scaler 564 "amplifies" the incoming signal based on the activity level such that the resulting swing in digital values going into the D/A converter 576 causes output analog signals which swing between the limits of the dynamic range of the D/A converter. These signals are later reduced in amplitude by a circuit (not shown) which limits the amplitude swings to prevent interfering with other signals sharing the media.

The output of the scaling circuit on buses 568$r$ and 568$i$ are coupled to shaping filter 570 which doubles to perform carrierless amplitude and phase modulation. There are two filters in the shaping filter which have transfer functions which are the Hilbert transform of each other and which have rolloff characteristics set to digitally filter the data on buses 568$r$ and 568$i$ to limit the bandwidth of the signal on each bus to the width and center frequency of the 6 mHz channel devoted to digital data communication on the coaxial cable or other media 24. The shaping filter has a squared raised cosine filter characteristic suitable to shape the outgoing chip pulses so as to satisfy Nyquist criteria in a known manner so as to provide optimal signal-to-noise enhancement and so as to minimize intersymbol interference. The filters in shaping filter/modulator 570 can have other transfer functions also which shape the chips to be transmitted such that the spectrum of the outgoing signals satisfy the Nyquist criteria. Any of these other pulse shapes will suffice to practice the invention. The coefficient data on bus 572 provide ability to set and change the filter characteristics of shaping filter/modulator 570. More details on the operation of the shaping filter/modulator 570 are given in connection with the discussion of FIGS. 42, 43 and 44.

The output of the filter/modulator is coupled on bus 574 (the filter/modulator 570 sums the orthogonal real and imaginary signals after filtering to generate a single signal on bus 574) is coupled to the input of the digital to analog converter 576 for conversion to an analog signal for application to the input of an up/down frequency converter 577. The purpose of the up/down frequency converter is to convert the frequency of the transmitted signal to the frequency allocated for upstream or downstream transmissions as the case may be in accordance with the frequency plan for the shared transmission media. The up/down converter outputs its signal on the transmission media 412 such as coaxial cable, cellular system, satellite uplink etc.

Figure 45:
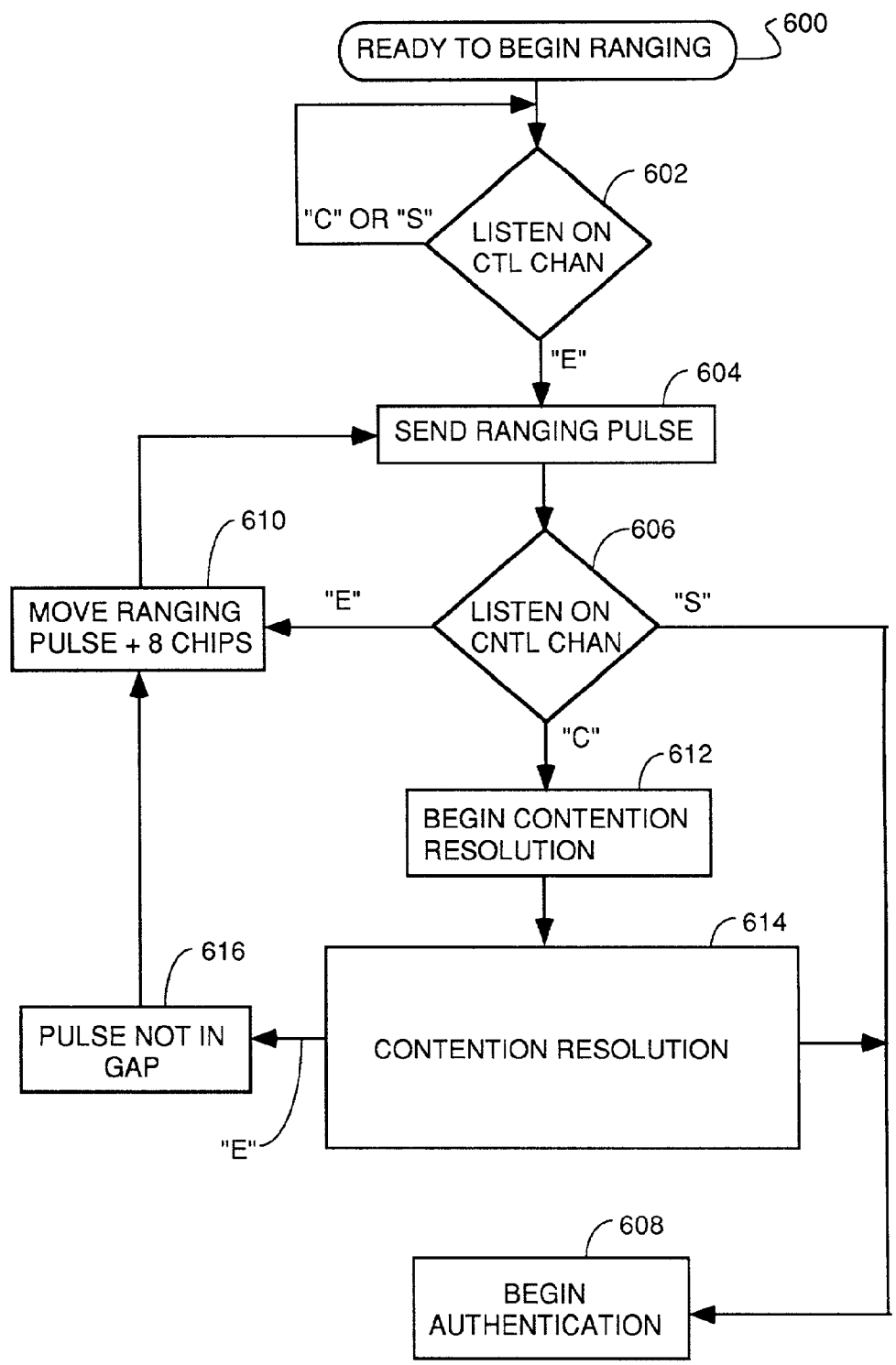
FIG. 45 is a flow chart of a simple, non-boundless RU ranging process.
Figure 46:
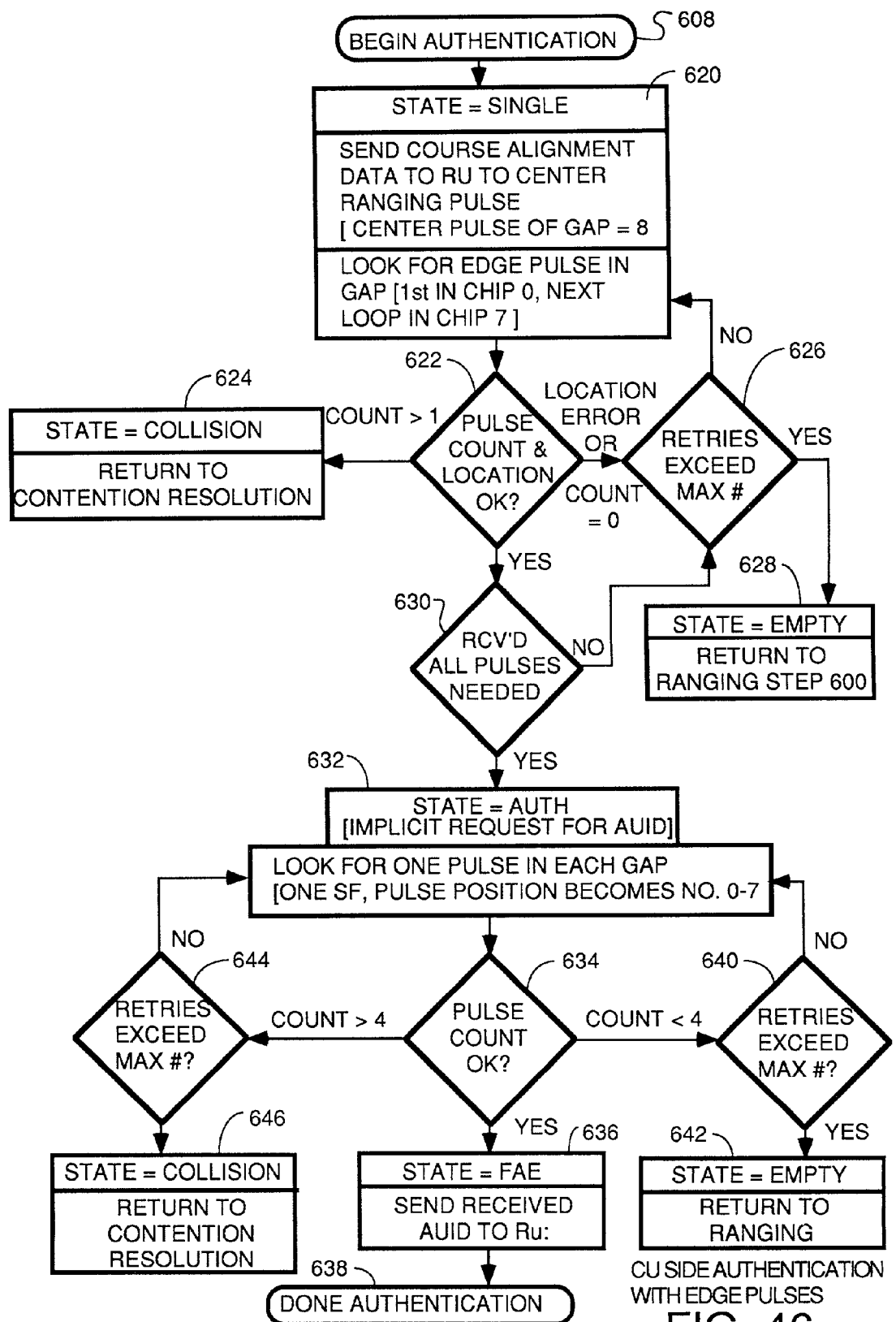
FIG. 46 is a flow chart of a CU side authentication process which counts pulses.
Figure 47:
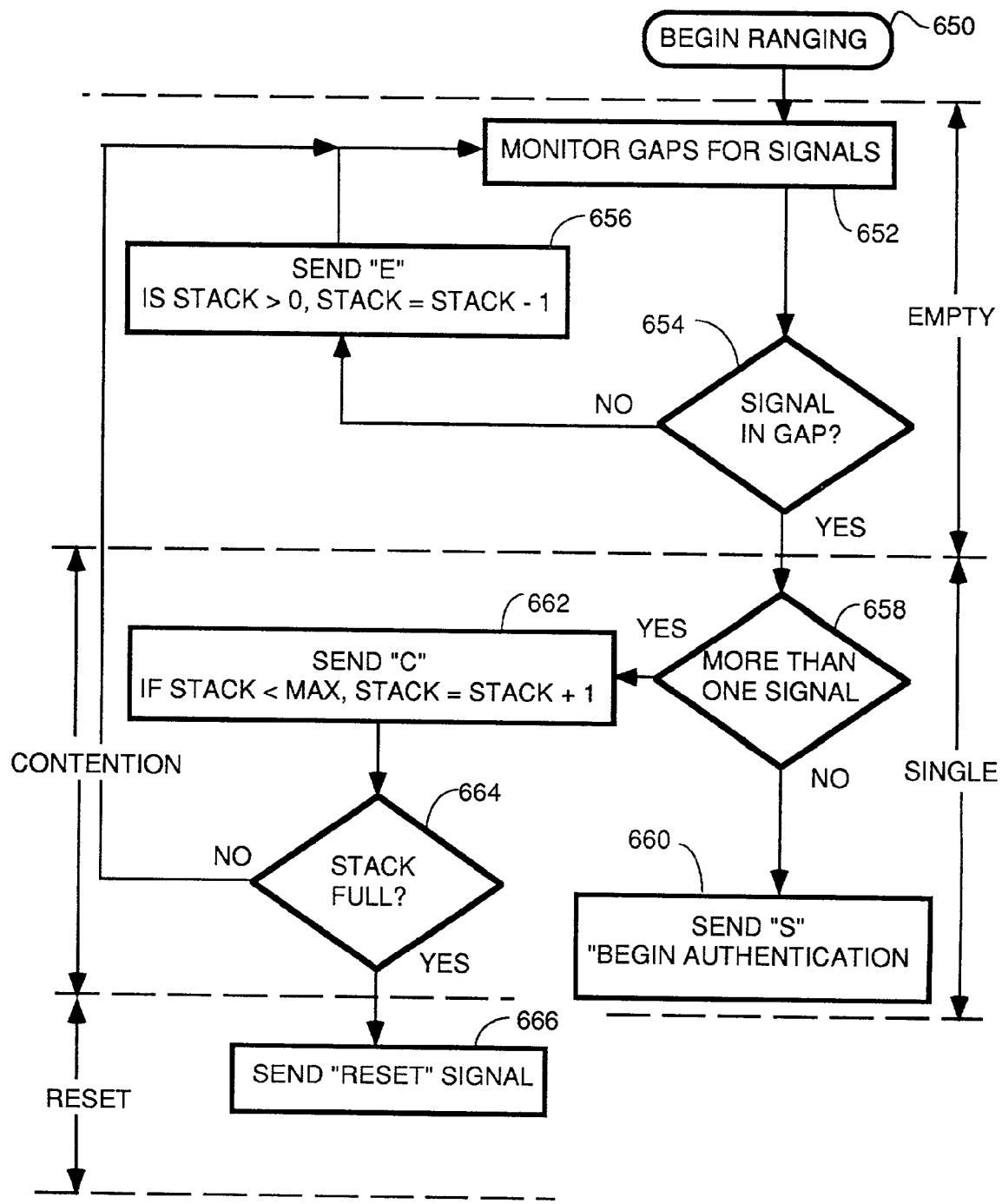
FIG. 47 is a flow chart of the process carried out by the CU for a simple, non-boundless ranging.

Alternative Ranging, Contention Resolution and Authentication Processes Carried Out by RUs and CU Referring to FIG. 45, there is shown a flow chart for a method of ranging using contention resolution where the span of the system is such that all RUs can align to the same gap at the end of one frame. In the preferred embodiment, the ranging, contention resolution and authentication processes of FIGS. 45–47 are carried out through cooperation of the RU receiver of FIG. 30 including the C3 circuit 860, frame detector 882 and the R/Tng circuit 763, CPU 405 and the CU transmitter of FIG. 32 including Rng circuit 510 and the CU receiver circuit of FIG. 31 cooperating with microprocessor 405 and the frame detector 882.

The starting point of the ranging process is block 600 in the RU ranging process shown in FIG. 45. Block 600 is reached after an RU has powered up and performed a self test and found itself to be operable. Next, test 602 is performed to listen on the control channel to wait until it is clear for transmission ("E"). 602. If test 602 determines that a collision ("C") is occurring on the control channel or a single RU is transmitting ("S") on the control channel. Test 602 vector processing to block 604 when the control channel is free. Block 604 represents the process carried out by circuit 510 in FIG. 32 of transmission of a ranging pulse (typically a copy of the Barker code transmitted in every frame by the CU). The multiplexer 556 is switched to select input bus 560 before transmission of the ranging pulse.

After the ranging pulse is transmitted, the CU receiver listens in the gap to determine if it finds a ranging pulse in the gap, and, if so, if only one ranging pulse is present. Block 604 vectors to test 606 after transmission of the ranging pulse in order to listen on the control channel. The CU will transmit an S on the control channel if a single pulse is found in the gap, and will transmit an E on the control channel if the gap is found to be empty. If test 606 hears an S on the control channel, processing is vectored to block 608 to start the authentication process. If block 606 hears an E on the control channel indicating the gap is empty, processing vectors to block 610 to move the ranging pulse plus 8 chips, and processing vectors back to block 604 to send a new ranging pulse. Processing then vectors back to test 606 to listen on the control channel again. This loop continues until either an S for single pulse is heard on the control channel or a C for collision is heard. The CU sends a C when it hears more than one ranging pulse in the gap.

When test 606 hears a C, processing is vectored to block 612 to start the contention resolution process which is then performed as symbolized by block 614. Contention resolution continues until only one pulse is found in the gap or no pulse is found in the gap. If, as a result of contention resolution, no pulse is found in the gap, the CU sends an E on the control channel, which vectors processing to block 616. Processing then vectors to block 610 to move the ranging pulse 8 chips forward, and the process repeats itself.

An Authentication Process

Authentication is started when the CU sends a message on the control channel that it has found a ranging pulse from a single RU in the gap. In both embodiments, the gaps of multiple frames are used to send an authentication code. Each RU that has been attempting to synchronize hears the "S" on the control channel in step 606 in FIG. 45 indicating the CU has detected the ranging pulse from a single RU in the gap, and vectors processing to the authentication process represented by block 608. There are several possibilities for how authentication is performed. The flow chart of FIG. 46 represents one embodiment which uses pulse position modulation to send the authentication code. In this embodiment, each RU that has been attempting to establish synchronization sends one ranging pulse during the gaps of each of 8 frames but varying the position of the pulse in the gap during each gap. In another embodiment previously described, the RU sends an authentication Barker code sequence comprised of sending the Barker code during some gaps of the 8 frame authentication sequence but not during others in a predetermined sequence. Each RU has a unique sequence, but all RUs send pulses during only half the authentication sequence gaps.

A Contention Resolution Process

Referring to FIG. 46, there is shown a flow chart of a typical process for authentication by CU modems when one RU's ranging pulse is found in the gap. The authentication process begins at block 608 and immediately proceeds to block 620. There, the CU sends out an S on the control channel indicating that it has found a single RUs ranging pulse in the gap. Which RU it is is not clear at this point, and the purpose of the authentication process is to determine which RU has hit the gap and so notify that RU so it can freeze its delay at the delay that hit the gap. Before starting the process of determining the RU identity, the CU sends out a command on the control channel for all RUs who are ranging to move their ranging pulses plus or minus the number of chips separating the ranging pulse the CU saw from the middle of the middle 8 chips of the gap. In block 620, this process is signified by the phrase "send course alignment data to RU to center ranging pulse". Because ranging pulses from other RUs may also be in the gap, but at an edge, when they also move the position of their ranging pulses, their pulses may also land somewhere in the middle 8 chips of the gap. Since authentication requires that only one ranging pulse be in the gap, block 620 looks for a so-called "edge pulse" or neighbor in the gap in addition to the single pulse previously found so as to make sure there is truly only one ranging pulse in the gap so as to avoid ambiguity. That is, the CU looks to find out if another RUs pulse which was originally in the gap but outside the middle 8 chips has landed in the middle 8 chips after the position of the pulse which was originally found in the middle 8 chips has been moved to the center of the gap. The CU looks for these extraneous pulses first by commanding a shift in the ranging pulse originally found in the gap which led to the broadcast of the S on the control channel to move sufficiently to land in chip 0 of the middle 8 chips. Then test 622 looks for more than one pulse as described in the next paragraph. Then, the CU commands a move of the original ranging pulse to the other extreme, i.e., to move to chip 7 of the middle 8 chips, and the process of test 622 is repeated.

The determination of whether more than one ranging pulse is in the middle 8 chips is performed by test 622 which counts the ranging pulses in the middle 8 chips of the gap and determines their locations. If the count of the number of ranging pulses found in the middle 8 chips is greater than one, the CU broadcasts a C on the control channel indicating a collision state, which causes all RUs to vector processing to their contention resolution protocols, as symbolized by block 624. If test 622 determines that the pulse count is 0 or their is a position error in the position of the single pulse found in the middle 8 chips, test 626 is performed to determine if the number of retries exceeds the maximum allowable number. If not, the process of block 620 is performed again to send new course alignment data to the RUs on the control channel. If the number of retries found by test 626 is found to exceed the maximum, the process of block 628 is performed where the CU broadcasts an E on the control channel indicating the gap is empty. This causes all RUs trying to synchronize to return to their ranging processes and start over at block 600 in FIG. 45.

Once test 622 determines that there is only a single Rus ranging pulses in the gap and it is within the middle 8 chips, processing is vectored to test 630 which determines if noise has caused detection of what was thought to be a ranging pulse but which was only noise. This test is performed by determining if at least two out of three ranging pulses were received when the ranging pulse was commanded to move to the extreme left edge, the extreme right edge and the center of the middle 8 chips of the gap. If ranging pulses were detected at at least two of these three positions, no false alarm exists, and processing is vectored to block 632. If a false alarm is detected, processing is vectored back to test 626 to start over in positioning the ranging pulse.

The process symbolized by block 632 is the process of the CU broadcasting an A on the control channel which signals all RUs that are attempting to synchronize to send their authentication codes. Therefore block 632 states State=Auth which means that the CU is broadcasting an implicit request for the authentication ID (AUID) of the RU whose pulse is in the gap. In response, all the RUs trying to synchronize send their AUIDs in the form of four ranging pulses during the gaps of each of the next four frames of a superframe, each ranging pulse being located in a specific one of the 8 chips positions of the middle 8 chips in the gap. The positions and sequence during these four gaps of the authentication superframe tell the CU which RU has hit the gap. This is the meaning of the language in block 632 "Look for one pulse in each gap [one SF, Pulse Position Becomes No. 1–7]" The steps following block 632 just check for errors in this process. Specifically, test 634 is performed after each frame to increment a pulse counter and determine if the pulse count has reached 4 by the end of the superframe. If the pulse count is 4 at the end of the authentication superframe, test 634 vectors processing to block 636 where the CU broadcasts an FAE message on the control channel indicating authentication is finished and sends the AUID code out on the control channel for recognition by the RU that sent it. The AUID will be a sequence of 4 numbers from 0–7 which indicate in which chip of the middle 8 of the gaps of the authentication superframe each ranging pulse was found. Each RU that is attempting to synchronize will compare this sequence of 4 numbers to the 4 numbers of its AUID. If there is a match, that RU will know that it successfully hit the gap and will freeze its transmit delay timing at the number that puts its ranging pulse in the center of the 8 middle chips of the gap. Step 638 is then reached indicating that authentication is complete.

If test 634 determines that the pulse count is less than 4 after any gap in the authentication superframe is complete, processing is vectored to test 640 to determine if the number of retries exceeds the maximum allowable number. Test 640 sends processing back to block 632 to look for pulses in the authentication superframe gaps and record their positions until the superframe is over and the pulse count is less than 4. Some number of superframes with the RUs sending their AUIDs can be allowed in some embodiments. Eventually, the number of retries exceeds the maximum, and processing is vectored by test 640 to block 642. In block 642, the CU broadcasts an E on the control channel and, in response, all the RUs attempting to synchronize will return to the ranging process.

Likewise, if at any time, the count determined by test 634 exceeds 4 during the authentication superframe or at the conclusion thereof, an error has occurred or another RU has moved its ranging pulse into the gap. If this happens, test 644 is performed to determine if the maximum number of retries has been exceeded. If not, processing returns to block 632. Typically, more than one authentication superframe will be permitted with the RUs sending their AUIDs during each superframe. Eventually, after several superframes, if block 636 is not reached, test 644 will trigger vectoring of processing to block 646 where the CU broadcasts a C on the control channel indicating a collision has occurred thereby causing the RUs to return to their contention resolution protocols.

Referring to FIG. 47, the ranging and contention resolution protocol performed on the CU side is detailed in flow chart form. Ranging starts with block 650 where the CU sends out a unique Barker code. This Barker code is a unique pattern of data, which, when received by the RUs is echoed by them back toward the CU after imposing a programmable delay. It is this programmable delay that is being adjusted during the ranging process until the echoed Barker code in the form of a ranging "pulse" hits the gap. Block 652 represents the process carried out by the CU of monitoring the gap to determine if any RUs ranging pulse has hit it. This monitoring is typically done by performing a correlation calculation between any signal received in the gap and the Barker code originally transmitted, but in other embodiments, it can be any other form of monitoring such as threshold comparison etc. which is effective given the noisy environment. Threshold monitoring of sharp or high power pulses is less desirable however, because sharp pulses tend to splatter the band with a broad range of Fourier components, while high power ranging pulses that will rise above the noise can, before alignment is achieved, arrive on top of or with payload data from other RUs and interfere therewith. Test 654 represents the examination of the results of the correlation calculation or other monitoring activity to determine if any pulse was found in the gap. If not, step 656 is performed where the CU broadcasts an E on the control channel indicating the gap is empty, thereby causing the RUs to adjust their delays and resend their Barker codes or ranging pulses during the next frame. Step 656 also subtracts one from an iteration stack which counts the number of iterations or attempts to range. Then the monitoring step 652 is performed again.

If test 654 determines that there is a ranging pulse in the gap, processing vectors to test 658 where the CU determines if there is more than one ranging pulse in the gap. If there is only one ranging pulse in the gap, step 660 is performed where the CU broadcasts an S on the control channel indicating to all RUs that are ranging to begin their authentication processes.

If more than one ranging pulse is found in the gap, step 662 is performed to broadcast a C on the control channel indicating to the RUs that there is a contention and forcing them to carry out their contention resolution protocols. The CU then checks the status of an iteration stack to see if it is full. The iteration stack is used to keep track of the rounds of ranging for purposes of contention resolution and more rapid ranging of all RUs attempting to synchronize in some embodiments. The stack is incremented by one, and tested in test 664 to determine if the maximum number of iterations has been reached. If not, processing returns to block 652 to again monitor the gap for ranging pulses transmitted during the next frame. If the maximum number of iterations has been reached, step 666 is performed to broadcast an R on the control channel thereby causing all RUs to reset and start the ranging process again.

Figure 49:
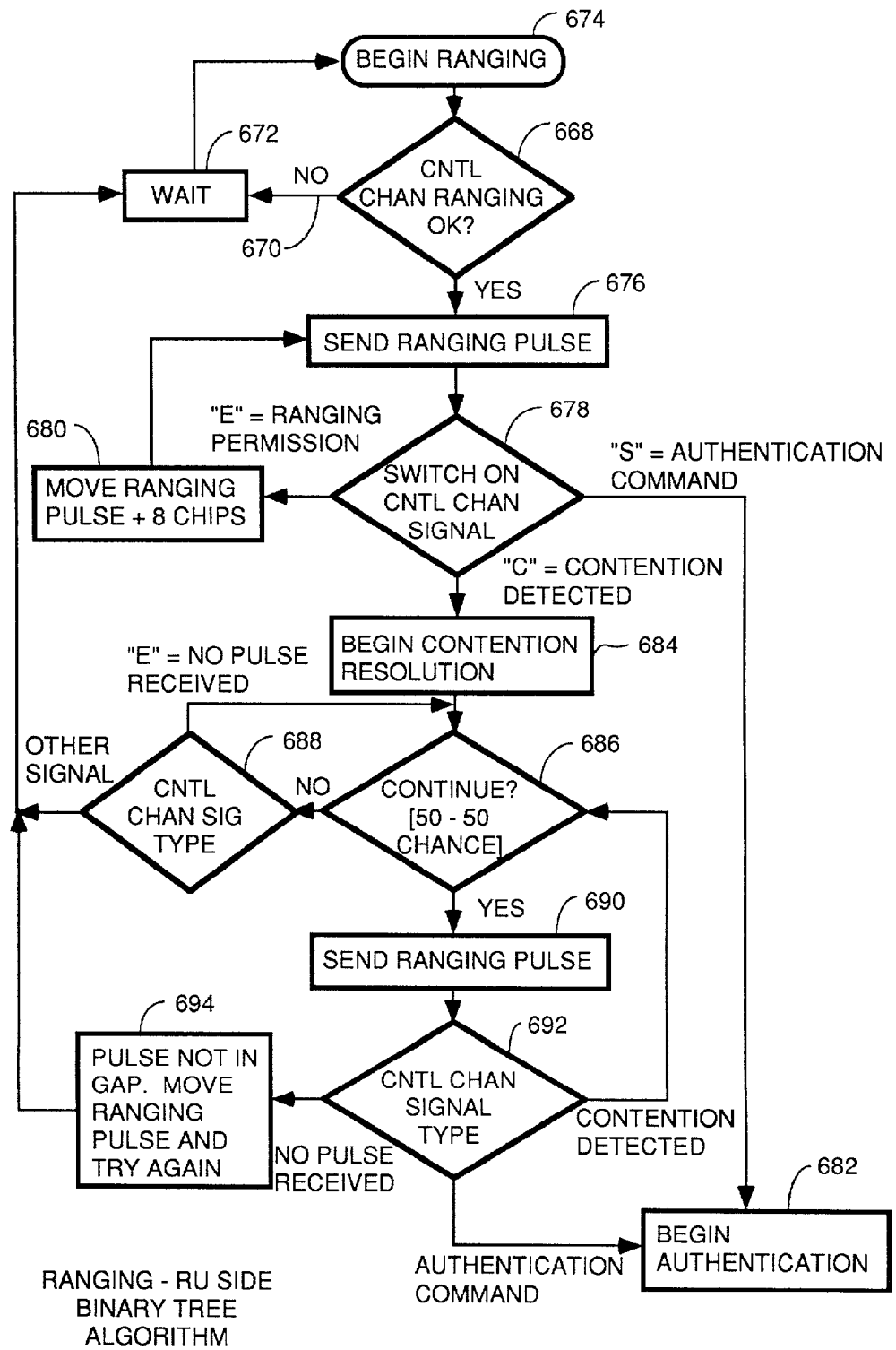
FIG. 49 is a flow chart for an RU side ranging and contention resolution process using a binary tree algorithm.

Referring to FIG. 49, there is shown a flow chart for a ranging process carried out by the RUs using a binary tree algorithm. The process starts with one or more RUs that are not in frame synchronization but which wish to achieve frame synchronization so as to be able to send data to the CU. These RUs first must synchronize their receivers to broadcasts on the control channel from the CU so that they can receive status commands from the CU which control their activities during the ranging process. The RUs can synchronize to the CU broadcasts themselves without assistance from or the need to send anything to the CU by recovering the system clock signal from the periodic broadcasts of the Barker code signals every frame from the CU. Once this has happened, test 668 determines that control channel signals can be received and ranging can start. Until this happens, path 670 is taken to wait state 672 and block 674 to idle until the RU receiver synchronizes to the CU and can receive its broadcasts.

When RU receiver synchronization has been achieved, step 676 is performed to pick some arbitrary delay and send a ranging pulse using that delay. Test 678 is then performed to switch on the control channel signal and determine the state of the CU. If the CU did not find any ranging pulse in the gap, it broadcasts an E on the control channel. Each RU then changes its delay by adding 8 chip times, as symbolized by block 680, and transitions to step 676 to send another ranging pulse. This process continues until one or more RUs set their delays such that their ranging pulses arrive in the gap. If the CU detects a single pulse in the gap, it broadcasts an S on the control channel which the RUs interpret as an authentication command. Each RU then transitions to step 682 to begin the authentication process, which has been previously described. Basically, the authentication process involves the RU sending its identification code as either a unique sequence of ranging pulse positions in the middle 8 chips of the gaps of multiple frames or as a unique sequence of the presence and absence of ranging pulses in the gaps of multiple frames.

If multiple RUs hit the same gap, test 678 finds that the CU is broadcasting a C on the control channel indicating that the RUs need to perform their contention resolution protocols, as symbolized by block 684. As symbolized by test 686, each RU then "flips a coin" to determine if it should continue and examines the outcome. If an RU decides not to continue, processing in that RU transitions to test 688 where the RU determines the control channel signal type. If an E is being broadcast, it means that all RUs that were ranging decided to stop, and processing returns to step 686 to "flip the coin" again. If test 688 determines that any other signal is being received, processing returns to block 672 and the ranging process starts over for that RU.

If the coin toss results in the RU deciding to continue ranging, step 690 is performed to send another ranging pulse. Then test 692 is performed to listen to the control channel and determine what the CU state is. If the CU found no pulse in the gap, step 694 is performed to move the ranging pulse, i.e., adjust the transmit frame timing delay, and try again. Accordingly, processing transitions back to test 668 through step 672. If the CU is broadcasting a C, more than one pulse has been detected in the gap, and processing returns to step 686 to flip the coin again to decide whether to continue ranging. If test 692 determines that the CU is broadcasting the S or authentication command, processing transitions to step 682 to begin authentication. After authentication, the CU sends fine tuning commands over the control channel to the RU which just authenticated itself to adjust the position of its ranging pulse to the center of the gap.

Figure 48:
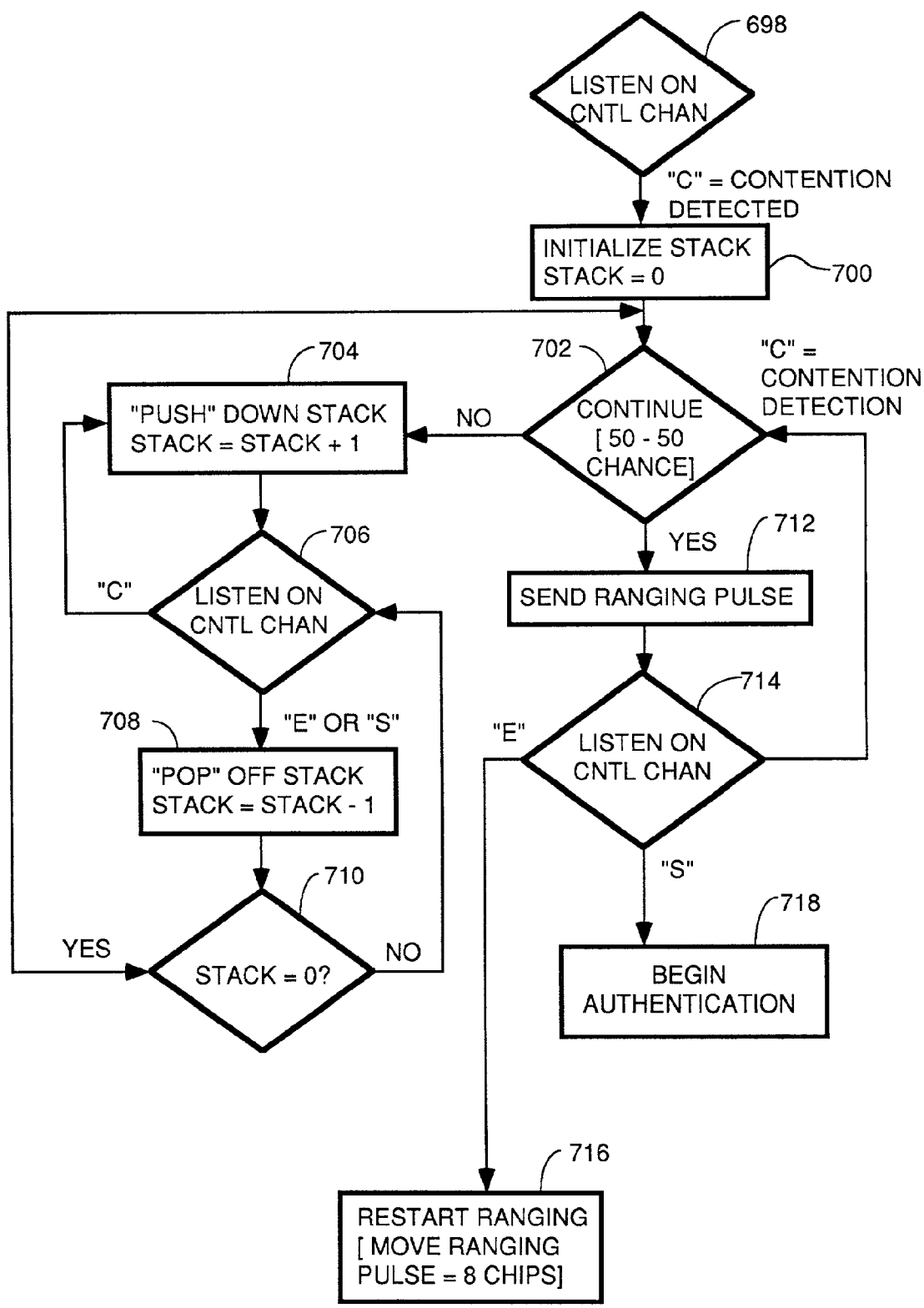
FIG. 48 is a flow chart for the RU side binary stack contention resolution process.

Referring to FIG. 48, there is shown a flow chart of the preferred process of ranging and contention resolution in the RU using a binary stack. This process is slightly faster than the binary tree algorithm in achieving alignment because in this process, the RU remembers upon which iteration it "failed", i.e., the coin toss after a contention caused the RU to stop attempting ranging. The process starts with step 698 to listen on the control channel. When a C is broadcast by the CU, step 700 is performed to initialize a binary stack to 0. This stack is used to keep track of the iteration number when the coin toss resulted in a decision to discontinue ranging. Next, step 702 "flips the coin" to make the decision as to whether to continue. If the decision is to not continue, step 704 is performed to push down the stack by setting the value on the stack to stack +1. Then test 706 is performed to listen again on the control channel and determine the CU state. If there is still a contention, step 704 is performed to increment the stack again. If test 706 determines that the CU says the gap is empty or only a single ranging pulse is in the gap, step 708 is performed to pop the stack, i.e., to set the stack value to stack −1 in step 708. Next, test 710 is performed to determine if the stack value has reached 0. If it has, processing returns to step 702 to flip the coin again to decide whether to resume ranging. If test 710 determines that the stack has not reached zero, test 706 is performed again to listen on the control channel.

Returning to the consideration of step 702, if the original coin toss caused the RU to decide to continue ranging, step 712 is performed to send a ranging pulse. Then test 714 is performed to listen on the control channel to determine the CU status. If a C is being broadcast, more than one RU is in the gap, and processing returns to step 702 to flip the coin again. If an E is being broadcast, the gap is empty and the delay for the next ranging pulse is adjusted by moving the pulse +8 chips and restarting the ranging process in step 716 by transitioning to step 600 on FIG. 45. If test 714 determines that the CU is broadcasting an S meaning a single pulse has been found in the gap, processing vectors to step 718 to begin the authentication process.

Preferred RU Receiver Block Diagram

Referring to FIGS. 30 and 31, there are shown detailed block diagrams of the preferred organization for an SCDMA receiver for the RU and CU modems, respectively. Circuits in the receiver which have similar functions have the same reference numbers and will be discussed without distinguishing whether they perform their function in the RU or CU if their functions are identical. Differences in the circuitry will be individually discussed.

The RF signals arrives at the receiver on coaxial cable 412 or other media. An RF demodulator section 750 synchronously demodulates the RF signals in the case of the RU receivers using a detector like that shown in FIG. 29 and a local carrier reference signal which is synchronized in phase and frequency to the master carrier embedded in the pilot channel data from the CU. A separate tracking loop in the RU receiver comprised of slicer 800, a low pass filter (not shown), control loop 781, VCXO 808 and frequency synthesizer 760 generate the local carrier signal on line 762 so as to be phase coherent with the master carrier. In the case of a CU receiver, the data from each RU is detected by achieving synchronization with the RU carrier using the preamble data sent in each timeslot by the RU prior to sending payload data and using the rotational amplifier 765 and G2 amplifier 788 to correct for amplitude and phase errors. The demodulator in RF section 750 of the CU receives a synthesized local carrier signal on line 762. This local master carrier signal is synthesized by frequency synthesizer 760 from the master carrier signal from the CU transmitter section which arrives on line 187.

The RF demodulator 750 outputs an analog signal on line 752 carrying the chip amplitude information for all time slots. The RF section 750 also includes a passband filter having a center frequency centered on the frequency of the 6 mHz wide band carrying the chip data and having a 6 mHz bandwidth. The RF section also includes a variable gain amplifier that has a gain control input coupled to line 758 coupled to automatic gain control circuit 756. The AGC circuit works over a fixed interval and counts the number of times the input signal is above a preset threshold and the number of times it is below it. A counter is preset to a negative value at the start of the interval. Each time the threshold is exceeded, the counter in incremented. If the counter has counted up to zero at the end of the interval, the AGC gain is set correctly. Positive values call for decreased gain, and negative values call for increased gain.

The signal on line 752 is converted to digital information by A/D converter 754 which performs IF sampling as is known in the prior art was first described by Colinberg, whose papers are hereby incorporated by reference. The sampling rate is 4 times the symbol period. The advantage of using IF sampling is that it allows the use of one A/D converter to sample both the sine and cosine carriers. In alternative embodiments, two A/D converters may be used, each having a sample rate substantially greater than the symbol period. IF sampling is not critical to the invention and other techniques of digitization which are compatible with the system may also be used.

The gain of the signal represented by the digital data output by the A/D converter 754 is examined by automatic gain control (AGC) 756, and if the amplitude is not high enough, the AGC circuit generates a signal on line 758 to increase the gain of the variable gain amplifier in the RF section.

Phase separation of the sine and cosine components of the QAM modulated data represented digitally on bus 760 is performed by matched filter 761. The matched filter has two filters which have filter characteristics that are the mirror image of the squared raised cosine filter characteristics of the filters 1134 and 1136 in the shaping filter/modulator 570 shown in FIG. 42. The matched filters separate the orthogonal real and imaginary components in the received signals and transmit them to the frame detector via buses 904 and 906 in FIGS. 30 and 31. The filter characteristic of the matched filter is established by data from the CPU 405 on bus 1090. In the preferred embodiment, the output of the matched filter 762 on bus 840 is filtered by an FFE/DFE filter 764 which functions to cut down on precursor and postcursor intersymbol interference. The FFE/DFE filter 764 has the structure of FIG. 50, and each of the FFE and DFE equalizers is an adaptive FIR filter. Adaptive FIR filters and many of the other digital signal processing components of the circuitry disclosed herein are known and are discussed in detail in Elliott, *Handbook of Digital Signal Processing: Engineering Applications*, (Academic Press, Inc. San Diego, 1987), ISBN 0-12-237075-9, which is hereby incorporated by reference. In the preferred embodiment, the FFE filter 764 is placed between circuits 765 and 767 to filter the data on bus 769 and that is the purpose of the notation "FFE" inside rotational amplifier circuit block 765 to symbolize this embodiment. In the RU receivers, the coefficients of the FFE/DFE or individually established by the equalization training process described below. However, in CU receivers, the coefficients of the FFE/DFE filter are established as an average for all RUs.

Next, despreading of the data and reassembly of the appropriate data into the corresponding timeslots to undo the code shuffling that happened in the transmitters is performed. The first step in this process is accomplished by CDMA MUX 766. This multiplexer multiplies the incoming data by the transpose code matrix $C^T$ of the code matrix used by CDMA MUX 527 in the transmitter that sent the data. The resulting despread data is stored in buffer memory 768 sequentially in the order of the individual code multiplications. The CDMA MUX 766 or control logic 1082 generates suitable read/write control signals to cause buffer 768 to sequentially store the despread data on bus 776 output by the CDMA MUX 766. A deshuffler circuit 770 receives the same seed number on bus 772 as was received by code diversity shufflers 506 in the transmitters. The seed number is sent on the control channel, and is relayed to circuit 770 by the CPU 405. The deshuffler uses the seed number to generate the same pseudorandom numbers as were generated from this seed during every symbol time by the transmitter. These pseudorandom numbers are used to generate read address pointers on address bus 774 which are coupled to the address port of buffer 768 along with suitable read/write control signals. The data stored at the addresses indicated by the read pointers is then output by the buffer on bus 795. This bus is coupled to one of two inputs of a switch/multiplexer 791. Because the address pointers are generated in the same sequence as in the transmitters when shuffling data, the data read out of the buffer 768 is read out in the correct sequence to put the despread data back into the sequential order of the timeslots.

Other data received by the code shuffling circuit 770 on bus 772 are the Tss data indicating which timeslots are currently being received, and RI indicating which codes are reserved and cannot be used by this RU or CU.

This deshuffling operation is not necessary if the receiver is located in an RU because the CU does not use code hopping for data it sends to the RUs. Therefore, in the preferred embodiment of RU receivers buffer 768 and deshuffler 770 do not exist. These circuits are present in FIG. 30 to symbolize the embodiments wherein code hopping is done by the CU. In the CU receiver, these circuits do exist and the function as described. In some embodiments, these circuits do exist, but are not used and a switch 791 guides the despread data on bus 776 from the CDMA MUX 766 around buffer 768 and directly into the input of the G2 amplifier 788. An RU/CU signal on line 793 controls the state of switch 791 such that either the data output bus 795 of buffer 768 or the bus 776 is coupled to input 789 of the amplifier 788. If the receiver is in a CU, bus 795 is coupled to bus 789, while if the receiver is in an RU, bus 776 is coupled to bus 789.

In some embodiments, the despread data on bus 776 is simultaneously read by a crosstalk detector which functions to determine the amount of interference between adjacent codes and also plays a role in clock recovery so that all RU and CU receivers and transmitters can be synchronized to the same clock. Crosstalk between channels encoded with adjacent cyclic, orthogonal codes always comes from adjacent channels and happens when the data encoded with adjacent cyclic CDMA codes do not arrive precisely aligned in time. In other words, to have zero crosstalk, the clock time at which the first chip of a symbol transmitted on one channel spread with a cyclic CDMA code arrives at the receiver must be exactly the same time as the clock time at which the first chip of a symbol transmitted on an adjacent channel spread with an adjacent cyclic code. This requires precise frame synchronization to minimize crosstalk between channels. A slippage of one chip clock means complete overlap and total crosstalk since adjacent cyclic codes are generated by shifting the code by one place to the right. A slippage or misalignment of less than one complete chip clock will mean that some crosstalk exists. The crosstalk detector in these alternative embodiments detects the amount of crosstalk affecting each chip of each channel by subtracting the amplitude of the chip of the channel currently being processed from the amplitude of the corresponding chip encoded on the immediately preceding channel.

In these alternative embodiments, the amount of crosstalk is sent as a clock tracking error to a control loop logic 781 which outputs a clock phase/frequency correction voltage on line 782 (RU receiver only—the following discussion applies only to the RU receiver clock tracking loop in this alternative embodiment). This signal 782 is coupled to the phase/frequency control input of a voltage controlled crystal oscillator 784 in the RU receiver which generates a chip clock reference signal on line 786. This chip clock reference signal is fed to one input of a switch 787, the other input of which is coupled to receive an external clock reference signal at 8.192 Mhz. A switching control signal on line 791 from the CPU 405 controls whether switch 787 selects which of the chip clock reference signals on lines 786 or 789 for output on bus 793 to the time base circuit 886. In some embodiments, the clock signal is multiplied in a PLL (not shown) by a factor of two so that two clock signals can be fed to the time base circuit 886. This PLL multiplies the clock reference signal on line 793 to generate two output signals at 114.688 Mhz and 57.344 Mhz which are supplied on bus 888 to a time base generator 886. The time base generator generates the various clock signals needed for synchronization of the system, and these clock signals are coupled to every circuit in the receiver and transmitter which need them.

Figure 34:
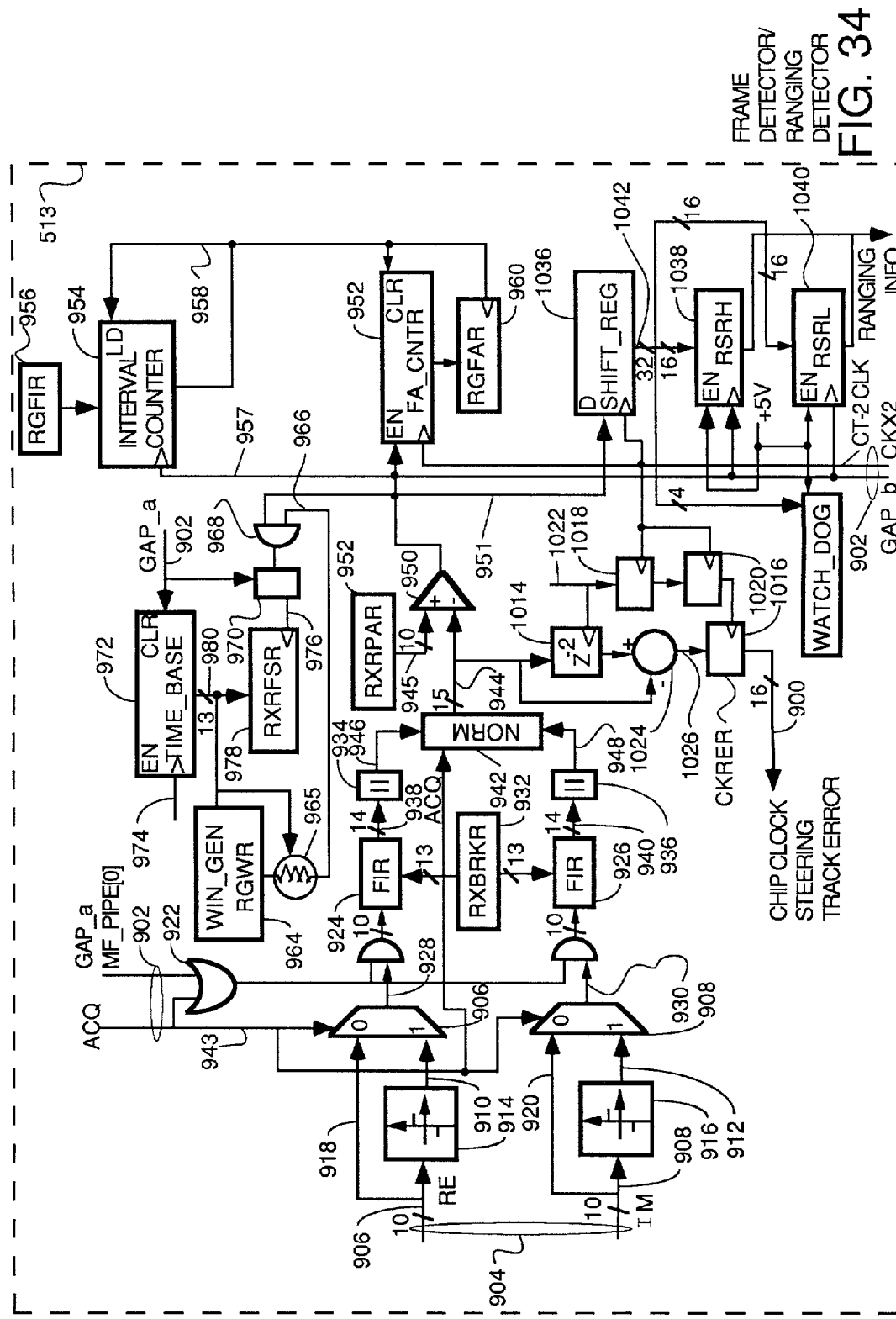
FIG. 34 is a block diagram for a frame detector/ranging detector useful in the RU and CU receivers to detect Barker codes, do clock recovery etc.

In the preferred embodiment for an RU receiver however, clock recovery is performed in the RUs by frame detector 882 using the fine tuning circuitry shown in FIG. 34. This circuitry generates a clock steering tracking error signal on line 900 in FIG. 30. This clock steering signal is input to the digital equivalent of an integrator in control loop 781 which serves as a loop filter for a phase lock loop including VCXO 784. The averaging process of integration eliminates the random noise. The integrated error signal is output as a clock phase steering signal on line 782 to the error signal input of VCXO 784 to generate the clock reference signal on line 786. The CU receiver of FIG. 31 does not have a clock tracking loop like that just described.

Although a global automatic gain control adjustment was made by AGC 756, data is being received in the CU receiver from many different RUs located at many different positions on the network. To minimize errors in interpretation of the upstream received data caused by amplitude variance caused by differing path length losses from the various RUs and channel impairments, a separate gain control adjustment is desirable for each RU. This is done by transmitting from each RU a preamble of known data before the payload data for each timeslot assigned to that particular RU as mentioned above. A variable gain G2 amplifier 788 is employed in the CU to amplify each timeslot's data with an individual gain value established to overcome the near-far problem so that the data from all the RUs, regardless of their distance from the CU, have the same amplitude level at the slicer 800. The same G2 amplifier is employed in the RU, but the gain value is fixed at one value for all the timeslots from the CU so that the CU signals to be adequately strong to be detected in the slicer and Viterbi decoder. Thus, in the RU receiver of FIG. 30, bus 792 is not present since the gain adjustment factor is the same for all timeslots. The control loop logic 781 assists in gain adjustment process in the RUs by sending a desired gain signal on line 790 to amplifier 788. The details of the design of the control loop circuitry 781 are not critical to the invention and any person skilled in the art can design suitable circuitry to function in the manner specified herein for the various embodiments. In the CU receiver, the gain adjustment factor on bus 790 results from the inputs received on buses 792 and 794. The input on bus 792 in the CU receiver tells the control loop which particular timeslot's data is currently at the input 789 of the amplifier 788 and is generated by deshuffling circuit 770. The control loop 781 in the CU receiver of FIG. 31 also receives an input on bus 1086 from control logic 1082 and CPU 405 which indicates when preamble data for a particular timeslot is being received. The input to the control loop 781 on bus 794 is the gain adjustment factor to use and this factor is received by the control loop in both RU and CU receivers. The gain adjustment factor is generated by a memory 796 which stores individual gain control and phase error correction numbers for each of the 128 payload channels (or all 144 channels in some embodiments) in the CU receiver. In the RU receiver, memory 796 stores only one gain adjustment value.

During reception of preamble data, the control loop 781 cooperates with the slicer 800, the G2 amplifier 788 and the rotational amplifier 765 to carry out an iterative process to reduce the slicer error to as low a value as possible by adjusting the amplitude error and phase error coefficients in the Upstream Carrier Recovery Error Correction Factor equation (Equation (5)) given above. Specifically, the CPU 405 and control logic 1082 will signal the control loop 781 and slicer 800 when preamble data is being received. Notification to the slicer 800 in FIG. 31 and slicer/detector 467 in FIG. 28 takes the form of activation of the CU Preamble signal on line 1086. When preamble data is being received, the control loop will set initial values for the $1/a$ and $e^{-j\phi}$ amplitude and phase error correction factors of Equation (5) and transmit these on buses 790 and 802, respectively, to the G2 amplifier 788 and rotational amplifier 765. In the preferred embodiment, the G2 and rotational amplifiers are the same amplifier, but they are shown separately in the figures for clarity of illustration of the concept. These circuits in the CU receiver will operate on the received data samples to make amplitude and phase error corrections. In the CU receiver only, the slicer will compare the received preamble data signal to the 3-j constellation point it knows it is supposed to be receiving during the preamble to derive amplitude and phase correction factors for the particular RU that sent the preamble data. The amplitude and phase errors between the actual received data and the 3-j point are output on bus 798 to the control loop 781. The control loop 781 examines these error values, and adjusts the 1/a and $e^{-j\emptyset}$ amplitude and phase error correction factors in an appropriate direction to tend to minimize the slicer error. The process repeats itself for the next preamble 3-j constellation point. Eventually, the control loop finds values for the 1/a and $e^{-j\emptyset}$ amplitude and phase error correction factors that minimize the amplitude and phase error values on bus 798. These values are then recorded in memory 796 in FIGS. 31 and 28 as the 1/a and $e^{-j\emptyset}$ amplitude and phase error correction factors to use in receiving in the CU data for the timeslot(s) assigned to the particular RU for which the correction factors were calculated. The process is repeated for each RU and each time the RU transitions from an idle state to an active state. This process resynchronizes the CU receiver detection process for each RUs data occasionally or periodically without the use of tracking loops in the CU. These correction factors are used only for controlling the G2 amplifier and rotational amplifier in the CU receiver and are not used to steer any clock or carrier VCXOs in tracking loops.

The process described above regarding synchronization in the upstream to the preamble data gives upstream carrier recovery synchronization. Frame synchronization and chip clock synchronization are done in the CU for the upstream data by the frame detector 882 using the coarse and fine tuning circuitry of FIG. 34. The CU receiver knows when the gap is, so the frame detector 882 in the CU does chip clock synchronization only based upon the RU's Barker code transmissions. The frame detector 882 in the CU receiver of FIG. 31 also functions to look for ranging Barker codes and supports the process of instructing the RUs on how to alter their transmit frame timing delay values $T_d$ so that their Barker codes hit the gap.

After synchronization to the preamble in the upstream data, the CU receiver control loop 781 uses the information received on bus 792 regarding which timeslot's data is currently being received to generate an address pointer to that timeslot's amplitude (1/a) and phase error ($e^{-j\emptyset}$) correction coefficients in memory 796. The control loop 781 then sends the address pointer to memory 796 via bidirectional bus 794 along with suitable read/write control signals and receives from the memory the amplitude and phase error correction coefficients for the particular timeslot being received. The control loop then places the amplitude and phase error correction coefficients on buses 790 and 802, respectively, to control the digital amplification process carried out by the amplifier 788 and the phase error correction process carried out by the rotational amplifier 765.

The slicer 800 is of conventional design, and includes circuitry to measure both gain and phase error for each channel's data. These errors are measured by circuitry in the slicer which compares the amplitude and phase of a received chip to the amplitude and phase of the legitimate constellation point which the received chip is supposed to represent. Recall that the constellation of FIG. 18 represents all the permissible 4 bit chips that can be part of a symbol. Each chip is comprised of 2 bits plus a sign bit which define the real or I axis coordinate and 2 bits plus a sign bit which define the imaginary or quadrature Q axis component. Therefore, in polar coordinates, each constellation point has an amplitude and phase the combination of which defines the constellation point. The circuitry in slicer 800 responsible for quantifying the magnitude and phase errors compares the magnitude and phase of the received point to the most probable point it is supposed to be and generates amplitude error and phase error signals on bus 798 from the differences.

The phase rotation amplifier 765 adjusts the amplified data on bus 789 representing each received chip so as to rotate the phase thereof to correct the phase error for that received chip. This is done by a matrix multiplication of the complex number representing each chip by cosine(ø)+j sine(ø) where ø is the amount of desired phase correction.

In the RU receiver of the embodiment of FIG. 30, the control loop 781 also uses the phase error data on bus 798 when the pilot channel data is being received to generate a local oscillator steering voltage on line 806 to alter the phase and/or frequency of a 3.584 MHz reference clock output on line 810 by a voltage controlled crystal oscillator 808 (vcxo). The steering signal on line 806 is a carrier tracking error derived from the pilot channel signal. The pilot channel signal carries the master carrier and time synchronization data (such as kiloframe markers) mapped onto a qpsk constellation. The carrier tracking error is extracted based upon a decision directed discriminator. Carrier recovery is started immediately after the AGC gain is set and ranging has achieved frame synchronization. The carrier recovery circuitry just described is monitored by the modem CPU to insure that it remains in synchronization, and if lock is lost, an interrupt occurs which causes re-initialization of the modem to be started and the modem transmitter to be disabled. The same is true if clock synchronization is lost, i.e., the RU local clock is locked to the CU clock and the clock recovery circuitry is monitored to make sure clock synchronization is not lost.

In the preferred embodiment, the master clock and master carrier signals generated by the CU modem are generated from the same temperature compensated VCXO by using different multiplication factors to generate the high speed clock and the master carrier signals. Thus, both the master clock and master carrier phase and frequency information are inherently embedded in the Barker codes transmitted by the CU during every CU transmit frame gap. The RUs in the preferred embodiment use the early late gating circuitry in the frame detector 882 in FIG. 30 to recover the master clock signal via the clock steering signal on line 900 and apply this master clock signal to frequency synthesizer 760 to generate the master carrier signal. The recovered master clock signal is supplied to the RU transmitter on line 901 and the recovered, synthesized master carrier signal is supplied to the RU transmitter on line 903.

Once carrier recovery has been achieved, the kiloframe data encoded in the pilot channel is recovered to achieve kiloframe synchronization so that the RU modem registers and software can be initialized to beginning counting CU frames so as to be able to keep straight which assigned codes from CU messages are to be used during which transmitted RU frames. The RU receiver decodes the synchronization sequence data on the pilot channel using a bpsk constellation. The CU transmitter generates the pilot channel signal as pseudorandom synchronization sequence of bits which are taken one at a time, bpsk modulated and transmitted on channel 1, one bit per symbol or 3 bits per frame. The RU generates its own matching pseudorandom sequence locally in a manner to be described below. The RU receiver frame detector demodulates and decodes the incoming pilot channel bits using its own internal slicer and compares them to its own matching pseudorandom pilot channel sequence. Each bit has only 2 possible digital values which defines 2 points in the bpsk constellation. If the incoming points are rotated in phase from one of these 2 points, the rotation is a carrier phase error and is used to generate a carrier phase steering signal on line 900 (line 900 carries both carrier steering signals and clock steering signals from the early-late gate sampling circuit in the frame detector) in FIG. 30. The carrier steering signals are transmitted to the control loop 781 and vcxo 808 via bus 806 to keep the local carrier reference signal on line 810 synchronized to the pilot channel data.

A kiloframe is 1024 frames long. As the pilot channel bits are received, they are compared to the local pseudorandomly generated pilot channel sequence. If communications were perfect, and frame synchronization is perfect, the incoming bits of the synchronization sequence would match the locally generated sequence exactly. A state machine counts the number of mismatches, and, if it is less than a threshold, frame synchronization is assumed, and the errors attributed to noise on the channel. If the number of errors exceeds the threshold, an interrupt signalling loss of frame synchronization is generated, and re-initialization is started. The kiloframe marker is detected in the synchronization sequence when a 16 bit feedback shift register which is loaded with 16 bits of the incoming bit stream of the synchronization sequence reaches a state which it only reaches after 1024 frames of bits of the synchronization sequence have arrived.

Figure 51:
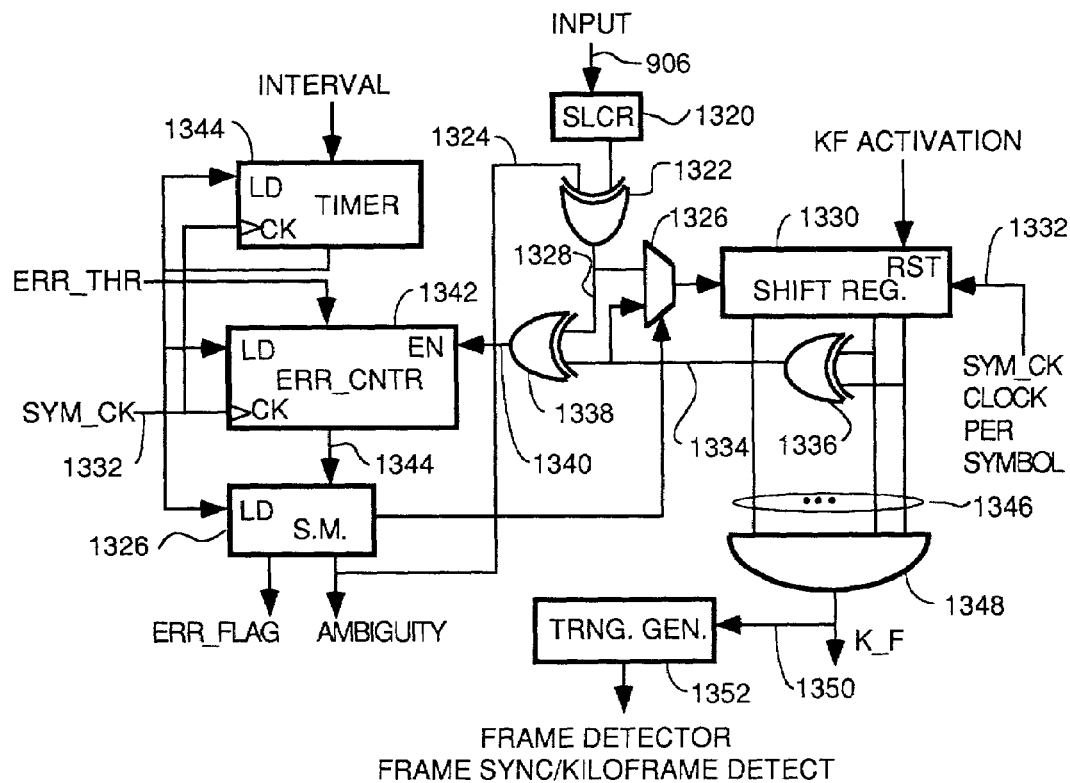
FIG. 51 is a block diagram of the kiloframe detector in the frame detector for recovering kiloframe markers from the pilot channel data.

Specifically, referring to FIG. 51, the circuitry of the frame detector 882 which monitors frame synchronization in the RU receiver and detects the kiloframe marker in the pilot channel synchronization sequence is shown. The bpsk pilot channel data enters on line 906 and is detected in a slicer 1320. The slicer output is coupled to a first input of an exclusive-OR (xor) gate which inverts the data selectively to correct phase ambiguity (the carrier may accidently lock in 180 degrees out of phase which causes every bit in the locally generated pseudorandom sequence to be the opposite of the incoming sequence bit) in accordance with a ambiguity signal on line 1324 from state machine 1326. A switch 1326 under control of the state machine selects the data on line 1328 for input to the 16 bit feedback shift register (FSR) 1330 for the first 16 clock cycles. The FSR is clocked once per symbol by a clock signal on line 1332 from time base 886 in FIG. 46. After the first 16 incoming bits are loaded, the multiplexer is switched by the state machine to select the feedback data on line 1334 from the output of xor gate 1336 which has its inputs coupled to the two MSB outputs of the FSR. The FSR acts as the local pseudorandom number generator to generate a sequence of bits that is supposed to match the incoming synchronization sequence. The feedback data on line 1334 serves as a predictor of the next incoming bits in the sequence, and is fed to one input of an xor gate 1338. The other input of this gate receives the actual incoming bits of the synchronization sequence. The feedback bits are also fed back into the FSR through switch 1326 to further alter the state thereof. The xor gate 1338 outputs a zero on line 1340 when the predicted bit on line 1334 matches the actual incoming bit. The zero on line 1340 does not enable error counter 1342, so no error count incrementation occurs. If the predicted bit disagrees with the actual bit, the error counter 1342 is enabled and incremented on the next symbol clock. Timer 1344 controls the interval over which the error count is taken. The error count on bus 1344 is read by state machine 1326 and used to detect loss of frame synchronization and automatically signal this event and attempt to reacquire the pilot channel and frame synchronization. Re-initialization is initiated by the software upon receipt of a loss of frame synchronization signal from the state machine. Reacquisition is continually retried until kiloframe synchronization is again achieved.

Figure 52:
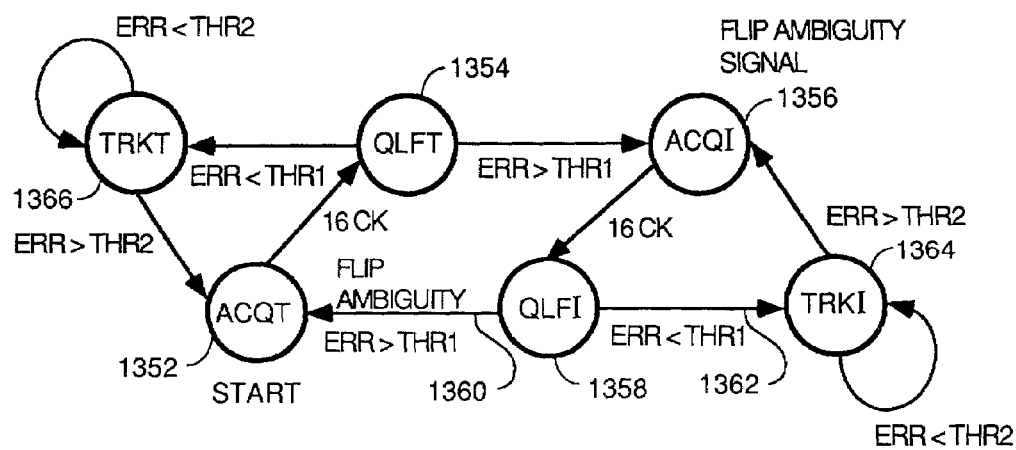
FIG. 52 is a diagram of the state machine that monitors frame synchronization.

FIG. 52 is a state diagram for the state machine 1326 that monitors frame synchronization. The state machine starts in acquisition true state 1352 by controlling switch 1326 to allow sixteen synchronization sequence bits enter the FSR 1330 without inverting them via the ambiguity signal on line 1324. Transition to qualification true state 1354 then occurs where the error count on line 1344 is monitored and switch 1326 is controlled to select the feedback bits on line 1334 for input to the FSR 1330. State 1354 determines if for each count interval, the error count exceeds or is less than threshold 1. If the count exceeds threshold 1, the possible problem is that the carrier has locked on 180 degrees out of phase. Transition to acquisition invert state 1356 then occurs where the ambiguity signal is driven so as to invert the next 16 incoming pilot channel bits, and switch 1326 is controlled to load these inverted bits into the FSR. Next, the state machine transitions to qualification invert state 1358 where the incoming pilot channel bits are inverted and switch 1326 is switched to select the feedback bits on line 1334, and the error count is again monitored. If the error count exceeds threshold 1 again, the problem is not a phase ambiguity, so path 1360 is taken to state 1352 to start over and the ambiguity signal is set to not invert the incoming bits. If the error count is less than threshold 1, the phase ambiguity was the problem, and path 1362 is taken to tracking invert state 1364. The state machine stays in state 1364 with incoming pilot channel bits being inverted and compared to the predicted bits generated by the FSR as long as the error count remains below a second threshold. As soon as the error rate exceeds threshold 2, transition to acquisition invert state 1356 occurs and a new 16 inverted pilot channel synchronization sequence bits are loaded through switch 1326 into the FSR, and the process starts over. A tracking true state 1366 works the same way as state 1364 except where lock on was reached without inverting the incoming pilot channel bits.

After 1024 frames of the foregoing activity, the state of the output lines 1346 will be all 1's. This is the kiloframe marker. This state causes AND gate 1348 to sent a K_F kiloframe marker 1 to training generator 1352. This circuit is used to coordinate frame tag number counting in the RU receiver. The RU counts incoming CU frames by virtue of a counter which counts the occurrences of the GAP_a signal from the CPU 405. In the preferred embodiment, this counter is located in the time base 886 in FIGS. 30 and 8 which communicates with the CPU via bus 1350. The frame counter can also be in frame detector 882 in FIG. 30 and frame detector 513 in FIG. 8 which communicate with the CPU via buses 755 and 902, respectively.

Returning to the discussion of FIG. 30, the carrier reference frequency on line 810 generated from the preamble data is used by frequency synthesizer 760 to generate a local carrier signal on line 762 that match the frequency and phase of the carrier signals used in the QAM modulators in the RU transmitters. Line 762 is coupled to the local carrier input of a synchronous demodulator in RF section 750. The control loop 781, VCXO 808 and the frequency synthesizer 760 combine in the embodiment of FIG. 30 to perform the function of the carrier recovery circuit 515 in FIG. 8.

The receiver of FIG. 30 uses two feed forward equalizers (FFE) and two decision feedback equalizers (DFE). The first FFE and DFE are shown combined as circuit 764 designated CE just after the matched filter 761 and just before the orthogonal code demultiplexer. The second FFE is combined with a rotational amplifier in circuit 765 after the orthogonal code demultiplexing operation and before the slicer. The second DFE is circuit 820. The circuits 820, 830, 832, 800, 767 and the FFE portion of circuit 765 are collectively referred to as the SE circuit in the materials included below on power alignment and other issues.

The equalization process involves some interplay between these FFEs and DFE as will be described below in the section on equalization. Both of the FFEs function to eliminate or substantially reduce precursor intersymbol interference, and both DFEs function to reduce or eliminate post cursor intersymbol interference.

Precursor and postcursor ISI can be understood as follows. If a transmitter were to send an impulse signal on one symbol with adjacent symbols empty, the receivers in an ideal system would receive the impulse with zeroes on either side of it. However, because of channel impairments, the receivers will receive an impulse and there will be some nonzero data in symbols on either side of the impulse. The nonzero data in symbols that precede the impulse symbol in time are precursor intersymbol interference. The FFE circuits removes this interference. The nonzero data in symbols that follow the impulse symbol in time is postcursor interference which is removed by the DFE circuits. The DFE circuit 820 receives as one of its inputs the decision data output by slicer 800 on bus 836 and processes these signals in accordance with the filter transfer function established by the tap weight coefficients received on bus 842 from a least means square calculation circuit. The resulting signals are output on bus 846 to the subtraction input of difference calculation circuit 767. The DFE and difference calculation circuit combine to subtract out that portion of the intersymbol interference produced by previously detected symbols from the estimates of future samples.

All the DFE and FFE circuits are FIR filters with adaptive tap coefficients. There is one main tap designated tap 3 and three secondary taps designated taps 0 through 2. The DFE circuit 820 and the FFE circuit 765 (circuit 765 is an FFE only during the equalization training period and is a rotational amplifier during payload data reception after training) receive their adaptive tap coefficients on buses 842 and 838, respectively, from the least mean square calculation circuit 830. The FFE/DFE circuit 764 receives its tap coefficients via bus 844 from the least mean square calculation circuit 830. The FFE and DFE FIR filters are given initial values for their adaptive tap coefficients that are close enough to allow the adaptation process to proceed. These preset coefficients are supplied from the CPU 405 via buses 824, 821 and 822. Thereafter, the coefficients are adaptively altered by signals on buses 842, 838 and 844 by the least mean squared circuit 830 using a conventional precursor and post cursor ISI elimination tap coefficient calculation algorithm.

The least mean square (LMS) circuit 830 iteratively calculates the new tap coefficients in a conventional manner and interacts with the FFEs and DFEs in the manner described below in the equalization section. The LMS starts with the initial tap weights and iteratively calculates the convolution sum between the tap input signals (input signals to each stage of the tapped delay lines) within the FFE 765 and the DFE 820 and the tap coefficients of the FFE 765 and DFE 820, all of which are obtained via bidirectional buses 842 and 838. The LMS then receives error signals on bus 831 calculated by difference calculation circuit 832 defined as the differences between the desired data points on bus 836 and the received data points on bus 834. The LMS then calculates new tap weights by multiplying the error signals times the corresponding tap input signals used to calculate the convolution sum times a predetermined step size which sets the rate of convergence to a stable value, and the result is added to the old tap weights to arrive at the new tap weights. These new tap weights are then sent to the FFE 765 and DFE 820 for use during the next iteration.

The LMS circuit implements a calculation which is based upon the fact that the needed change in the adaptive coefficients to the adaptive FIR filters 764 and 820 is proportional to the error on bus 831 times the conjugate of the data being input to the filters. In other words, the error is multiplied by complex numbers representing the received chips which have had the signs of their Q or imaginary components inverted.

The DFE filter eliminates or reduces post cursor interference by supplying a subtraction value on bus 846 to subtractor 767. The data sent by the DFE filter on bus 846 is subtracted from the data on bus 769 output by the FFE filter 765 during the equalization training interval. Eliminating the precursor interference and post cursor interference from the data on the bus 834 allows the slicer 800 and a Viterbi Decoder 850 to make better decisions about what chips were actually sent despite the channel impairments. The LMS, DFE and FFE circuits can be eliminated in some simple embodiments with, for example, only 4 points in their constellations. But to get more data throughput, more complex constellations are needed, and in such a situation, the points are closer together and ISI interference makes decisional discrimination between the constellation points more difficult. This creates a need for the above described ISI elimination circuitry.

After correction for ISI interference, the corrected data is passed via bus 834 to slicer 800. The purpose of the slicer is to make instantaneous decisions regarding which point in the constellation each chip represents for purposes of generating the gain and phase errors needed by the control loop and for purposes of generating the desired data on bus 836. The slicer does not make use of the 4th redundant bit in each chip for this purpose, and, as a result, makes errors in interpreting chips. It is up to the Viterbi Decoder 850 to correct these errors of interpretation.

Viterbi Decoders are well known in the art, and any Viterbi decoder algorithm will suffice for purposes of practicing the invention. The particular Viterbi algorithm used in the preferred embodiment is given below. Basically, Viterbi Decoder 850 and memory 852 keep track of the present and last state for each timeslot for purposes of tracing a path through a three dimensional space defined by the constellation of permissible input points stretched out over a third axis representing time which is orthogonal to the I and Q axes. There is one of these three dimensional spaces for each timeslot. By making use of the redundant bit or bits in each chip, and examining the path the states of each timeslot take through the appropriate 3-D space over time, the Viterbi Decoder makes a better informed decision as to which legitimate point in the constellation of permissible points each received code represents. The information on bus 792 to the Viterbi Decoder from the deshuffler tells the Viterbi Decoder which timeslot during which each code received on bus 836 was transmitted. The Viterbi Decoder uses this information to generate an address pointer to memory 852 pointing to the state information for that timeslot. This allows memory 852 to output the state information which is used by the Viterbi Decoder to make its analysis.

In the preferred embodiment, the following Viterbi algorithm is used.

```
N = 16;          % number of states
C = 2; (C=2+3;)  % for trace back in one symbol time.
                 % (if trace back is ⅓ in a symbol time C=2+3)
Dd = 12          % Decision Delay
for every input_symbol
    for present_state = 0:N-1
        for i = 0:7      % loop on previous states
            previous_state = f(present_state, i);
            tx = f(previous_state,present_state); % possible
                transmitted signal
            bm = f(tx,r);            % branch metric
            pm_tmp(i) = pm(previous_state) + bm; % ADD, find
path metric
                    % ADD with limiter (no overflow)
                    % pm_new(present_state) can be computed here by
minimum of 2 values
                    % previous_state_min can be computed here with
pm_new(present_state)
        end
        [pm_new(present_state),previous_state_min] =
min(pm_tmp);  % Compare &
                % Select (find min & index), (can be computed in loop
of i)
            survivor(present_state,survivor_pointer) =
previous_state min;  % update survivor,
                % i (3 bits) can be saved instead of
previous_state_min (4 bits).
    end
    pm = pm_new;   % update path metric, or switch path metric
memory
    if mod(symbol,3) = 0, do:   % begin trace back when 1'st symbol
of frame is received.
            surv_rd_add_l = min(pm) ;   % survivor RD address
            surv_rd_add_h = survivor_pointer;
            start TRACE_BACK;   % While trace back is employed
continue the process.
    end
        inc(survivor_pointer);   % circular increment survivor_pointer
end
        % TRACE_BACK (Two options:
    % a. Trace back all the survivor memory and output 3 symbols in
one symbol time.
    % b. For each symbol trace back ⅓ of the survivor memory.
            % the trace back is employed while the ACS is employed too.
    surv_rd_add = [surv_rd_add_h , surv_rd_add_l];    % RD
ADD of survivor memory
for k = 1:Dd + 2                                      % trace
back loop,
            surv_rd_add_l_old = surv_rd_add_l;        % save
old address
                surv_rd_add_l = survivor(surv_rd_add); % read
survivor memory
                surv_rd_add_h = dec(surv_rd_add_h);    % cir-
cular decrement
            if k >= Dd,                                % Get 3
output symbols
                    out(0:2) = f(surv_rd_add_l,
surv_rd_add_l_old)  % output 3 bit symbols
            end
end
```

The branch metrics are calculated after one symbol in normal mode and after two symbols in fallback mode, and then are stored in memory. The precomputed branch metrics are then used to calculate the path metrics. In fallback mode, the branch metrics of the two symbols are computed by summing the two square distances to each QPSK symbol. The branch metrics of the decoded symbols are summed to obtain one branch metric as in normal mode.

The particular Trellis code selected for implementation in the invention is rotational invariant with no parallel paths and 16 states.

After the Viterbi Decoder 850 outputs the correct data for each timeslot on bus 854, deframer 856 reassembles the data into the time division multiplexed timeslots in which these same data originally arrived at the framer circuit of the transmitter for encoding and CDMA spreading. The deframer 856 also descrambles the data to undo the effects of the scrambling carried out by the scrambler 524. The resulting TDMA stream of 9-bit bytes is output on serial data format bus 858. Each 9-bit byte in this data stream is comprised of the deshuffled, descrambled three tribits into which it was originally broken in the framer of the transmitter to form the three symbols of the frame during which this 9-bit byte was transmitted.

The output bus 854 from the Viterbi Decoder 854 is also coupled to a command and control channel circuit 860 which stores and/or processes codes sent on the command and control channels in the downstream data. Some switching or multiplexing function to select the command and control codes out of the stream of data on bus 854 is provided but is not shown. Codes sent on the access channel in the upstream or downstream data are stored and/or processed by an access channel circuit 862 which receives these codes from the output of the Viterbi Decoder 850 via bus 854. The command control code data is input to C3 circuit 860 from the Viterbi Decoder via bus 854. The CPU 405 accesses the command and control data and access channel communications from the C3 circuit 860 and the access channel circuit 862 via bus 1096. The processing of the command and control channel codes and access channel codes may also occur in circuits 860 and 862, respectively, in alternative embodiments without interaction with the CPU, or the codes may simply be buffered in circuits 860 and 862 until they can be read by a management and control process performed in the CPU 405.

The ranging process in its various embodiments described earlier herein is aided by the R/Tng circuit 763. This circuit receives an RU/CU signal on line 759 from the CPU 405 which tells the circuit whether it is performing its function in an RU or a CU. In the preferred embodiment, circuit 763 is simply a DMA FIFO which stores status information regarding positioning of the Barker codes in the guardbands during the ranging and initial frame synchronization process. This status information is received from the frame detector 882 via bus 883. This data is relayed to the CPU 405 via DMA transfers over bus 755 to a memory (not shown) coupled to the CPU 405. If it is performing its function in an RU, circuit 763 stores status data generated by the frame detector circuitry in implementing any of the functions indicated for any selected one of the embodiments of the RU in the ranging, contention resolution and authentication flow charts. This data may include data as to how many ranging pulses appeared in the gap and data to be sent to the ranging circuit 510 in the transmitter via bus 757 for purposes of setting transmit frame timing delay. These messages to the transmitter on bus 757 include data telling the transmitter ranging circuit 510 when the Barker code or other signal from the CU has been received in each frame thereby establishing the receive frame timing reference, whether to transmit another ranging pulse after contention resolution, and how to adjust the delay factor that establishes the transmit frame timing reference before sending each ranging pulse or Barker code, and, in some embodiments, what Barker code to transmit.

In the preferred embodiment, command, communication and control (C3) circuit 860 receives message traffic involved in the ranging, authentication and media access control processes as detailed in the flow charts and transmits this data to CPU 405 via bus 1096. Such data includes data from the CU indicating when authentication is desired and data regarding when to start sending that particular RUs authentication code. Circuit 860 also receives the authentication code broadcast by the CU after an authentication interval to determine if it is the RU that hit the gap. If so, circuit 860 sends a message to the transmitter via CPU 405 to freeze its current value for the transmit frame timing reference delay at the value last used for transmission of the ranging pulses in the authentication code sequence. The circuit 860 also monitors the control channel for instructions from the CU on how to adjust its transmit frame timing reference delay to exactly center the ranging pulse in the center of the gap.

If the signal on line 759 indicates the receiver of FIG. 30 is operating in a CU, the circuit 860 and the CPU 405 carries out those functions indicated for any selected one of the embodiments of the CU in the ranging, contention resolution and authentication flow charts. Circuit 860 and the CPU 405 in the RU and CU combine to process the following data in support of ranging, authentication, contention resolution and fine tuning: data received from the frame detector 882 and R/Tng circuit 763 regarding how many Barker codes have appeared in the gap during ranging and authentication and data regarding how many RUs have hit the gap, data determining the position of the Barker code(s) in the gap, and data ordering changes of position of the Barker code in the gap, data resulting from scanning the gap for additional unwanted pulses at the edges of the gap. This data is read by the CPU and used to compose messages for transmission by the transmitter on the control channel such as "no codes in gap-adjust your delays and try again", "one code in gap", "multiple codes in gap-enter contention resolution", "move Barker codes x chips left or right", "saw sequence xxxxxxx in gaps during authentication frames", "no activity in gap during authentication interval-reexecute your contention resolution protocols" etc.

Equalization Training Process

Referring to FIGS. 54A, 54B and 54C, there is shown an embodiment of a process carried out by the RUs to carry out "training". Training determines channel impairments and set coefficients into precode filters to predistort their transmissions such that their upstream data transmissions arrive at the CU undistorted. Training, in the preferred embodiment, also causes the modem to set the optimum transmitter power level and perform fine timing alignment.

Training is performed immediately after ranging and periodically thereafter. If the insertion loss, phase response and group delay were known for the channel and the effects of dispersion on the pulse shapes were known, intersymbol interference could be effectively controlled by the matched filters 761 in the CU receiver of FIG. 31 and 570 in the RU transmitter of FIG. 33. However, even if these characteristics were known in advance, they tend to vary over time. Hence, in the preferred embodiment, an adaptive equalization process is performed to set variable coefficients in tapped delay line equalization filters to correct for the combined effects of residual distortion and noise caused by a dispersive and noisy channel. Prechannel equalization is performed in each RU and CU transmitter, and post channel equalization is performed in each RU and CU receiver in some embodiments. In the preferred embodiment, the training process is performed only for some filters in the system. Specifically, the CU precode equalization filter uses only averaged coefficients suitable for all RUs and the CE equalization filters in the RU receivers use only average coefficients found to be suitable for the average RU. Specific coefficients are computed for the SE circuits for each RU however after a training process similar to the process to be described below. This allows the equalized system to approach the ideal condition specified by the Nyquist criteria for distortionless transmission free of intersymbol interference so as to realize the full data carrying capacity of the channel. The adaptive equalization filters are tapped delay line filters in some embodiments with the tap delays equal to one chip time. In the preferred embodiment, the post channel filters are decision feedback equalizers. The equalization filters on both the transmit and receive side are embodied in precode equalization filter 563 in the transmitter of FIG. 32 and the FFE (feed forward) filter 764 and DFE (decision feedback) filter 820 along with least mean square calculation circuit 830 and difference calculating circuit 832 and FFE 765 in the receiver of FIG. 30.

Figure 53A:
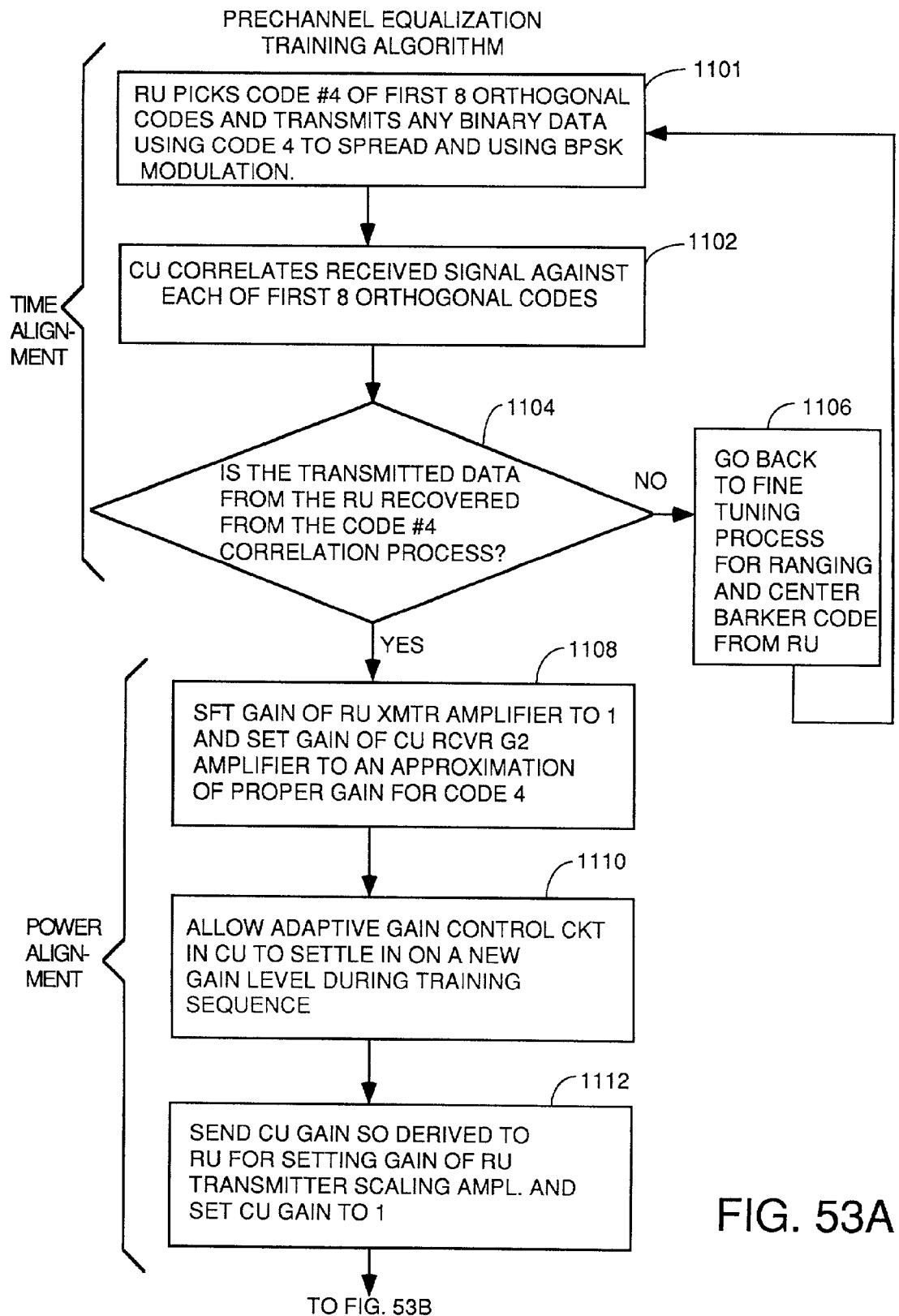
FIG. 53 is a flow diagram of one embodiment of a time alignment, power alignment, upstream and downstream equalization training processes.

The equalization training process occurs in every RU as part of its startup sequence. The prechannel equalization process starts with establishment by the RU controller of default precoder coefficients, a default transmit power level (input on line 566 to the scaler amplifier 564 in FIG. 32) and a default fine timing alignment value in the preferred embodiment. Next, step 1101 in FIG. 53A is performed to transmit data on code #4. The RU uses only the first 8 CDMA codes during the equalization process. Step 1101 represents the process of transmitting any binary data bit sequence (preferably a pseudorandom sequence) to the CU using code #4 of the first 7 or 8 orthogonal spreading codes (the first 8 codes will be assumed for this example but it could be other numbers of sequential cyclic codes as well) to spread the data and using bipolar phase shift keying (BPSK). In step 1102, the CU correlates the received data signal, after BPSK asynchronous demodulation, against each of the first 8 orthogonal, cyclic spreading codes. BPSK has only a two point constellation, so the CU is expecting to receive either of these two points from the correlation done between code #4 and the received signal if the ranging process has been done correctly. If the ranging process has not been properly fine tuned to put the RU's Barker code in the center of the gap, then the output data sent by the RU will be output from one of the other correlation processes which use one of the other 8 orthogonal, cyclic spreading codes. Each of the orthogonal, cyclic spreading codes is generated by shifting the code used during the previous chip time by one bit position. Therefore, each of the first 8 orthogonal, cyclic spreading codes is effectively different from its neighboring codes by one bit position and one chip time. If during the ranging fine tuning process, the Barker code was not exactly centered, the data transmitted by the RU will not be output by the correlation against code 4 but will be output by the correlation against one of the other codes depending upon how many chips away from the center of the gap the RU Barker code is found. Step 1104 is a test to determine if the data transmitted by the RU is output by the correlation against code #4. Step 1104 is preferably performed by checking the amount of code crosstalk by monitoring the demultiplexer memory. The CU also monitors the power level of the RU transmission by adapting the 4th tap of the FFE. If the training data did not come through purely on code #4 and crosstalk exists, it means the frame alignment is not perfect so step 1106 is performed to go back to the fine tuning process for ranging and center the RU Barker code in the gap. Step 1106 also symbolizes the process, in some embodiments, of computing a new power level and fine alignment value based upon measurements and sending them downstream to the RU in training. This process is repeated until the power level and frame alignment are within predetermined acceptable values of precision. The foregoing process of sending the proper power level to the RU from the CU may take the form of steps 1108, 1110 and 1112 in FIG. 53AA. Step 1106 represents the process of telling the RU to go back to ranging and doing a fine alignment process in some embodiments, but in the preferred embodiment, it is not necessary to do the full fine tuning process detailed above for ranging since the CU knows exactly how far away from the center of the gap the data landed by virtue of which correlation computation put out the correct transmitted data. Therefore, if the code 3 correlation put out the transmitted training data, the transmit frame timing delay for this RU is off by one chip, and the CU sends a message to that RU telling it to move one chip toward the center.

In the preferred embodiment, the CU has an array of 8 correlators each of which correlates the received data using one of the first 8 orthogonal cyclic spreading codes. This arrangement is used for maximum speed. In other embodiments, a single correlator can be used on the buffered received data with the first 8 orthogonal cyclic codes being supplied during successive correlation intervals. In other alternative embodiments, the correlation can be done in serial or parallel in software.

Power Alignment

The equalization process also is used for power alignment. Power alignment of all the RUs is the process of setting their transmit powers so that their transmissions all arrive at the CU at approximately the same power level. This is important in preventing interference between the signals from different RUs as well as in allowing the CU receiver's detectors to properly interpret the QAM 16 constellation points which are distinguished from each other in part by their amplitude levels. This process is started with step 1108 in which the RU transmitter causes the gain of scaling amplifier 564 to be set to one. The CU receiver control circuitry then causes the initial gain level for code 4 to be retrieved from memory 796 and transmitted through control loop 781 to the gain control input 790 of G2 amplifier 788. This initial gain level set into G2 amplifier 788 is an approximation of the proper gain level needed for this amplifier to allow slicer 800 to make proper decisions. Next, in step 1110, the CU waits for its adaptive gain control circuitry to settle in at a gain level needed for low or no error interpretation of the BPSK modulated data being sent during the training interval. The adaptive gain control circuit is comprised of slicer 800 which outputs amplitude error numbers on bus 798 in FIG. 30 to control loop 781. The control loop compares the amplitude error numbers to the current gain set on bus 790 and tries to adjust the gain number on bus 790 to minimize the slicer amplitude error. This process continues for a number of iterations by the end of which the gain of amplifier G2 will have been set at a value which reduces the slicer amplitude error by as much as possible. Finally, in step 1112, the CU takes this gain number on bus 790 (by reading the gain level on bus 790 from memory 796 via bus 797) and transmits it to the RU telling the RU to set that gain level as the gain of scaler amplifier 564 in FIG. 33. The CU then sets the gain of G2 amplifier 788 in FIG. 31 to one by writing a one into memory 796 as the gain level for code 4.

Since the overall gain of the system for code 4 is the gain of the RU transmitter amplifier times the gain of the CU receiver amplifier, the overall gain of the system does not change by swapping the gains. This power alignment process happens only for the RUs. Each RU, when it powers up, has its gain level aligned in this manner and will use that gain level for subsequent operation sending payload data until the power alignment is subsequently performed again.

Simultaneous Upstream and Downstream Equalization

Figure 54:
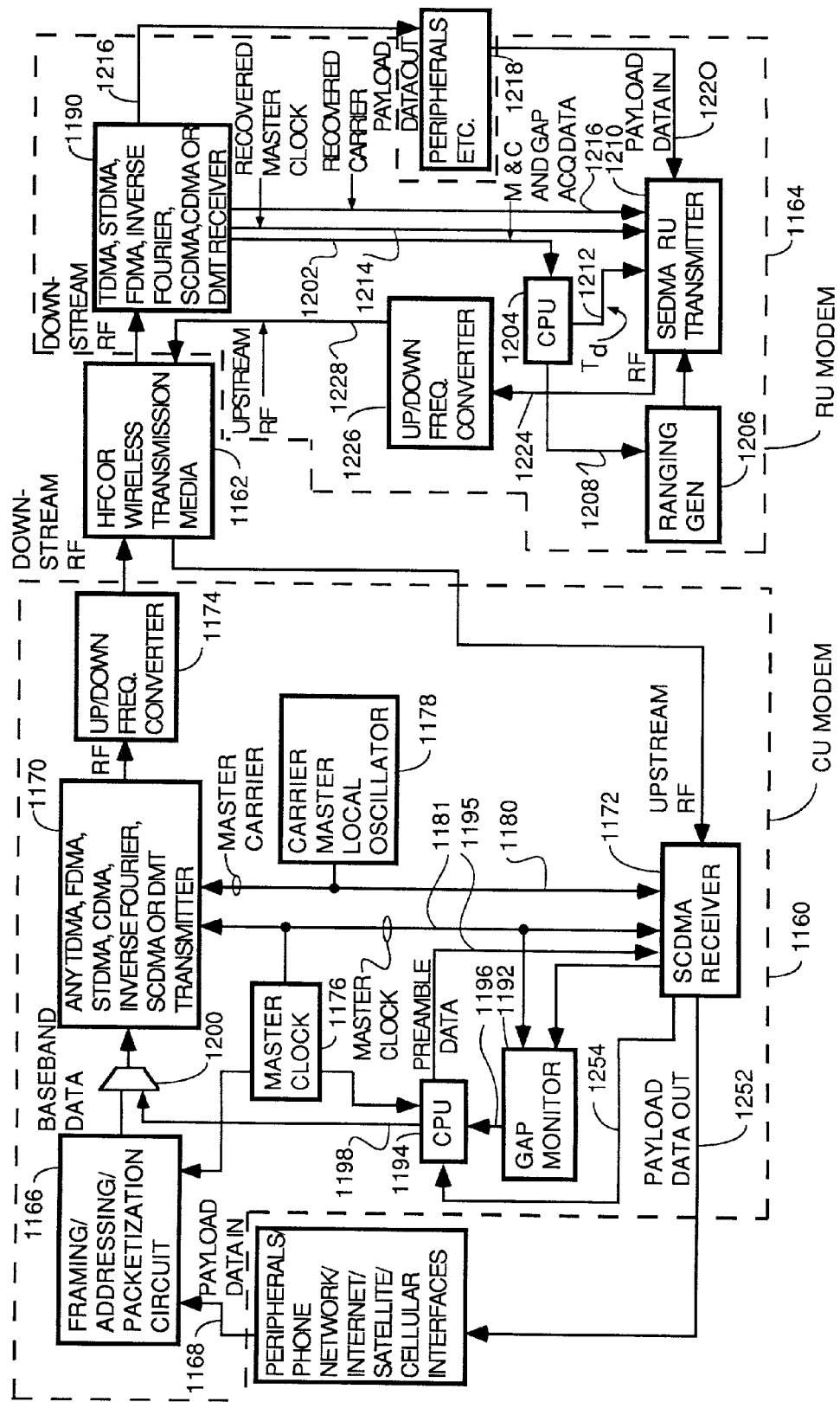
FIG. 54 is a block diagram of a system using any multiplexing and modulation form for transmissions downstream and SCDMA RU transmitters for upstream data and uses an RU receiver with no tracking loops for carrier and clock synchronization with the RUs.

Processing now moves on to the equalization process for both the upstream and downstream data path equalizers. The idea in downstream equalization is to set the tap coefficients of the FFE equalization filters in the RU receiver to values which equalize for channel impairments based upon errors observed in training data sent via the 8 training codes by the CU to the RU. The idea in upstream equalization is to set the tap coefficients of the precode filter in the RU transmitter to values which equalize channel impairments based upon information received from the CU receiver after training data is sent by the RU to the CU using the 8 training codes. The 8 training codes are the first 8 orthogonal, cyclic codes. They can and are used simultaneously in both the upstream and downstream directions (as are the rest of the codes) because the upstream transmissions are on a different frequency from the downstream transmissions. Although the flow chart of FIG. 54 (comprised of FIGS. 54A through 54C) shows the upstream equalization process occurring first, starting with step 1114, both the upstream and downstream equalization processes are occurring simultaneously. FIGS. 54A through 54C show one alternative embodiment for an equalization and power alignment process. The preferred embodiment is discussed later herein.

Upstream

The first steps in the upstream equalization process are symbolized by steps 1114 and 1116 wherein, in step 1114, the CU sends a message to the RU telling it to send some equalization training data (any data but preferably a pseudorandom PN sequence) to the CU using all 8 of the first 8 orthogonal, cyclic codes. In the embodiment shown in FIGS. 53A–53C, the CU requests that the RU send the training data using only one of the codes as a first transmission and then asks that the same data be sent using the other codes one code at a time or in small groups. With this method, if the RU's equalization filter coefficients are very far off the correct values, the transmissions by the RU in training will cause less intersymbol interference with payload data transmissions by other RUs that have already trained. However, in other alternative embodiments, the training data may be spread by all 8 of the first 8 codes and the results simultaneously transmitted. When the RU sends training data, it sets tap coefficients of its precode equalization filter such as filter 563 in FIG. 33 to values that cause the precode equalization filter to not predistort the training data signal. Step 1116 represents the process of sending the training data as spread by the first 8 codes to the CU either serially or all at once.

Step 1118 represents the process performed in the CU of receiving the equalization training data and using FFE equalizer 765, DFE equalizer 820 and LMS circuit 830 to perform one iteration of tap weight (adaptive coefficient) adjustment for the tap weights of the FFE and DFE. Step 1120 represents the process of continuing to make tap weight adjustments on subsequent transmissions of equalization training data using the same first 8 orthogonal spreading codes until convergence is achieved when the error signals computed by difference calculation circuit 832 in FIG. 31 drop to near zero.

After convergence, step 1122 is performed wherein the CU sends the final tap weight coefficients from FFE 765 and DFE 820 to the RU. This can be done by the CPU 405 reading the tap weights from shared memory in which LMS stores them via bus 833 and transmitting them to the RU on the command and control channels. To calculate the new coefficients for the precode equalization filter 563 in the RU transmitter of FIG. 33, the old coefficients of the RU precode filter FFE and DFE equalization filter are convolved with the new coefficients FFE and DFE coefficients which the central unit modem symbol equalizer circuit converged on to derive new coefficients. These new coefficients are then set into the RU precode filter.

Figure 50:
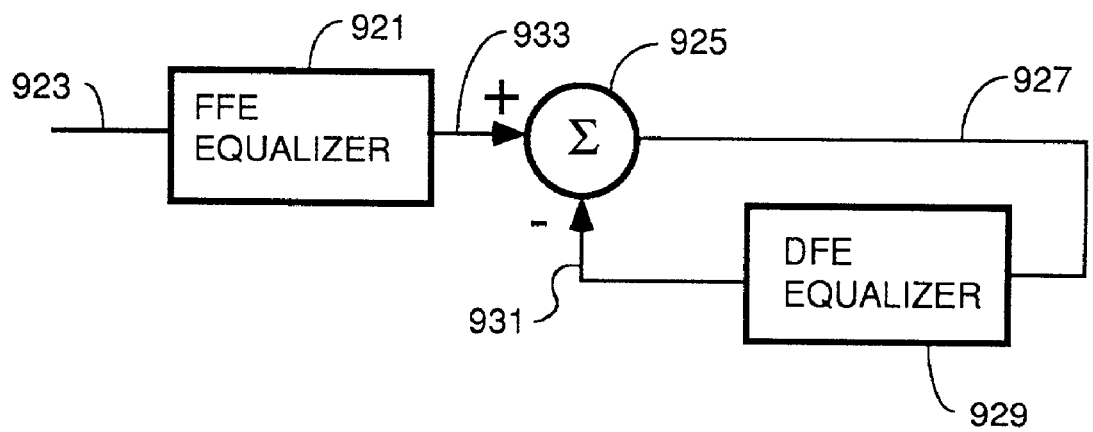
FIG. 50 is a diagram of the structure of FFE/DFE filter 764.

A block diagram of the structure of the precode equalization filter 563 in the RU transmitter of FIG. 33 and the FFE/DFE equalizer 764 in FIG. 31 is shown in FIG. 50. The FFE/DFE circuits are comprised of a conventional FFE equalizer which receives the input data on bus 923 and outputs its results on bus 933 which is coupled to the plus input of a difference calculating circuit 925. The minus input of the difference calculating circuit receives the output of a conventional DFE equalizer 929 via bus 931. The output of the difference calculating circuit 925 on bus 927 is coupled to the input of the DFE equalizer 929.

Finally, the CU, in step 1126, sets the main tap of said FFE equalizer 921 in FIG. 50 to one and sets the side tap coefficients of the FFE equalization filter 921 and the DFE equalization filter 929 in FIG. 50 to zero for reception of upstream payload data.

In some embodiments, after the CU sends its tap weight coefficients to the RU in step 1122, the process of steps 1114, 1116, 1118 are performed again for several iterations. The coefficients extracted from the CU adaptive equalizer on the second and subsequent iterations cannot be used directly in the precoder, since they were not produced from default precoder values. Instead, the new coefficients for use by the RU are computed as the convolution of the old precoder coefficients with the new adaptive equalizer coefficients. At each iteration, the CU evaluates the coefficients extracted from the adaptive equalizer, and when the errors have dropped below a predetermined threshold indicating that the RU is transmitting with adequate quality, then the training process is completed except for downstream training.

Downstream

Regardless of which upstream training embodiment is used, processing now proceeds to the downstream equalization training process. This downstream equalization process starts with step 1128 wherein the CU send equalization training data to the RU using all 8 training codes. Specifically, the CU sends a PN sequence simultaneously on 8 channels, each channel spread by one of the first 8 orthogonal, cyclic codes modulated using BPSK. Step 1130 symbolizes the process of the RU receiver receiving the equalization training data in multiple iterations and using the LMS circuit 830, the FFE equalizer 765, the DFE equalizer 820 and the difference calculating circuit 832 in FIG. 30 to converge on the proper FFE and DFE tap weight coefficients for the FFE equalizer 765 and the DFE equalizer 820. After convergence, the RU CPU reads the final tap weight coefficients for the FFE equalizer 765 and the DFE equalizer 820 via bus 833 and calculates new tap weight coefficients for the FFE and DFE filters of the CE circuit 764 in the RU receiver of FIG. 30 by convolving the old CE filter tap weights with the FFE and DFE filter tap coefficients converged upon by the SE circuit during reception of multiple bursts of training data, and loads these newly calculated tap weight coefficients into the FFE and DFE filters of CE circuit 764 in the RU receiver of FIG. 30 via bus 844, as symbolized by step 1132 of FIG. 53C. The RU CPU 405 then sets the tap weight coefficients of the FFE 765 and DFE 820 to initialization values in this alternative embodiment so that they can reconverge as payload data is sent. In the preferred embodiment, the tap weights of FFe 765 and DFE 820 are maintained at their convergence values, and the tap weights of FFE/DFE 764 in the RU receiver of FIG. 30 are set to averages for all RUs. In some embodiments, step 1132 also involves sending a training status message indicating the success or failure of training, an indication of success being an implicit request to the CU to disable training transmissions on all channels.

The iterations of the processes symbolized by FIG. 53A through 54C occur every few milliseconds, and convergence occurs within a fixed amount of time. The processes are repeated every 2 minutes in some embodiments, and in other embodiments, retraining occurs both periodically and immediately upon activation of an RU's first and any subsequent timeslot assignments. In some embodiments, retraining occurs periodically at some lesser interval when an RU has no active timeslots and when a link quality monitoring process reports poor quality transmission. Retraining usually only takes 2 iterations for power and time alignment and one iteration for filter adaptation. In one embodiment, the CU does correlation between the coefficients currently being used by the RU and extracted coefficients on subsequent iterations. This means that the CU must know what coefficients the RU is currently using either by keeping a mapping of those coefficients in CU memory or by requesting them from the RU via the command and control channels.

After equalization training, the RU link to the CU is active, and the RU can begin receiving messages after receiving a hello message from the CU. The hello message gives the RU the CU's software revision number and the superframe offset number. The revision number allows the RU to check its software revision number for compatibility, and the superframe offset number is set into a SFDOR register in the RU receiver time base for use in correctly reproducing an external time division multiplex stream superframe signal at the appropriate spot in the data stream so that external devices that depend upon the superframe signal can correctly interpret the TDM data.

Carrierless Modulation

Figure 42:
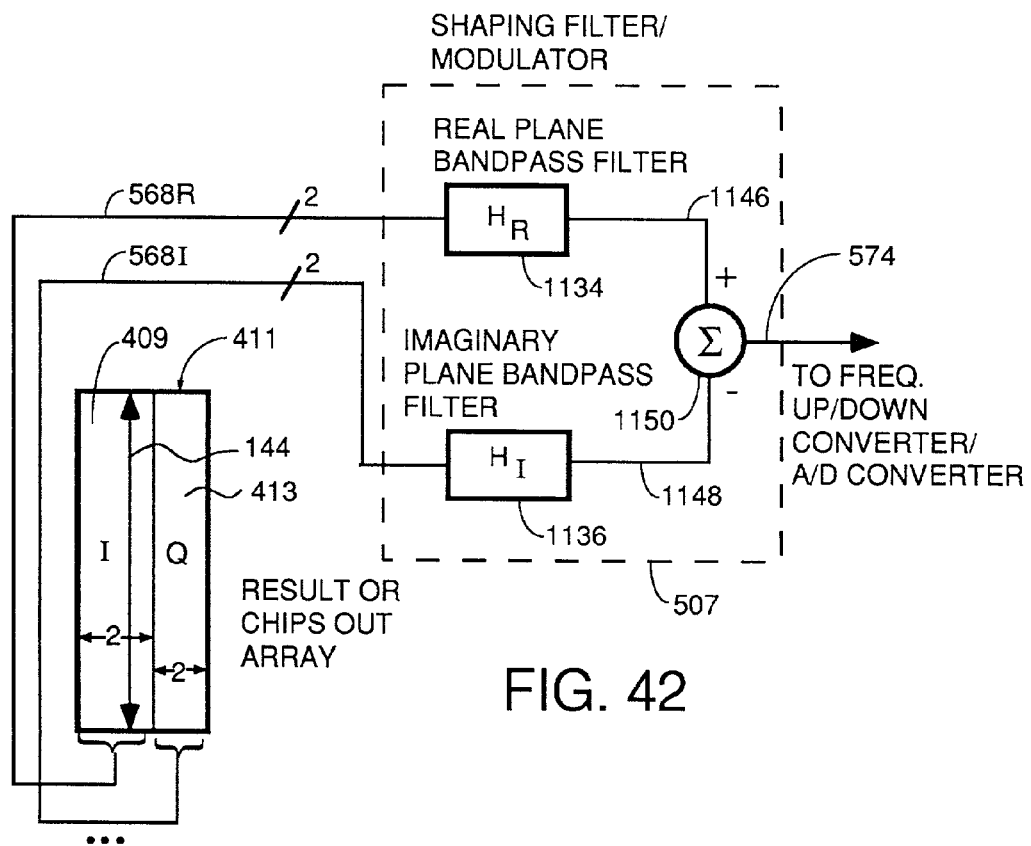
FIG. 42 is a block diagram of a carrierless shaping filter modulator.

Referring to FIG. 42, there is shown the preferred form of carrierless modulators used in the RU and CU transmitters. In the modulator of FIG. 23, multipliers 429 and 435 are used to multiply the incoming data times the local carrier sine and cosine signals. The result is two orthogonal RF signals bearing the inphase and quadrature information.

This same result can be achieved in a substantially different way by using Hilbert transform filters and carrierless amplitude and phase modulation. In the preferred form of modulator 507 shown in FIG. 42, the multipliers 429 and 435 and local oscillator 425 and phase shift circuit 439 in FIG. 23 are eliminated thereby resulting in a less expensive, less complex modulator that achieves the same result as the modulator of FIG. 23. Specifically, shaping filter/modulator 507 of FIG. 42 receives inphase (real) and quadrature (imaginary) digital inputs (or analog) on buses 568*r* and 568*i*. Although, buses 568*r* and 568*i* are shown in FIG. 42 as originating at the results array for clarity of illustration, in the preferred RU and CU transmitters of FIGS. 32 and 33, they actually originate from the output of the scaling circuit 564. In some embodiments, the scaling circuit 564 and the precode equalization filter 563 can be eliminated where higher error rates or less payload capacity can be tolerated.

Figure 43:
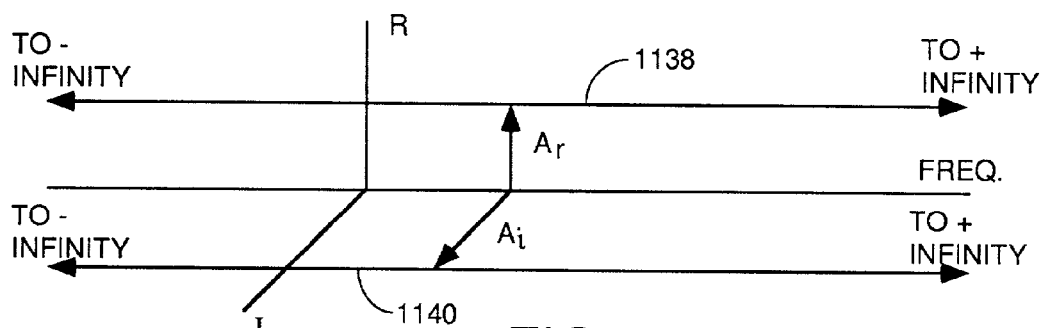
FIG. 43 is a diagram of the Fourier spectra of the real and imaginary parts of the orthogonally code division multiplexed data.

The Fourier spectrum of the baseband, orthogonally code division multiplexed data on bus 568r is shown as a constant amplitude spectrum 1138 of amplitude $A_r$ on the real axis in FIG. 43. The Fourier spectrum of the baseband, orthogonally code division multiplexed data on bus 568i is shown as a constant amplitude spectrum 1140 of amplitude $A_i$ on the imaginary axis in FIG. 43 The direct sequence spread spectrum techniques employed in the transmitters according to the teachings of the invention has the effect of spreading the energy of the signals represented by the information vectors in frequency from minus infinity to plus infinity at a constant amplitude. Because any 6 mHz wide section of the spectrum of FIG. 43 can be selected with a passband filter and all the channel data therein recovered, this fact is employed to simultaneously carry out carrierless amplitude and phase modulation as well as filtering to satisfy the Nyquist criteria in shaping filter/modulator 507. To do this, two shaping filters $H_R$ 1134 and $H_I$ 1136 in modulator 507 are coupled to receive the signals on buses 568r and 568i, respectively. Filter 1134 has its filter characteristics set (programmable by CPU 405 in some embodiments) to establish a "squared-raised cosine" passband filter characteristic 1142 in the real plane of the frequency domain shown in FIG. 44. The passband filter characteristic has a bandwidth of 6 mHz and is centered on an intermediate frequency Fc which is established at a frequency which can be easily and conveniently achieved in a digital filter. The output signals of the filter are ultimately sent to digital-to-analog converter 576 in FIGS. 32 and 33 and from there to frequency translator up/down converter 577. The function of the up/down converter 577 is to raise the frequency to a frequency in the band devoted to digital data communication and assigned to upstream or downstream communications as appropriate to implement the CATV or cellular system supplemental services on the shared transmission media 412.

Figure 44:
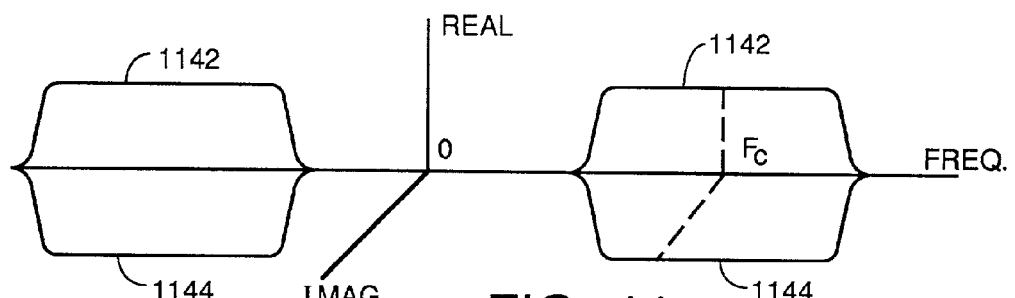
FIG. 44 is a spectrum diagram of the real and imaginary Fourier components of the spread spectrum data after is passed through the shaping filters 1134 and 1136 of the carrierless Hilbert transform modulator 507.

Filter 1136 also has a "squared-raised cosine" passband filter characteristic 1144, but its filter characteristic is located in the imaginary plane of the frequency domain shown in FIG. 44. The passband filter characteristic has a bandwidth of 6 mHz and is centered on an intermediate frequency Fc which is easy to attain in digital filter design. To insure orthogonality between the real and imaginary data output signals on buses 1146 and 1148, the transfer function of filter 1136 is the Hilbert transform of the transfer function of filter 1134.

When the baseband spectra of FIG. 43 for the real and imaginary signal components are passed through filters 1134 and 1136, the resulting Fourier spectra of the digital data on buses 1146 and 1148 are as shown in FIG. 44. These spectra contain all the encoded information from the real and imaginary information vectors encoded by the orthogonal code multiplexer 527. These digital signals on buses 1146 and 1148 are summed in summing circuit 1150.

Referring to FIG. 54, there is shown a block diagram of an alternative embodiment of a system employing simple CU and RU modems according to the genus of the invention and using forms of modulation and multiplexing options for downstream data including SCDMA, DMT, TDMA, FDMA, etc. The system comprises a CU modem 1160 coupled by an HFC (hybrid fiber coax) or wireless transmission media such as a cellular or satellite radio transmission system 1162 to one or more RU modems 1164. The purpose of the CU modem is to provide a multiple-user and/or multiple-source simultaneous digital data communication facility over a limited bandwidth channel such as 6 megahertz to one or more remote unit modems coupled to the CU modem by a shared RF transmission media.

The CU modem transmits data in the downstream direction toward the RU modems using a transmitter 1170 that uses digital data to modulate one or more radio frequency carriers that are transmitted over the media 1162 after frequency conversion by up/down frequency converter 1174 to the proper assigned downstream channel frequency. The transmitter can use any modulation and any multiplexing scheme which can effectively transmit a master clock reference and a master carrier reference signal as well as payload data to the RU modems. The clock and carrier references may be transmitted either in-band or out-of-band. Data is transmitted in frames which the RU receiver detects. The RU transmitter achieves frame synchronization by the ranging processes described elsewhere herein or by any other means. Examples of multiplexing schemes that will work for the downstream direction CU transmitter are TDMA, synchronous TDMA, FDMA, Inverse Fourier, SCDMA or DMT (digital multitone transmitter). Any compatible modulation scheme can be used. Any of the conventional transmitters described in the treatises incorporated by reference herein will suffice for the CU transmitter, but an SCDMA transmitter is preferred. Non-SCDMA multiplexing schemes can be used in the downstream direction because the noise and interference problems are less severe than in the upstream direction.

The definition of "in-band" transmission of the clock and carrier is that one or more channels which would otherwise be used to transmit payload data are dedicated to transmitting the clock and carrier signals. The definition of "out-of-band" transmission is that a separate carrier or some other subchannel/sideband etc. modulation scheme is used to transmit the clock and carrier information so that no timeslot or packets that could be used to send payload data is used to send clock and carrier information. In the embodiment of FIG. 54, the master clock signal is generated by master clock 1176 and the master carrier reference signal is generated by oscillator 1178. This master carrier signal is modulated by transmitter 1170.

The CU transmitter has a framing/addressing/packetization circuit 1166 which functions to receive payload data at an input 1168 and organizes said data into frames and addresses the data to the proper destination RU modem and the proper peripheral device coupled to that RU. The manner in which this is done is not critical to the invention so long as the downstream data is organized into frames since the upstream data is transmitted by SCDMA. The CU transmitter's framing addressing circuit 1166 can have the structure and operation of the framing circuit 400 in FIG. 8 it the transmitter 1170 is an SCDMA or DMT transmitter. If the transmitter 1170 is, for example, a TDMA or synchronous TDMA transmitter, the framing/addressing circuit 1166 organizes the data into frames and places data bound for specific RU modems into timeslots assigned to those RUs. The data in these timeslots of each frame assigned to a particular RU will includes header bits which tell the RU modem to which particular peripheral or other destination the data in these timeslots is addressed and may include other information such as packet delimiters which define the start and stop of each packet destined to a particular RU or peripheral or may include byte counts etc. which tell the RU how many timeslots of data to collect for a complete packet destined for a particular destination coupled to that RU. Basically, the function of the framing/addressing/packetizing circuit 1166 includes organizing the payload data such that information as to which RU and peripheral each payload data byte is directed to can be determined.

The CU receives upstream radio frequency signals using an SCDMA receiver 1172. The function of the SCDMA receiver is to extract the payload data from the upstream RF signals. In the preferred embodiment, the SCDMA CU receiver receives the master clock and master carrier signals on lines 1181 and 1180 and periodically recovers the clock and carrier from the RU signals using the preamble data and Barker codes transmitted by the RU in the manner previously described. This upstream payload data is multiplexed by an SCDMA transmitter in the RU modem using orthogonal, pseudorandom spreading codes. Then a suitable modulation scheme such as QAM is used to control one or more characteristics of one or more RF carriers to generate the upstream RF signal. The CU receiver 1172 can have the structure of the receivers of FIG. 28 or 32 or the more basic, but lower performance structure of FIG. 54 or any other code division multiplexed receiver structure which is compatible with the ranging processes defined herein. In the preferred embodiment, the RU transmitter uses clock and carrier signals which are synchronized to or at least phase coherent with the master clock and master carrier signals used by the CU transmitter and the RU receiver. In these embodiments, the CU receiver 1172 does not include tracking loops to continuously track the phase and frequency of the clock and carrier signals used by the RU transmitter to generate the upstream signals. In these embodiments, each RU transmitter send preamble data prior to sending upstream payload data. This preamble data from each RU is used by the CU SCDMA receiver 1172 to determine the phase differences between the clock and carrier signals used by each RU transmitter and the master clock and master carrier signals used by the CU transmitter. These phase differences are detected once for each RU and stored in a memory location dedicated to that RU. These phase differences are updated each time the RU transmits preamble data. The SCDMA receiver in the CU is informed by CPU 1194 each time preamble data is being received by activation of a PREAMBLE DATA signal. This signal is sent to the SCDMA receiver 1172 by a line 1195. FIG. 54 is also intended to symbolize embodiments wherein the RU transmitter uses its own clock and carrier signals which are unrelated to the CU clock and carrier signals and wherein the SCDMA receiver includes tracking loops to continuously track the phase and frequency of the clock and carrier signals used by each RU. In these latter embodiments each RU sends preamble data prior to sending upstream payload data. This preamble data is sufficient for the tracking loops in said SCDMA receiver 1172 to lock onto the phase and frequency of the clock and carrier signals used by that RU for the time when upstream payload data is being received from that RU.

The RU modem 1164 has the following structure. A receiver 1190, having a demodulator and detector compatible with the type of modulation performed in the CU transmitter, is coupled to the transmission media 1162. The function of the RU receiver is to receive downstream RF signals transmitted by the CU transmitter, recover the master clock and master carrier of the CU, and synchronously extract the downstream payload data transmitted by the CU. The RU receiver also extracts any management and control data transmitted by the CU to coordinate the process of achieving frame synchronization and coordinates with the CPU 1204 and the RU SCDMA transmitter 1210 to carry out the ranging process or whatever other process is used to achieve frame synchronization. The RU receiver recovers the master clock and the carrier used by the CU transmitter in the manner described above or in any other way known in the prior art. The recovered master clock signal is distributed on bus 1214 to all RU circuits that need it including the SCDMA transmitter 1210 in embodiments that eliminate the tracking loops in the CU receiver. The recovered carrier signal is distributed by receiver 1190 on bus 1216 to all circuits that need it including the SCDMA transmitter 1210 in embodiments that eliminate the tracking loops in the CU receiver. The preferred method of recovering the clock in the RU is by encoding the clock into Barker codes sent during every gap by the CU and using a gap monitor/frame detector circuit like that shown in FIG. 34 to generate clock steering signals to keep an RU local clock oscillator in synchronization with the master clock 1176. The preferred method of recovering the carrier is by dedicating one channel or timeslot to a pilot tone that defines the phase and frequency of the master carrier generated by the master carrier local oscillator 1178 in the CU and monitoring that channel to generate steering signals to keep a local oscillator in the RU synchronized.

The RU receiver 1190 can have the structure of the receivers described in FIGS. 28 or 31 and 34 as well as alternatives and functional equivalents thereof mentioned herein or known to those skilled in the art, or it can have the structure of conventional receivers described in the treatises incorporated by reference herein. The only requirement is that whatever structure the RU receiver has, it must be capable of decoding and extracting the downstream payload and management and control data transmitted by the CU transmitter. The extracted payload data is output on bus 1216 for use by peripherals and interfaces to other networks or processes represented by block 1218.

An RU transmitter 1210 receives payload data on bus 1220 from the peripheral devices or processes and organizes that data into frames of the same size as the CU frames. The data so framed then has its Fourier spectrum spread by the transmitter over a bandwidth much larger than said data originally had by orthogonal code division multiple access encoding or by performing an inverse Fourier transform operation. In some embodiments RU transmitter 1210 can be a synchronous TDMA transmitter. If code division multiple access is used, the spread spectrum data is then modulated onto one or more radio frequency carrier signals using a suitable modulation scheme such as QAM16 as described elsewhere herein. The process of organizing the upstream data into frames, spreading the spectrum of each frame of data and using the spread spectrum data to modulate one or more RF carriers is done synchronously with the CU using the master clock and master carrier signals recovered by receiver 1190 and output on buses 1214 and 1216, respectively. In some embodiments the RU local carrier reference signal on line 1216 is a different frequency but phase coherent with the master carrier. The resulting RF signals are output on line 1224 to an up/down frequency converter 1226 where the frequency is converted to the designated frequency of an upstream frequency band, usually 6 mHz in width, and then the resulting signals are output on line 1228 to the transmission media 1162. Therefore, frequency division multiplexing for the upstream and downstream traffic is employed to share the transmission media between upstream and downstream channels. Those skilled in the art will appreciate that the system of the invention uses a combination of time division multiplexing, frequency division multiplexing and code division multiplexing to achieve high-performance, multiple-user, multiple-source bidirectional digital data traffic in a distributed communication system.

Frame synchronization is achieved, in the preferred embodiment, by the trial and error process of adjusting the transmit frame timing delay described elsewhere herein and then transmitting a unique code such as a Barker code which the CU receiver can detect using that transmit frame timing delay following detection of the CU gap by frame detector in RU receiver 1190. The CU modem includes a gap monitor circuit 1192 (shown separately but which could be inside SCDMA receiver 1172) that functions to monitor the CU guardband or other interval included in each frame to which the RU transmitters are trying to synchronize to determine if one or more RU Barker codes have been received. The gap monitor circuit can have the structure shown in FIG. 34 or any other structure that can: determine when the unique code of an RU has been received; determine if more than one code from an RU has been received in the gap; detect how far away from the center of the gap the received Barker code is; and, provide status information on bus 1196 to a computer 1194. The status information tells the CPU 1194 whether a Barker code has been received, if more than one Barker code has been received, and, if only one Barker code has been received, and how far away from the center of the gap the received Barker code is. Although a computer is preferred for circuit 1194, other circuits to perform this function such as gate arrays, state machines etc. may be used to generate the management and control data on bus 1198 which informs the RUs of information they need to achieve frame synchronization. Hereafter, circuit 1194 will be referred to as a computer. The same is true of computer 1204 in the RU. The computer 1194 then generates management and control message data on bus 1198 which are presented at one input of a switch 1200 the switching state of which is controlled by computer 1194 (or other timing logic) to select the data on bus 1198 during the interval for transmitting data from timeslots devoted to management and control messages. Those skilled in the art will appreciate that a switching multiplexer like MUX 1200 need not be used and any other known data transfer circuit or process to get data from one process to another such as shared memory etc. may be used to get the management and control data transmitted at the proper time. For example, the management and control data may be stored in specific locations of a shared address space of a memory which also stores the output data from the framing circuit 1166, and the transmitter may have a computer or state machine which accesses the memory at the proper times to send the data assigned to various timeslots including the management and control data.

The RU receiver 1190 receives these management and control messages and passes them on bus 1202 to a computer 1204 which uses the management and control data to control the ranging process carried out by said SCDMA transmitter 1210 and Ranging Generator 1206 and for other purposes. The gap monitor circuit in receiver 1129 supports the CU gap acquisition process by locating the time of each CU frame gap. This gap monitor circuit listens for Barker code data transmitted by the CU during every gap, usually by correlating received energy against the known Barker code data pattern, and sends gap acquisition data detailing the receipt of correlation pulses and the relative times of their occurrence to computer 1204 via bus 1202. In some embodiments, the gap monitor circuit is structured like the frame detector of 34 and uses the Barker code transmitted by the CU to recover the CU master clock by an early-late gating technique.

Computer 1204 or other control circuitry uses this gap acquisition data to determine the time of receipt of the Barker code thereby establishing a frame boundary reference for the receiver to aid it in demodulating, decoding and deframing the received data and a reference time from which to start the transmit frame timing delay. Specifically, the computer 1204 uses the receive frame timing reference during the ranging process to establish the starting time against which to measure a trial and error value for the transmit frame timing delay value $T_d$, and then sends this transmit frame timing delay value $T_d$ on bus 1212 to the RU transmitter 1210 to control the delay between the time when a frame of downstream data arrives from the CU transmitter, and the time the RU transmitter 1210 sends the same frame back to the CU receiver with new upstream data therein. During the ranging process, the value of $T_d$ is varied experimentally during successive Barker code transmissions until management and control data is received by the RU indicating that the Barker code has been centered in the CU frame gap thereby achieving frame synchronization. Once frame synchronization has been achieved, the computer 1204 freezes the value for $T_d$ thereby causing the SCDMA transmitter to send its frames in frame synchronization with the CU frames and frames transmitted by all other RUs.

The frames all have numbers and can be visualized in the following manner. A downstream frame travelling from the CU transmitter to the RU receiver is like a bus with a load of particular people, the people being the payload and management and control data in the frame. When that bus arrives at the RU, the people are unloaded, and a new set of people get on representing the payload and management and control data the RU wants to sent to the CU. After delay $T_d$, the bus leaves the RU and travels back to the CU. The different channels of data can be visualized as different buses each destined for a different RU although in reality, they are data from different timeslots in the same frame which is received by all RUs. Frame synchronization is the process of setting the value of $T_d$ properly in each RU after a trial and error process so that the buses from each RU travelling toward the CU all arrive at the same time.

As a further operation in achieving frame synchronization, the computer 1204 also enables a ranging generator circuit 1206 via signals on a bus 1208 and passes messages to the ranging generator to control its operation. The ranging generator 1206 functions to generate and send to the RU transmitter 1210 data defining the Barker code for transmission during a ranging process, the power level for transmission and the unique on-off morse code authentication signature sequence that is used to identify each particular RU during the ranging process.

Computer 1204 also generates and sends management and control data to the RU SCDMA transmitter 1210 via bus 1212. This management and control data can include requests to start ranging, requests for more bandwidth, messages relinquishing bandwidth etc for various species within the broad genus of the invention.

Figure 55:
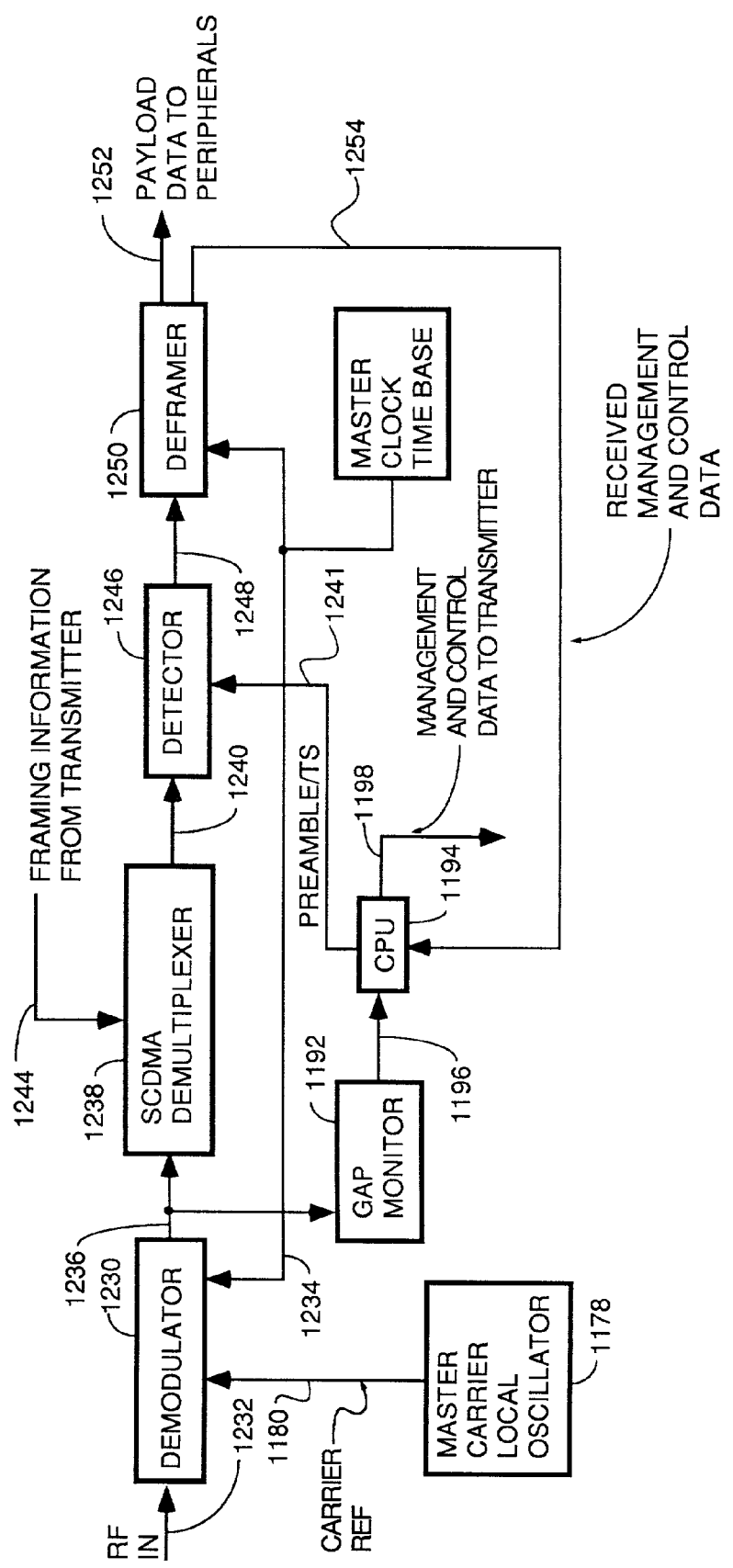
FIG. 55 is a block diagram of a simple CU SCDMA receiver with no tracking loops for clock and carrier synchronization with the RUs.

Referring to FIG. 55, there is shown a block diagram of a simple form for the SCDMA receiver in the CU of block 1172. This embodiment has a demodulator 1230 which receives the modulated RF signals on line 1232 and the master carrier reference signal on line 1180 from the master carrier local oscillator 1178. The demodulator also may receive the master clock signal on line 1234 in some embodiments where the output signal is converted to digital samples and output as a baseband signal on bus 1236. These baseband signals are coupled via bus 1236 to the SCDMA demultiplexer 1238. The demultiplexer 1238 multiplies the results vectors times the transpose of the code matrix that the information vectors were multiplied by in the SCDMA multiplexer of the RU transmitter. This despreads the Fourier component power spectrum and results in signals output on bus 1240 in frame format in accordance with framing information received on bus 1244 from the CU transmitter. This framing information defines the CU frame times, but the RU data frames are arriving synchronously with this frame timing.

The signals on bus 1240 are corrupted by noise and impairments that degrade the upstream channel. In addition, the phase and amplitude errors, for each RU need to be removed. Accordingly, the detector 1246 includes a G2/rotational amplifier and a memory for storing gain and phase adjustment numbers, as well as a slicer. When preamble data is being received, the CPU so informs the detector by signals on bus 1241. This bus is also used to inform the detector which timeslot is being received so that the detection can retrieve the proper gain and phase connection factors. The corrupted phase and gain adjusted information signals can then be processed by a conventional decoder in detector 1246 to determine the actual constellation points that were sent. In the preferred embodiment, the decoder is a Viterbi decoder and FFE and DFE equalization is optionally used along with Trellis modulation at the RU transmitter to improve throughput, decrease error rate and improve signal to noise performance.

The information vectors resulting from the decoding process are then output on bus 1248 to a deframer circuit 1250 which functions to reassemble the original payload data streams, ATM cells, LAN packets or TCP/IP packets and management and control messages from the information vectors in each frame. The payload data is output on bus 1252 to the peripherals and interfaces to the phone network, internet etc. The management and control data are output on bus 1254 to the CPU 1194 for use in processing such as assigning channels and dynamic bandwidth management in species that implement these functions as opposed to fixed channel assignments.

An RU SCDMA receiver could be structured like the receiver of FIG. 55 in embodiments using SCDMA downstream transmission. However, instead of using the master clock and master carrier reference signals of the CU, recovered clock and recovered carrier signals would be used in the RU receiver. These recovered clock and carrier signals could be generated by the same circuitry in FIG. 8 that perform these functions.

Figure 56:
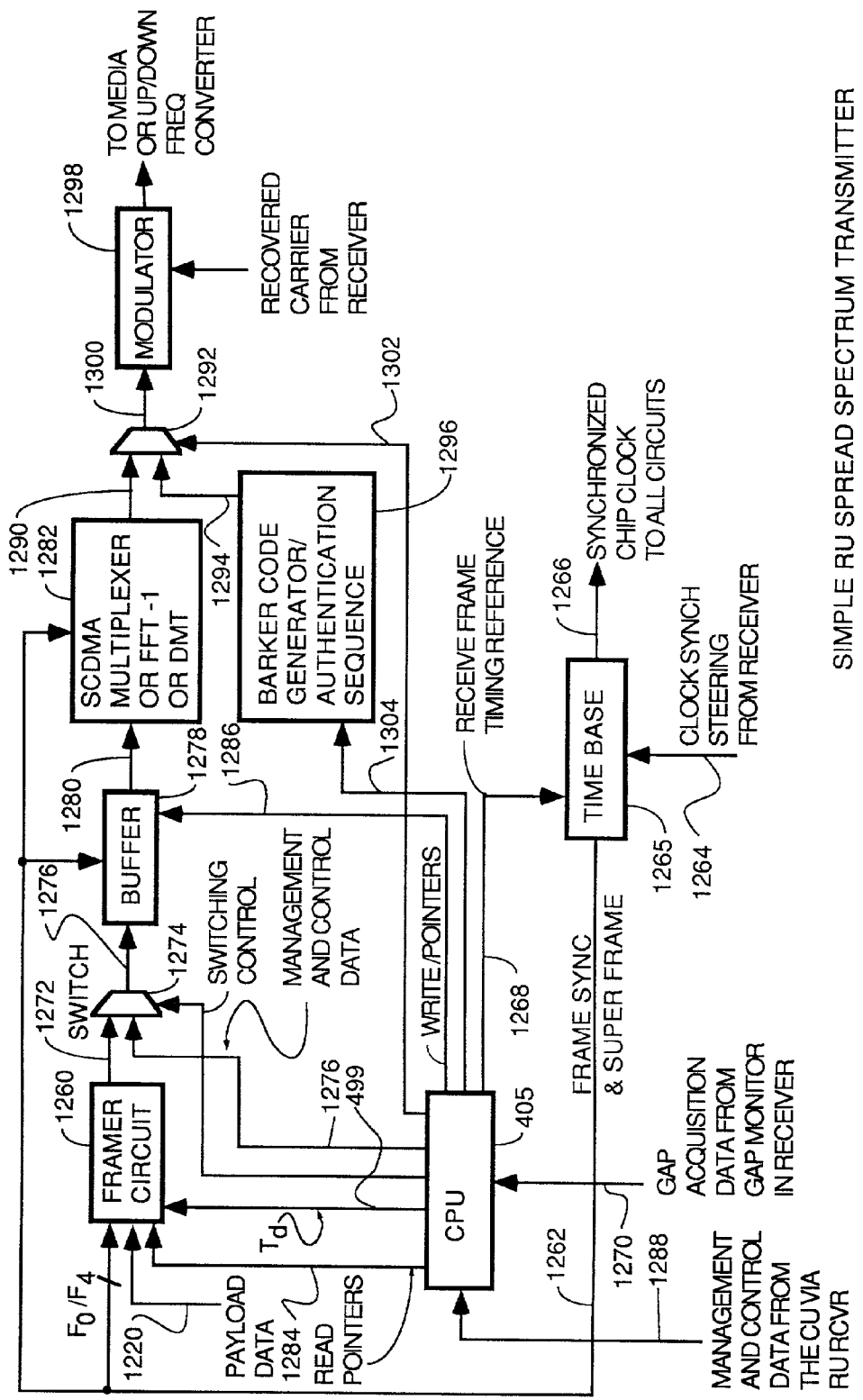
FIG. 56 is a block diagram of a simple RU SCDMA, $FFT^{-1}$ or DMT transmitter.

Referring to FIG. 56, there is shown a block diagram of a simple RU spread spectrum transmitter which could be used to implement block 1210 in FIG. 54. A framer circuit 1260 receives payload data on bus 1220 from the peripherals and organizes it into frames of the same size as the CU frames. The framer can have the structure of framer in FIG. 9 or some other structure that organizes the frames of information vectors differently. The framer receives frame timing information in the form of frame sync and super frame signals on bus 1262 from time base 1265. Time base 1265 has a tracking loop therein and receives a clock synchronization steering signal on bus 1264 from the RU receiver gap detector, and uses this signal to keep its local clock in VCXO synchronization with the master clock in the CU. A synchronized chip clock reference signal is distributed on bus 1266 to all circuits in the transmitter that need it. The time base 1265 also receives a receive frame timing reference on bus 1268 from the computer/control circuit 405. The control circuit 405 receives gap acquisition data on bus 1270 from the gap monitor circuit in the RU receiver and uses this gap acquisition data to determine when the CU frames arrive. This information is also used to generate the transmit frame timing delay $T_d$ on line 499.

The framer circuit 1260 outputs information vectors on bus 1272 to one input of a switch 1274. The other input bus 1276 of this switch is coupled to the computer 405 and carries management and control data generated by the computer. The switch 1274 has a single output bus 1276 which is coupled to the data bus input of a buffer memory 1278. The buffer memory serves to store the final information vectors which will be input on bus 1280 to the spectrum spreading multiplexer 1282. The multiplexer 1282 functions to spread the Fourier spectrum of the data on bus 1280 over a much larger bandwidth than the data originally had. In the preferred embodiment, the multiplexer 1282 is a direct sequence code division multiplexer like those described elsewhere herein which carries out matrix multiplication between the information vectors and a plurality of pseudorandom, orthogonal codes, which are preferably cyclic codes. At least one code is assigned to each RU that has payload data to send, and in the preferred embodiment, multiple codes may be assigned when more bandwidth is needed by an RU. The number of codes assigned to an RU can be dynamically varied by exchanges of messages between the RU and CU via management and control channels. The computer 405 receives code assignment messages from the CU as well as other management and control data which supports, for example, the ranging process, via bus 1288 from the RU receiver.

The computer 405 carries out the assignment of codes per instruction from the CU (or frequency components in FFT and DMT embodiments) by controlling read pointer addresses on bus 1284 coupled to framer circuit 1260 and write pointers on bus 1286 coupled to buffer 1278. The read pointers control the addresses in the framer circuit from which data is read for output on bus 1272. The write pointers control the addresses to which data on bus 1276 is written into buffer 1278. Since the contents of any particular address in buffer 1278 always get multiplied by the same code, by controlling these write pointers, the computer can implement the code assignments and put management and control data in the correct channels if specific channels are assigned for management and control data. The embodiment of FIG. 56 includes the capability to shuffle codes pseudorandomly (or frequency components in DMT embodiments) by pseudorandomly altering the write pointers to place data from specific channels into pseudorandomly assigned locations that will get multiplied by different codes.

The transmitter of FIG. 56 can also implement inverse FFT and DMT multiplexing by using an appropriately structured spectrum spreading circuit 1282. To implement inverse FFT embodiments, block 1282 represents a process to calculate the inverse Fast Fourier Transform using as the different frequency component magnitudes magnitudes represented by individual information vector elements on bus 1280. The inverse FFT embodiment uses the same information vector elements to define the magnitude of the same frequency components during each frame. A DMT or digital multitone system is like an inverse FFT system but alters (either pseudorandomly or sequentially) the frequency components assigned to each vector element from time to time. To implement a DMT embodiment, block 1282 performs the inverse Fast Fourier Transform, and computer 405 controls the read and write pointers to alter the frequency components assigned to each information vector element.

Whatever the spectrum spreading process carried out by block 1282, the resulting data is output on bus 1290 to one input of a switch 1292. The other input bus to this switch is coupled to receive Barker code data on bus 1294 from a Barker code generator/authentication sequence generator

1296. The switch functions to selectively couple the data on bus 1294 to the input of a modulator 1298 via bus 1300 when the CPU changes the state of the switch via control line 1302 at time delay $T_d$ after the CU gap is detected during ranging. Generally, the switch is controlled to send the Barker code data on bus 1294 to the modulator 1298 during the ranging process and to send payload data on bus 1290 to the modulator during normal operation after frame synchronization has been achieved. Computer 405 controls the Barker code generator 1296 via data on bus 1304.

The payload data extraction process is done synchronously in the CU and RU modem receivers. "Synchronously" as that word is used in the claims means the following forms of synchronization are practiced in the RU receiver, CU SCDMA receiver and the RU SCDMA transmitter. The RU transmitter uses the recovered master clock and master carrier reference signals recovered by the RU receiver to drive its digital circuitry and modulator in synchronism with the CU master clock and master carrier. Coherent detection is performed in the CU SCDMA receiver using the master carrier signal on line 1180 and a rotational amplifier or using a recovered carrier from either an in-band source like the pilot channel described elsewhere herein or some out-of-band source and driving the demodulator with the recovered carrier. In the preferred embodiment, the CU's SCDMA receiver uses its own master clock and master carrier without recovering either from the signals transmitted by the RU. These signals plus information derived from each RU's preamble data provides knowledge in the CU SCDMA receiver of the RU's SCDMA transmitter carrier phase and frequency. An RU SCDMA or other type of receiver recovers the master carrier reference from, for example, the pilot channel transmitted by the CU and recovers the master clock reference from the Barker codes sent by the CU during the gaps of every CU frame. Those recovered master clock and master carrier signals are used for synchronous demodulation in the CU and to synchronize the detector in the RU receiver and are also used by the RU SCDMA transmitter. Frame synchronization is also part of the synchronization implied by the term "synchronously" in the claims.

Figure 57:
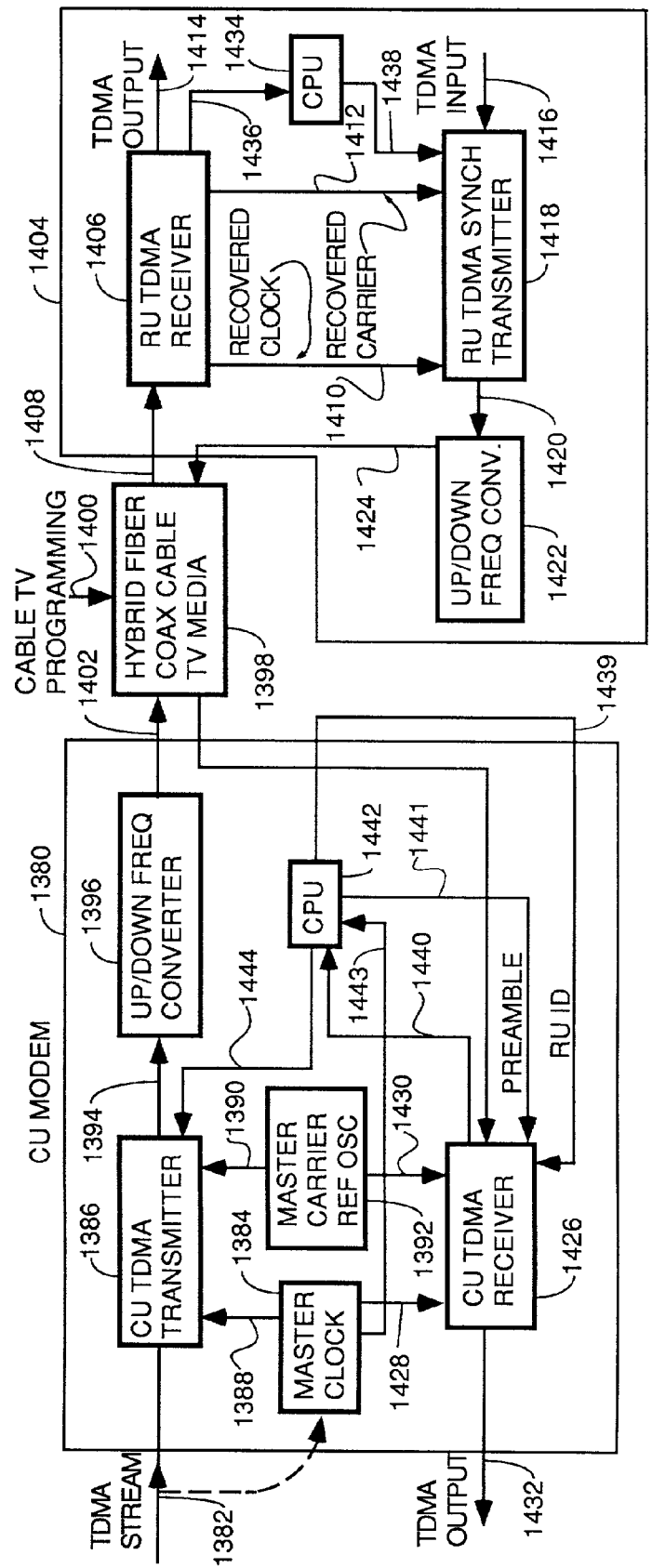
FIG. 57 is a block diagram of a simple bidirectional digital data communication system which uses TDMA or any other multiplexing scheme for downstream transmission and synchronous TDMA for upstream transmission.

Referring to FIG. 57 there is shown a block diagram of a synchronous TDMA system for bidirectionally communicating digital data over any transmission media including hybrid fiber coax using FDMA upstream and downstream channel separation so as to not interfere with other services such as cable television programming sharing the HFC. The CU modem 1380 receives a TDMA stream of data from higher level software layers, peripherals or other interfaces such as a T1/E1 line, and synchronizes its own master clock 1384 from signals on the TDMA bus 1382 that define the frames of timeslots thereon. The TDMA stream on bus 1382 is received by a CU TDMA transmitter 1386 which also receives a master clock signal on bus 1388 and a master carrier reference signal on bus 1390 from a master carrier reference oscillator 1392. The TDMA transmitter receives the frames of data and modulates the data from each timeslot of each frame onto one or more carrier signals supplied by the master carrier oscillator 1392 using any modulation scheme which can transmit the master clock and a carrier reference signal to the RU modem either in-band or out-of-band. Examples of such modulation schemes include QAM, QPSK etc. For example, one or more time slots may be devoted to sending data encoding the master clock signal and master carrier reference. Alternatively, one timeslot can be devoted to carrying the master carrier as a pilot channel signal, and the master clock may be sent embedded in Barker codes sent in gaps between frames. In alternative embodiments, the downstream data can be transmitted by a CU transmitter 1386 which uses any other multiplexing scheme other than TDMA.

The modulated RF signals are output on line 1394 to an up/down frequency converter 1396 which converts the frequency thereof to a downstream frequency which will not interfere with other services sharing the transmission media 1398 such as cable TV programming fed into the media from bus 1400. The frequency converted signals are output on line 1402. Frequency conversion is optional if the master carrier in the CU modem can generate a carrier at the desired downstream frequency and the upstream channel can be some frequency which can be synchronized to the downstream frequency such as a harmonic. An RU modem 1404 receives the downstream data on line 1408. A TDMA receiver 1406 coupled to line 1408 recovers the master clock and master carrier reference signals using any conventional circuitry or the circuitry and methods disclosed earlier herein in the STDMA embodiments. The TDMA receiver 1406 outputs the recovered clock signal on line 1410 and outputs the recovered carrier signal on line 1412. The recovered payload data is reassembled into a TDMA data stream and output on bus 1414 to peripherals or other interface processes.

Those peripherals or other interface processes also supply a TDMA input data stream on bus 1416 to an RU synchronous TDMA transmitter 1418. This transmitter receives the recovered clock and recovered carrier signals on lines 1410 and 1412, respectively, and synchronously organizes the TDMA input data on bus 1416 into timeslots in TDMA frames having the same duration as the CU frames. These frames are then modulated onto one or more carrier signals using the same (or different) modulation scheme used by the CU transmitter, and the frames of modulated RF signals are transmitted to the CU in frame synchronization with the CU. That is, the RU frames are transmitted from the RU transmitter with a transmit frame timing delay set for this particular RU's position in the system relative to the CU such that the frames transmitted by the RU arrived at the CU aligned with the CU frame boundaries. All RU modems in the system have their transmit frame timing delays set for their particular positions on the network so that all their frames arrive at the CU aligned with the CU frame boundaries. All RU's also send preamble data prior to sending payload data for use by the CU in determining the phase error for that particular RU. This preamble data is used in the manner described above for the SCDMA embodiments to find the phase error.

The modulated RF data output by RU TDMA transmitter 1418 is coupled on line 1420 to an up/down frequency converter 1422 that functions to change the frequency of the upstream channel to a frequency that is far enough removed from the downstream channel frequency and from the cable TV programming so as to not interfere therewith.

The upstream data is then transmitted via line 1424 and the transmission media to a CU TDMA receiver 1426. This receiver receives a master clock signal on line 1428 from the master clock oscillator 1384 and receives the master carrier signal on line 1430 from the CU's master carrier reference oscillator. The CU TDMA receiver 1426 also receives a PREAMBLE signal on line 1441 from the CU CPU 1442. This signal is activated when preamble data is being received. The CPU also supplies receiver 1426 with an RU ID signal on line 1439. This signal tells the receiver 1426 which RU's data is being received in the timeslot currently being received. The CPU keeps track of which RU's data is being received with the help of data received on line 1440 from receiver 1426. The receiver 1426 includes a frame detector which detects the Barker codes transmitted during the ranging process by the RU's. The TDMA receiver's frame detector can have the same structure as the frame detector previously described herein. The data on line 1440 tells the CPU when each RU has achieved frame synchronization. From that point, the CPU knows that the RU frames are coincident with the CU frame boundaries. Line 1440 also carries data received from the RU's requesting bandwidth. In response to these requests, the CPU would assign one or more timeslots to the requesting RU. These assignments would be conveyed to the RU's by management and control messages generated by the CPU 1442 and sent to the CU transmitter via bus 1444. The CPU keeps track of which timeslot is being received with the help of master clock data on line 1443. The CPU then looks up the RU assigned to each timeslot and sends that information to the TDMA receiver 1426 as the RU ID signal on line 1439.

The CU TDMA receiver 1426 recovers the payload data from the modulated upstream signals and reassembles the payload data into a TDMA output data stream on bus 1432.

The TDMA transmitters and receivers in this system can be conventional, but the RU TDMA transmitter must be able to delay transmission of its frames by a variable transmit frame timing delay so that its frames arrive in frame synchronization with the frame boundaries of the CU. Any ranging process described herein or any other known ranging process can be used to achieve this frame synchronization. If any of the trial and error class of ranging processes described herein is used, computer 1434 in the RU modem sets an initial transmit frame timing delay either at its own initiative or upon receipt of a ranging solicitation message from the CU via a management and control data path 1436 from the receiver 1406. This initial delay value is sent to the RU transmitter via bus 1438. The CU receiver assists in the ranging process by sending data regarding what signals from the RUs it found in the frame gaps if gaps are used or what RU ranging signals were detected over the frame interval via bus 1440 to CU computer 1442. The CU computer 1442 sends feedback ranging data to the RU via bus 1444 coupled to the CU transmitter 1386.

In the class of embodiments where the CU does the ranging process for the RU by determining how much the RU must move its ranging pulse to achieve frame synchronization and so instructing the RU, bus 1440 still carries data regarding what ranging pulses the CU receiver saw. However, computer 1442 then figures out how much delay the RU needs to add to or subtract from its transmit frame timing delay by calculating the total turnaround time and then sends a message via bus 1444 to the RU so instructing it. This message reaches RU computer 1434 via bus 1436, and the computer 1434 sets the instructed delay via bus 1438. Any other ranging process that can achieve frame synchronization other than the ones described herein will also suffice to practice this particular embodiment.

Active Bandwidth Management

All of the transmitter embodiments disclosed herein can utilize an active bandwidth management process carried out by bidirectional message traffic between the remote units and central unit over the management and control channels. Remote units can request more or less bandwidth on a first-come, first-served basis or the RU's can request reserved bandwidth, i.e., bandwidth that has been reserved to each RU but which can be loaned to other RU's until the RU for which the bandwidth is reserved need it. The central unit can evaluate RU privileges for bandwidth reservation, privileges, etc., and arbitrate conflicting requests for reserved bandwidth or more bandwidth and then award bandwidth in accordance with the results. The CU then sends downstream management and control messages telling each remote unit which codes have been assigned to carry its traffic during specified frames.

Upstream Time Alignment Algorithm

Section 1.1 Time Alignment Procedure

Time alignment is the procedure by which fine delay adjustments are made to provide exact frame synchronization of all RU's to exactly center the RU Barker codes in the gaps. (Coarse frame synchronization is accomplished by ranging). Every RU undergoes an initial upstream training process to achieve coarse frame synchronization, exact centering of its Barker code in time alignment, power alignment to solve the near-far problem, and equalization to predistort transmissions to minimize the effects of channel impairments. Time alignment fits into the overall upstream training procedure as follows:

For initial training:
1. Ranging by any of the processes previously described
2. Time alignment
3. Power alignment
4. Time alignment
5. Power alignment
6. Equalization
7. Repeat steps 4–6 N times For periodic training:
1. Time alignment
2. Power alignment
3. Equalization Section 1.2 presents the requirements for one embodiment of time alignment, with input requirements dictated by ranging and output requirements dictated by system performance. Section 1.3 gives a detailed description of the time alignment algorithm of one embodiment with Section 1.4 giving alternative enhanced embodiments to the algorithm of Section 1.3.

1.2 Time Alignment Requirements

The ranging procedure is capable of aligning the upstream Barker code transmission to within +/−1 chips of the center of the gap and aligning the power to within a number of dB which is acceptable for the system performance criteria. Time alignment must operate within these constraints for this embodiment.

The demultiplexer and equalizer circuits require fine time alignment to within +/−1 high-speed clock in this embodiment.

Initial time alignment must be accomplished within a number of seconds in this embodiment which is acceptable for the system performance criteria.

Periodic time alignment must be accomplished within a number of seconds in this embodiment which is acceptable for the system performance criteria.

Time alignment phase shifts must be compensated in this embodiment.

1.3 Algorithm Description

The time alignment algorithm has two main components: coarse time alignment and fine time alignment. Coarse alignment can begin with offsets of up to +/−8 chips and align to within +/−½ chip. Fine alignment begins with offsets of up to +/−1 chip and aligns to within +/−1 high-speed clock.

1.3.1 Coarse Alignment Algorithm

Figures 58, 59:
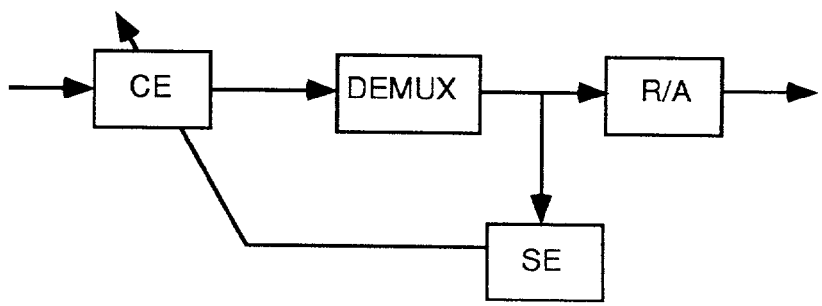
FIG. 58 shows a diagram of the ranging registers as a function of timing offset.
FIG. 59 is a simple block diagram of the hardware involved in the equalization structure of the RUs used in the equalization training process of the preferred embodiment.

Coarse alignment uses the two ASIC ranging registers (the modem transceivers described herein are typically implemented in ASICs), RGSRH and RGSRL. These registers contain information regarding the location of the Barker correlation peak. The registers are each 16 bits, with each bit representing a ½ chip spacing such that the alignment window is +/−8 chips. Referring to FIG. 58, there is shown a diagram of the ranging registers as a function of timing offset. FIG. 58 shows an example of how timing offset affects the values of the RG registers. Note that the 1B and 2A ASICs (two different versions of the ASIC) have a −½ chip offset difference.

Coarse alignment tries to align the RGSRH and RGSRL register to equal 0x0000 0x8000 or 0x0000 0xC000 for the 1B ASIC and 0x0001 0x0000 or 0x0001 0x8000 for the 2A ASIC. The coarse alignment algorithm is summarized in the pseudocode algorithm given below (the actual code in the appendices hereto varies somewhat in that it is structured differently and it must handle both versions of the ASIC).

Coarse Time Alignment Algorithm Pseudocode Fragment

```
RXRMR = 1;                              % Acquisition mode
iterations = 0;
while ((iterations)++ < TIMEOUT) {    % TIMEOUT = 10
    if (iterations > 4)
        fine_shift = 1;   % Gear shift to avoid oscillation
    else
        fine_shift = 2;
    read non-zero value of RGSRH and RGSRL; %try up to 8 times
    if (RGSRH == 0 && RGSRL == 0) return
        (TIME_ALIGN_ERROR);
    if (peak ½ chip to right of center)
        shift_value = fine_shift;
    else if (peak is > ½ chip to right of center)
        shift_value = 4;
    else if (peak is ½ chip to left of center)
        shift_value = -fine_shift;
    else if (peak is < -½ chip to left of center)
        shift_value = -4;
    else return (TIME_ALIGN_DONE)
    SendPowerCommand (shift_value); % Send to RU
}% end while loop
if (iterations == TIMEOUT) return(TIME_ALIGN_ERROR);
```

The time required for coarse time alignment is dominated by the number of iterations required to converge since each iteration involves the CU having to send a command to the RU via the command and control channels. With a worst-case timing offset of +/−2 chips, the coarse alignment will take at most 10 iterations to converge. With each command taking 64 frames, this amounts to 640 frames or 80 msec.

1.3.2 Fine Alignment Algorithm

The fine alignment algorithm uses the ClocK Recovery Error Register in FIG. 34 (CKRER) as the metric of timing offset. The CKRER value is derived from the difference of the samples ½ chip on either side of the Barker code correlation peak ("early-late") shown in FIG. 36. If timing is perfectly aligned, the samples at 1010 and 1012 in FIG. 36 will equal one another. If timing is off by up to 1 chip, the sign of this metric will indicate the direction of the offset. Since the Barker correlation process is performed prior to chip equalization, the CKRER values are prone not only to noise but also intersymbol interference. As a result of the noise susceptibility, the CKRER values are averaged to mitigate the effects of the noise in this embodiment.

The fine time alignment algorithm of the embodiment currently being discussed is given below as a pseudocode fragment. The algorithm consists of reading N CKRER samples and averaging them. This averaged value is used to determine if time alignment had been accomplished. If it is not, the sign of the averaged CKRER value in the CU frame detector of FIG. 34 (the CPU 405 in the CU modem reads the CKRER values repeatedly and averages them) is used by the CU to send a time alignment command to the RU. The process continues until time alignment has been completed or a time-out occurs.

Fine Time Alignment Pseudocode Fragment

```
RXRMR = 0;
N = 240;
while ((iterations) ++ < TIMEOUT) {     % TIMEOUT = 8
    Read CKRER N times and take abs value of
        ave =>abs_ave_ckrer;
    /* Check if below threshold or zero crossing */
    if (abs_ave_ckrer < threshold) ||
        (sign(abs_ave_ckrer) == sign(previous_abs_ave_ckrer))
        return (TIME_ALIGN_DONE);
    else {
        if (abs_ave_ckrer < 0)
            shift_value = -1;
        else
            shift_value = 1;
    }% if
} % while
```

The time required for fine time alignment is dominated by the time required to read the 240 CKRER values. Because of software constraints, 8 CKRER samples are read each 64 frames. So to read 240 CKRER samples each for 8 iterations requires 64*30*8=15360 frames or 1.92 seconds.

1.3.3 Time Alignment Phase Shift Compensation

Time shifts at the RUs result in phase shifts at the CU. These phase shifts will cause bursts of errors in periodic training and therefore must be compensated. Each high-speed clock (57.344 MHz) offset results in a 22.5 degrees phase offset of the IF-1 (3.584 MHz) carrier frequency. The RU transmitters transmit at IF-10 (35.84 MHz), so the IF-1 carrier is multiplied by a factor of 10. This means that the phase offset is also multiplied by a factor of 10 so that for each high-speed clock offset, the upstream signal is phase shifted by 225 degrees.

The precode equalization filters 563 in the RU transmitters can be used to compensate for these changes. By multiplying all four feed-forward coefficients by the negative of the phase shift caused by a timing offset, the phase shift is exactly offset, thereby enacting only the desired time shift of the fine tuning process.

1.4 Performance Enhancements and Optimization

1.4.1 Coarse Alignment Optimization

Worst-case, the coarse alignment algorithm takes 80 msec to achieve alignment. In order to reduce this time, the number of alignment iterations which are required to converge would have to be reduced. Reducing the number of iterations, makes the algorithm more vulnerable to noise. Given that course alignment procedure is effectively only accomplished during initial training, it is not sped up in the preferred embodiment.

1.4.2 Fine Alignment Optimization

Worst-case, the fine alignment algorithm takes 1.92 seconds to achieve precise alignment. This worst case will likely only be reached in initial training. In periodic training, the system usually performs only one or two iterations for fine alignment. If the CKRER register is read in two iterations (one to detect an offset and another to verify convergence), this gives a fine alignment time of 0.48 seconds. If there are 2000 RU's in the system, this equates to a minimum training period for each modem of 16 minutes ignoring all of the other aspects of training. This fine alignment execution time can be reduced in some embodiments where such a delay is not acceptable.

The simplest option for reducing this time which is implemented in some embodiments is performing less averaging of the CKRER register. In the embodiment implemented by the software appendices appended hereto, 240 CKRER samples are averaged. Preliminary laboratory results have shown that averaging over only 30 CKRER samples yields comparable results. In alternative embodiments where such a reduction is implemented, execution time is reduced by a factor of 8. This gives a worst-case number of 240 msec for initial alignment and a worst-case typical number of 60 msec for periodic alignment.

Another embodiment which applies only to 2A modems (and above) uses the demultiplexer memory instead of the CKRER register to sense fine timing alignment status. The demultiplexer memory stores the symbols from all 144 codes output from the demultiplexer. This memory can be used for time alignment by having the RU send only code 4 in BPSK mode. If the RU is perfectly aligned (and ignoring ISI), the CU will see energy only in code 4, with all of the other codes equal to zero. However, if there is a timing misalignment, this will result in the code "spilling" into adjacent codes. By analyzing the direction of spilling, the direction of the timing offset can be determined.

In order to make the timing measurements independent of phase (since the phase of the received code is not known), the absolute value of the received codes is taken. However, a blind absolute value will rectify the noise so that it cannot be averaged away. This problem is eliminated by using the soft decisions to take the absolute value. If the RU is aligned within +/−½ chip, the phase of code 4 will equal the phase of the received symbol. This phase can be used to rectify that transmitted symbol. Since the noise is uncorrelated to the sign of the symbol, it will be reversed in sign. Subsequent averaging of these absolute value symbols will result in an averaging of the noise, but will not average away the transmitted symbols (which is what would happen if averaging was performed before a blind absolute value).

Define $dmm(3)$, $dmm(4)$ and $dmm(5)$ as the complex symbols from the demultiplexer memory relating to codes 3, 4, and 5, respectively. Then the time alignment error is given by Equation 6, below, with the absolute value function being performed by multiplying the difference of the adjacent codes by the conjugate of code 4 and then taking the real part of the result.

$$\text{error}=\text{real}[(dmm(3)-dmm(5))((dmm)^*(4))]/(abs(dmm(4)))) \quad (6)$$

This error is averaged N times and used in exactly the same manner as the averaged CKRER is used in these alternative embodiments as described above in subsection 1.3.2.

In order for Equation 6 to be valid, $dmm(3)$, $dmm(4)$ and $dmm(5)$ must all correspond to the same symbol.

FIG. 59 shows the preferred structure for the equalizer structure in the RU receivers. Block SE symbolizes the symbol equalizer 1500 in FIG. 30 whereas block CE represents the chip equalizer circuit 764 there. Block Demultiplexer is the demultiplexer 766, and block R/A is the rotational amplifier in circuit 765 of FIG. 30. After equalization is achieved in the RU receiver, the coefficients are moved to the local chip equalizer in alternative embodiments represented by FIG. 59. After equalization is achieved in the symbol equalizer of the CU receiver, the SE coefficients are moved to the precode equalization filter at the RU transmitter.

Figure 53B:
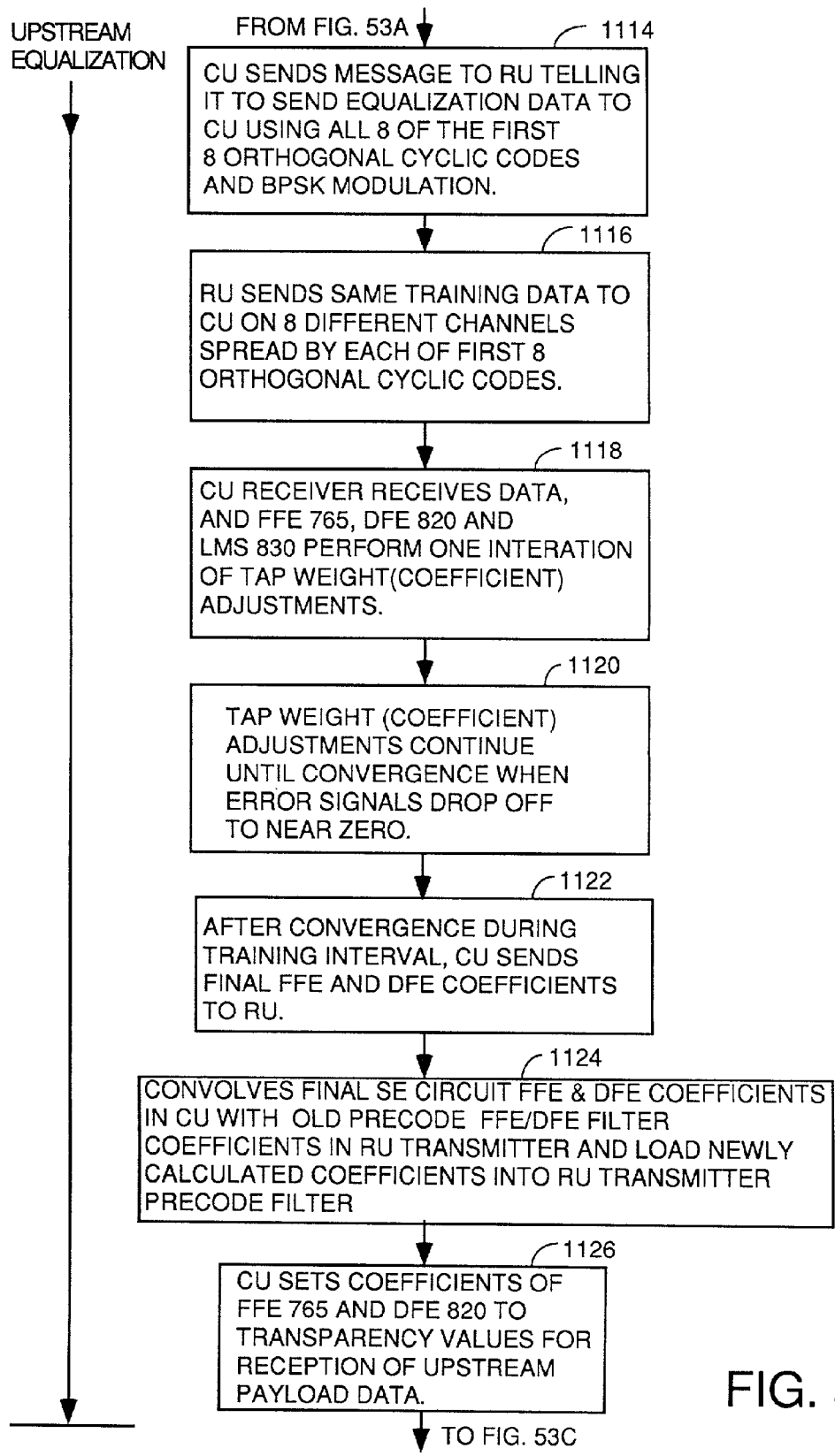
Figure 53C:
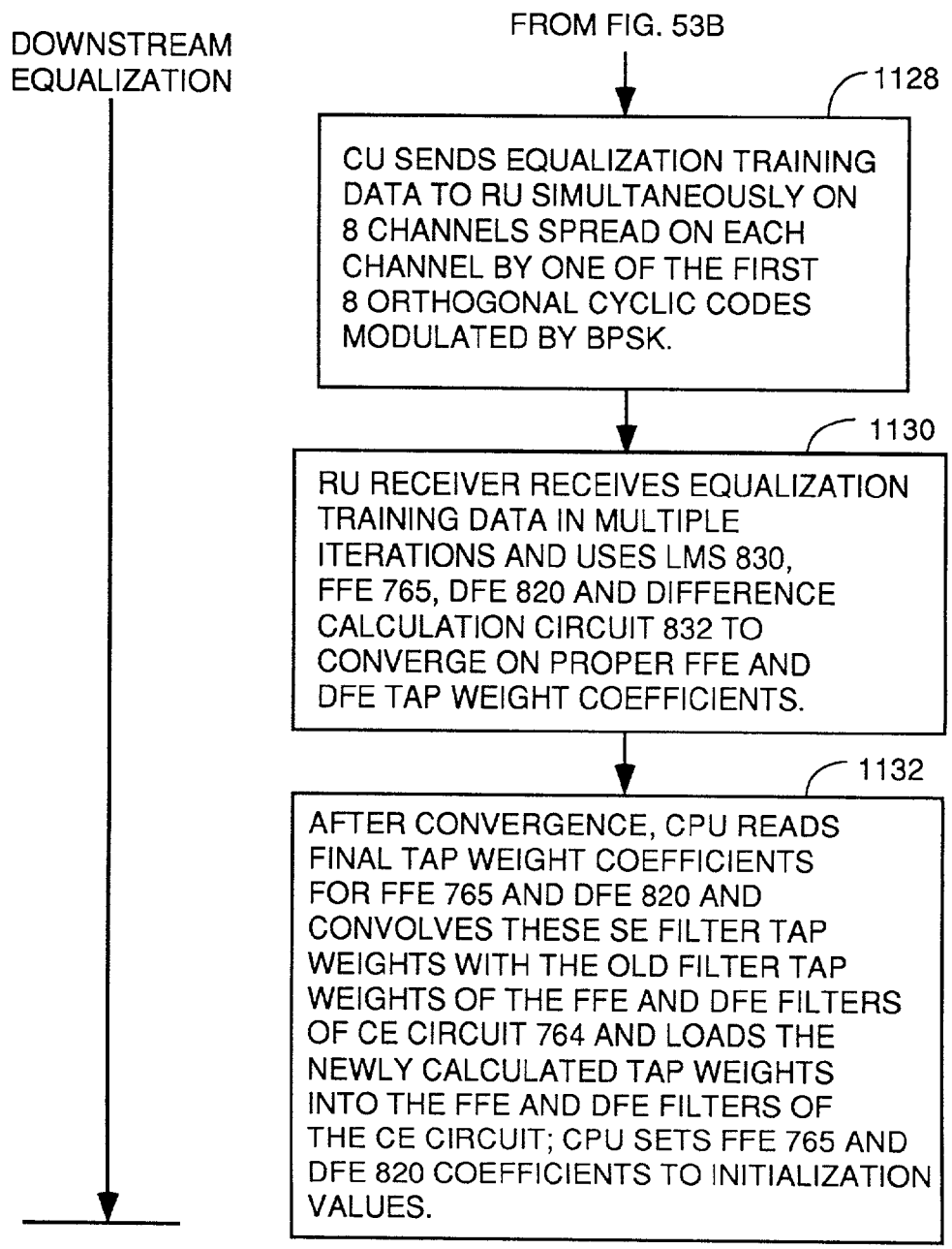
Figure 60:
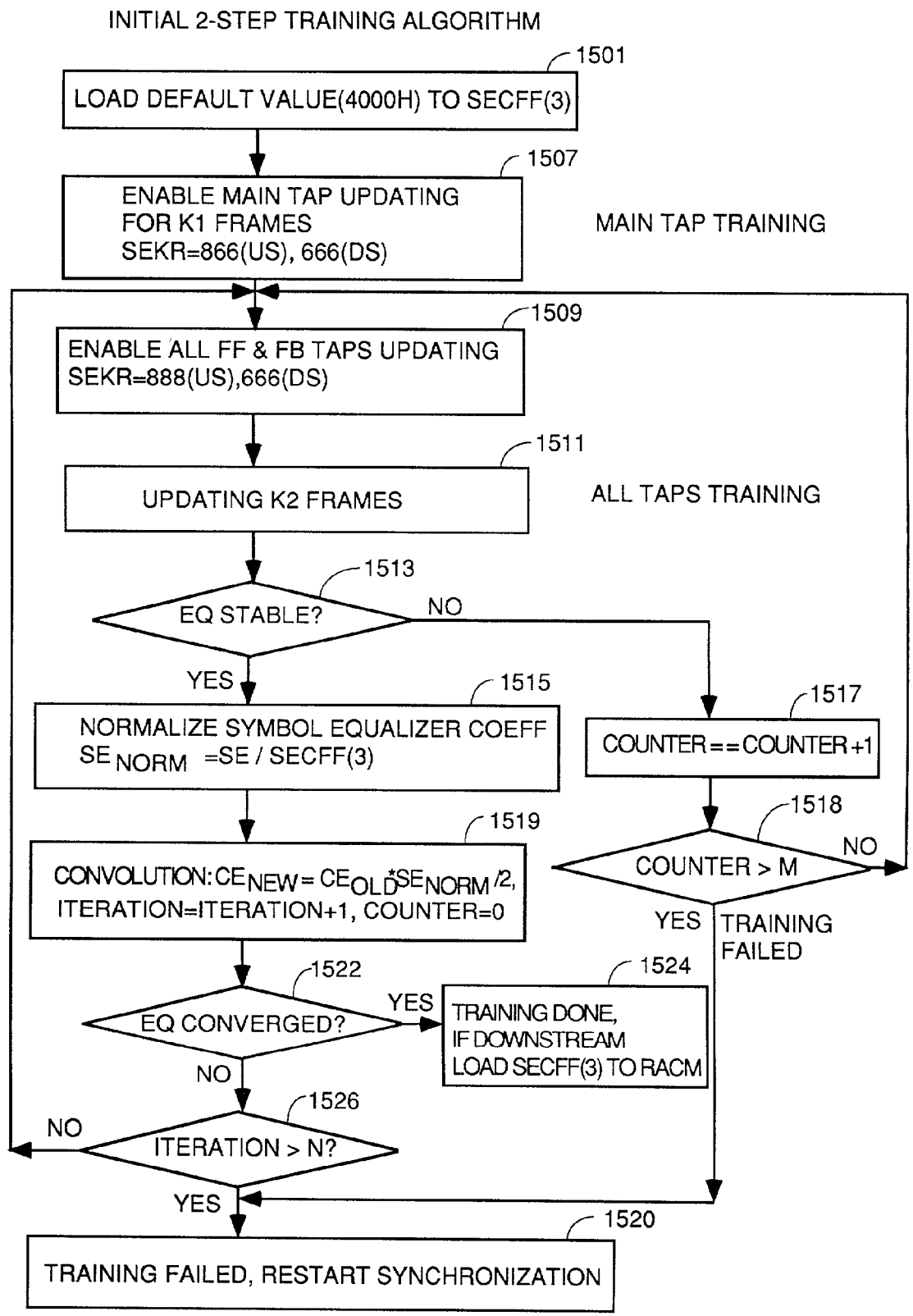
FIG. 60 is a flow chart of the preferred 2-step initial equalization training process.

FIG. 60 is a flow diagram of the preferred 2-step initial equalization training algorithm. The purpose of this equalization training algorithm, like the equalization training algorithms disclosed in FIGS. 53A through 53C is to perform equalization training so as to predistort transmissions to minimize the effect on the detection process of phase and amplitude errors induced by channel impairments. In step 1501, a default value is loaded into SECFF(3) which is a register in the symbol equalizer 1500 in FIG. 30 that stores the coefficient for the main (last) tap of the feed forward equalizer in block 765 of FIG. 30 (the same initial equalization training algorithm applies to both the CU and RU except what is done with the final coefficients differs). Step 1507 trains the main tap by enabling main tap updating for a predetermined number of frames (currently 100 frames in upstream and downstream) and sets the value of an SEKR register in the LMS 830 in FIG. 30 to a value of 866 for upstream equalizations and 666 for downstream equalization training. The SEKR register stores the adaptation coefficient. The rest of the process of FIG. 60 determines when equalization has been achieved by the method of examining the stability of the taps compared to their expected values. When equalization has been completed, it is expected that the main tap will be one and all the other taps will be zero. Step 1509 represents the process of starting to train all the taps by enabling all feedback and feed forward tap updating and setting the SEKR register to 888 for upstream equalizations and 666 for downstream equalizations.

Step 1511 represents updating these taps for K2 frames. K2 is which is currently set at 20 frames for downstream and 30 frames for upstream equalizations. Test 1513 determines when the equalization process has stabilized. Test 1513 is performed by performing the process of FIG. 61 to determine if the coefficients are close to the expected values for the tap coefficients of 0001. If the equalization has not stabilized, an iteration counter is incremented in step 1517, the count is checked against the constant M (currently a value of 3) in step 1518, and if M iterations have not been performed, processing returns to step 1506. If M iterations have been performed, and the equalization process has not converged, training has failed, and processing proceeds to step 1520 to restart the synchronization process.

If the equalization process has stabilized, step 1515 is performed to normalize the symbol equalizer coefficients by dividing them by the value of the main tap SECFF(3). Then step 1519 is performed to convolve the old chip equalizer coefficients and the normalized symbol equalizer coefficients divided by two to derive the new chip equalizer coefficients for downstream or the new precoder coefficients for the upstream. The main tap coefficient of the SE feed forward equalization filter is then set to one and the side tap coefficients of the SE feed forward and decision feedback equalization filters are set to zero for receipt of payload data. Then test 1522 is performed to determine if the equalization process has converged. The equalization convergence test process symbolized by step 1522 is shown in more detail in the flow chart of FIG. 64. If the convergence has occurred, step 1524 is performed to load the real and imaginary main tap values of SECFF(3) to the rotational amplifier correction routine given below in FIG. 63. Test 1526 returns processing to step 1506 if convergence has not occurred and passes through the loop are less than 8 for the downstream or less than 5 for the upstream.

Figure 62:
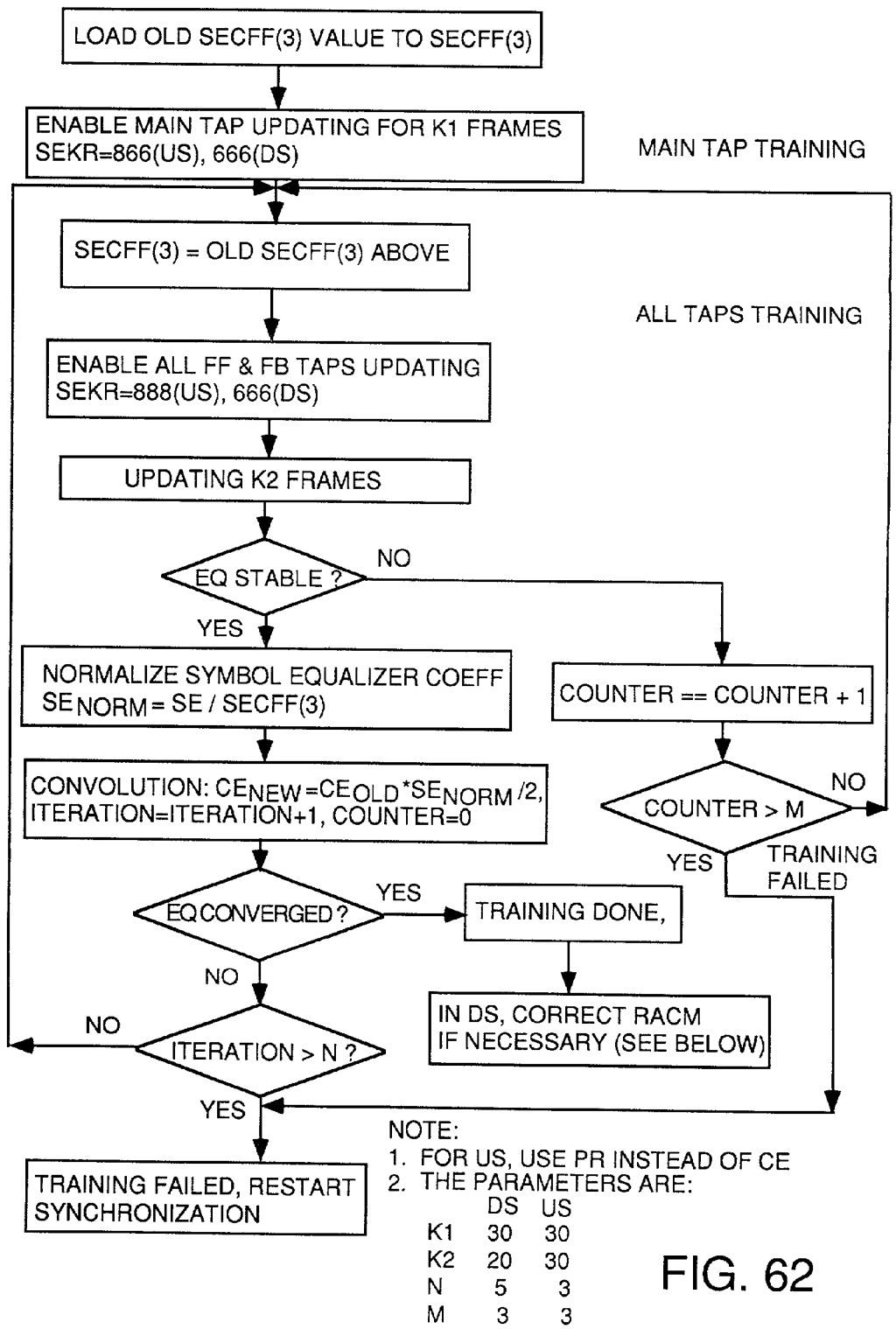
FIG. 62 is a flow diagram of the preferred periodic 2-step equalization training process.

The process of FIG. 62 is the preferred two-step equalization process which is periodically performed. It is quite similar to the initial equalization process, but fewer iterations are performed.

Figure 63:
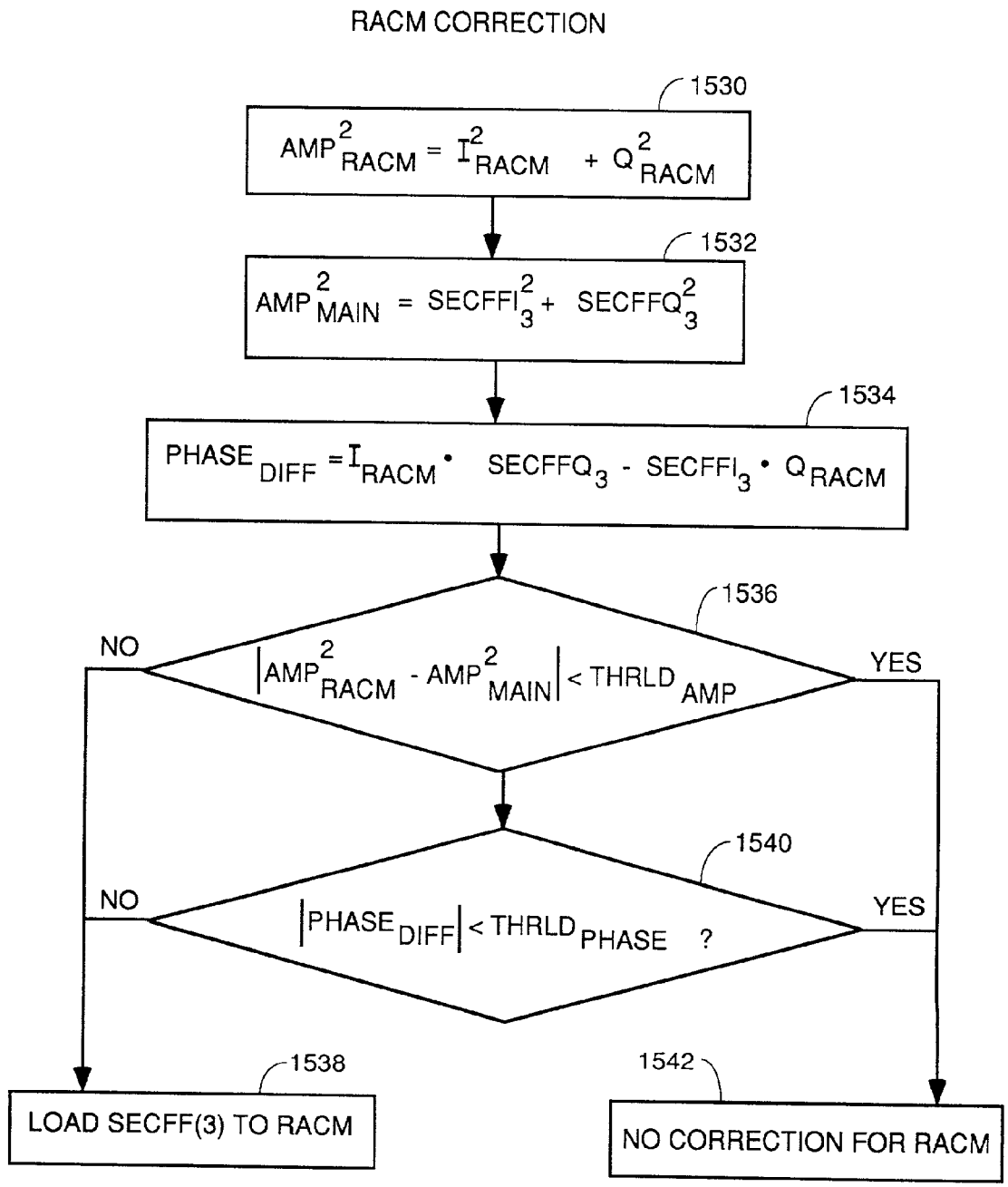
FIG. 63 is a flow diagram of the preferred rotational amplifier correction process to insure that the rotational amplifier has not falsely locked on a local minima.

Rotational amplifiers which work on QAM16 constellations can lock improperly on false minima in the error surface of the constellations and cause improper decisions to be made by the slicer. The purpose of the process symbolized by the flow chart of FIG. 63 is to check the rotational amplifier operation in the CU receiver to make sure it has not falsely locked on a local minima. This check is done by comparing the rotational amplifier's amplitude and phase correction factors against the symbol equalizer main tap correction factor. The rotational amplifier can be considered to be a one tap equalizer which runs all the time. The symbol equalization process is only performed periodically, but it is performed using a QPSK constellation of training data which does not have the false local minima of a QAM16 constellation. Thus, the main tap of the symbol equalizer never falsely locks on a local minima and will always be a correct correction factor to eliminate the effect of phase and amplitude impairments on the channel. The process of FIG. 63 checks for improper locking of the rotational amplifier during reception of each RU's data by comparing the difference between its amplitude and phase correction factors to the amplitude and phase correction factors of the main tap of the symbol equalizer. If the difference is too large, the rotational amplifier has falsely locked, and it must be corrected by setting its correction factors to the amplitude and phase correction factors of the main tap of the symbol equalizer. Step 1530 symbolizes the step of setting the square of the amplitude, $Amp_{racm}$, of the rotational amplifier correction factor $Amp_{racm}e^{j\theta}$ to the sum of the squares of the RU correction factor stored in memory 796 in FIG. 31 for the particular RU whose data is being received. Step 1532 then calculates the square of the amplitude correction factor for the main tap of the symbol equalizer by setting it equal to the sum of the squares of the real and imaginary parts of the SE main tap coefficient, i.e., $SECFFI_3$ and $SECFFQ_3$. Step 1534 then calculates the phase difference between the rotational amplifier and the symbol equalizer main tap by calculating: $Phase_{dif}=I_{racm}SECFFQ_3-SECFFI_3Q_{racm}$. Test 1536 then determines whether the absolute value of the difference between the rotational amplifier correction factor and the SE main tap amplifier correction factor is less than an amplitude threshold. If it is not less than this threshold, the rotational amplifier has falsely locked, and processing proceeds to step 1538 to correct the situation by loading the SE main tap correction factor into the memory for the rotational amplifier as the new correction factor for this RU. Test 1540 makes a similar comparison for the phase difference between the rotational amplifier and the symbol equalizer main tap. If the phase difference is too large, processing proceeds to step 1538 again. In other words if either the amplitude difference or the phase difference between the correction factors of the rotational amplifier and the main tap of the SE is too large, the rotational amplifier correction factor for that RU is set equal to the SE main tap value. If both tests are passed, step 1542 symbolizes the process of not making any correction to the rotational amplifier correction factor.

Figure 64:
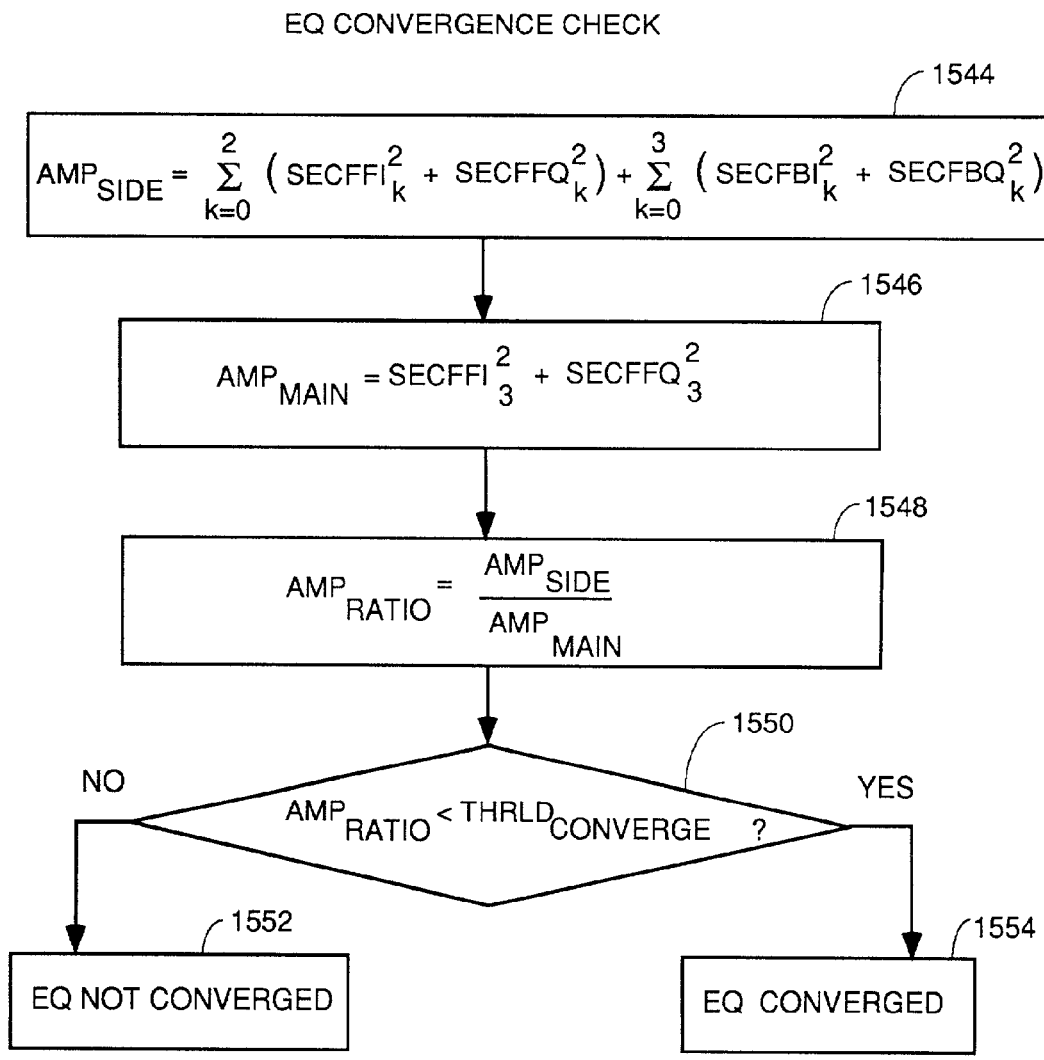
FIG. 64 is a flow diagram of the preferred equalization convergence check.

FIG. 64 is a flow chart symbolizing the process of step 1522 in FIG. 60 in determining whether the equalization training process has converged. Generally, if the equalization training process properly converged, the SE main tap (tap 3) correction factor will be one and the SE side taps (taps 0–2) will be zero. The process of FIG. 64 determines whether the ratio of the amplitude correction factor of the SE side taps to the amplitude correction factor of the SE main tap is smaller than a threshold. If it is, then the equalization training process has converged. If not, the equalization training process has not converged. Step 1544 calculates the amplitude of the side taps of the SE as the summation of the sum of the squares of the real and imaginary components of side taps 0 through 2 of the FFE filter in circuit 765 of FIG. 31 plus the sum of the squares of the real and imaginary parts of the side taps 0 through 3 of the feedback DFE filter 820 in FIG. 31. Step 1546 calculates the amplitude correction factor of the SE main tap as the sum of the squares of the real and imaginary parts of the SE main tap correction factor. Step 1548 calculates the ratio of the SE side tap to main tap amplitude correction factors, and step 1550 compares this ratio to the threshold of convergence which can be experimentally determined. If the ratio is not less than the threshold, the equalization process has not converged, as symbolized by step. If the ratio is less than the threshold, the equalization process has converged, as symbolized by step 1554.

Figure 61:
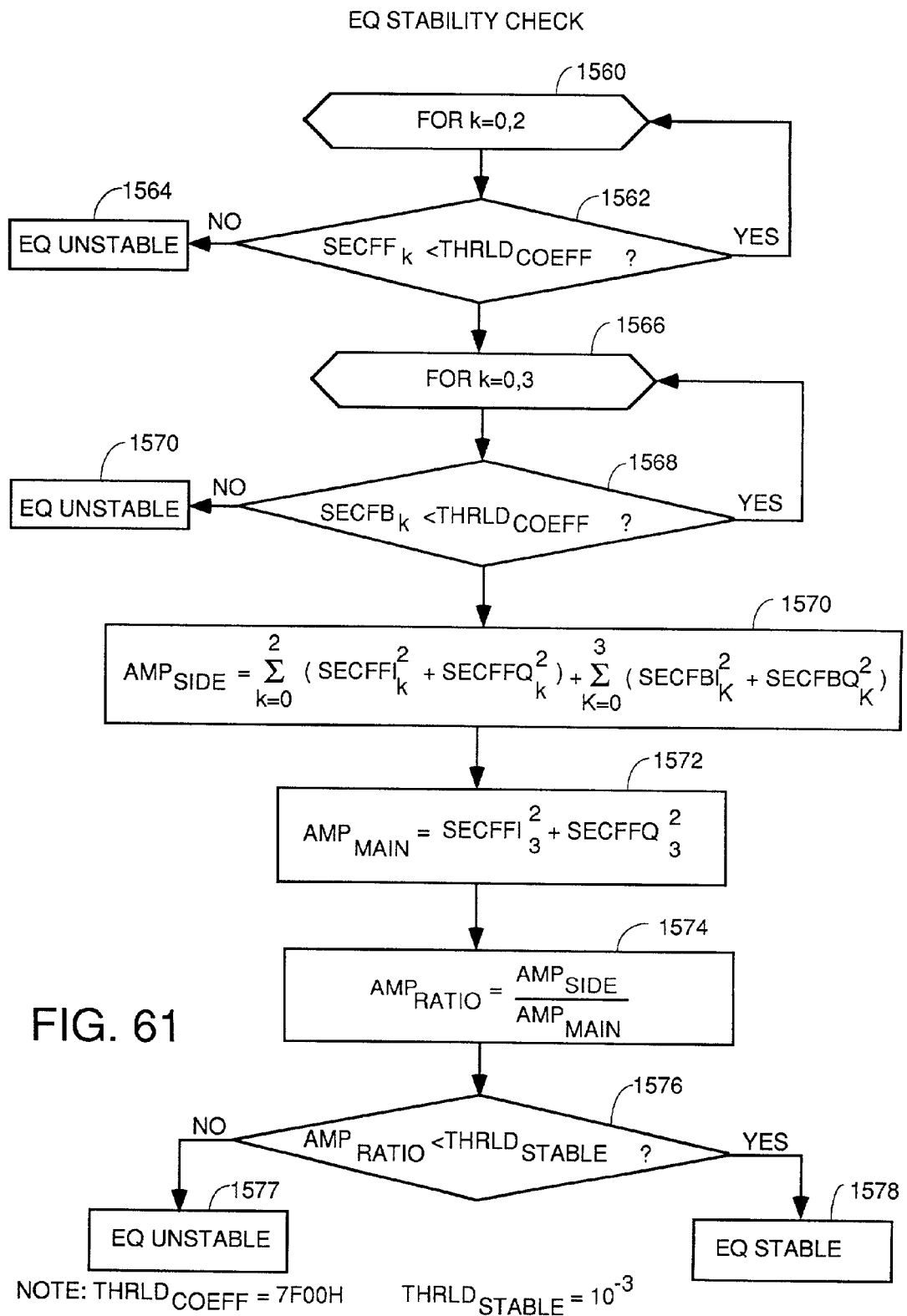
FIG. 61 is a flow chart of the preferred equalization training stability check process.

Referring to FIG. 61, the details of the process represented by step 1510 of FIG. 60 in determining whether the equalization process has stabilized are shown. When the equalization training has converged properly, the SE side taps will be zero or small and the SE main tap is expected to be near one. The basic test performed in FIG. 61 is to compare the ratio of the amplitude correction of the SE side taps to the amplitude correction of the SE main tap to make sure the ratio is below a predetermined threshold. If it is, then equalization has converged. Other subtests also exist. Steps 1560 and 1562 represents one subtest to determine if each of the SE's FFE side taps 0 through 2 are smaller than a predetermine threshold $Thrld_{coef}$. If any one of the feed forward side tap coefficients is not smaller than the threshold, processing proceeds to step 1564 (representing steps 1516 and 1518 in FIG. 60) to declare the equalization unstable and return to step 1506 in FIG. 60 to begin the all taps training again. Steps 1566, 1568 and 1570 represent a similar subtest for the side taps of the SE feedback side taps 0 through 3 ($SECFB_k$). If any one of these feedback filter side taps is larger than the threshold, the equalization training process will be declared unstable. Step 1570 calculates the composite amplitude of the side tap correction factors for both the feed forward (FFE filter in circuit 765 in FIG. 31) and feed back (DFE filter 820 in FIG. 31) SE filters as the summation for taps 0 through 2 of the squares of the real and imaginary components of each tap's coefficient for the FFE filter, plus the summation for taps 0 through 3 of the squares of the real and imaginary components of each tap's coefficient for the DFE filter. This sum is called $Amp_{side}$. Step 1572 calculates the amplitude of the SE filter FFE main tap coefficient as the sum of the squares of the real and imaginary parts thereof, and assigns this sum to variable $Amp_{main}$. Step 1574 calculates the ratio $Amp_{side}/Amp_{main}$, and step 1576 compares this ratio to a threshold of stability $Thrld_{stable}$. The ratio is expected to be small for a stabilized equalization process, so step 1578 (representing a vector to step 1512 in FIG. 60) is reached if the ratio is less than the threshold, meaning that the equalization process is equalized. Step 1580 (representing steps 1516 and 1518 in FIG. 60) is reached if the ratio is greater than the threshold, meaning that equalization process has not stabilized.

Power Alignment Procedures

The near-far problem in upstream transmission is solved partially by the ranging process which does a coarse power alignment. In the preferred embodiment, a fine tuning of the power level of each RU is also performed so that the power of each RU's transmission as received at the CU is approximately the same. The power level of each RU at the CU is detected by a gain detector which, in the preferred embodiment, if the main tap amplitude correction factor of the SE. The RU transmitter power of each RU is adjusted with the help of information from the CU gain detector. The CU expects specific received power levels from each RU (0 dBmv). The RU transmitter power ranges from 32 dBmv to 52 dBmv. The power alignment fine tuning process is accomplished as follows and as depicted in the flow chart of FIG. 65.

1) CU asks RU to transmit all training codes. These are the 8 training codes used for the equalization training process.
2) CU run the SE equalization process for N frames (N=80) (when the training codes are being sent, the CPU in the CU enables the SE in the CU receiver to iterate for 80 frames) with SEKR=0x0855H (SEKR is a register in the LMS 830 in FIG. 31 which stores the adaptation coefficient—in this case the adaptation coefficient is set equal to this constant in hex notation, as symbolized by step 1600—this adaptation coefficient is selected to insure rapid convergence during power alignment which is important in huge systems with many RUs although slower convergence can be selected in smaller systems).

SECFF(3) enabled and all other taps disabled (only the main tap of the FFE filter in the SE is enabled for fine tuning of the power alignment so as to act as the gain detector, and all side taps are disabled, as symbolized by step 1602).
3) Calculate delta1=(SECFF(3)^2−1FFFH)/k1, where k1=64 (this is the process of calculating the amplitude of the coefficient of the FFE filter main tap in the SE as the sum of the squares of the real and imaginary components I and Q; this amplitude has subtracted from it the expected value of the expected main tap value, 1FFF hex, when power alignment has been achieved; the difference is then divided by the constant 64, which in this embodiment is set equal to 64; the result is called delta1—all as symbolized by step 1604). The power alignment process of FIG. 65 differs from the power alignment process of steps 1108 through 1112 of FIG. 53A in that the process of FIG. 65 uses the main tap of the SE filter as the gain sensor in the CU after convergence by the SE whereas in the process of FIG. 53A, the gain control number for power alignment is derived by convergence of an adaptive gain control circuit comprising the slicer, slicer error signal, control loop 781 and the variable gain amplifier 788 in CU receiver. Further, there is no necessity in the power alignment process of FIG. 65 to set the RU gain level at one before transmitting the training data.
4) If abs(delta1)<TH, Power alignment is done (this is the process of comparing delta1 to a small threshold; if delta1 is below the threshold, power alignment is completed and processing vectors to step 1608; if not, a message is sent to the RU to lower its power in the next step—all as symbolized by step 1606).
5) If not, send to RU a power adjustment factor equal to delta2=delta1*2^(−ki). The factor delta2 is a power adjustment factor telling the RU a correction factor by which to adjust its power, with the correction factor larger for larger differences over the threshold than for smaller differences; the correction factor is equal to delta1 times a constant—this process is symbolized by step 1610 in FIG. 65).
6) RU updates TXLVLR=TXLVLR+delta2 (this is the process symbolized by step 1612 wherein the RU updates the value in register TXLVLR which controls the power level of the RU transmissions by adding the value of delta2 to the register contents).

Figure 65:
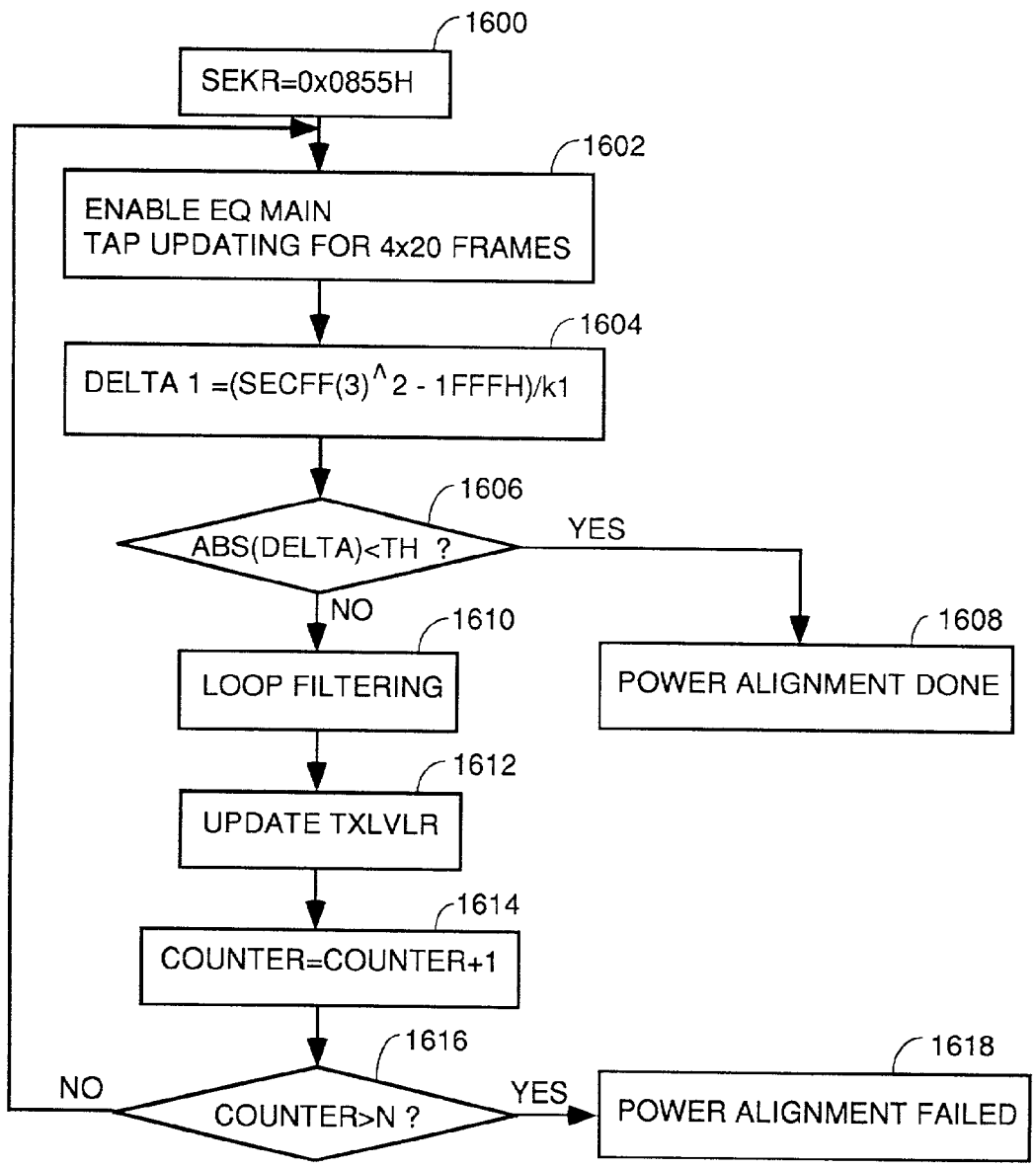
FIG. 65 is a flow diagram of the preferred power alignment process.

Steps 1612, 1614, 1616 and 1618 in FIG. 65 are the steps which determine if the number of desired iterations of the power alignment process have been achieved.

Boundless Ranging Preferred Embodiment

Previous Ranging Scheme

With the exception of the boundless ranging scheme wherein the CU calculates the total turnaround time for each RU and sends that data to the RU, the previously described ranging schemes do not deal with boundless distance ranging. Boundless ranging schemes are especially useful in large systems where there is an RU at the head-end in addition to many RU modems distributed throughout a system coupled by multiple fiber nodes, a situation depicted in FIG. 66. If the RUs beyond optical nodes 1620 and 1622 have more than one frame offset in TTA and are aligned to different gaps than the RU 1624 at the CU, the boundless ranging problem of possible confusion of which codes to use in the CU in decoding particular frames from the RUs exists.

In addition, the previously described ranging scheme requires a calibration procedure with the modem at the optical node in order to find the latency from the head-end to the optical node. The other ranging schemes described herein (with the exception of the alternative boundless ranging scheme mentioned briefly above, required that all RUs be close enough (16 kilometers) of the CU such that their TTA was less than one frame (125 microseconds). In these embodiments, it was assumed that there was an RU at the optical node and the CU receive window and gap was offset from the CU transmit gap by the amount of the TTA to the first optical node such that if the RU at the optical node sent back the CU barker code immediately without delay, it would arrive at the CU later by the TTA to the optical node. This required a calibration procedure to determine the TTA to the optical node so as to offset the CU receive window properly. This was inconvenient, but is unnecessary in the boundless ranging embodiment disclosed here.

In addition, the previously described ranging schemes uses a sequence of 8 pulses during all the ranging stages which adds a lot of interference to the data portion, and requires a longer time. In other words, the old ranging scheme had the RUs continuously sending their ranging IDs which had 8 barker codes. If these 8 barker codes were misaligned, they landed on payload data and could cause errors. The boundless ranging scheme described here uses only one barker code transmission at a time until confirmation is received from the CU that it landed in the gap.

The preferred boundless ranging process has all RUs adjusting their delays to hit the gap after the frame number from receipt of the Barker code from the CU which the farthest away RU can hit (currently the 13th frame for a system which spans 100 miles). Each RU hits the same gap using an offset number plus a transmit frame timing delay value $T_d$. The offset number is the total turnaround time (TTA) from the CU to that RU and back in frames. Any fraction of the TTA that is less than a complete frame is the value of $T_d$. Note that it is only necessary for all the RUs to align to the same gap and keep track of CU frame numbers where the codes are being time shared. In embodiments where the codes are not time shared such as where each RU always transmits on the same code or codes, it is only required that the frame boundaries be aligned, and this is only necessary in order to minimize ISI. If other methods of limiting, eliminating or compensating for ISI are available, even this frame synchronization can be eliminated and regular CDMA used in the upstream channel.

Figure 66:
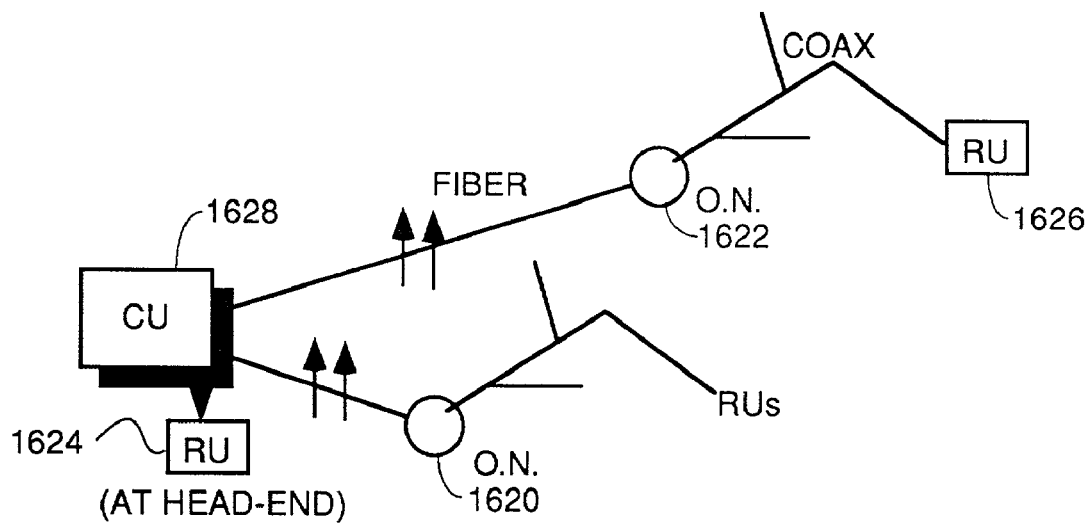
FIG. 66 is a network diagram showing a typical installation of a distributed system wherein the teachings of the invention are useful.
Figure 67:
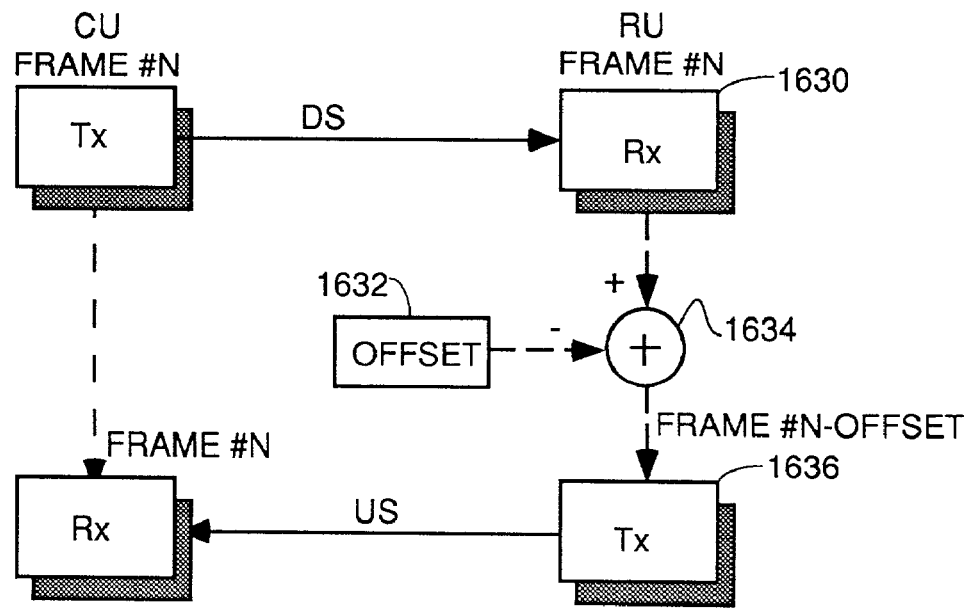
FIG. 67 is a diagram showing how the offset register affect the frame number count in the transmitter of RUs in boundless ranging systems.

This can best be understood by joint reference to FIGS. 66 and 67. FIG. 67 shows how the offset number is used to achieve frame synchronization. Suppose RU 1626 is 100 miles away from CU, and that, assuming that RU 1626 sends its ranging signal immediately upon receiving the Barker code from the CU, that ranging signal does not arrive until the gap following the 13th frame from the gap in which the CU originally transmitted its Barker code. For boundless ranging RU 1624 has to hit the same gap and puts its data in the assigned frame.

Proper accounting for assigned frames is the reason for boundless ranging. Since there are only 128 channels, but there may be 2000 RUs, the CU controls the situation as follows. RUs having data to transmit, send management and control messages to the CU saying they need bandwidth. The CU assigns one or more codes to the RUs according to whatever bandwidth allocation scheme is in use.

***Dynamic bandwidth allocation allows as many 64 kbps streams or channels as necessary to be allocated to a particular service so that high demand applications such as video teleconferencing or high speed internet access can be supported simultaneously with low demand applications like telephony over the same HFC link. Bandwidth allocation is managed at the CU through an activity status table in each RU and the CU that indicates the status of each timeslot and code assignments. The CU updates the RU tables by downstream messages. Bandwidth can be guaranteed upon request while other services with more bursty traffic may contend for the remainder of the total 10 Mbps payload.

The bandwidth assignments are sent downstream as code numbers to use during specific frame numbers. Referring to FIG. 67, each RU receiver section 1630 includes a frame counter in the frame detector that increments each time a Barker code is received from the CU. That information plus the kiloframe markers in the pilot channel data, tell the RUs which CU frame they just received.

Suppose RU 1624 in FIG. 66 was assigned code 1 for use during frame 1000, and RU 1626 was assigned code 2 for use during frame 1000. For frame synchronization to exist, RU 1626 must transmit its frame 1000 using code 2 at a time 13 frames earlier than RU 1624 transmits its frame 1000 using code 1. This is accomplished by using an offset number. Basically, the offset register 1632 in FIG. 67 is set to −13 in RU 1624 and is set to 0 in RU 1626. The value in the offset register is subtracted by subtractor 1634 from the CU frame count determined by the receiver 1630. The result is the frame count that the RU transmitter section 1636 uses to control when it transmits its frame 1000. Thus, the transmitter 1636 of RU 1626 100 miles away from the CU reaches frame count 1000 13 frames earlier than the transmitter 1636 of RU 1624 which is at the CU. Therefore, the RU 1626 transmits its frame 1000 using code 2 13 frames earlier than RU 1624 transmits its frame 1000. As a result, frame 1000 from each of the RUs 1626 and 1624 reach the CU at the same time (CU frame count 1000) and are properly demultiplexed using the codes assigned to these RUs for frame 1000.

There follows a detailed discussion of a ranging process which supports boundless ranging.

The Preferred Ranging Algorithm for Boundless Ranging

The ranging algorithm is the procedure by which an RU aligns its coarse transmission frame timing so that its frame start (i.e. the beginning of the frame gap) will be received by the CU exactly when the CU begins a new frame. This will cause all the RU transmitted frames to be received in the CU aligned to each other and to the CU.

The ranging process is performed after the RU is powered on and finishes its downstream initialization (clock and carrier recovery) functions and its received frames are aligned to its clock. This sequence of events allows the RU to be able to receive the data sent in the downstream by the CU.

Ranging is the first step of the upstream initial training process which includes the following steps:
  1. Ranging.
  2. Time alignment.
  3. Power alignment.
  4. Time alignment.
  5. Power alignment.
  6. Equalization.
  7. Repeat steps 4 through 7 N times.

The ranging process should:
1. Align the RU's frames to within +/−1 chip of the exact timing required to achieve frame synchronization
2. Align the RU's power level to achieve detectable power levels but not exceed the power level that increases the bit error rate of the operating RUs.

Figure 68:
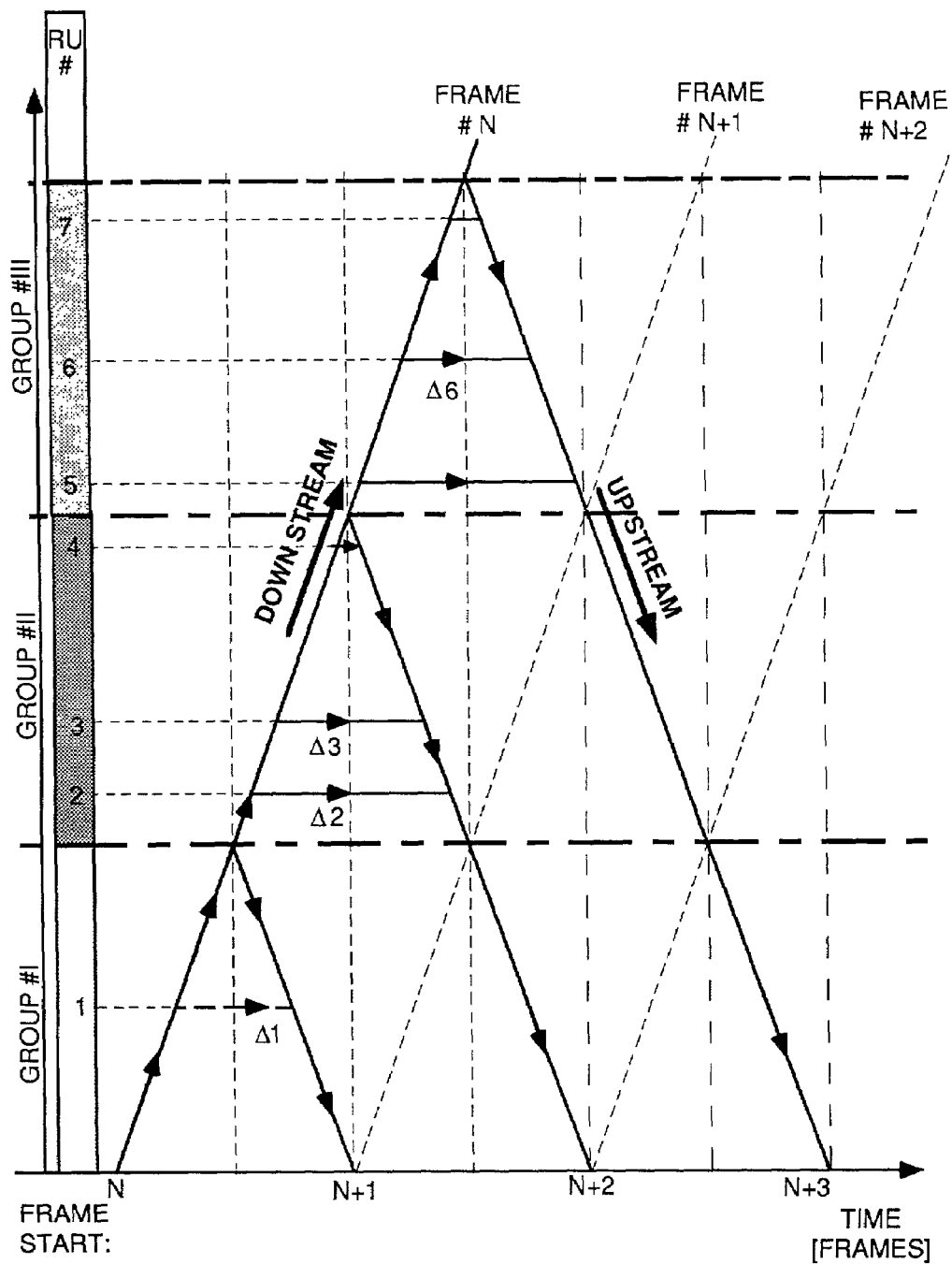
FIG. 68 is a ranging timing diagram for an alternative form of ranging.
Figure 69:
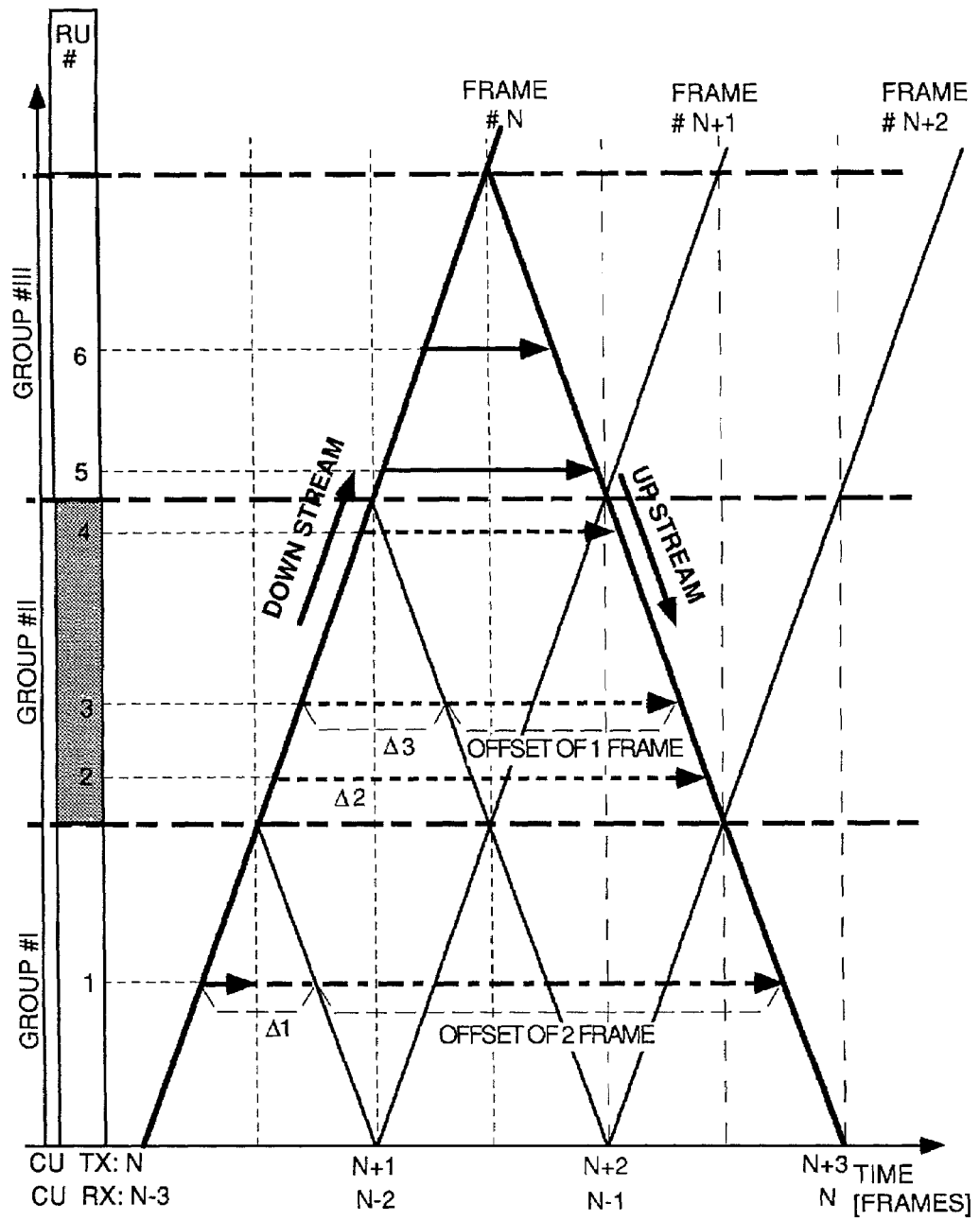
FIG. 69 is a ranging timing diagram for a distributed system having a maximum TTA of 3 frames.

The objective of the ranging process are as follows.
1. To find the delay between the instant that the RU under consideration receives the frame start from the CU (in the downstream channel) until it has to begin transmitting the frame start in the upstream so that it will be received by the CU aligned with the CU frame start. FIG. 68 represents the frame start propagation delays along the downstream channels and the required delays Δ1, Δ2 for each RU to hit a gap assigned to the group of RUs to which that RU is assigned.
2. To find the power level with which the RU has to transmit its ranging signals, so that the CU receiver will be able to detect it, but at the same time will not introduce additional noise in the running RUs data channels (in the upstream). That is, it has to find the minimum power level that the RU should transmit the ranging signals, so that the CU receiver will detect them with high enough detection probability without unduly interfering with data being transmitted by other RUs should the RU ranging signals arrive at the CU mistimed and in the middle of another RU's payload data.
3. To find the frames offset that the RU under consideration has to have in its frame counter in order to be able to align its transmitted frames indices to the received frames in the CU. This offset is required to synchronize all the RUs in the frame level for control purposes (such as time-slot allocation, retraining initialization, etc.) and is needed because of the channel total-turn-around time (TTA) due to the required maximum distance between the CU and the farthest RU (100 miles). This element of the ranging is also known as the "boundless distance ranging". FIG. 69 shows a channel with TTA of 3 frames.

Figure 70:
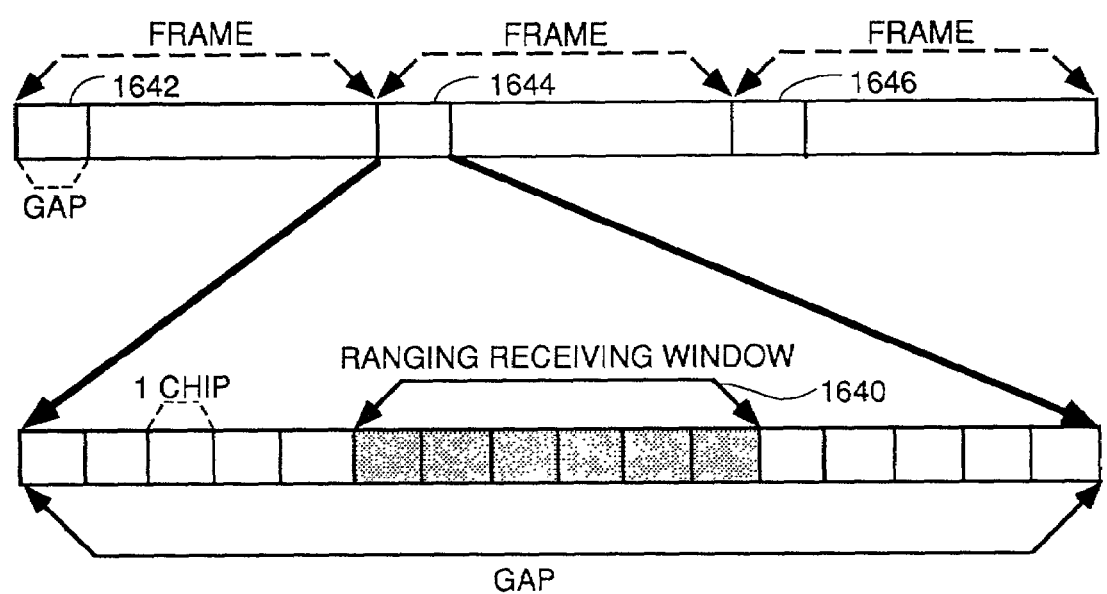
FIG. 70 illustrates a 6 chip wide ranging listening window in a gap.

The main idea in the ranging process is that the RU performs an efficient search of the [delay, power] plane in order to find the appropriate delay and power that will satisfy objectives 1 and 2 above. The RU has to transmit the ranging signal so that it will be received by the CU's receiver at a window located at the center of its gap as shown in FIG. 70. The window in the center of the gap during which ranging signals are received in this embodiment is shown at 1640 and is 6 chips wide. The gap, of which gaps 1642, 1644 and 1646 are examples, is located at the beginning of every frame, and serves as a listening window for the CU receiver. The CU serves as a sensor for RU ranging signals that provides feedback signals when detecting activity in the gap. In order that the CU's receiver will receive the ranging signal of some RU, the signal must be received within the CU gap (and more specifically, in the ranging listening window 1640) and with high enough power.

The ranging algorithm described here allows many RUs to perform their ranging at the same time and still achieve the separate frame synchronization of each of the RUs. Each RU sends a ranging signal that is a series of 17 pulses (one pulse per frame–gap). These 17 pulses include a starting pulse and 16 ranging ID pulses out of which 8 are "0" and 8 are "1". A "1" signal is represented by the presence of a Barker coded pulse with length of 13 chips. A "0" is represented by the absence of transmission of the Barker code. The ranging ID is randomly picked by each RU. It takes 17 frames for an RU to send its ranging signal. Because the maximum distance between the CU and the farthest RU is 100 miles, the TTA time is 16 frames. This means that the possible received ranging ID will be located within 32 (–17+16–1) frames in the CU.

The CU receiver looks for Barker signals in the six middle chips (i.e. the ranging listening window 1640) of the gaps of 32 successive frames whose positions (indices) were pre-defined by the CU in the ranging solicitation message it transmitted. The CU translates these 32, 6-chips-long vectors, into 6 32-digit vectors V1, V2 . . . V6 where V1 denotes all the received values (0/1) of chips number 1 in the successive frame listening windows 1640, and V2 contains the same for chip number 2 in the ranging listening windows, and so on. In the boundless ranging embodiment described below, the listening window in the middle of each gap is 8 chips wide, so vectors V1 through V8 are built by the CU CPU in the same fashion as described above.

Figure 71:
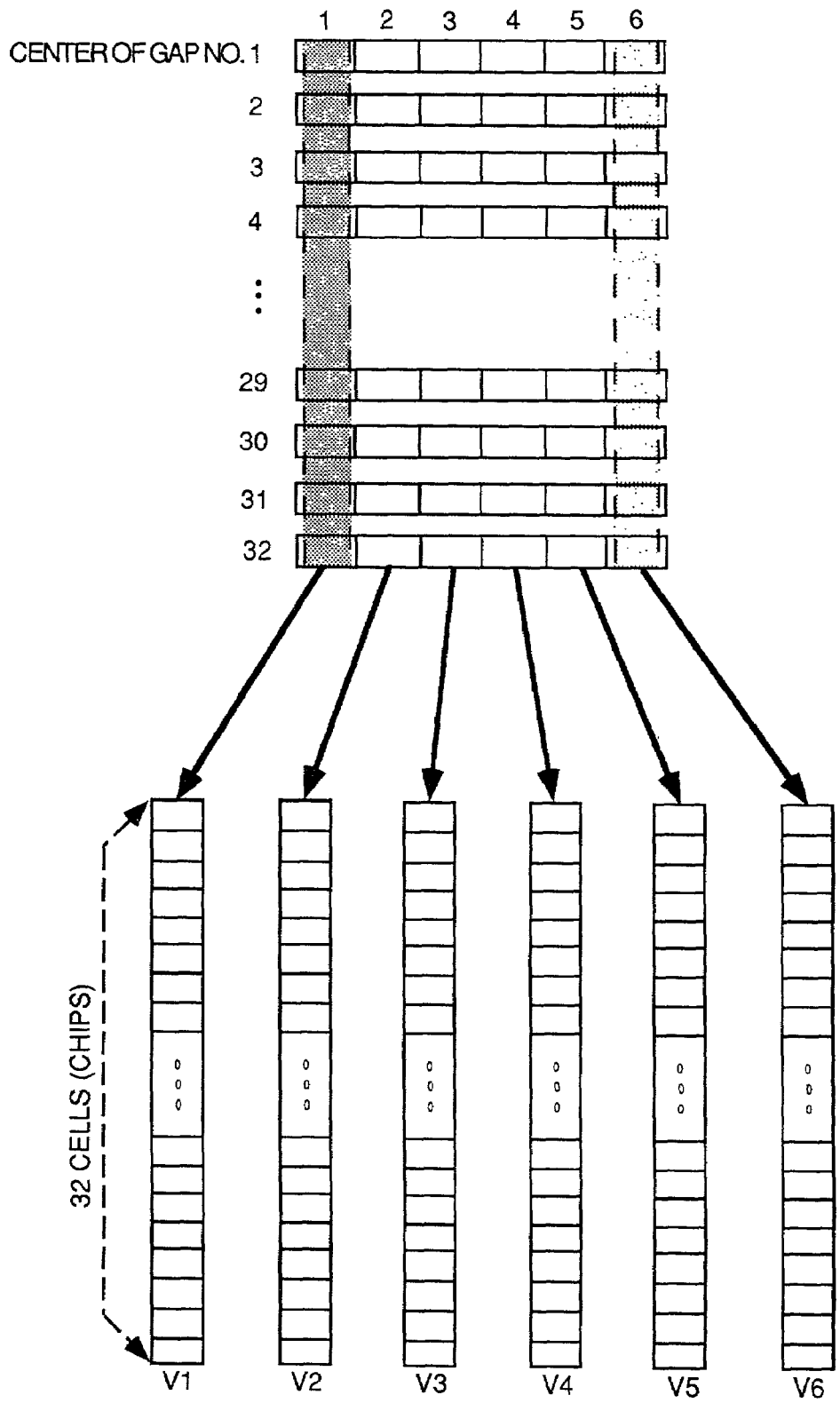
FIG. 71 illustrates how 6 contention vectors V1 through V6 are generated from the 6 chips of the listening window of 32 consecutive frames to find contentions or valid IDs.

FIG. 71 is a pictorial description of the 6 chip listening window translation or mapping of the contents to the 6 chips of the listening window of 32 consecutive frames into the vectors V1 through V6. In each of these six vectors, the CU looks for the structure of a ranging signal (17 pulses with 1 start bit and in the next 16 cell positions, the CU looks for the structure of a ranging ID—8 ones and 8 zeros. When the CU identifies this structure in some Vk vector it defines it as a "valid ID".

In general, the CU receiver can have the following possible cases for each vector:

1. The CU does not detect any signal in these vectors—in this case it sends an "empty" message in the downstream.

2. The CU detects only valid ID (up to six)—in this case it will send the "valid ID" message in the downstream with the detected IDs list.

3. The CU detects signals that do not have the structure of a valid ID—in this case the CU treats the received signal as being the result of contention of at least two RUs and sends a "collision" message.

Since the CU examines six vectors, it can also have the mixed cases: "valid+empty", or "valid+collision".

The scan of the delay-power plane is performed so that the RU scans all the relevant delays for a given power, and if this does not get the CU's response, the RU increases its power by a given step ($\Delta P$), and re-scans all the delays. Assume A is the initial scanning point (minimum delay and minimum power). From A, the scan goes with constant power and increasing delays until the maximum delay is checked. If this is not sufficient, the power is increased and the delay is scanned from minimum to maximum values. Once the RU Barker code transmission has the correct delay and power level values to be received by the CU receiver in the gap, the CU will send an appropriate message that will stop the scan. If the message is "valid ID" with the RU's ranging ID, the RU completes its ranging while performing a last update of its delay according to the CU's adjustment data that is sent to the RU.

If the CU gets a non-valid ID with at least three "ones", it responds with a "collision" message that puts all the RUs that are ranging in this instant into a contention resolution mode. The contention resolution is performed in the ranging algorithm via a binary tree algorithm to "flip the coin" as previously described.

Summary of Steps of Preferred Boundless Ranging Process (1) CU solicits for ranging and scans a number of following frames equal to or greater than the TTA in frames to the farthest RU.

(2) RU transmits Barkers continuously with 4 chip delay increase. After each iteration through all possible delays, the power increases by k dB (k is a constant which can be determined experimentally).

(3) CU sends "ACTIVITY DETECTED IN FRAME#".

(4) RU does not know which value of $T_d$ resulted in hitting the gap or even if it was the RU that hit the gap. There is a 16 frame ambiguity or 16 different possible delay values that could have caused the gap to be hit for the farthest RU in a system with a 16 frame TTA span. As a result, it assumes it was the RU that hit the gap and goes back to the delay value it used for the frame number 1.6 frames ago (for a system with a TTA span of 16 frames) and starts negotiation with the CU by sending one Barker code at a time and waiting for a reply. That is, a value for $T_d$ will be picked starting with the $T_d$ used 16 frames ago and a Barker code will be sent. The RU will then wait 16 frames for a reply message from the CU regarding whether activity was detected in the gap. If no such message is received, the next value for $T_d$ will be selected, and another Barker code will be sent with the RU again waiting 16 frames for a reply.

This is one Barker code at a time scheme is faster than some of the alternative ranging schemes previously described wherein the RU sends its entire ranging ID each time it picked a new delay value since in those alternative schemes a number of frames equal to the number of bits in the ID was consumed for each value of $T_d$ before the RU knew whether that was the correct $T_d$ value.

(5) CU sends "ACTIVITY DETECTED IN FRAME#, START CONTENTION RESOLUTION".

(6) all RUs that are ranging, transmit an ID sequence comprised of a start bit (always a logic 1) and 8 random Barkers out of 16 in the 16 consecutive frames following the start bit (in some embodiments, the ID code for each RU can be fixed and will be comprised of a start bit and an even number of consecutive bits exactly half of which are "1s"—in some embodiments, the ID code may have some other known number of 1's which are more or less than half with contentions being detected by detection in one vector of a number of 1s in excess of a predetermined threshold).

(7) CU looks for valid ID (exactly 8 of the 16 gaps following the start bit contain barker codes), and, if a valid ID is found, broadcasts a message containing the VALID ID (the actual ID found), the FRAME# (frame # of the frame in which the start bit arrived of the valid ID), and a CHIP OFFSET (instructions on which way to adjust the value of $T_d$ to start the fine tuning process).

(8) each RU with an ID found by the CU recognizes its ID in the CU broadcast message or messages, calculates its offset value and does fine tuning (one RU at a time under control of the CU) to center its barker code exactly in the middle of the gap.

(9) For centering and confirmation, CU sends a downstream message containing PREVIOUS ID (the ID it just received) and a request, TX ANOTHER ID.

(10) RU sends another random ID (randomly selected and usually different from the first ID it used in the ranging process). CU broadcasts new IDs found and RU knows it has completed ranging unless contentions found.

(11) If there are contentions, CU sends "CONTENTIONS DETECTED"

(12) each RUs that is ranging starts binary tree algorithm for contention resolution as previously described, and some stop ranging and some continue ranging.

More Details on Preferred Boundless Ranging Process

The preferred boundless ranging process is broken generally down into several phases: Activity detection; Contention detection resolution, and authentication, and Frame alignment and gap centering.

In the preferred embodiment, only one pulse is transmitted per frame by each RU which is ranging for purposes of activity detection. For contention detection and resolution and frame alignment, gap centering nand authentication, the RUs send a 17 bit ID which comprises a sequence of one start Barker code followed by an ID comprised of 16 ON or OFF "bits" of which precisely 8 will be ON.

The details of the preferred boundless ranging process for use in an SCDMA embodiment where the codes are time shared are as follows.

(1) the CU solicits for ranging continuously and then analyzes each X frames following each Barker code transmission for activity. X is equal to the TTA to the farthest RU in number of frames, so if the farthest RU is 16 frames out, the 32 frames following each Barker code transmission from the CU will be analyzed for activity.

(2) each RU which is ranging transmits Barkers in consecutive frame gaps with a 4 chip delay increase in $T_d$ until CU reports activity detection. RU starts with a small power level so as to not cause excessive interference if it is not properly frame synchronized at the current value for $T_d$. If it does not receive feedback from the CU at this power level after scanning all the possible delays, the RU increases the power by k3=3 dB and starts scanning again with 4 chip delay increases during each successive transmission. The power for ranging is limited to maximum power allowed less 4 dB. At this time the RU is only trying to hit the nearest gap and does not care what its offset is. That offset will be deduced later from a message from the CU.

In other words, in the beginning of the ranging process, the RU transmitter FRAME # has 0 offset relative to the receiver FRAME #, and the CU FRAME # is the same in the transmitter and the receiver.

(3) Activity detection: As CU detects activity in the gap, it notifies the RUs "activity detected in frame #m". The FRAME# is sent to the RUs to eliminate any software delay. No RU is allowed to start new ranging processing after the first activity detection. The RU optionally increases the power by k4=1 dB to ensure better Barker detection.

The TTA for the RU or RUs that hit the gap is unknown at this point. Therefore the RU assumes that it is the RU that hit the gap and needs to determine which of the values for $T_d$ it used for previous Barker code transmissions which caused it to hit the gap. The RU therefore backs up its delay value and starts a one Barker code at a time negotiation process with the CU to attempt to locate the value for $T_d$ which caused it to hit the nearest gap. The value of $T_d$ is always less than one frame or 125 microseconds. For RU located up to 100 miles from the CU the maximum latency or TTA delay is 13 frames obtained from:

$$TTA_{\max} = \frac{2 \times 100 \text{ miles}}{0.65 \times 3 \times 10^8 \text{ m/s}} = 1.6 \text{ ms} = 13 \text{ frames}$$

For margin, assume a maximum TTA of 16 frames to the farthest RU. The RU uses the same chip delay used in frame #m identified in the CU's "activity detected" message in order to transmit the first Barker code. Only one Barker code is transmitted, and a reply from the CU is awaited for k5 frames (an experimentally determined number of frames). If the Barker is not detected, the RU continues to try all the 16 possible delays by increasing the delay by 4 chips for each trial. Each trial takes k5 frames until the RU receives feedback from the CU that activity has been detected in the gap. The value of k5 is set according to due to TTA and software delay. In alternative embodiments, a few pulses can be together.

Once the CU detects a pulse inside the gap, it sends to the RUs a message indicating "a pulse was detected in frame #n". This frame number can be used to set the offset value in some embodiments where there is known to be no contention (such as embodiments where only one RU is allowed to range at a time), but, in the preferred embodiment, since the RU is not yet sure it is the RU that hit the gap and there is only one RU in the gap, the offset number cannot yet be calculated.

(4) Contention detection and resolution: After the pulse was detected inside the gap, there are a few possibilities. First, there could be one pulse inside the gap was detected as well as other pulses which landed in the data portion. The source of the pulse in the gap can be from one RU, a contention of two or more RUs, or a noise hit. Second, there could be more than one pulse inside a gap or more than one pulse in several gaps. To resolve any contentions between multiple RUs, a contention resolution scheme similar to the scheme previously described herein can be used but with the addition of a start bit to accommodate the fact in boundless ranging that there is no longer any limitation that $TTA_{max}$ be limited to one frame. Thus, the CU sends a downstream message, "ACTIVITY DETECTED IN FRAME #XX, START CONTENTION RESOLUTION".

(5) ***To determine if there are any contentions in the preferred boundless ranging embodiment, the RUs transmit a sequence of 17 bits comprises of a start bit (a Barker code) and 8 1's out of 16 successive gaps where a "1" is a gap with a Barker code transmission in it. Vectors V1 through V8 are created by the CU in the same manner described above for creation of vectors V1 through V6 for the 6 chip listening window embodiment. Contentions are detected by the CU when the number of 1's in any particular chip vector V1 through V8 is more than 3 and different from 8. If there are contentions, the CU goes into contention resolution phase. The CU looks for a valid ID sequence in each vector in the process of examining each vector for contentions. A valid ID is found when exactly 8 of 16 gaps following the start bit having a "1", i.e., a Barker code in them during an interval of 17+16=33 frames (17 frames for the start bit and 16 bit ID and 16 frames for TTA involving propagation of the command START CONTENTION RESOLUTION to the farthest RU in the system and propagation of the start bit back to the CU from the farthest RU. Each valid ID sequence starts with a start bit, and it is the frame number during which the start bit arrived at the CU which is the frame number in which the valid ID is deemed to have arrived if a valid ID is found. The use of the start bit in this manner give definiteness to the offset calculation by insuring that each valid ID starts with a 1 so that its time of arrival can be determined with no ambiguity. The receipt of the valid ID insures that there are no contention, because if more than one RU is in the gap, more than 8 "1s" will be received in the 16 gaps following the start bit. When the valid ID is received, it is broadcast downstream in a message "VALID ID, FRAME #, CHIP OFFSET", and the RU which transmitted the ID will know that it is the RU that hit the gap by virtue of seeing its ID in the downstream message.

An example of a table obtained at the CU in looking for valid IDs is given in FIG. 72. Each row in the table represents one of the vectors V1 through V8. Note that in this particular embodiment, the listening window for Barker codes is 8 chips in width. In alternative embodiments such as the embodiment described next above, the listening window can be 6 or even 4 chips in width.

The table of FIG. 72 shows 8 valid IDs received during the window, one during each of the 8 chips of the listening window. The start bit for each valid ID is shown in a shaded box, and is used to detect the beginning of the sequence. Using this scheme the CU can detect collisions and ranging IDs for up to 8 different RUs. Contentions are detected on a per chip, i.e., a per vector basis in the 8 chip listening window in each gap.

(6) After a valid ID is detected, the CU broadcasts messages for each correct ID. Each message is comprised of: valid ID (the actual ID received), FRAME number of the frame in which the start bit of the valid ID was received, and the number of chips the start bit was offset from the center of the listening window. The RUs which see their ID in the downstream messages know they have hit the gap and that there is no contention on the particular chip in the listening window in which they have landed. Each RU which recognizes its ID in the downstream message "VALID ID xxxxxxxxx, FRAME #, CHIP OFFSET" then calculates its offset number by using the CU frame number contained in this downstream message containing that RU's valid ID (this is the CU receive frame number during which the start bit of that RU's valid ID was received) and the CU transmit frame number count from the CU transmit frame counter in the frame detector of that RU's receiver (which matches the CU transmit frame count) contained in the message from the CU saying "ACTIVITY DETECTED IN FRAME #, START CONTENTION RESOLUTION (Send your ID)". The difference between these two frame numbers is the propagation time in whole frames of a signal from the CU to the RU and back to the CU which is equal to the TTA in whole frame for that RU. That offset number is set into the offset register 1632 in FIG. 67 so as to achieve frame synchronization in this boundless ranging process.

In some embodiments, the Barker code listening window inside the gap is only 4 chips wide instead of 8, to prevent any of the Barker energy from being spilled into the data portion. Note that contentions are determined on a per chip basis in the listening window, so as long as only one RU has its Barker codes landing on that particular chip in every gap listening window, there is no contention on that chip. To avoid complication of the centering or fine tuning process, the CU in the preferred embodiment will fine tune only one RU at any particular time by messages in the downstream command and control channels telling the RUs which is to fine tune at any particular time.

(7) Fine Tuning: The RUs that see their valid ID in the downstream messages, then employ frame alignment and Barker centering by correcting the delay in terms of frames and chips to complete their ranging when so instructed by the CU.

(8) Contention resolution: When the RUs get a message of contention from the CU instead of the message "VALID ID xxxxxxxxx, FRAME #, CHIP OFFSET", the RUs "flip the coin" using a binary tree algorithm, to decide whether they continue ranging. Each RU in contention resolution mode has a probability of 1/2 that it will retransmit the 17 bit ID sequence.

The CU should have the following commands for contention resolution:

(A) "retransmit the sequence with probability of x, x=1/2 or 1"

(B) "retransmit the sequence with probability of x, x=1/2 or 1 only if the RU transmitted the sequence one stage before"

(C) "retransmit the sequence with probability of x, x=1/2 or 1 only if the RU transmitted the sequence one or two stages before"

(9) Centering and confirmation: The CU asks each successful RU which has centered its ID to transmit another random ID at the gap center in order to reduce the probability of errors.

After the CU finishes with sending IDs and contention resolution it should notify all the RUs that they are allowed to start ranging or restart ranging. The RUs that restart ranging should continue their ranging from the state it was stopped.

Although the teachings of the invention have been illustrated herein in terms of a few preferred and alternative embodiments, those skilled in the art will appreciate numerous modifications, improvement and substitutions that will serve the same functions without departing from the true spirit and scope of the appended claims. All such modifications, improvement and substitutions are intended to be included within the scope of the claims appended hereto.

What is claimed is:

1. A Trellis encoder for encoding payload data bits with redundant bits and mapping the resulting bits into a constellation point, comprising:
   a plurality of payload data inputs for receiving a plurality of payload bits;
   a convolutional encoder having a plurality of inputs coupled directly to a plurality of said payload data inputs and a first output and a second output;
   a separate exclusive OR gate having an input coupled to one of said payload data inputs and having an input coupled to said first output of said convolutional encoder and having an output;
   a mapper having a plurality of inputs coupled directly to a plurality of said payload data inputs, and having an input coupled to said second output of said convolutional encoder, and having an input coupled to said output of said exclusive OR gate, and having a plurality of I outputs and a plurality of Q outputs at which signals appear which are constellation points in a quadrature amplitude modulated constellation which are derived from said payload data appearing at said payload data inputs.

2. The apparatus of claim 1 wherein said mapper functions to nonlinearly map the bits input thereto into a constellation point of a 16 QAM constellation.

3. The apparatus of claim 1 wherein three payload bits are received, and wherein said first and second payload bits are applied to said mapper in an unchanged state, and wherein said convolutional encoder is comprised of a chain of four D type flip flops, the first, second and third of which have their outputs coupled to the input of an exclusive OR gate which has its output coupled to the input of the next D flip flop in said chain, and the fourth flip-flop having its output coupled to an input of said mapper and to the input of said first flip flop, and wherein the exclusive OR gate between said first and second flip flops has an input coupled to receive said second payload bit, and wherein said exclusive OR gate between said second and third flip flops has an input coupled to receive said first payload bit and an additional input coupled to said output of said separate exclusive OR gate, and having an additional input coupled to the output of an AND gate which has a first input coupled to the output of said fourth flip flop and a second input coupled to the input of said fourth flip flop, and wherein said third payload bit is modified by said separate exclusive OR gate by exclusive OR combination with the output bit from said third flip flop of said convolutional encoder, and wherein said exclusive OR gate having an input coupled to the output of said third flip flop and an output coupled to the input of said fourth flip flop has an additional input coupled to said output of said exclusive OR gate and an additional input coupled to said output of said fourth flip flop.

4. The apparatus of claim 3 wherein said mapper at least one control input for receiving control signals which control whether said Trellis encoder operates in a normal mode wherein one redundant bit is added to each three payload bits or a fallback mode wherein the output of said mapper is divided into two symbols and transmitted separately with the two least significant bits (y0, y1) being transmitted as first symbol or constellation point in a QPSK 4 point constellation and the two most significant bits (y3, y2) being transmitted as a second symbol or constellation in a DQPSK constellation.

5. The apparatus of claim 1 wherein said convolutional encoder and separate exclusive OR gate are structured and coupled together to implement a 16 state convolutional encoding process which only allows certain predetermined patterns in the constellation points that are generated from said payload data bits.

6. The apparatus of claim 1 wherein said convolutional encoder and separate exclusive OR gate are structured and coupled together so as to be characterized by parity check polynomials given in octal form as follows: h3=04, h2=10, h1=06, h0=23, d^2_free=5.O, Nfree=1.68, and wherein the nonlinear term is given by $D^2[y0(S).AND.D^(-1)y0(D)]$.

7. The apparatus of claim 1 wherein said mapper has multiple modes which add different numbers of redundant bits while always maintaining the code word length at 4 bits including a normal mode where one redundant bit is added per tribit, and a fallback mode which can be used when channel impairments are high wherein fewer payload bits are sent and more redundant bits are sent in each 4 bit code word.

8. An encoder for encoding payload data bits with redundant bits and mapping the resulting bits into a constellation point so as to achieve a coding gain, comprising:

first means for receiving a plurality of payload data bits and convolutionally encoding said payload bits to generate at least one additional bit derived mathematically from a Boolean logic combination of said payload bits, and for outputting at least some of said payload bits unchanged and at least one of said payload bits as modified by a logical operation with a bit output from an intermediate stage of a convolutional encoding process carried out in said first means, and outputting a final bit resulting from said convolutional encoding process; and second means coupled to receive one or more mode control signals and coupled to receive said final bit from said convolutional encoding process and said unchanged payload bits and said payload bit after modification by said convolutional encoding process, for mapping said bits into a constellation point of a constellation of possible data points, each point defined by a value on a real axis and a value on an imaginary axis, said mapping having at least a normal mode and a fallback mode.

9. The encoder of claim 8 wherein said first means includes a 16-state convolutional encoder characterized by parity check polynomials given in octal form as follows: h3=04, h2=10, h1=06, h0=23, d^2_free=5.O, Nfree=1.68 and wherein the nonlinear term is given by $D^2[y0(S).AND.D^(-1)y0(D)]$.

10. The encoder of claim 8 wherein said first means and second means implement a forward error correction encoder state machine or lookup table coupled to a state memory which adds at least one extra bit to provide redundancy for error detection and correction and for use by a Viterbi Decoder in a receiver for ascertaining with greater accuracy the data that was actually sent despite the presence of noise, said at least one extra bit providing a constellation that is bigger than the constellation would have without said extra bit(s) thereby enabling more spacing between constellation points thereby enabling better discrimination between points by the receiver and lowering the bit error rate without increasing the bandwidth.

11. A process for Trellis encoding a plurality of payload bits into a constellation point, comprising:

receiving a plurality of payload bits;

convolutionally encoding a combination of said payload bits into one or more additional bits by applying said payload bits to different inputs of a convolutional encoder and also applying a modified bit to an input of said convolutional encoder, said modified bit being generated by exclusive-ORing one of said payload bits with an output bit from an intermediate stage of said convolutional encoder, said convolutional encoding step resulting in output of one or more additional bits; and mapping the combination of at least some of said payload bits in an unmodified state, said modified bit and said one or more additional bits into a constellation point, wherein said process for Trellis encoding is performed upon multiple pluralities of said payload bits successively, and wherein said step of convolutional encoding comprises introducing a certain dependency between successive constellation points generated from said successive plurality of payload bits such that only certain patterns or permissible sequences of constellation points are permitted, said patterns or permissible sequences capable of being modelled in a receiver's Viterbi decoder as a Trellis code.

12. A process for Trellis encoding a plurality of payload bits into a constellation point, comprising:

receiving a plurality of payload bits;

convolutionally encoding a combination of said payload bits into one or more additional bits by applying said payload bits to different inputs of a convolutional encoder and also applying a modified bit to an input of said convolutional encoder, said modified bit being generated by exclusive-ORing one of said payload bits with an output bit from an intermediate stage of said convolutional encoder, said convolutional encoding step resulting in output of one or more additional bits; and mapping the combination of at least some of said payload bits in an unmodified state, said modified bit and said one or more additional bits into a constellation point, wherein said step of mapping includes the steps of receiving a control signal that indicates whether a normal mode or a fallback mode is to be implemented wherein said normal mode maps said plurality of payload bits, said modified bit and said one or more additional bits into a constellation point in a constellation of points that is larger than a constellation of possible points would be if only the original payload bits were mapped into a constellation, and said fallback mode mapping said plurality of bits in an unmodified payload state, said modified bit and said one or more additional bits into a constellation point in a constellation of points that is larger than the constellation of points that are possible in said normal mode.

13. A process for Trellis encoding a plurality of payload bits into a constellation point, comprising:

receiving a plurality of payload bits;

convolutionally encoding a combination of said payload bits into one or more additional bits by applying said payload bits to different inputs of a convolutional encoder and also applying a modified bit to an input of said convolutional encoder, said modified bit being generated by exclusive-ORing one of said payload bits with an output bit from an intermediate stage of said convolutional encoder, said convolutional encoding step resulting in output of one or more additional bits; and mapping the combination of at least some of said payload bits in an unmodified state, said modified bit and said one or more additional bits into a constellation point, wherein the step of convolutionally encoding is characterized by parity check polynomials given in octal form as follows: h3=04, h2=10, h1=06, h0=23, d^2_free=5.0, Nfree=1.68, and wherein the nonlinear term is given by $D^2[y0(S).AND.D^{(-1)}y0(D)]$.

* * * * *